United States Patent
Cameron et al.

(10) Patent No.: US 7,415,079 B2
(45) Date of Patent: *Aug. 19, 2008

(54) **DECODER DESIGN ADAPTABLE TO DECODE CODED SIGNALS USING MIN* OR MAX* PROCESSING**

(75) Inventors: Kelly Brian Cameron, Irvine, CA (US); Ba-Zhong Shen, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 746 days.

This patent is subject to a terminal disclaimer.

(21) Appl. No.: 10/865,456

(22) Filed: Jun. 10, 2004

(65) Prior Publication Data

US 2004/0240590 A1 Dec. 2, 2004

Related U.S. Application Data

(63) Continuation-in-part of application No. 10/369,168, filed on Feb. 19, 2003, and a continuation-in-part of application No. 09/952,210, filed on Sep. 12, 2001, now Pat. No. 7,023,934, and a continuation-in-part of application No. 09/878,148, filed on Jun. 8, 2001.

(60) Provisional application No. 60/571,655, filed on May 15, 2004, provisional application No. 60/408,978, filed on Sep. 6, 2002, provisional application No. 60/403,847, filed on Aug. 15, 2002, provisional application No. 60/232,288, filed on Sep. 12, 2000, provisional application No. 60/232,053, filed on Sep. 12, 2000.

(51) Int. Cl.
*H03D 1/00* (2006.01)
*H03M 13/03* (2006.01)

(52) U.S. Cl. ............... 375/340; 375/341; 714/794; 714/795

(58) Field of Classification Search .......... 375/340, 375/341, 262, 265; 714/724, 755, 794, 795, 714/796, 780, 801, 781

See application file for complete search history.

(56) References Cited

U.S. PATENT DOCUMENTS

2005/0246618 A1* 11/2005 Tran et al. ............... 714/801
2005/0262408 A1* 11/2005 Tran et al. ............... 714/724
2005/0268206 A1* 12/2005 Tran et al. ............... 714/758

OTHER PUBLICATIONS

Zarkeshvari et al. On Implementation of Min-Sum Algorithm For Decoding Low-Density Parity-Check (LDPC) Codes, Nov. 17-21, 2002, IEEE Global Telecommunications Conference, Nov. 17-21, 2002, vol. 2, pp. 1349-1353.*
Jianguang et al., On Implementation of Min-Sum Algorithm And Its modifications For Decoding Low-Density Parity-Check (LDPC) Codes, Apr. 2005, vol. 53, Issue 4, pp. 549-554.*

* cited by examiner

*Primary Examiner*—Mohammad H. Ghayour
*Assistant Examiner*—Lawrence B Williams
(74) *Attorney, Agent, or Firm*—Garlick Harrison & Markison; Shayne X. Short

(57) ABSTRACT

Decoder design adaptable to decode coded signals using min* or max* processing. A very efficient means of min* processing or max* processing may be performed within a communication device to assist in the very complex and cumbersome calculations that are employed when decoding coded signals. The types of coded signals that may be decoded using min* processing or max* processing are varied, and they include LDPC (Low Density Parity Check) coded signals, turbo coded signals, and TTCM (Turbo Trellis Coded Modulation) coded signals, among other coded signal types. Many of the calculations and/or determinations performed within min* processing or max* processing are performed simultaneously and in parallel of one another thereby ensuring very fast operation. In a finite precision digital implementation, when certain calculated bits of min* or max* processing are available, they govern selection of resultants from among multiple calculations and determinations made simultaneously and in parallel.

92 Claims, 101 Drawing Sheets rate 2/3 feedforward encoder rate 2/3 feedforward encoder rate 2/3 basic constituent encoder

Fig. 14B table 7

| seq. #1 | 3 |   |   |   |   |   |   |   |   |   | 0 |   |   |   | 5 |   | 2 |   |   |   | 1 |
|---|---|---|---|---|---|---|---|---|---|---|---|---|---|---|---|---|---|---|---|---|---|
| seq. #2 |   | 2 |   |   |   | 4 |   |   |   | 5 |   |   |   | 4 |   |   |   | 2 |   |   |   |
| seq. #3 |   |   | 2 |   |   |   | 1 |   |   |   |   | 1 |   |   |   | 3 |   |   | 4 |   |   |
| seq. #4 |   |   |   | 3 |   |   |   | 0 |   |   |   |   | 1 |   |   |   | 5 |   |   | 4 | 2 |
| seq. 1-2-3-4 | 3 | 2 | 2 | 3 | 0 | 1 | 4 | 1 | 5 | 0 | 5 | 0 | 1 | 5 | 4 | 3 | 0 | 2 | 2 | 4 | 3 | 1 | table 8

| position | 23 | 22 | 21 | 20 | 19 | 18 | 17 | 16 | 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|---|---|---|---|---|---|---|---|---|
| seq. 1-2-3-4 | 3 | 2 | 2 | 3 | 0 | 1 | 4 | 1 | 5 | 0 | 5 | 0 | 1 | 5 | 4 | 3 | 0 | 2 | 2 | 4 | 3 | 1 |   |   |
| X4 (mod) | 2 | 8 | 8 | 2 | 0 | 4 | 6 | 0 | 20 | 0 | 20 | 0 | 4 | 20 | 16 | 12 | 0 | 8 | 8 | 16 | 12 | 4 | 0 |   |
| +mod 4 (position) | 3 | 2 | 1 | 0 | 3 | 2 | 1 | 0 | 3 | 2 | 1 | 0 | 3 | 2 | 1 | 0 | 3 | 2 | 1 | 0 | 3 | 2 | 1 | 0 |
| seq. #8 | 5 | 0 | 9 | 2 | 3 | 6 | 7 | 0 | 23 | 2 | 21 | 0 | 7 | 22 | 17 | 12 | 3 | 10 | 9 | 16 | 15 | 6 | 1 | 4 |

Fig. 14C rate 2/3 encoder rate 1/2 encoder

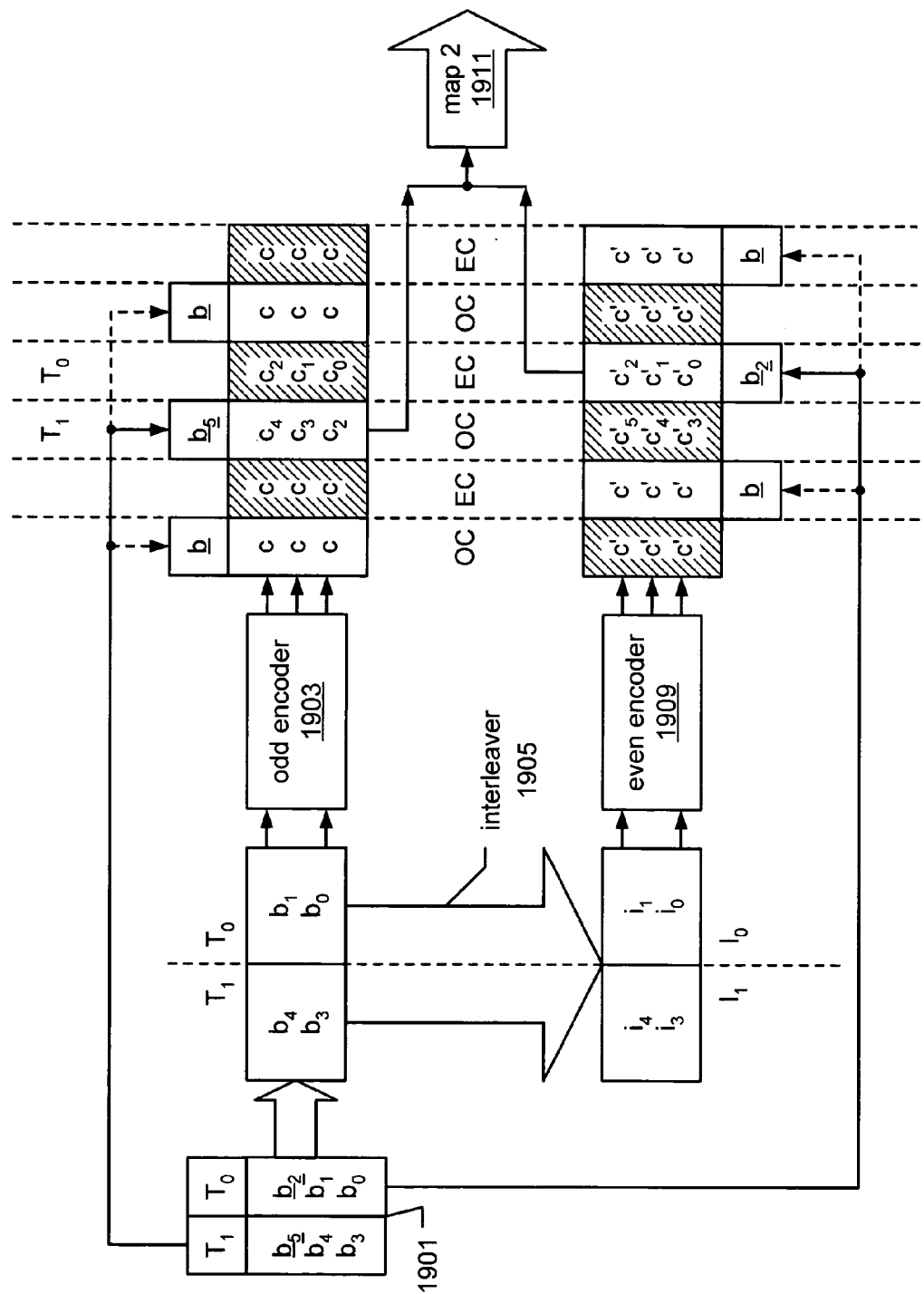
Fig. 19 rate 3/4 encoder

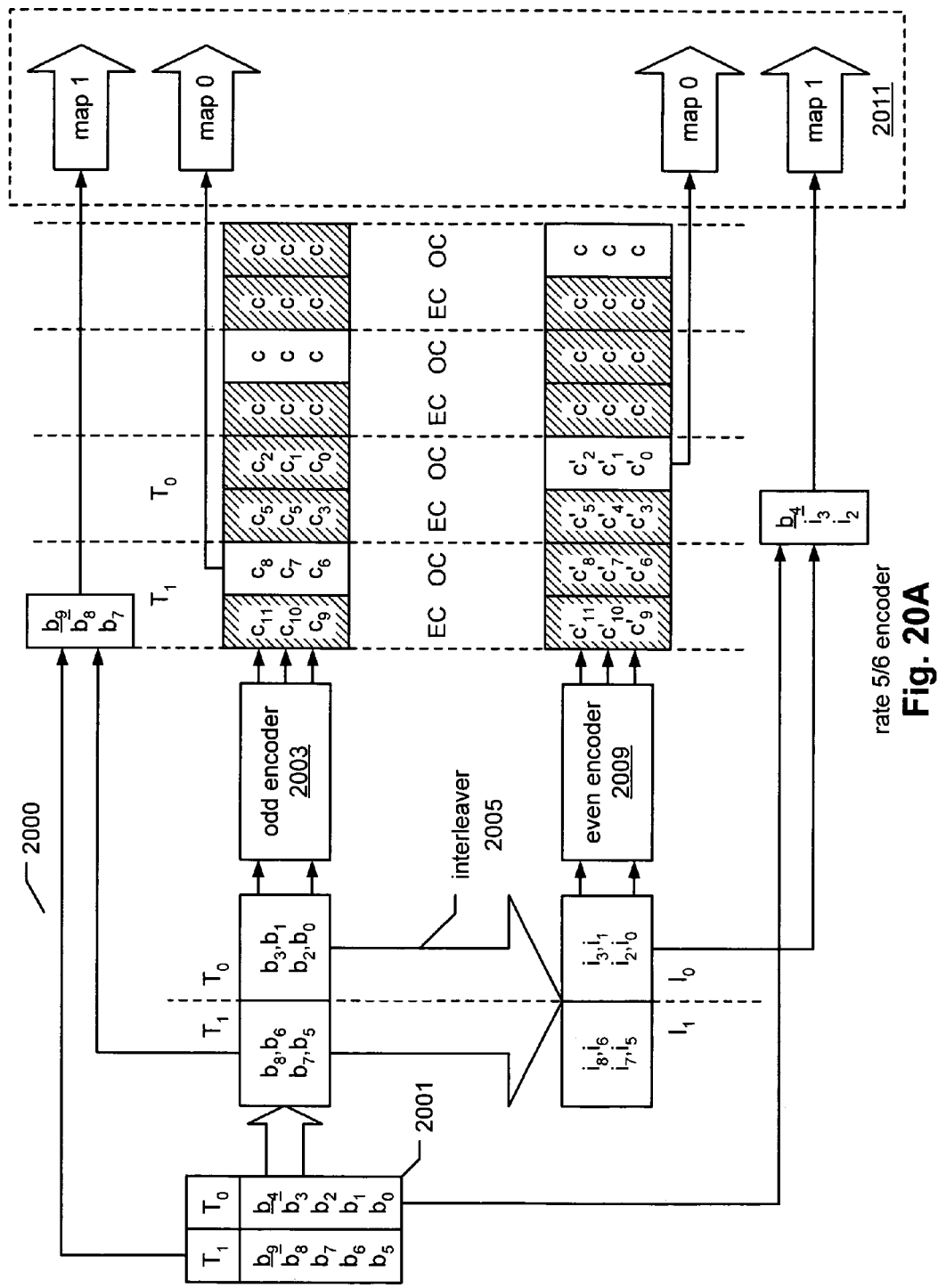
Fig. 20A rate 5/6 encoder

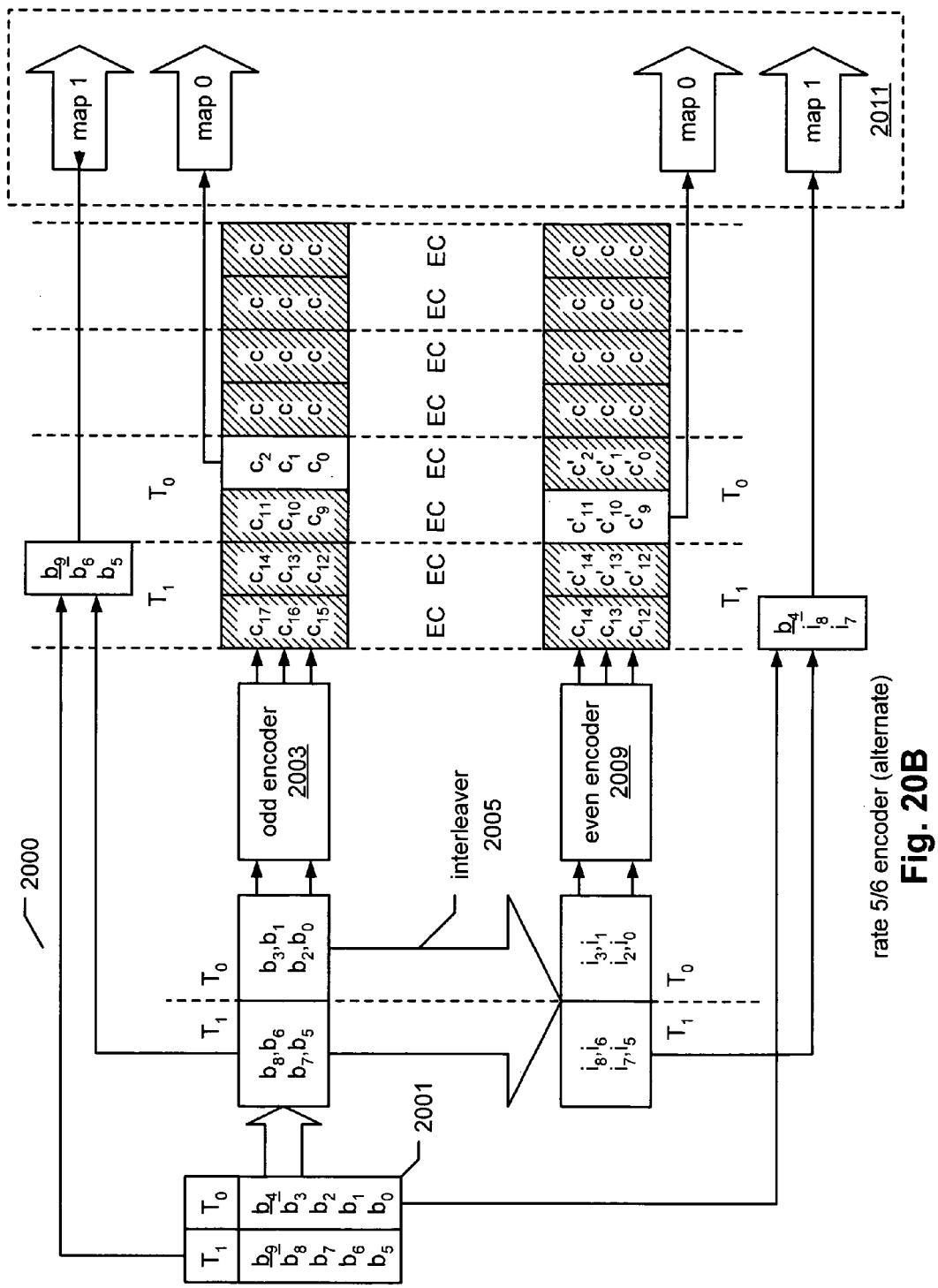
Fig. 20B rate 5/6 encoder (alternate)

rate 8/9 encoder min* circuit (or min* processing functional block)

| Δ(2:0) | log(+value) 5111 out | log(-value) 5709 out |
|---|---|---|
| 111 | 1 | 0 |
| 110 | 1 | 0 |
| 101 | 0 | 0 |
| 100 | 0 | 0 |
| 011 | 0 | 0 |
| 010 | 0 | 1 |
| 001 | 0 | 1 |
| 000 | 0 | 1 | alpha/beta (α/β) min* log table
(used by log(-value) 5709 and by log(+value) 5111 of Fig. 51)

Fig. 51B

| Δ[2:0] | log saturation (5113 out) |
|---|---|
| 1.75 | 0.5 |
| 1.50 | 0.5 |
| 1.25 | 0 |
| 1.00 | 0 |
| 0.75 | 0 |
| 0.50 | 0 |
| 0.25 | 0 |
| 0.00 | 0 |
| -0.25 | 0 |
| -0.50 | 0 |
| -0.75 | 0 |
| -1.00 | 0 |
| -1.25 | 0 |
| -1.50 | 0.5 |
| -1.75 | 0.5 |
| -2.00 | 0.5 | alpha/beta (α/β) min* table
(used by log saturation circuit 5113 of Fig. 51)

Fig. 51A simplified version of Table of Fig. 51A

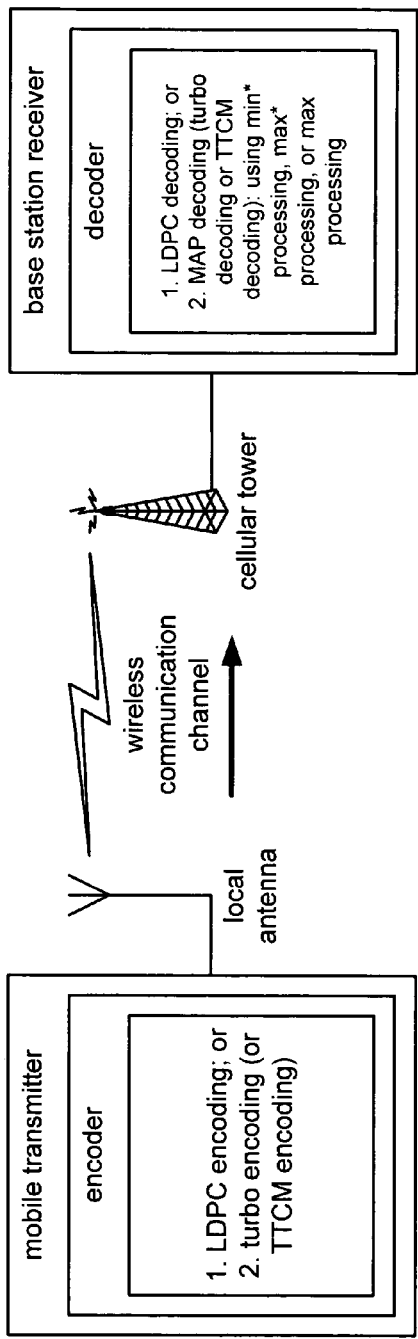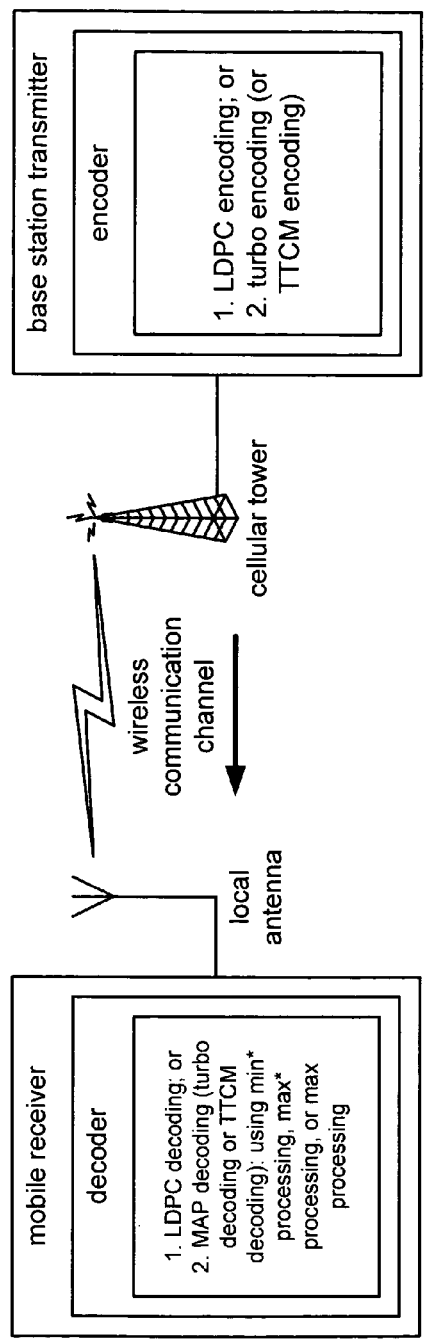

bi-directional cellular communication system uni-directional microwave communication system bi-directional microwave communication system uni-directional point-to-point radio communication system bi-directional point-to-point radio communication system uni-directional communication system bi-directional communication system one to many communication system WLAN (Wireless Local Area Network) communication system satellite receiver STB (Set Top Box) system communication system LDPC (Low Density Parity Check) code bipartite graph LDPC (Low Density Parity Check) decoding functionality using bit metric Fig. 73 alternative LDPC decoding functionality using bit metric (when performing n number of iterations)

LDPC (Low Density Parity Check) decoding functionality using bit metric (with bit metric updating)

alternative LDPC decoding functionality using bit metric (with bit metric updating) (when performing n number of iterations)

LDPC code LLR (Log-Likelihood Ratio) decoding functionality straightforward check node processing functionality min* (min*+ and min*-) or max* (max*+ and max*-) check node processing functionality processing of min* circuit (or min* processing functional block) (performs operation of min* operator)

min* circuit (or min* processing functional block) (alternate representation of Fig. 51)

processing of max* circuit (or max* processing functional block) (performs operation of max* operator)

max* circuit (or max* processing functional block)

| Δ(2:0) | ln(+value) | ln(-value) |
|---|---|---|
| 111 | 0 | 1 |
| 110 | 0 | 1 |
| 101 | 1 | 1 |
| 100 | 1 | 1 |
| 011 | 1 | 1 |
| 010 | 1 | 0 |
| 001 | 1 | 0 |
| 000 | 1 | 0 | alpha/beta (α/β) max* log table
(used by ln(-value) and by ln(+value) of Fig. 83)

Fig. 83B

| Δ[2:0] | max* log saturation output |
|---|---|
| 1.75 | 0.5 |
| 1.50 | 0.5 |
| 1.25 | 0 |
| 1.00 | 0 |
| 0.75 | 0 |
| 0.50 | 0 |
| 0.25 | 0 |
| 0.00 | 0 |
| -0.25 | 0 |
| -0.50 | 0 |
| -0.75 | 0 |
| -1.00 | 0 |
| -1.25 | 0 |
| -1.50 | 0.5 |
| -1.75 | 0.5 |
| -2.00 | 0.5 | alpha/beta (α/β) max* table
(used by max* log saturation circuit of Fig. 83)

Fig. 83A

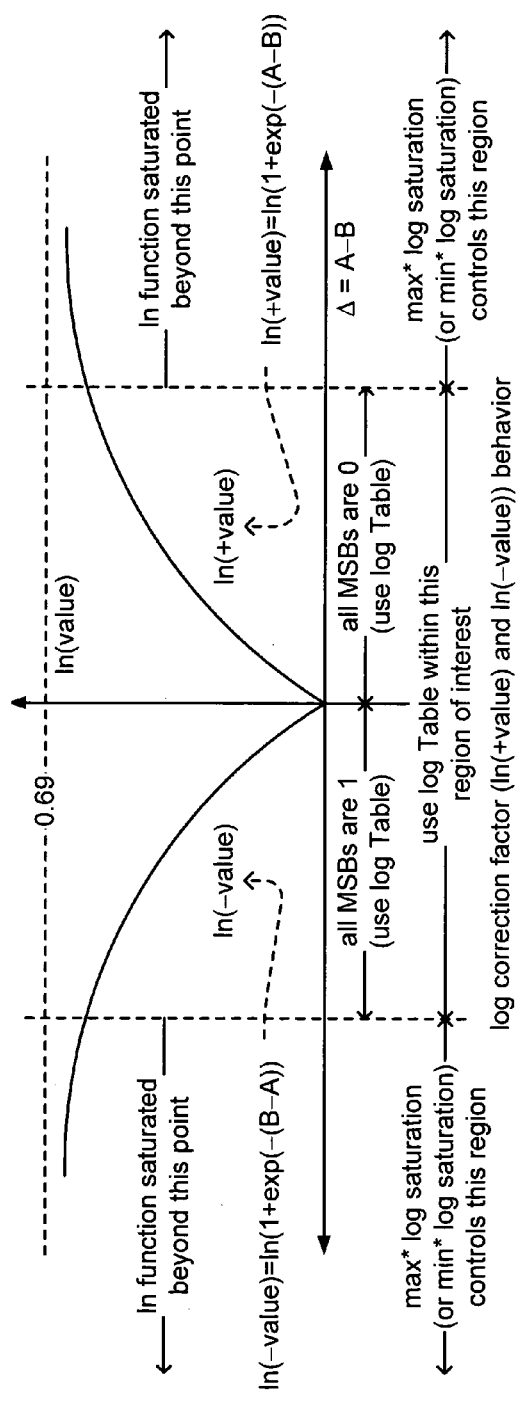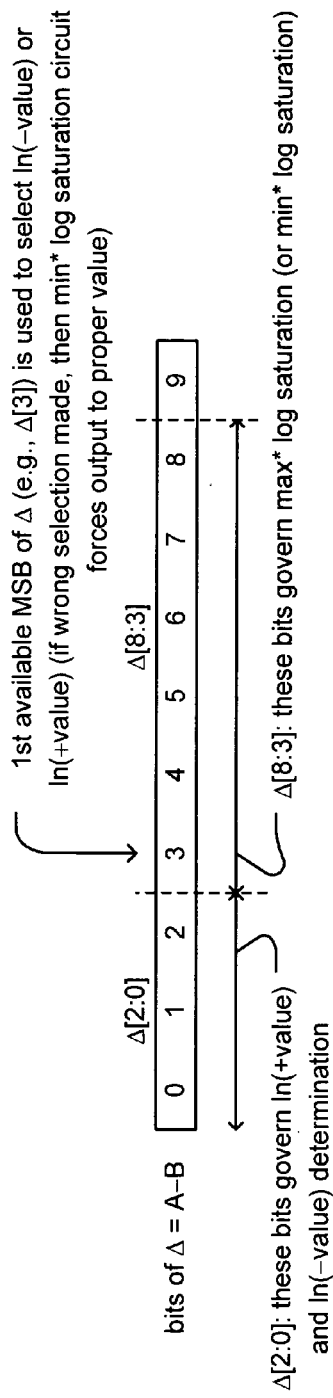
Fig. 84A
Fig. 84B timing diagram of calculating Δ = A−B, ln(−value), and ln(+value) that may be employed for min* or max* circuits method for decoding LDPC coded signals employing min* processing, max* processing, or max processing method for decoding LDPC coded signals employing min* processing, max* processing, or max processing method for performing min* (or max*) processing

DECODER DESIGN ADAPTABLE TO DECODE CODED SIGNALS USING MIN* OR MAX* PROCESSING

CROSS REFERENCE TO RELATED PATENTS/PATENT APPLICATIONS

The present U.S. Utility Patent Application claims priority, pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Patent Application Ser. No. 60/571,655, entitled "Decoder design adaptable to decode coded signals using min* or max* processing," filed May 15, 2004 (May 15, 2004).

The present U.S. Utility Patent Application is also a continuation-in-part (CIP) of the following U.S. Utility Patent Application which is hereby incorporated herein by reference in its entirety and made part of the present U.S. Utility Patent Application for all purposes:

1. U.S. Utility patent application Ser. No. 09/952,210, entitled "Method and apparatus for min star calculations in a MAP decoder," filed Sep. 12, 2001 (Sep. 12, 2001), now U.S. Pat. No. 7,023,934, which claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Patent Application Ser. No. 60/232,053, entitled "Turbo trellis encoder and decoder," filed Sep. 12, 2000 (Sep. 12, 2000).

2. U.S. Provisional Patent Application Ser. No. 60/232,288, entitled "Parallel concatenated code with SISO interactive turbo decoder," filed Sep. 12, 2000 (Sep. 12, 2000).

The following U.S. Utility Patent Application is hereby incorporated herein by reference in its entirety and made part of the present U.S. Utility Patent Application for all purposes:

1. U.S. Utility patent application Ser. No. 09/878,148, entitled "Parallel concatenated code with Soft-In Soft-Out interactive turbo decoder," filed Jun. 8, 2001 (Jun. 8, 2001)

The present U.S. Utility Patent Application is also a continuation-in-part (CIP) of the following U.S. Utility Patent Application which is hereby incorporated herein by reference in its entirety and made part of the present U.S. Utility Patent Application for all purposes:

1. U.S. Utility patent application Ser. No. 10/369,168, entitled "Low Density Parity Check (LDPC) code decoder using min*, min**, max* or max** and their respective inverses," filed Feb. 19, 2003 (Feb. 19, 2003), which claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Application Ser. No. 60/403,847, entitled "Inverse of function of min*: min*–(inverse function of max*: max*–)," filed Aug. 15, 2002 (Aug. 15, 2002).

2. U.S. Provisional Application Ser. No. 60/408,978, entitled "Low Density Parity Check (LDPC) Code Decoder using min*, min*–, min, and/or min–," filed Sep. 6, 2002 (Sep. 6, 2002).

BACKGROUND OF THE INVENTION

1. Technical Field of the Invention

The invention relates to methods, apparatus, and signals used in channel coding and decoding, and, in particular embodiments to methods, apparatus and signals for use with turbo and turbo-trellis encoding and decoding for communication channels.

2. Description of Related Art

A significant amount of interest has recently been paid to channel coding. For example a recent authoritative text states:

"Channel coding refers to the class of signal transformations designed to improve communications performance by enabling the transmitted signals to better withstand the effects of various channel impairments, such as noise, interference, and fading. These signal-processing techniques can be thought of as vehicles for accomplishing desirable system trade-offs (e.g., error-performance versus bandwidth, power versus bandwidth). Why do you suppose channel coding has become such a popular way to bring about these beneficial effects? The use of large-scale integrated circuits (LSI) and high-speed digital signal processing (DSP) techniques have made it possible to provide as much as 10 dB performance improvement through these methods, at much less cost than through the use of most other methods such as higher power transmitters or larger antennas."

From "Digital Communications" Fundamentals and Applications Second Edition by Bernard Sklar, page 305 8 2001 Prentice Hall PTR.

Stated differently, improved coding techniques may provide systems that can operate at lower power or may be used to provide higher data rates.

Conventions and Definitions:

Particular aspects of the invention disclosed herein depend upon and are sensitive to the sequence and ordering of data. To improve the clarity of this disclosure the following convention is adopted. Usually, items are listed in the order that they appear. Items listed as #1, #2, #3 are expected to appear in the order #1, #2, #3 listed, in agreement with the way they are read, i.e. from left to right. However, in engineering drawings, it is common to show a sequence being presented to a block of circuitry, with the right most tuple representing the earliest sequence, as shown in FIG. 2, where 207 is the earliest tuple, followed by tuple 209. The IEEE Standard Dictionary of Electrical and Electronics Terms, Sixth Edition, defines tuple as a suffix meaning an ordered set of terms (sequence) as in N-tuple. A tuple as used herein is merely a grouping of bits having a relationship to each other.

Herein, the convention is adopted that items, such as tuples will be written in the same convention as the drawings. That is in the order that they sequentially proceed in a circuit. For example, "Tuples 207 and 209 are accepted by block 109" means tuple 207 is accepted first and then 209 is accepted, as is seen in FIG. 2. In other words the text will reflect the sequence implied by the drawings. Therefore a description of FIG. 2 would say "tuples 207 and 209 are provided to block 109" meaning that tuple 207 is provided to block 109 before tuple 209 is provided to block 109.

Herein an interleaver is defined as a device having an input and an output. The input accepting data tuples and the output providing data tuples having the same component bits as the input tuples, except for order.

An integral tuple (IT) interleaver is defined as an interleaver that reorders tuples that have been presented at the input, but does not separate the component bits of the input tuples. That is the tuples remain as integral units and adjacent bits in an input tuple will remain adjacent, even though the tuple has been relocated. The tuples, which are output from an IT interleaver are the same as the tuples input to interleaver, except for order. Hereinafter when the term interleaver is used, an IT interleaver will be meant.

A separable tuple (ST) interleaver is defined as an interleaver that reorders the tuples input to it in the same manner as an IT interleaver, except that the bits in the input tuples are interleaved independently, so that bits that are adjacent to each other in an input tuple are interleaved separately and are interleaved into different output tuples. Each bit of an input tuple, when interleaved in an ST interleaver, will typically be found in a different tuple than the other bits of the input tuple from where it came. Although the input bits are interleaved separately in an ST interleaver, they are generally interleaved into the same position within the output tuple as they occupied within the input tuple. So for example, if an input tuple comprising two bits, a most significant bit and a least significant bit, is input into an ST interleaver the most significant bit will be interleaved into the most significant bit position in a first output tuple and the least significant bit will be interleaved into the least significant bit position in a second output tuple.

Modulo-N sequence designation is a term meaning the modulo-N of the position of an element in a sequence. If there are k item $s^{(I)}$ in a sequence then the items have ordinal numbers 0 to k−1, i.e. $I_0$ through $I_{(k−1)}$ representing the position of each time in the sequence. The first item in the sequence occupies position 0, the second item in a sequence $I_1$ occupies position 1, the third item in the sequence $I_2$ occupies position 2 and so forth up to item $I_{k−1}$, which occupies the k'th or last position in the sequence. The modulo-N sequence designation is equal to the position of the item in the sequence modulo-N. For example, the modulo-2 sequence designation of $I_0$=0, the modulo-2 sequence designation of $I_1$=1, and the modulo-2 sequence designation of $I_2$=0 and so forth.

A modulo-N interleaver is defined as an interleaver wherein the interleaving function depends on the modulo-N value of the tuple input to the interleaver. Modulo interleavers are further defined and illustrated herein.

A modulo-N encoding system is one that employs one or more modulo interleavers.

BRIEF SUMMARY OF THE INVENTION

In one aspect of the invention a method for computing an alpha metric for a selected state in a map decoder is disclosed. The method includes determining Min_α=minimum of the operands comparing a first input (A) and the second input (B), wherein A comprises an β metric, a priori values and a transition metric for a first previous state and B comprises an β metric, a priori values and a transition metric for a second previous state, outputting Min_α from the min* operation wherein Min_α comprises the MIN(A,B), a first portion of the output of a min* operation, computing ln_β=B log $(1+e^{-|A-B|})$ as a second portion of a min* operation; and outputting ln_α from the min* operation;

In another aspect of the invention a method for computing a beta metric for a selected state in a map decoder is disclosed. The method includes determining Min_β=minimum of the operands comparing a first input (A) and the second input (B), wherein A comprises an β metric, a priori values and a transition metric for a first previous state and B comprises a β metric, a priori values and a transition metric for a second previous state, outputting Min_β from the min* operation wherein Min_β comprises the MIN(A,B), a first portion of the output of a min* operation, computing ln_β=B log$(1+e^{-|A-B|})$ as a second portion of a min* operation and outputting ln_β from the min* operation.

In one aspect of the invention an apparatus for calculating a min* resultant in a MAP decoder is disclosed. The apparatus includes a circuit for calculating the minimum (Min) of A and B where A is the sum of a1 and a2 and a3, wherein a1 is the Min_α of a previous state, a2 is ln_α of the previous state and a3 is equal to a priori values from a previous state plus a transition metric from a previous state and B is equal to b1 and b2 and b3, wherein b1 is the Min_α of a previous state, b2 is ln_α of the previous state and b3 is equal to a priori values from a previous state plus a transition metric from a previous state and a circuit for calculating B log$(1+e^{-|A-B|})$.

The min* processing described herein may be implemented to assist in decoding of other types of coded signals besides only turbo coded signals or TTCM (Turbo Trellis Coded Modulation) coded signals. For example, the min* processing described herein may be adapted to perform various calculations as required when decoding LDPC (Low Density Parity Check) coded signals. In addition, an alternative form of processing, max* (max star) processing may employed to assist in the various calculations that need to be performed when decoding various types of coded signals.

The arrangement of the functional blocks and/or components that are implemented to perform either min* processing or max* processing is in such as way that computational and processing speed is kept at a highest possible value. For example, the intelligent means by which various intermediate components are determined and/or calculated simultaneously and in parallel provides for a very fast means by which a min* resultant or a max* resultant may be achieved. In addition, in an effort to maximize operational speed of the functional blocks and/or circuits used to perform min* processing or max* processing, the degree of precision of the log correction factors employed may be implemented using only a single bit. When this is done (e.g., a single bit of precision for log correction factor), the operational speed of min* processing and max* processing is increased even more.

BRIEF DESCRIPTION OF THE SEVERAL VIEWS OF THE DRAWINGS

The features, aspects, and advantages of the present invention which have been described in the above summary will be better understood with regard to the following description, appended claims, and accompanying drawings where:

FIG. 14B is a graphical illustration of a process by which modulo-2 and modulo-3 interleaving sequences may be generated.

FIG. 14C is a graphical illustration of a process by which a modulo-4 interleaving sequence may be generated.

FIG. 19 is a graphical illustration of a rate ¾ TTCM encoder, with constituent ⅔ rate encoders, according to an embodiment of the invention.

FIG. 20A is a graphical illustration of a rate ⅚ TTCM encoder, with constituent ⅔ rate encoders, according to an embodiment of the invention.

FIG. 20B is a graphical illustration which represents an alternate encoding that will yield the same coding rate as FIG. 20A.

FIG. 52C is a graphical illustration of a simplified version of the table of FIG. 51A.

FIG. 55A and FIG. 55B are system diagrams illustrating embodiment of uni-directional cellular communication systems that are built according to the invention.

FIG. 83A is a diagram illustrating an embodiment of an alpha/beta ($\alpha/\beta$) max* table that may be employed by the max* log saturation circuit of FIG. 83 in accordance with certain aspects of the invention.

FIG. 83B is a diagram illustrating an embodiment of an alpha/beta ($\alpha/\beta$) max* table that may be employed by the ln(−value) and ln(+value) functional blocks of FIG. 83 in accordance with certain aspects of the invention.

FIG. 84A is a diagram illustrating an embodiment of log correction factor (e.g., ln(−value) and ln(+value)) behavior in accordance with certain aspects of the invention.

FIG. 84B is a diagram illustrating an embodiment of the individual bit contributions of $\Delta$ as governing the log correction factors, ln(−value) and ln(+value), respectively, and the max* or min* log saturation circuits in accordance with certain aspects of the invention.

DETAILED DESCRIPTION OF THE INVENTION

Figure 1:
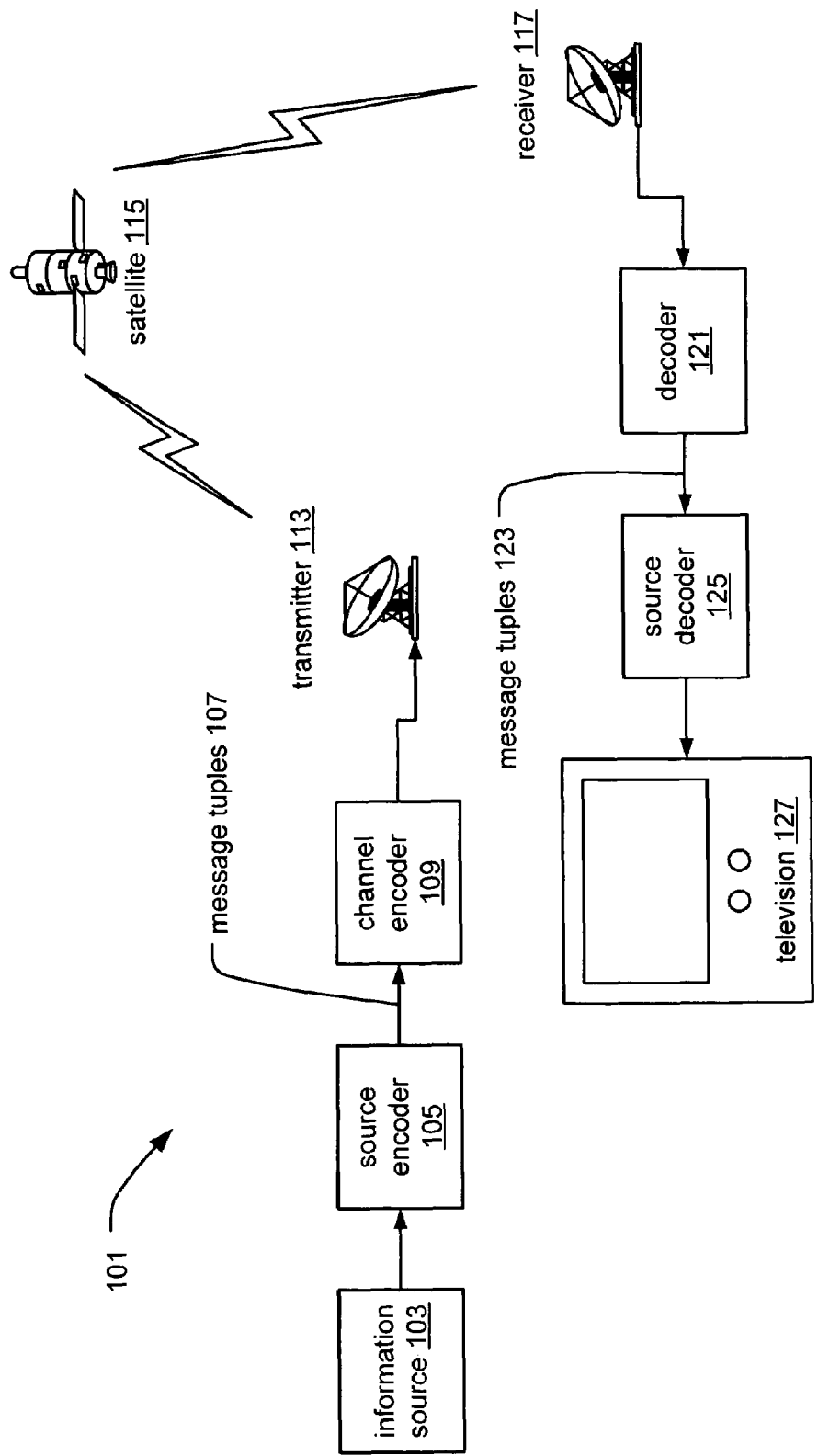
FIG. 1 is a graphical illustration of an environment in which embodiments of the present invention may operate.

FIG. 1 is a graphic illustration of an environment in which embodiments of the present invention may operate. The environment illustrated at 101 is an information distribution system, such as may be found in a cable television distribution system.

In FIG. 1 data is provided to the system from an information source 103. For purposes of illustration, the information source displayed in FIG. 1 may be considered to be a cable television system head end which provides video data to end users. A formatter 105 accepts data from the information source 103. The data provided by information source 103 may comprise analog or digital signals such as (but not limited to) video signals, audio signals, and data signals. The formatter block 105 accepts the data from the information source and formats it into an appropriate form, such as message tuples, which are illustrated at 107. The formatted data is then provided to a channel encoder 109. Channel encoder 109 encodes that data provided to it. In some embodiments of the present invention, the channel encoder 109 may provide an encoding, with different goals depending on the particular implementation, for example to make the signal more robust, to reduce the error probability, to operate the system using less transmission power or to enable a more efficient decoding of the signal. Channel encoder 109 then provides the encoded data to a transmitter 111. The transmitter transmits the encoded data provided to it by the channel encoder 109, for example, using an antenna 113. The signal broadcast from antenna 113 is received by a relay satellite 115 and then rebroadcast to a receiving terrestrial antenna, such as earth station antenna 117. Earth station antenna 117 collects the satellite signal and provides the collected signal to a receiver 119. The receiver 119 will amplify and demodulate/detect the signal as appropriate and provide the detected signal to a decoder 121. Decoder 121 will essentially, reverse the process of the channel encoder 109 and recreate the message tuples 123, which should represent a good estimate of the message tuples 107 that had been broadcast. The decoder 121 may use Forward Error Correction (FEC), in order to correct errors in the received signal. The tuples 123 provided by the decoder are then provided to a formatting unit 125, which prepares the received message tuples for use by an information sink, such as the television display illustrated at 127.

Figure 2:
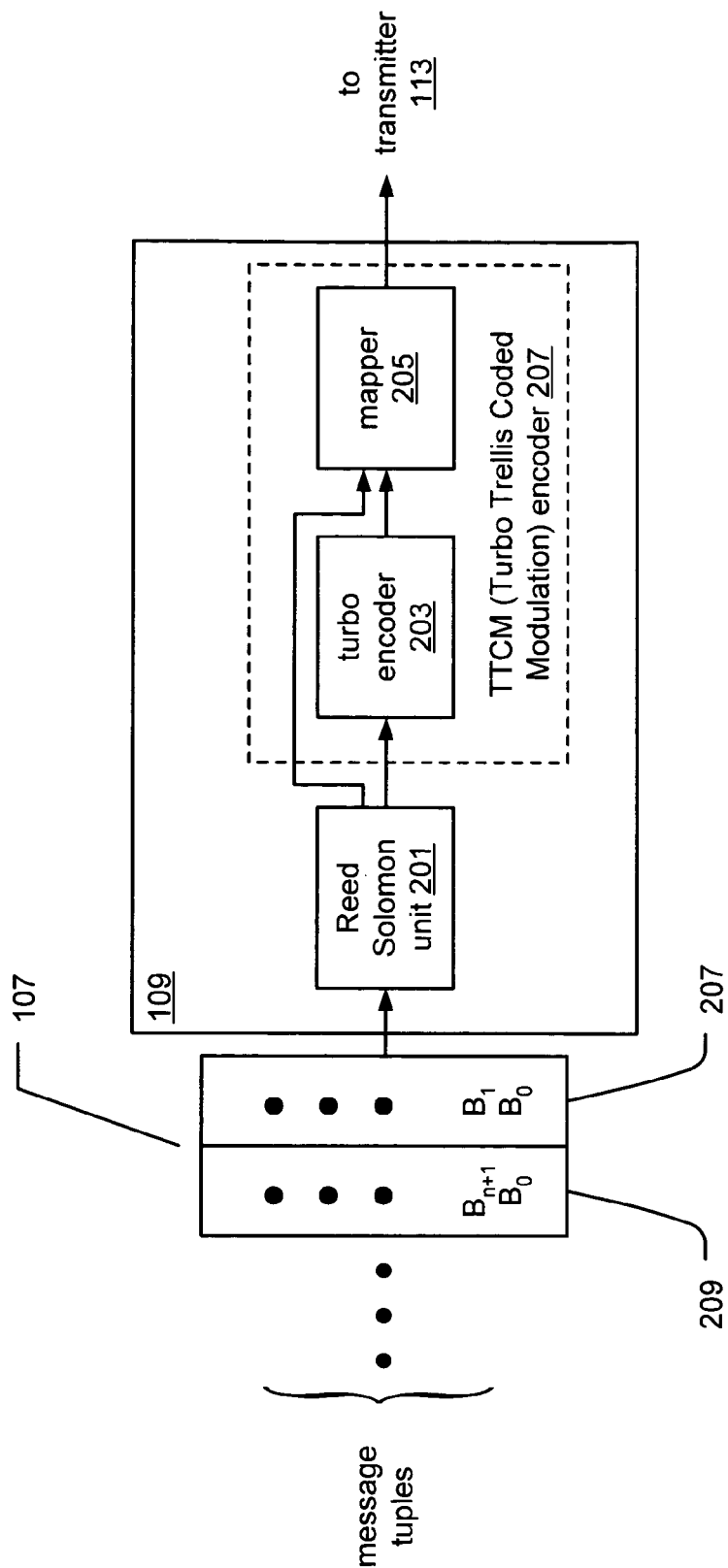
FIG. 2 is a block diagram of a portion of a signal encoder according to an embodiment of the invention.

FIG. 2 is a block diagram of a portion of a signal encoder according to an embodiment of the invention. In FIG. 2 message tuples 107 are provided to channel encoder 109. Channel encoder 109 comprises a Reed-Solomon unit 201, which provides a first encoding of the message tuples 107. The output of the Reed-Solomon (RS) unit 201 which includes a RS encoder and may include an interleaver is then provided a turbo trellis-coded modulation (TTCM) encoder 208. The output of the Reed-Solomon unit 201 is then provided to a turbo encoder 203, which applies a parallel concatenated (turbo) encoding to the input received from the Reed-Solomon unit 201, and further provides it to a mapper 205. In addition, some of the bits of the data output from the Reed-Solomon unit 201 may bypass the turbo encoder 203 entirely and be coupled directly into the mapper 205. Such data bits which bypasses the turbo encoder 203 are commonly referred to as uncoded bits. The uncoded bits are taken into account in the mapper 205 but are never actually encoded in the turbo encoder 203. In some embodiments of the invention there are no uncoded bits. In other embodiments of the invention there may be several uncoded bits depending on the data rate of the overall turbo trellis-coded modulation (TTCM) encoder desired. The output of the Reed-Solomon unit 201 may vary in form depending on the overall rate desired from the TTCM encoder 208. Turbo encoders, such as that illustrated at 203, may have a variety of forms and classifications. One of the classifications of encoders in general and turbo encoders in particular is illustrated in FIG. 3.

Figure 3:
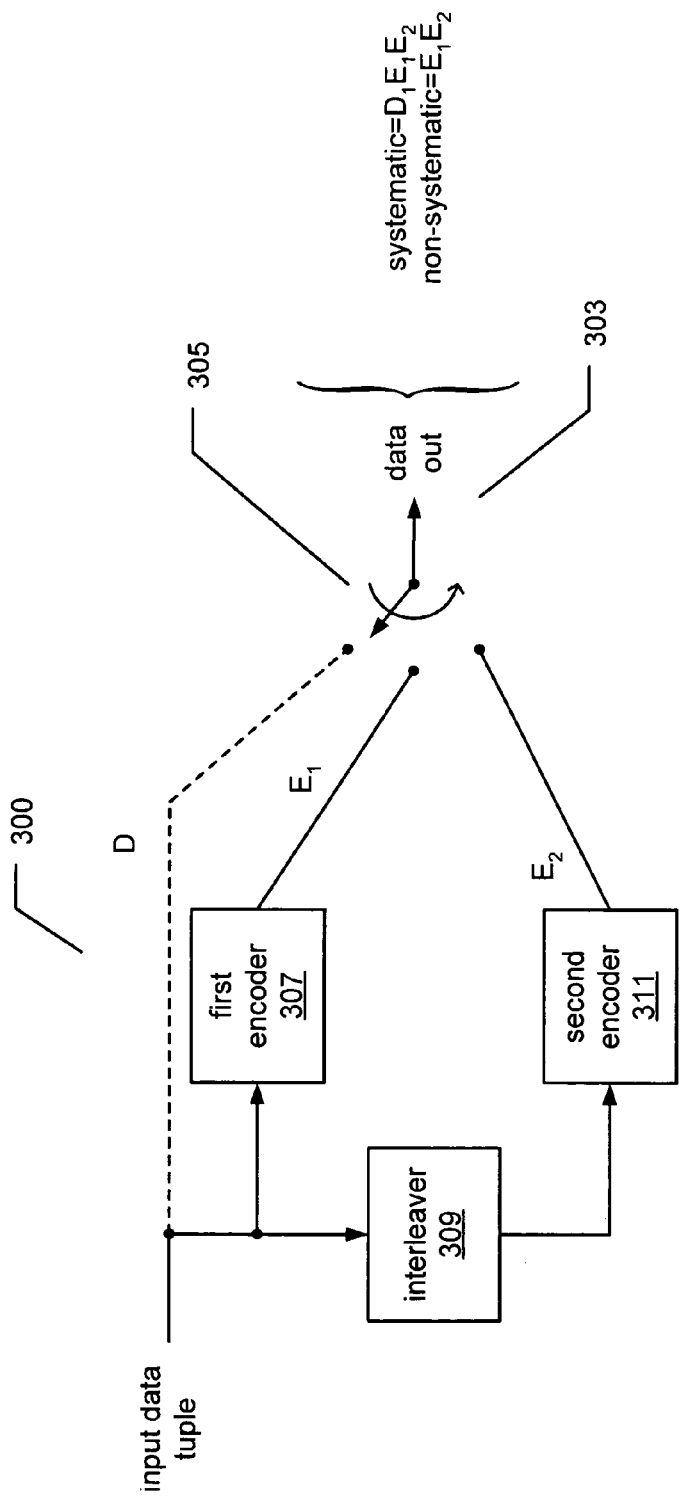
FIG. 3 is a block diagram of a parallel concatenated (turbo) encoder, illustrating the difference between systematic and nonsystematic forms.

FIG. 3 is a block diagram of a parallel concatenated encoder illustrating the difference between systematic and nonsystematic forms. In FIG. 3 data is input into the circuit at 301. Data is output from the parallel concatenated encoder (PCE) circuit 300 at 303. The data output 303 of the PCE illustrated at 300 may reach the output via three different paths. Input data tuples (groups of one or more bits) may be received at 301 and coupled directly to the data output 303 through selector mechanism 305 along the path labeled D. The data input may also be coupled into a first encoder 307 where it will be encoded and then coupled along the path E1 through selector 305 and into data output 303. The data accepted into the PCE circuit at 301 may also be provided to an interleaver 309. Interleaver 309 rearranges the input sequence of the data accepted by the PCE circuit at 301. In other words, the interleaver shuffles the order of the data so that the data out of the interleaver 309 is not the same order as the data into the interleaver 309. The data out of the interleaver 309 is then provided to a second encoder 311. The second encoder 311 encodes the data provided to it by the interleaver 309 and then provides the encoded data along path $E_2$ through the selector 305 into the data output 303. If the selector 305 selects the data from path D and $E_1$ and $E_2$, where D represents all of the input data tuple, then a systematic-type turbo encoding is performed. However, if the data selector selects only between path $E_1$ and $E_2$, such that there is no direct path between the data input and data output, a nonsystematic turbo encoding is performed. In general the data input at 301 comprises input data tuples which are to be encoded. The data output at 303 comprises code words, which are the encoded representation of the input data tuples. In general, in a systematic type of encoding, the input tuples are used as part of the output code words to which they correspond. Within parallel concatenated encoders, such as that illustrated at 300, encoders such as the first encoder 307 and second encoder 311 are commonly referred to as component or constituent encoders because they provide encoding, which are used as components of the overall turbo encoding. The first encoder 307 and the second encoder 311 may also have a variety of forms and may be of a variety of types. For example, the first encoder 307 may be a block encoder or a convolutional-type encoder. Additionally, the second encoder 311 may also be a block or convolutional-type encoder. The first and second encoders themselves may also be of systematic or nonsystematic form. The types of encoders may be mixed and matched so that, for example, the first encoder 307 may comprise a nonsystematic encoder and second encoder 311 may comprise a systematic-type encoder.

Constituent encoders, such as first encoder 307 and second encoder 311 may have delays incorporated within them. The delays within the encoders may be multiple clock period delays so that the data input to the encoder is operated on for several encoder clock cycles before the corresponding encoding appears at the output of the encoder.

Figure 4:
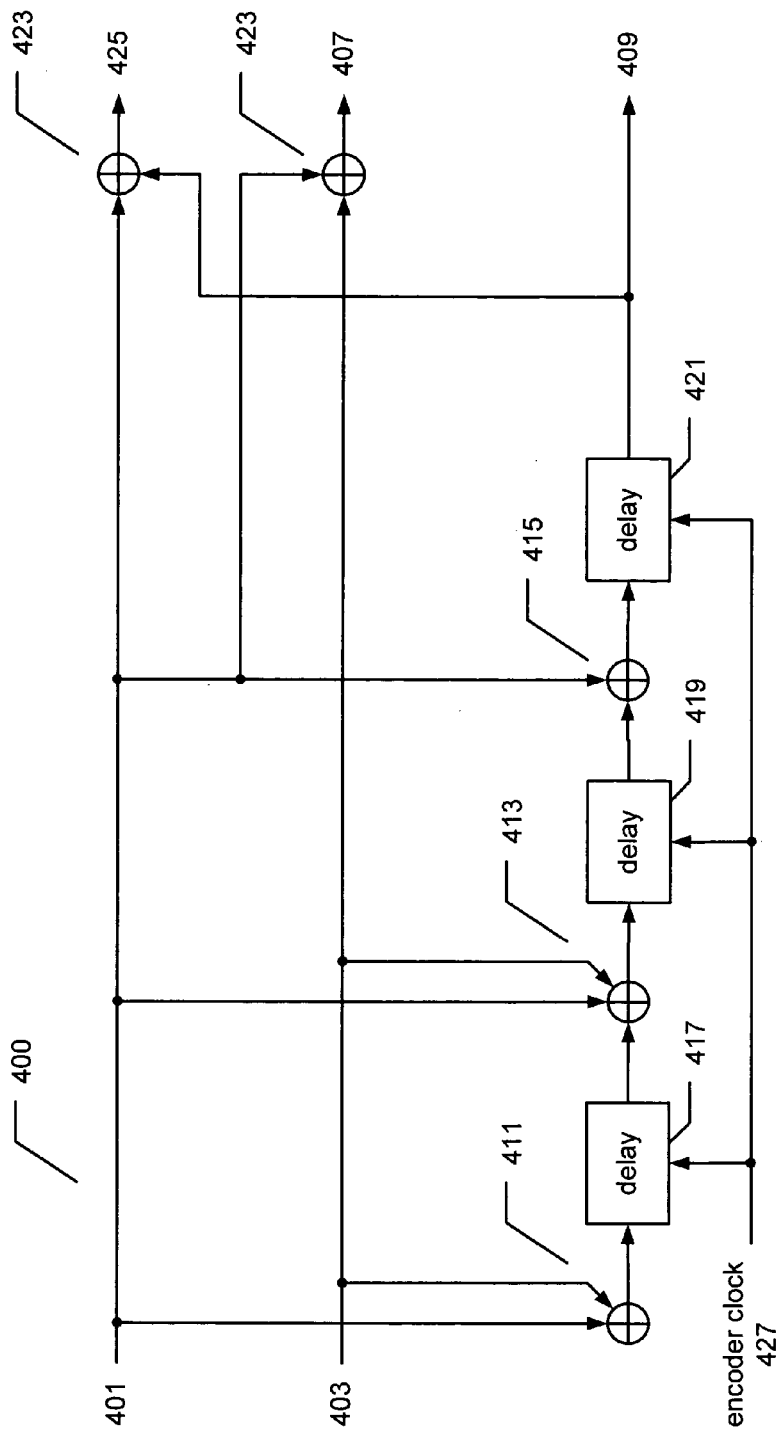
FIG. 4 is a schematic diagram of a rate ⅔ "feed forward" convolutional nonsystematic encoder.

One of the forms of a constituent encoder is illustrated in FIG. 4.

FIG. 4 is a schematic diagram of a rate two-thirds feed forward nonsystematic convolutional encoder. The encoder illustrated at 400 in FIG. 4 is a rate two-thirds because there are two inputs 401 and 403 and three outputs 405, 407 and 409. Accordingly, for each input tuple comprising two input bits 401 and 403, which are accepted by the encoder 400, the output is a code word having three bits 405, 407 and 409. Therefore, for each two bits input at inputs 401 and 403 three bits are output at 405, 407 and 409. The encoder of FIG. 4 comprises three delays 417, 419 and 421. Such delays may be formed from D-type flip flops or any other suitable delay or storage element. The rate two-thirds feed forward encoder of FIG. 4 also comprises five modulo-2 adders 411, 413, 415, 423 and 425. Modulo-2 adders are adders in which the outputs of the modulo-2 adder is equal to the modulo-2 sum of the inputs. Delay elements 417, 419 and 421 are clocked by an encoder clock. Modulo-2 adders 411, 413, 415, 423 and 425 are combinational circuits which are unclocked. In combinational circuits the output appears a time delay after the inputs are changed. This time delay is due to the propagation time of the signal within the combinational circuits (this delay is assumed as a near zero delay herein) and not due to any clocking mechanisms. In contrast, a delay unit, such as 417, will not change its output until it receives an appropriate clock signal. Therefore, for an input signal to propagate, for example from input 403 through modulo-2 adder 411, through delay 417, through modulo-2 adder 413, through delay 419, through modulo-2 adder 415, through delay 421 in order to appear at output 409, the encoder clock 427 must first clock the input signal from 403 through delay unit 417, then through delay unit 419, and finally through delay unit 421. Therefore, once an input signal appears at 403 three encoder clocks 427 in succession will be required for the resultant output 409, which is associated with that input at 403, to be seen at the output.

The encoder of FIG. 4 is a feed forward encoder. The signal is always fed forward and at no point in the circuit is there a path to feed back a signal from a later stage to an earlier stage. As a consequence a feed forward encoder, such as that illustrated in FIG. 4, is a finite impulse response (FIR) type of state machine. That is, for an impulse signal applied at the input, the output will eventually settle into a stable state.

The encoder illustrated in FIG. 4 may further be classified as a nonsystematic encoder because none of the inputs, that is either 401 or 403, appear at the output of the encoder. That is outputs 405, 407 or 409 don't reproduce the inputs in an encoded output associated with that input. This can be inferred from the fact that output 407, 405 and 409 have no direct connection to inputs 401 or 403.

Figure 5:
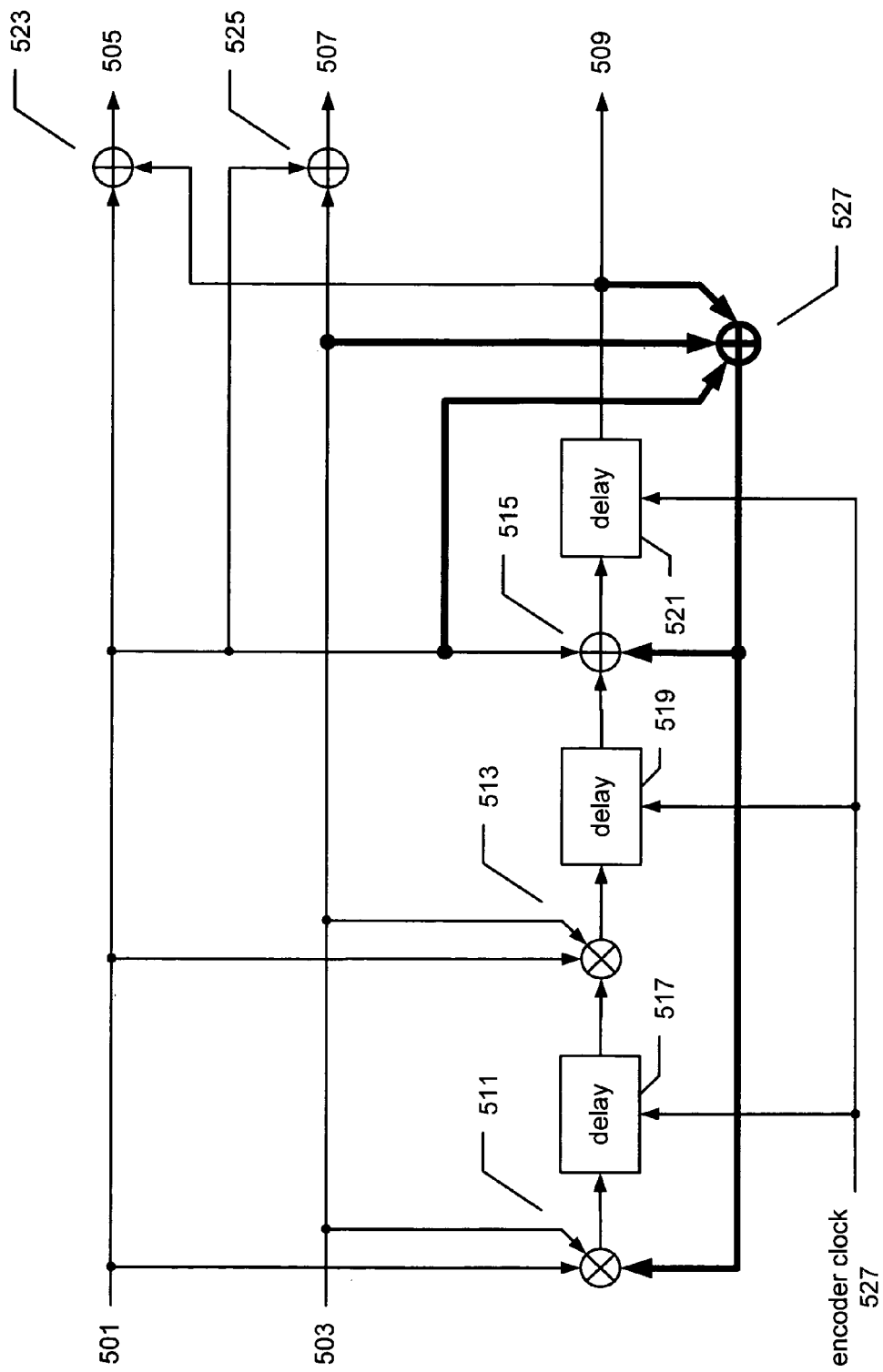
FIG. 5 is a schematic diagram of a rate ⅔ "recursive" convolutional nonsystematic encoder.

FIG. 5 is a schematic diagram of a rate two-thirds, recursive, convolutional nonsystematic encoder. The encoder of FIG. 5 is similar to the encoder of FIG. 4 in that both encoders are nonsystematic and convolutional. The encoder of FIG. 5 is the same schematically as the encoder of FIG. 4 with the addition of a third input at modulo-2 adder 511 and a third input at modulo-2 adder 515. The third input for each of modulo-2 adders 511 and 515 is formed by an additional modulo-2 adder 527. Modulo-2 adder 527 is formed in part by the output of delay 521. Modulo-2 adder 527 receives an input from delay 521 which is provided to modulo-2 adders 511 and 515. Accordingly the encoder of FIG. 5 is recursive. In other words, the inputs of delays 517 and 521 are partially formed from outputs occurring later in the signal path and fed back to an earlier stage in the circuit. Recursive encoders may exhibit outputs that change when repeatedly clocked even when the inputs are held constant. The encoder of FIG. 5 is a constituent encoder, and is used with an embodiment of the invention as will be described later.

Figure 6:
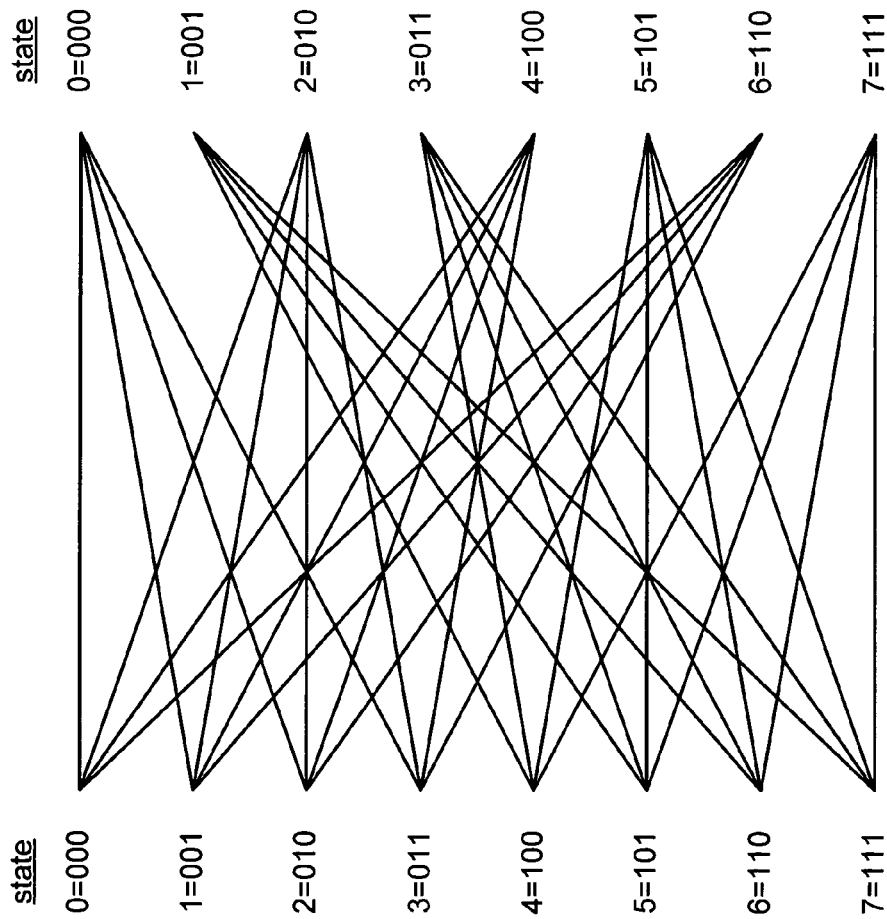
FIG. 6 is a trellis diagram of the convolutional encoder illustrated in FIG. 5.

FIG. 6 is a trellis diagram for the encoder illustrated in FIG. 5. A trellis diagram is a shorthand method of defining the behavior of a finite state machine such as the basic constituent encoder illustrated in FIG. 5. The state values in FIG. 6 represent the state of the encoder. As can be seen from the trellis diagram in FIG. 6, when the encoder of FIG. 5 is in any single state, it may transition to any one of four different states. It may transition to four different states because there are two inputs to the encoder of FIG. 5 resulting in four different possible input combinations which cause transitions. If there had been only one input to the encoder of FIG. 5, for example, if inputs 501 and 503 were connected, then each state in the trellis diagram would have two possible transitions. As illustrated in the trellis diagram in FIG. 6, if the encoder is in state 0, state 1, state 2 or state 3, the encoder may then transition into state 0, state 2, state 4 or state 6. However, if the encoder is in state 4, state 5, state 6 or state 7, it may transition into state 1, state 3, state 5 or state 7.

Figure 7:
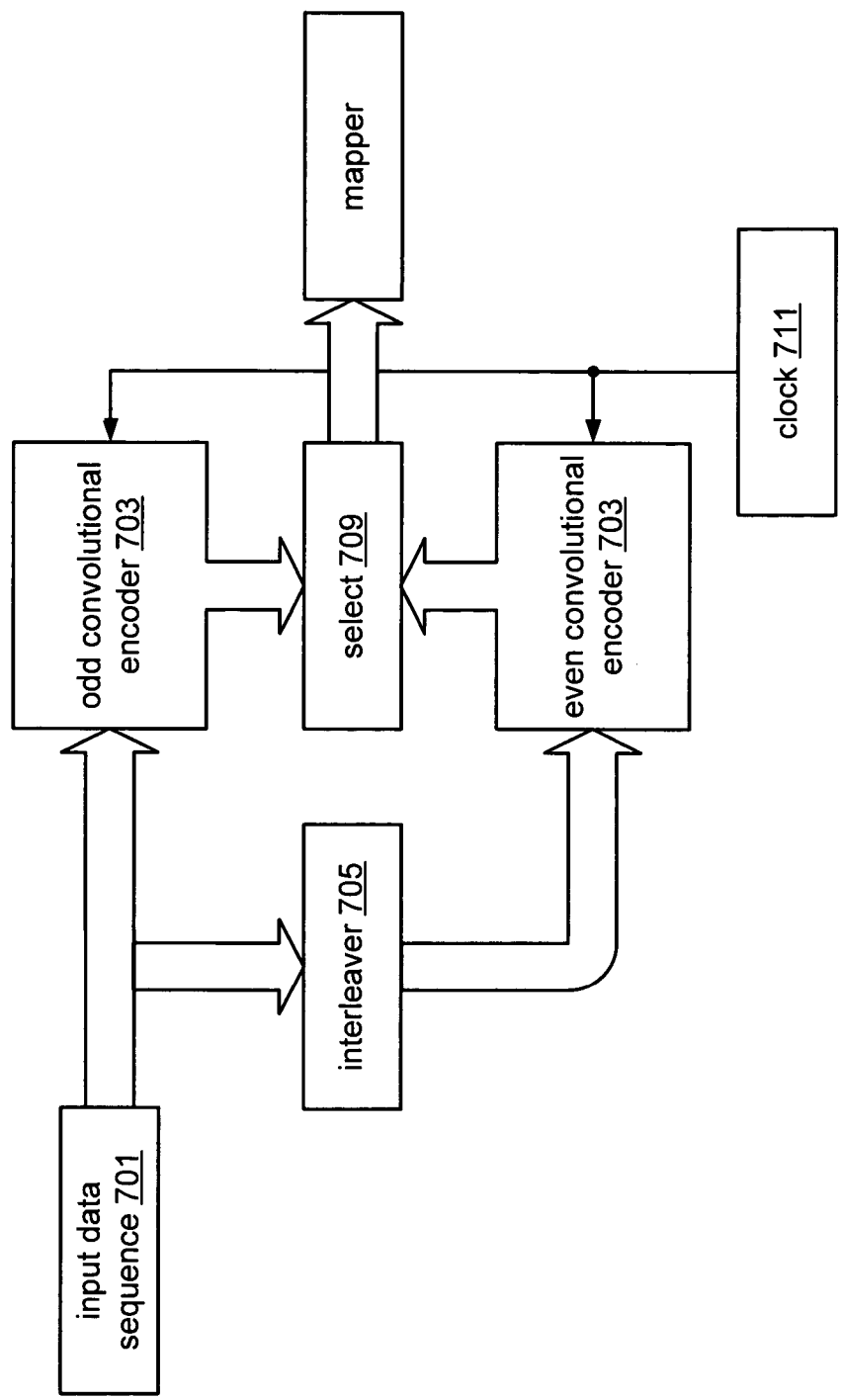
FIG. 7 is a block diagram of a turbo-trellis coded modulation (TTCM) encoder.

FIG. 7 is a block diagram of a turbo trellis-coded modulation (TTCM) encoder. In FIG. 7 an input data sequence 701 is provided to an "odd" convolutional encoder 703 and an interleaver 705. The interleaver 705 interleaves the input data sequence 701 and then provides the resulting interleaved sequence to "even" convolutional encoder 707. Encoders 703 and 707 are termed "odd" and "even" respectively because encodings corresponding to odd input tuples (i.e. input tuple no. 1, 3, 5, etc.) are selected by selector 709 from encoder 703 and encodings corresponding to even input tuples (i.e., input tuple no. 0, 2, 4, etc.) are selected by selector 709 from encoder 707. The output of either the odd convolutional encoder 703 or the even convolutional encoder 707 is selected by a selecting mechanism 709 and then passed to a mapper 710. FIG. 7 is a generalized diagram according to an embodiment of the invention which illustrates a general arrangement for a TTCM encoder. The odd convolutional encoder 703 receives the input data sequence and, in an embodiment of the invention, convolutionally, nonsystematically, encodes the input data sequence. Even convolutional encoder 707 receives the same input data as the odd convolutional encoder, except that the interleaver 705 has rearranged the order of the data. The odd and even convolutional encoders may be the same encoders, different encoders or even different types of encoders. For example, the odd convolutional encoder may be a nonsystematic encoder, whereas the even convolutional encoder may be a systematic encoder. In fact the convolutional encoders 703 and 707 may be replaced by block-type encoders such as Hamming encoders or other block-type encoders well known in the art. For the purposes of illustration, both constituent encoders 703 and 707 are depicted as nonsystematic, convolutional, recursive encoders as illustrated in FIG. 5. The select mechanism 709 selects, from convolutional encoder 703, outputs corresponding to odd tuples of the input data sequence 701. The select mechanism 709 selects, from convolutional encoder 707, outputs which correspond to even tuples of the input data sequence 701. Select mechanism 709 alternates in selecting symbols from the odd convolutional encoder 703 and the even convolutional encoder 707. The selector 709 provides the selected symbols to the mapper 710. The mapper 710 then maps the output of either the even convolutional encoder 707 or the odd convolutional coder 703 into a data constellation (not shown). In order to maintain a sequence made up of distance segments stemming from the even and odd input tuples, the selector 709 selects only encodings corresponding to even tuples of the input data sequence 701 from one encoder (e.g. 703), and selects only encoding corresponding to odd tuples of the input data sequence from the other encoder (e.g. 707). This can be accomplished by synchronizing the selection of encoded tuples from the odd (703) and even (707) encoders, for example using a clock 711, and by using an odd/even interleaver 705 to maintain an even/odd ordering of input data tuples to the even encoder 707. The odd/even interleaver 705 will be described in detail later.

The encoder illustrated in FIG. 7 is a type which will be known herein as a turbo trellis-coded modulation (TTCM) encoder. The interleaver 705, odd convolutional encoder 703, even convolutional encoder 707 and selector form a turbo encoder, also known as a parallel concatenated encoder (PCE). The encoder is known as a parallel concatenated encoder because two codings are carried on in parallel. For the parallel encoding, in the FIG. 7 example one coding takes place in the odd convolutional encoder 703, and the other takes place in the even convolutional encoder 707. An output is selected sequentially from each encoder and the outputs are concatenated to form the output data stream. The mapper 710 shown in FIG. 7 provides the trellis coded modulation (TCM) function. Hence, the addition of the mapper makes the encoder a turbo trellis-type encoder. As shown in FIG. 7, the encoders may have any number of bits in the input data tuple. It is the topology that defines the encoder-type.

The encoder of FIG. 7 is an illustration of only one of the possible configurations that may form embodiments of the present invention. For example, more than one interleaver may be employed, as shown in FIG. 8.

Figure 8A:
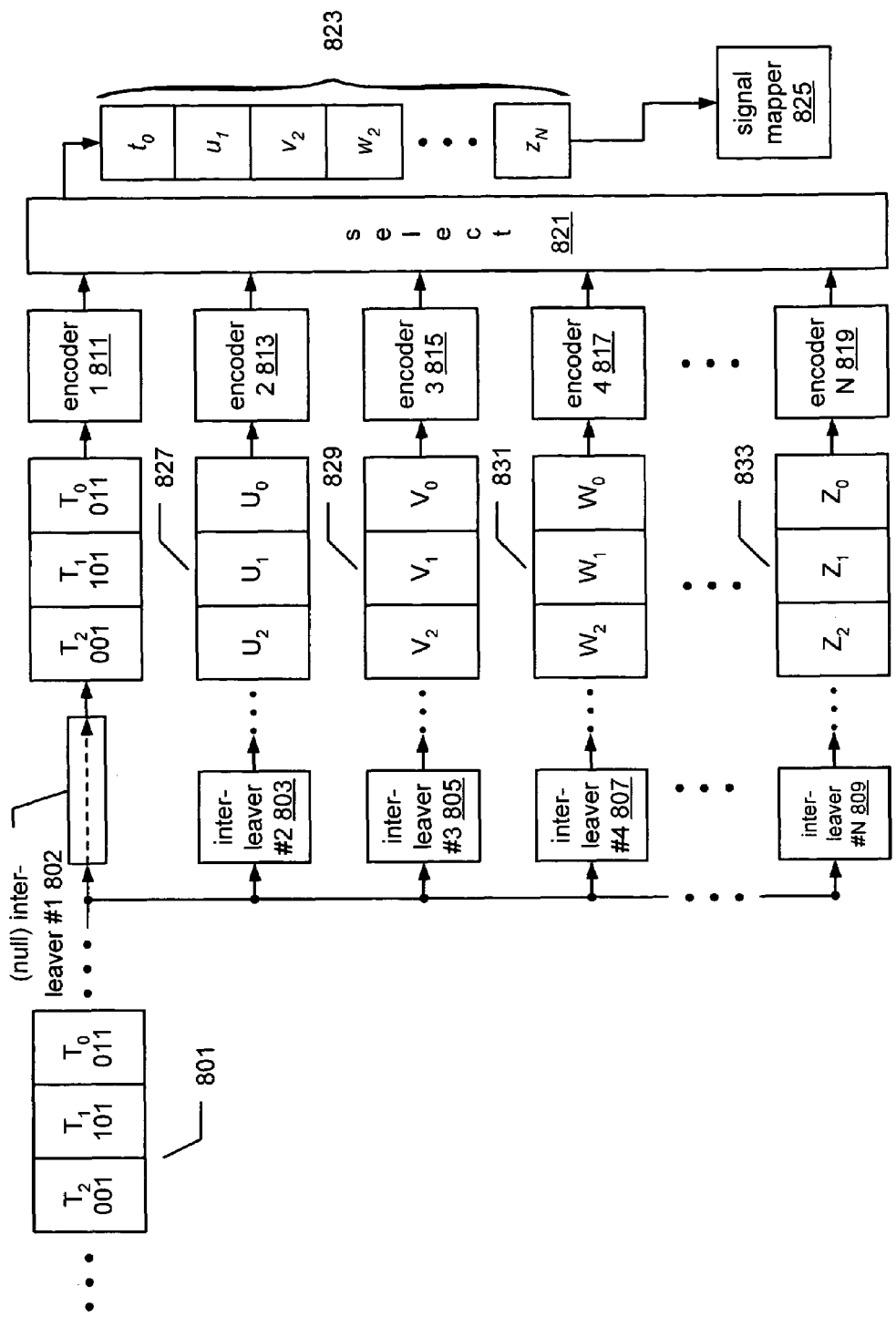
FIG. 8A is a block diagram of a TTCM encoder utilizing multiple interleavers.

FIG. 8A is a block diagram of a TTCM encoder using multiple interleavers. FIG. 8A illustrates an exemplary embodiment of the present invention utilizing N interleavers.

The first interleaver 802 is called the null interleaver or interleaver 1. Generally in embodiments of the invention the null interleaver will be as shown in FIG. 8A, that is a straight through connection, i.e. a null interleaver. All interleaving in a system will be with respect to the null sequence produced by the null interleaver. In the case where the null interleaver is merely a straight through connection the null sequence out of the null interleaver will be the same as the input sequence. The concept of null interleaver is introduced as a matter of convenience, since embodiments of the invention may or may not have a first interleaver a convenient way to distinguish is to say "where the first interleaver is the null interleaver" when the first encoder receives input tuples directly and to say "where the first interleaver is an ST interleaver", when an ST interleaver occupies a position proximal to a first encoder.

In FIG. 8A source input tuples 801 are provided to encoder 811 and to interleavers 802 through 809. There are N interleavers counting the null interleaver as interleaver No. 1 and N encoders present in the illustration in FIG. 8A. Other embodiments may additionally add an ST interleaver as interleaver No. 1 to process input tuples 801 prior to providing them to encoder 811.

Source tuples $T_0$, $T_1$ and $T_2$ are shown as three bit tuples for illustrative purposes. However, those skilled in the art will know that embodiments of the invention can be realized with a varying number of input bits in the tuples provided to the encoders. The number of input bits and rates of encoders 811 through 819 are implementation details and may be varied according to implementation needs without departing from scope and spirit of the invention.

Interleavers 803 through 809 in FIG. 8A each receive the same source data symbols 801 and produce interleaved sequences 827 through 833. Interleaved sequences 827 through 833 are further coupled into encoders 813 through 819. Select mechanism 821 selects an encoded output from encoders 811 through 819. Selector 821 selects from each encoder 811 through 819 in sequence so that one encoded tuple is selected from each encoder in one of every N+1 selections. That is the selection number 0 (encoded tuple $t_0$) is chosen from encoder 811, the selection number 1 (encoded tuple $u_1$ is chosen from encoder 813 $V_2$ is chosen from encoder 815, and so forth. The same selection sequence is then repeated by selector 821.

In order not to miss any symbols, each interleaver is a modulo-type interleaver. To understand the meaning of the term modulo interleaver, one can consider the interleaver of FIG. 7 as a modulo-2 interleaver. The interleaver of FIG. 7 is considered a modulo-2 interleaver because input tuples provided to the interleaver during odd times (i.e. provided as input tuple 1, 3, 5 etc.) will be interleaved into odd time positions at the output of the interleaver (e.g. output tuple 77, 105, 321 etc.) That is the first tuple provided by an odd/even interleaver may be the third, fifth, seventh, etc. tuple provided from the interleaver, but not the second, fourth, sixth, etc. The result of any modulo-2 operation will either be a 0 or a 1, that is even or odd respectively, therefore the interleaver of FIG. 7 is termed a modulo-2 or odd/even interleaver. In general, according to embodiments of the invention, the value of N for a modulo-N interleaving system is equal to the number of interleavers counting the Null interleaver as the first interleaver in the case where there is no actual first interleaver. The modulo interleaving system of FIG. 8A is modulo-N because there are N interleaves, including null interleaver 1, interleaving system. The interleavers in a modulo interleaver system may interleave randomly, S randomly, using a block interleaver, or using any other mechanism for interleaving known in the art, with the additional restriction that input/output positional integrity be maintained. When a sequence of tuples is interleaved, the modulo position value of an output will be the same as the modulo positional value of the input tuple. The position of a tuple modulo-N is known as a sequence designation, modulo designation, or modulo sequence designation. For example, in a modulo-4 interleaver the first tuple provided to the interleaver occupies position 0 of the input tuple stream. Because 0 modulo-4 is zero the modulo sequence designation of the first input tuple is 0. The tuple occupying the position 0 may then be interleaved to a new output position #4, #8, #12, #16, etc., which also have the same modulo sequence designation, i.e. 0. The tuples occupying output position #4, #8, #12, #16 all have a sequence designation of 0 because 4 mod 4=8 mod 4=12 mod 4=16 mod 4=0. Similarly, the input tuple occupying position 2 and having sequence designation of 2 may be interleaved to a new output position #6, #10, #14, #20, etc, which also have the same modulo sequence designation of 2. The tuples in output positions #6, #10, #14, #20 etc have a modulo sequence designation of 2 because 6 mod 4=10 mod 4=14 mod 4=20 mod 4=2.

For example, in FIG. 7 the modulo-2 interleaver 705, also known as an odd/even interleaver, may employ any type of interleaving scheme desired with the one caveat that the input data sequence is interleaved so that each odd sequence input to the interleaver is interleaved into another odd sequence at the output of the interleaver. Therefore, although interleaver 705 may be a random interleaver, it cannot interleave the inputs randomly to any output. It can, however, interleave any odd input to any random odd output and interleave any even input into any random even interleaved output. In embodiments of the present invention, a modulo interleaving system, such as that illustrated in FIG. 8A, the interleavers must maintain the modulo positional integrity of interleaved tuples. For example, if there are 5 interleavers including the null interleaver (numbers 0-4) in FIG. 8A, then FIG. 8A would describe a modulo-5 interleaving system. In such a system, the input source data would be categorized by a modulo sequence number equal to the sequence position of the source data tuple modulo-5. Therefore, every input data tuple would have a sequence value assigned to it between 0 and 4 (modulo-5). In each of the 5 interleavers of the modulo-5 system, source data elements (characterized using modulo numbers) could be interleaved in any fashion, as long as they were interleaved into an output data tuple having an output sequence modulo number designation equal to the input sequence modulo number designation. The terms modulo sequence number sequence designation, modulo position value modulo designation, modulo position all refer to the same modulo ordering.

In other words an interleaver is a device that rearranges items in a sequence. The sequence is input in a certain order. An interleaver receives the items form the input sequence, I, in the order $I_0, I_1, I_2$, etc., $I_0$ being the first item received, $I_1$ being the second item received, item $I_2$ being the third item received. Performing a modulo-N operation on the subscript of I yields, the modulo-N position value of each input item. For example, if N=2 modulo-N position $I_0$–$Mod_2(0)$=0 i.e. even, modulo-N position $I_1$=$Mod_2(1)$=1 i.e., odd, modulo-N position $I_2$=$Mod_2(2)$=0 i.e. even.

Figure 8B:
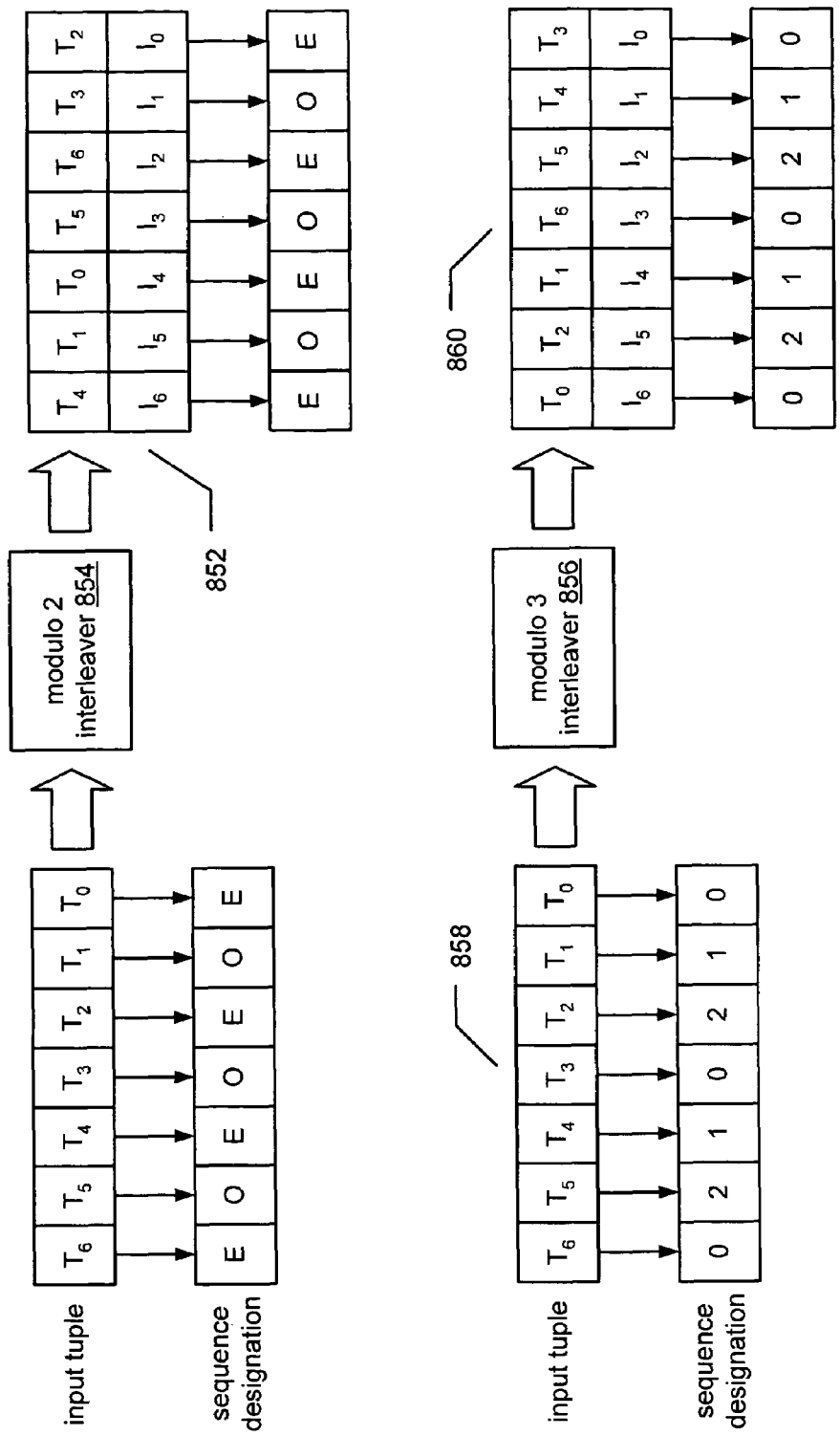
FIG. 8B is a graphical illustration of the process of modulo interleaving.
Figure 8C:
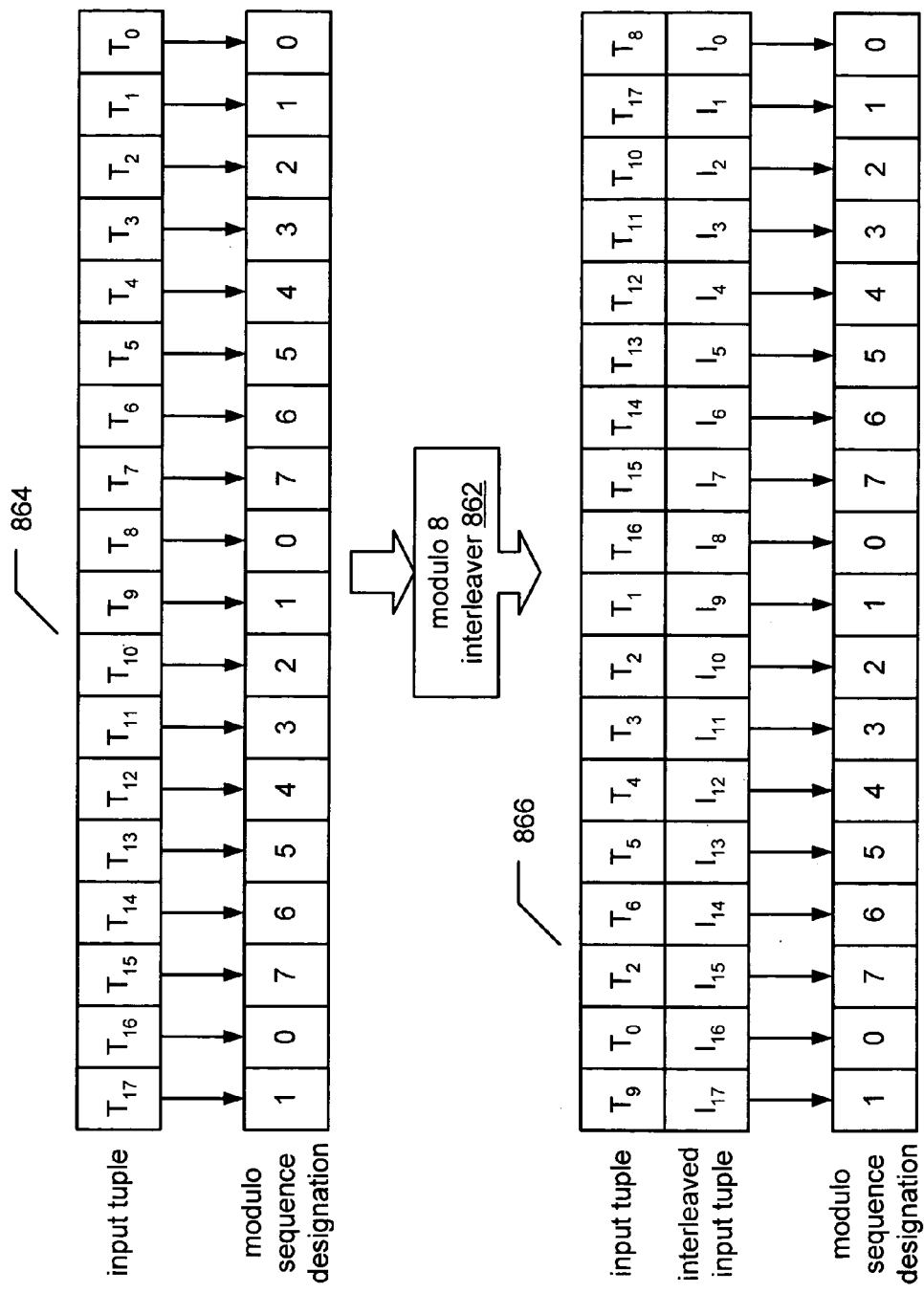
FIG. 8C is a further graphical illustration of the process of modulo interleaving.

FIG. 8B is a graphical illustration of examples of modulo interleaving. Interleaving is a process by which input data tuples are mapped to output data tuples.

FIG. 8B illustrates of the process of modulo interleaving. As previously stated for the purposes of this disclosure an interleaver is defined as a device having one input and one output that receives a sequence of tuples and produces an output sequence having the same bit components as the input sequence except for order. That is, if the input sequence contains X bits having values of one, and Y bits having values of zero then the output sequence will also have X bits having values of 1 and Y bits having values of zero. An interleaver may reorder the input tuples or reorder the components of the input tuples or a combination of both. In embodiments of the invention the input and output tuples of an interleaver are assigned a modulo sequence designation which is the result of a modulo division of the input or output number of a tuple. That is, each input tuple is assigned a sequence identifier depending on the order in which it is accepted by the interleaver, and each output tuple is assigned a sequence identifier depending on the order in which it appears at the output of the interleaver.

For example, in the case of a modulo-2 interleaver the sequence designation may be even and odd tuples as illustrated at 850 in FIG. 8B. In such an example, the input tuple in the 0 position, indicating that it was the first tuple provided, is designated as an even tuple $T_0$. Tuple $T_1$, which is provided after tuple $T_0$ is designated as an odd tuple, tuple $T_2$, which is provided after $T_1$ is designated as an even tuple and so forth. The result of the modulo interleaving is illustrated at 852. The input tuples received in order $T_0, T_1, T_2, T_3, T_5, T_6$ have been reordered to $T_2, T_3, T_6, T_5, T_0, T_1, T_4$. Along with the reordered tuples at 852 is the new designation $I_0$ through $I_6$ which illustrates the modulo sequence position of the interleaved tuples.

The modulo-2 type interleaver illustrated in FIG. 8B at 854 can be any type of interleaver, for example, a block interleaver, a shuffle interleaver or any other type of interleaver known in the art if it satisfies the additional constraint that input tuples are interleaved to positions in the output sequence that have the modulo position value. Therefore an input tuple having an even modulo sequence designation will always be interleaved to an output tuple having an even modulo sequence designation and never will be interleaved to an output tuple having an odd modulo sequence designation. A modulo-3 interleaver 856 will function similarly to a modulo-2 interleaver 854 except that the modulo sequence designation will not be even and odd but zero, one and two. The sequence designation is formed by taking the modulo-3 value of the input position (beginning with input position 0. Referring to FIG. 8B modulo-3 interleaver 856 accepts input sequence $T_0, T_1, T_2, T_3, T_4, T_5$ and $T_6$ (858) and interleaves it to interleaved sequence 860: $T_3, T_4, T_5, T_6, T_1, T_2$ which are also designated as interleaved tuples 10 through 16.

As a further illustration of modulo interleaving, a modulo-8 interleaver is illustrated at 862. The modulo 8 interleaver at 862 takes an input sequence illustrated at 864 and produces an output sequence illustrated at 866. The input sequence is given the modulo sequence designations of 0 through 7 which is the input tuple number modulo-8. Similarly, the interleaved sequence is given a modulo sequence designation equal to the interleaved tuple number modulo-8 and reordered compared to the input sequence under the constraint that the new position of each output tuple has the same modulo-8 sequence designation value as its corresponding input tuple.

In summary, a modulo interleaver accepts a sequence of input tuples which has a modulo sequence designation equal to the input tuple number modulo-N where N=H of the interleaver counting the null interleaver. The modulo interleaver then produces an interleaved sequence which also has a sequence designation equal to the interleaved tuple number divided by the modulo of the interleaver. In a modulo interleaver bits which start out in an input tuple with a certain sequence designation must end up in an interleaved modulo designation in embodiments of the present invention. Each of the N interleavers in a modulo N interleaving system would provide for the permuting of tuples in a manner similar to the examples in FIG. 86; however, each (interleaver would yield a different permutation.

The input tuple of an interleaver, can have any number of bits including a single bit. In the case where a single bit is designated as the input tuple, the modulo interleaver may be called a bit interleaver.

Inputs to interleavers may also be arbitrarily divided into tuples. For example, if 4 bits are input to in interleaver at a time then the 4 bits may be regarded as a single input tuple, two 2 bit input tuples or four 1 bit input tuples. For the purposes of clarity of the present application if 4 bits are input into an interleaver the 4 bits are generally considered to be a single input tuple of 4 bits. The 4 bits however may also be considered to be 2 of an 8 bit input tuple, two 2 bit input tuples or four 1 bit input tuples the principles described herein. If all input bits input to the interleaver are kept together and interleaved then the modulo interleaver is designated a tuple interleaver (a.k.a. integral tuple interleaver) because the input bits are interleaved as a single tuple. The input bits may be also interleaved as separate tuples. Additionally, a hybrid scheme may be implemented in which the input tuples are interleaved as tuples to their appropriate sequence positions, but additionally the bits of the input tuples are interleaved separately. This hybrid scheme has been designated as an ST interleaver. In an ST interleaver, input tuples with a given modulo sequence designation are still interleaved to interleaved tuples of similar sequence designations. Additionally, however, the individual bits of the input tuple may be separated and interleaved into different interleaved tuples (the interleaved tuples must all have the same modulo sequence designation as the input tuple from which the interleaved tuple bits were obtained). The concepts of a tuple modulo interleaver, a bit modulo interleaver, and a bit-tuple modulo interleaver are illustrated in the following drawings.

Figure 9:
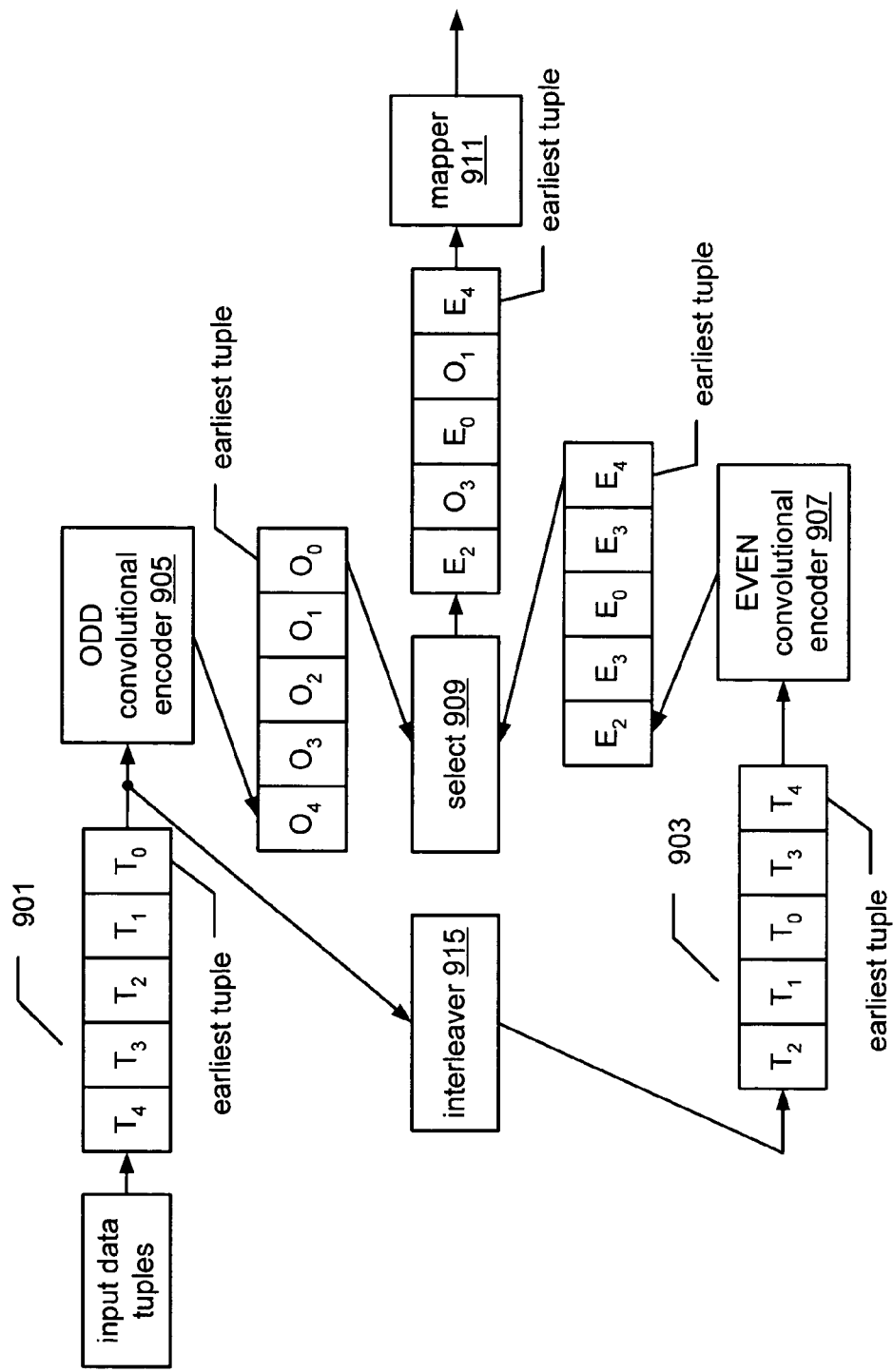
FIG. 9 is a block diagram of a TTCM encoder employing a tuple interleaver.

FIG. 9 is a block diagram of TTCM encoder employing a tuple type interleaver. In FIG. 9 an exemplary input data sequence 901 comprises a sequence of data tuples $T_0$, $T_1$, $T_2$, $T_3$ and $T_4$. The tuples are provided in an order such that $T_0$ is provided first, $T_1$ is provided second, etc. Interleaver 915 interleaves data sequence 901. The output of the interleaver comprises a new data sequence of the same input tuples but in different order. The data sequence 903, after interleaving, comprises the data tuples $T_4$, $T_3$, $T_0$, $T_1$ and $T_2$ in that order. The tuple interleaver illustrated in FIG. 9 at 915 is a modulo-2 or odd/even type interleaver. The original data sequence 901 is provided to odd convolutional encoder 905 and the interleaved data sequence 903 is provided to an even convolutional encoder 907. A select mechanism 909 selects encoded outputs from the odd convolutional encoder 905 and the even convolutional encoder 907, according to the procedure provided below and illustrated in FIG. 9, and provides the encoder output selected to the mapper 911. The select mechanism 909 illustratively chooses encoded outputs from the "odd" convolutional encoder 905 that correspond to odd tuples in the input data sequence 901. The select device 909 also chooses encoded tuples from the even convolutional encoder 907, that correspond to the even tuples of input sequence 903. So if the odd convolutional encoder 905 produces encoded tuples $O_0$, $O_1$, $O_2$, $O_3$ and $O_4$ corresponding to the input sequence of data tuples 901, the selector will select $O_1$ and $O_3$ (which have an odd modulo sequence designation) to pass through the mapper. In like manner if the even convolutional encoder-produces symbols $E_4$, $E_3$, $E_0$, $E_1$ and $E_2$ from the input sequence 903 and select mechanism 909 selects $E_4$, $E_0$ and $E_2$ and passes those encoded tuples to the mapper 911. The mapper will then receive a composite data stream corresponding to encoded outputs $E_4$, $O_1$, $E_0$, $O_3$, and $E_2$. In this manner an encoded version of each of the input data sequence tuples 901 is passed onto the mapper 911. Accordingly, all of the input data sequence tuples 901 are represented in encoded form in the data 913 which is passed onto the mapper 911. Although both encoders encode every input tuple, the encoded tuples having an odd sequence designation are selected from encoder 905 and the encoded tuples having an even sequence designation are selected from encoder 907. In the interleaver 915 of FIG. 9, each tuple is maintained as an integral tuple and there is no dividing of the bits which form the tuple. A contrasting situation is illustrated in FIG. 10.

Figure 10:
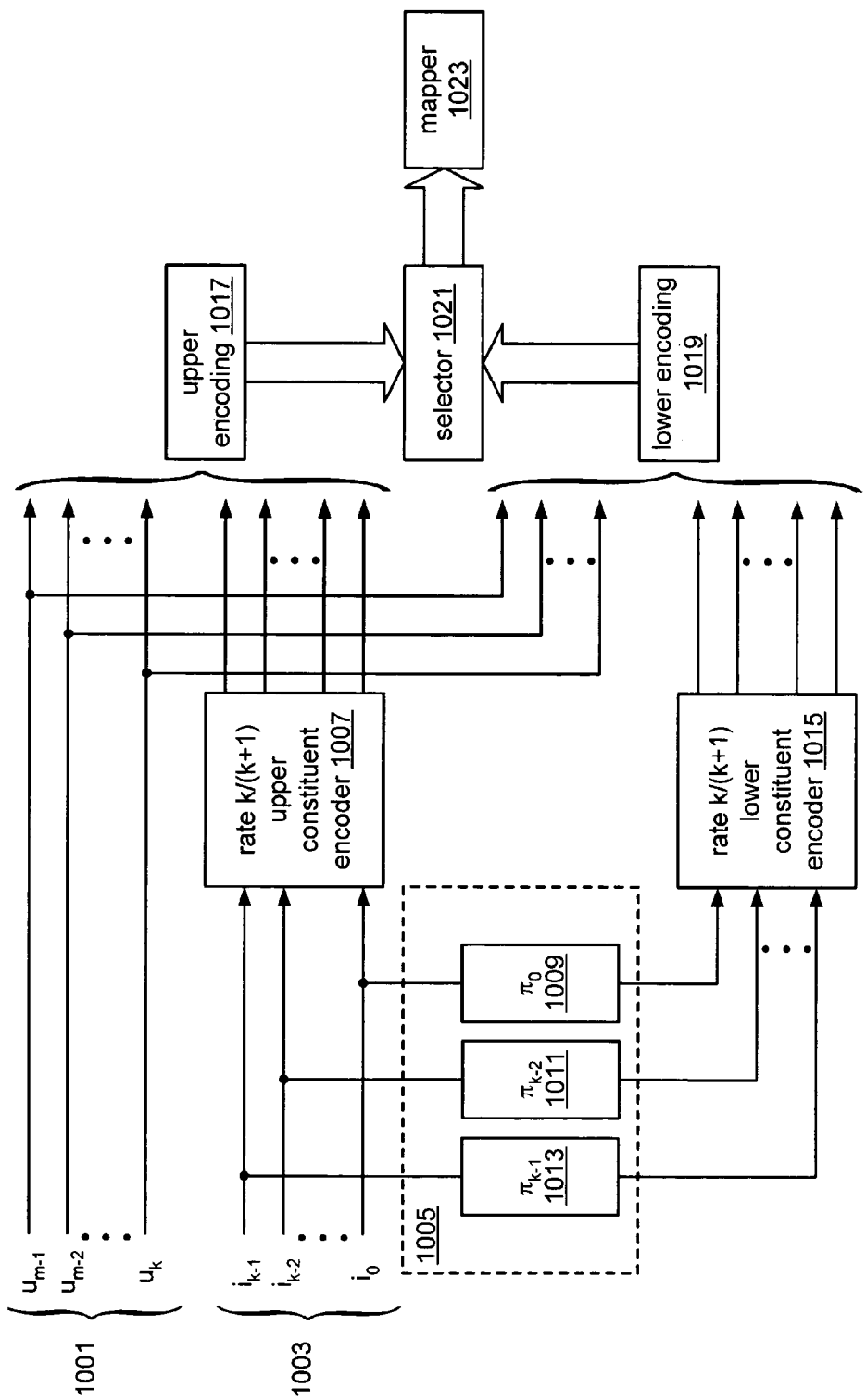
FIG. 10 is a block diagram of a TTCM encoder employing a bit interleaver.

FIG. 10 is a block diagram of a TTCM encoder employing a bit type interleaver. In FIG. 10 an input tuple is represented at 1003 as input bits $i_0$ through $i_{k-1}$. The input bits $i_0$ through $i_{k-1}$ are coupled into an upper constituent encoder of 1007. The input tuple 1003 is also coupled into interleaver 1005. The interleaver 1005 is further divided into interleavers 1009, 1011 and 1013. Each of the interleavers 1009, 1011 and 1013 accepts a single bit of the input tuple. The input tuple 1003 is then rearranged in the interleaver 1005 such that each bit occupies a new position in the sequence that is coupled into the lower constituent encoder 1015. The interleaving performed by the interleaver 1005 may be any type of suitable interleaving. For example, the interleaver may be a block interleaver a modulo interleaver as previously described, or any other type of interleaver as known in the art.

In the illustrated interleaver of FIG. 10 the interleaving sequence provided by interleaver 1005, and hence by sub-interleavers 1009, 1011 and 1013, is independent of the positions of the bits within the input 1003. Input tuple 1001 represents input bits which are not passed through either of the constituent encoders 1007 or 1015. The upper encoding 1017 comprises the uncoded input tuple 1001 plus the encoded version of input tuple 1003, which has been encoded in the upper constituent encoder 1007. The lower encoding 1019 comprises the uncoded input tuple 1001 plus the output of the lower constituent encoder 1015 which accepts the interleaved version of input tuple 1003. A selector 1021 accepts either the upper or lower encoding and passes selected encoding to a symbol mapper 1023.

Figure 11A:
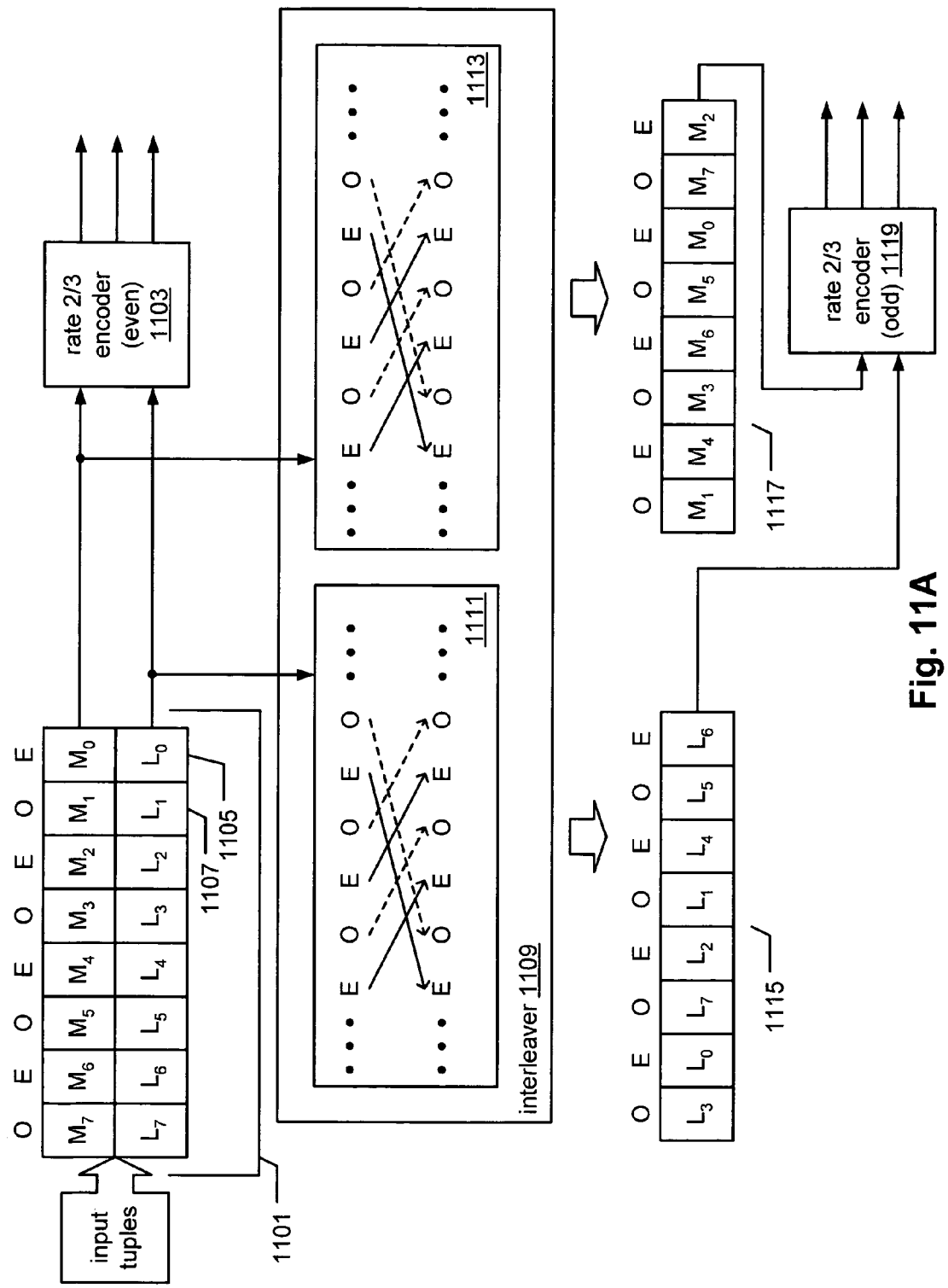
FIG. 11A is a first portion of combination block diagram and graphical illustration of a rate ⅔ TTCM encoder employing a ST interleaver, according to an embodiment of the invention.
Figure 11B:
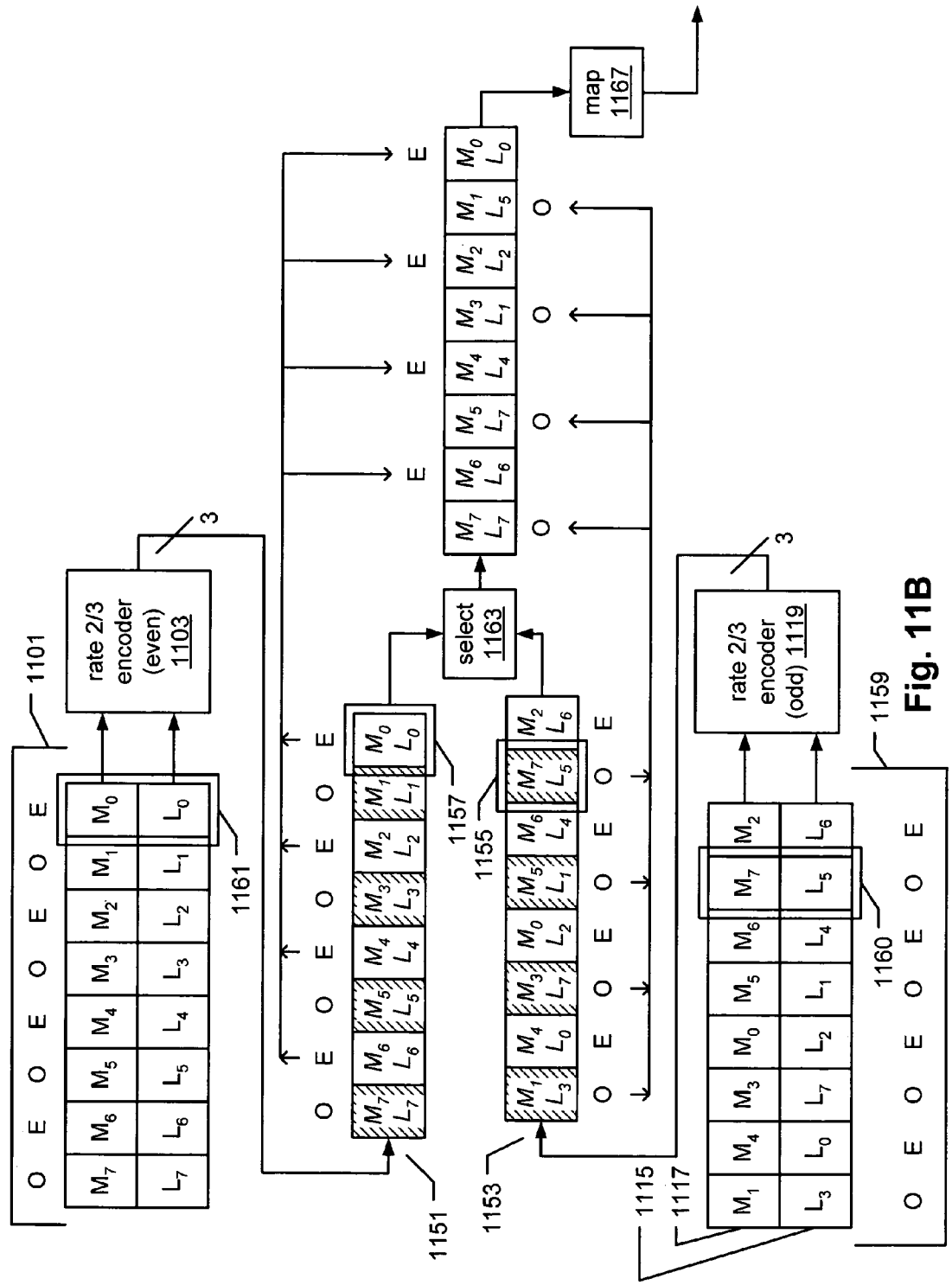
FIG. 11B is a second portion of combination block diagram and graphical illustration of a rate ⅔ TTCM encoder employing a ST interleaver, according to an embodiment of the invention.

FIG. 11A is a first part of a combination block diagram and graphic illustration of a rate ⅔ TTCM encoder employing a ST interleaver according to an embodiment of the invention. FIG. 11A and 11B in combination illustrate a modulo-2 ST interleaver as may be used with a rate ⅔ TTCM encoder. In FIG. 11A input tuples 1101 are provided to a rate ⅔ encoder 1103. The rate ⅔ encoder 1103 is designated as an even encoder because, although it will encode every input tuple, only the tuples corresponding to encoded even tuples will be selected from encoder 1103 by the selection circuit. Input tuples comprise 2 bits, a most significant bit designated by an M designation and a least significant bit designated by an L designation. The first tuple that will be accepted by the rate ⅔ even encoder 1103 will be the even tuple 1105. The even input tuple 1105 comprises 2 bits where $M_0$ is the most significant bit, and $L_0$ is the least significant bit. The second tuple to be accepted by the rate ⅔ even encoder 1103 is the 1107 tuple. The 1107 tuple is designated as an odd tuple and comprises a most significant bit $M_1$ and a least significant bit $L_1$. The input tuples are designated even and odd because the interleaver 1109, which is being illustrated in FIG. 11A, is modulo-2 interleaver also known as an even/odd interleaver.

The same principles, however, apply to any modulo-N interleaver. If the modulo interleaver had been a mod 3 interleaver instead of a mod 2 interleaver then the input tuples would have sequence designations 0, 1 and 2. If the modulo interleaver had been a modulo-4 interleaver then the input tuples would have modulo sequence designations 0, 1, 2, 3. The modulo interleaving scheme, discussed here with respect to modulo-2 interleavers and 2 bit tuples, may be used with any size of input tuple as well as any modulo-N interleaver. Additionally, any rate encoder 1103 and any type encoder may be used with the modulo ST interleaving scheme to be described. A rate ⅔ encoder, a modulo-2 ST interleaver, and 2 bit input tuples have been chosen for ease of illustration but are not intended to limit embodiments of the invention to the form disclosed. In other words, the following modulo-2 ST interleaver is chosen along with 2 bit input tuples and a rate ⅔ encoder system in order to provide for a relatively uncluttered illustration of the principles involved. The ST interleaver 1109 in this case actually can be conceptualized as two separate bit type interleavers 1111 and 1113. The separation of the interleavers is done for conceptual type purposes in order to make the illustration of the concepts disclosed easier to follow. In an actual implementation the interleaver 1109 may be implemented in a single circuit or multiple circuits depending on the needs of that particular implementation. Interleaver 1111 accepts the least significant bits of the input tuple pairs 1101. Note input tuple pairs designate input tuples having a pair, i.e. MSB (Most Significant Bit) and LSB (Least Significant Bit), of bits. The interleaver 1111 interleaves the least significant bits of the input tuple pairs 1101 and provides an interleaved sequence of least significant bits of the input tuple pairs for example those illustrated in 1115.

In the example, only eight input tuple pairs are depicted for illustration purposes. In an actual implementation the number of tuple pairs in a block to be interleaved could number tens of thousands or even more. Eight input tuple pairs are used for ease of illustration purposes. The least significant bits of the input tuple pairs 1101 are accepted by the interleaver 1111 in the order $L_0, L_1, L_2, L_3, L_4, L_5, L_6,$ and $L_7$. The interleaver, in the example of FIG. 11A, then provides an interleaved sequence 1115 in which the least significant bits of the input tuples have been arranged in the order $L_6, L_5, L_4, L_1, L_2, L_7, L_0$ and $L_3$. Note that although the least significant bit of the input tuple pairs have been shuffled by the interleaver 1111 each least significant bit in an even tuple in the input tuple pairs is interleaved to an even interleaved position in the output sequence 1115. In like manner, odd least significant bits in the input sequence 1101 are interleaved by interleaver 1111 into odd position in the output sequence 1115. This is also a characteristic of modulo ST interleaving. That is although the data input is interleaved, and the interleaving may be done by a variety of different interleaving schemes know in the art, the interleaving scheme, however, is modified such that even data elements are interleaved to even data elements and odd data elements are interleaved to odd data elements. In general, in modulo-N interleavers the data input to an interleaver would be interleaved to output positions having the same modulo sequence designation as the corresponding modulo sequence designation in the input sequence. That is, in a modulo-4 interleaver an input data element residing in a input tuple with a modulo sequence designation of 3 would end up residing in an interleaved output sequence with a modulo sequence designation of 3. In other words, no matter what type of interleaving scheme the interleaver (such as 1111) uses, the modulo sequence designation of each bit of the input data tuples sequence is maintained in the output sequence. That is, although the positions of the input sequence tuples are changed the modulo interleaved positions are maintained throughout the process. This modulo sequence designation, here even and odd because a modulo-2 interleaver is being illustrated, will be used by the selection mechanism to select encoded tuples corresponding to the modulo sequence designation of the input tuples. In other words, the modulo sequence designation is maintained both through the interleavers and through the encoders. Of course, since the input tuples are encoded the encoded representation of the tuples appearing at the output of the encoder may be completely different and may have more bits than the input tuples accepted by the encoder.

Similarly, the most significant bits of input tuples 1101 are interleaved in interleaver 1113. In the example of FIG. 11A, the sequence $M_0$ through $M_7$ is interleaved into an output sequence $M_2, M_7, M_0, M_5, M_6, M_3, M_4,$ and $M_1$. The interleaved sequence 1117, produced by interleaving the most significant bits of the input tuples 1101 in interleaver 1113, along with the interleaved sequence of least significant bits 1115 is provided to into the "odd" rate ⅔ encoder 1119. Note that in both cases all data bits are interleaved into new positions which have the same modulo sequence designation as the corresponding input tuples modulo sequence designation.

FIG. 11B is a second part of a combination block diagram and graphic illustration of a rate ⅔ TTCM encoder employing an ST interleaver. In FIG. 11B the even rate ⅔ encoder 1103 and the odd rate ⅔ encoder 1119, as well as the tuples input to the encoders, are reproduced for clarity. Even encoder 1103 accepts the input tuple sequence 1101. The odd encoder 1119 accepts an input sequence of tuples, which is formed from the interleaved sequence of most significant bits 1117 combined with the interleaved sequence of least significant bits 1115. Both encoders 1103 and 1119 are illustrated as rate ⅔ non-systematic convolutional encoders and therefore each have a 3 bit output. Encoder 1119 produces an output sequence 1153. Encoder 1103 produces an output sequence 1151. Both sequences 1151 and 1153 are shown in script form in order to indicate that they are encoded sequences. Both rate ⅔ encoders accept 2 bit input tuples and produce 3 bit output tuples. The encoded sequences of FIG. 11B may appear to have 2 bit elements, but in fact the two letter designation and comprise 3 encoded bits each. Therefore, output tuple 1155 which is part of sequence 1153 is a 3 bit tuple. The 3 bit tuple 1155 however, is designated by a script $M_7$ and a script $L_5$ indicating that that output tuple corresponds to an input tuple 1160, which is formed from most significant bit $M_7$ and least significant bit $L_5$. In like manner, output tuple 1157 of sequence 1151 comprises 3 bits. The designation of output tuple 1157 as $M_0$ and $L_0$ indicates that that output tuple corresponds to the input tuple 1101, which is composed of input most significant bit $M_0$ and input least significant bit $L_0$. It is worthwhile to note that output tuple of encoder 1103, which corresponds to input tuple 1161 maintains the same even designation as input tuple 1161. In other words, the output tuple of an encoder in a modulo interleaving system maintains the same modulo sequence designation as the input tuple to which it corresponds. Additionally, in a ST interleaver input tuple bits are interleaved independently but are always interleaved to tuples having the same modulo sequence designation.

Selector mechanism 1163 selects between sequences 1153 and 1151. Selector 1163 selects tuples corresponding to an even modulo sequence designation from the sequence 1151 and selects tuples corresponding to an odd modulo sequence designation from sequence 1153. The output sequence created by such a selection process is shown at 1165. This output sequence is then coupled into mapper 1167. The modulo sequence 1165 corresponds to encoded tuples with an even modulo sequence designation selected from sequence 1151 and encoded tuples with an odd modulo sequence designation selected from 1153. The even tuples selected are tuple $M_0 L_0$, tuple $M_2 L_2$, tuple $M_4 L_4$ and tuple $H_6 L_6$. Output sequence also comprises output tuples corresponding to odd modulo sequence designation $M_7 L_5$, tuple $M_5 L_1$, tuple $M_3 L_7$ and tuple $M_1$ and $L_3$.

A feature of modulo tuple interleaving systems, as well as a modulo ST interleaving systems is that encoded versions of all the input tuple bits appear in an output tuple stream. This is illustrated in output sequence 1165, which contains encoded versions of every bit of every tuple provided in the input tuple sequence 1101.

Those skilled in the art will realize that the scheme disclosed with respect to FIG. 11A and FIG. 11B can be easily extended to a number of interleavers as shown in FIG. 8A. In such a case, multiple modulo interleavers may be used. Such interleavers may be modulo tuple interleavers in which the tuples that will be coupled to the encoders are interleaved as tuples or the interleavers may be ST interleavers wherein the input tuples are interleaved to the same modulo sequence designation in the output tuples but the bits are interleaved separately so that the output tuples of the interleavers will correspond to different bits than the input sequence. By interleaving tuples and bits within tuples a more effective interleaving may be obtained because both bits and tuples are interleaved. Additionally, the system illustrated in FIG. 11A and FIG. 11B comprise an encoder 1103 which accepts the sequence of input tuples 1101. The configuration of FIG. 11A and 11B illustrates one embodiment. In a second embodiment the input tuples are ST interleaved before being provided to either encoder. In this way both the even and odd encoders can receive tuples which have had their component bits interleaved, thus forming an interleaving which may be more effective. In such a manner, an even encoder may produce a code which also benefits from IT or ST tuple interleaving. Therefore, in a second illustrative embodiment of the invention the input tuples are modulo interleaved before being passed to either encoder. The modulo interleaving may be a tuple interleaving, or a ST interleaving. Additionally, the types of interleaving can be mixed and matched.

Additionally, the selection of even and odd encoders is arbitrary and although the even encoder is shown as receiving uninterleaved tuples, it would be equivalent to switch encoders and have the odd encoder receive uninterleaved tuples. Additionally, as previously mentioned the tuples provided to both encoders may be interleaved.

Figure 12:
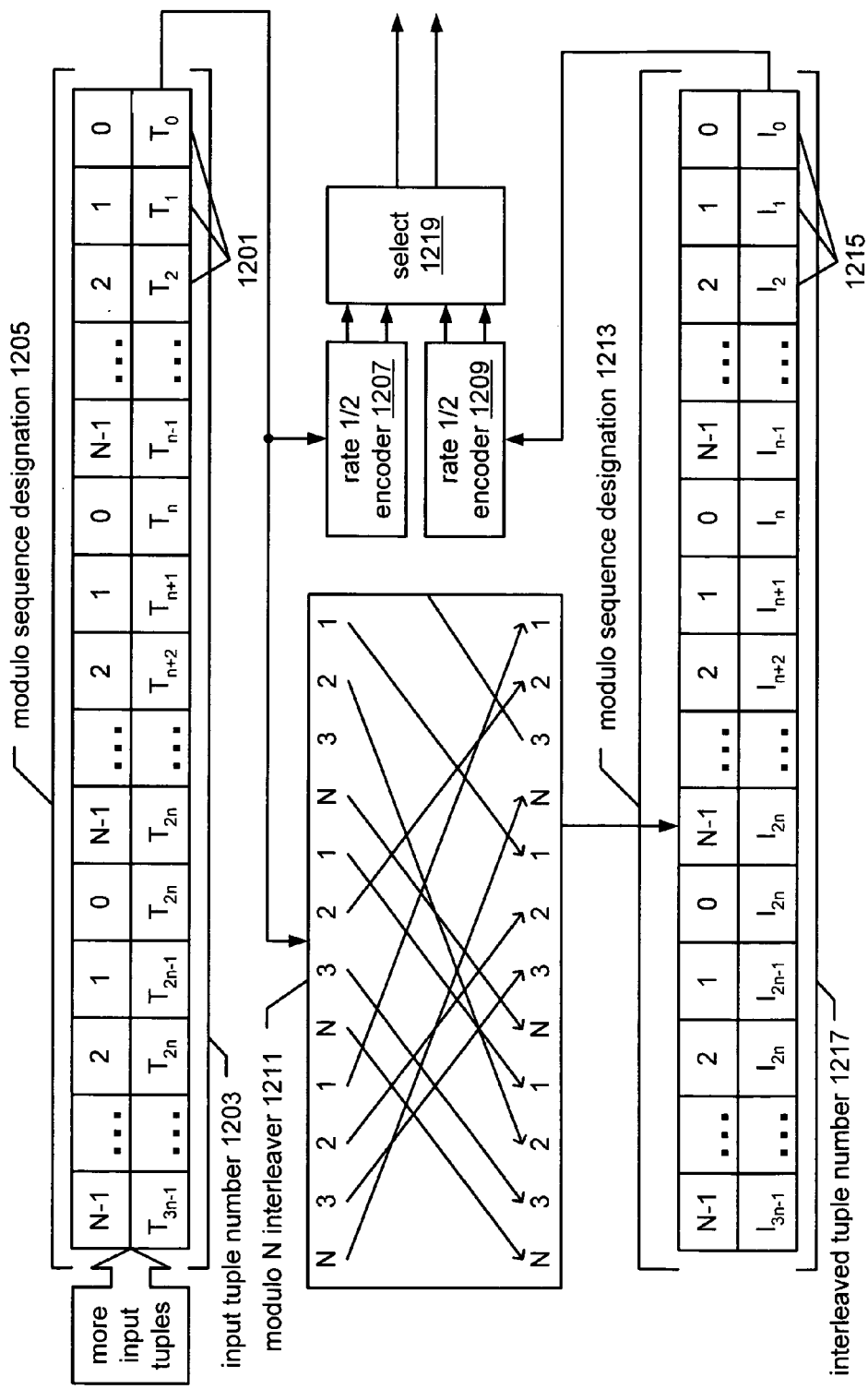
FIG. 12 is a combination block diagram and graphical illustration of rate ½ parallel concatenated encoder (PCE) employing a modulo-N Interleaver.

FIG. 12 is a combination block diagram and graphical illustration of a rate ½ parallel concatenated encoder (PCE) employing a modulo-N interleaver. FIG. 12 is provided for further illustration of the concept of modulo interleaving. FIG. 12 is an illustration of a parallel concatenated encoder with rate ½ constituent encoders 1207 and 1209. The input tuples to the encoder 1201 are provided to rate ½ encoder 1207. Each input tuple, for example, $T_0$, $T_1$, $T_2$ and $T_n$ given an input tuple number corresponding to the order in which it is provided to the encoder 1207 and interleaver 1211. The input tuple number corresponds to the subscript of the input tuple. For example, $T_0$ the zero tuple is the first tuple provided to the rate ½ encoder 1207, $T_1$ is the second tuple provided to the rate ½ encoder 1207, $T_2$ is the third tuple provided to the rate ½ input encoder 1207 and $T_n$ is the N plus first tuple provided to the rate ½ encoder 1207. The input tuples may be a single bit in which case the output of the rate ½ encoder 1207 would comprise 2 bits. The input tuples may also comprise any number of input bits depending on the number of inputs to the rate ½ encoder 1207.

The modulo concept illustrated is identical where the rate ½ encoder is provided with tuples having a single bit or multiple bits. The input tuples 1201 are assigned a modulo sequence designation 1205. The modulo sequence designation is formed by taking the input tuple number modulo-N, which is the modulo order of the interleaver. In the example illustrated, the modulo order of the interleaver 1211 is N. Because the modulo order of the interleaver is N the modulo sequence designation can be any integer value between 0 and N−1. Therefore, the $T_0$ tuple has a modulo sequence designation of 0, the $T_1$ tuple has a modulo sequence designation of 1, the $T_{n-1}$ input tuple has a modulo sequence designation of N−1, the $T_n$ input tuple has a modulo sequence designation of 0 and the $T_{n+1}$ input tuple has a modulo sequence designation of 1 and so forth. Interleaver 1211 produces interleaved tuples 1215. Similarly to the input tuples the interleaved tuples are given a modulo sequence designation which is the same modulo order as the interleaver 1211. Therefore, if the input tuples have a modulo sequence designation from 0 to N−1 then the interleaved tuples will have a modulo sequence designation of 0 to N−1. The interleaver 1211 can interleave according to a number of interleaving schemes known in the art. In order to be a modulo interleaver, however, each of the interleaving schemes must be modified so that input tuples with a particular modulo sequence designation are interleaved to interleaved tuples with the same modulo sequence designation. The interleaved tuples are then provided to a second rate ½ encoder 1209. The encoder 1207 encodes the input tuples, the encoder 1209 encodes the interleaved tuples and selector 1219 selects between the output of the encoder 1207 and the output of encoder 1209. It should be obvious from the foregoing description that modulo type interleaving can be carried out using any modulo sequence designation up to the size of the interleaver. A modulo-2 interleaver is typically referred to herein as an odd/even interleaver as the modulo sequence designation can have only the values of 1 or 0, i.e., odd or even respectively.

Figure 13:
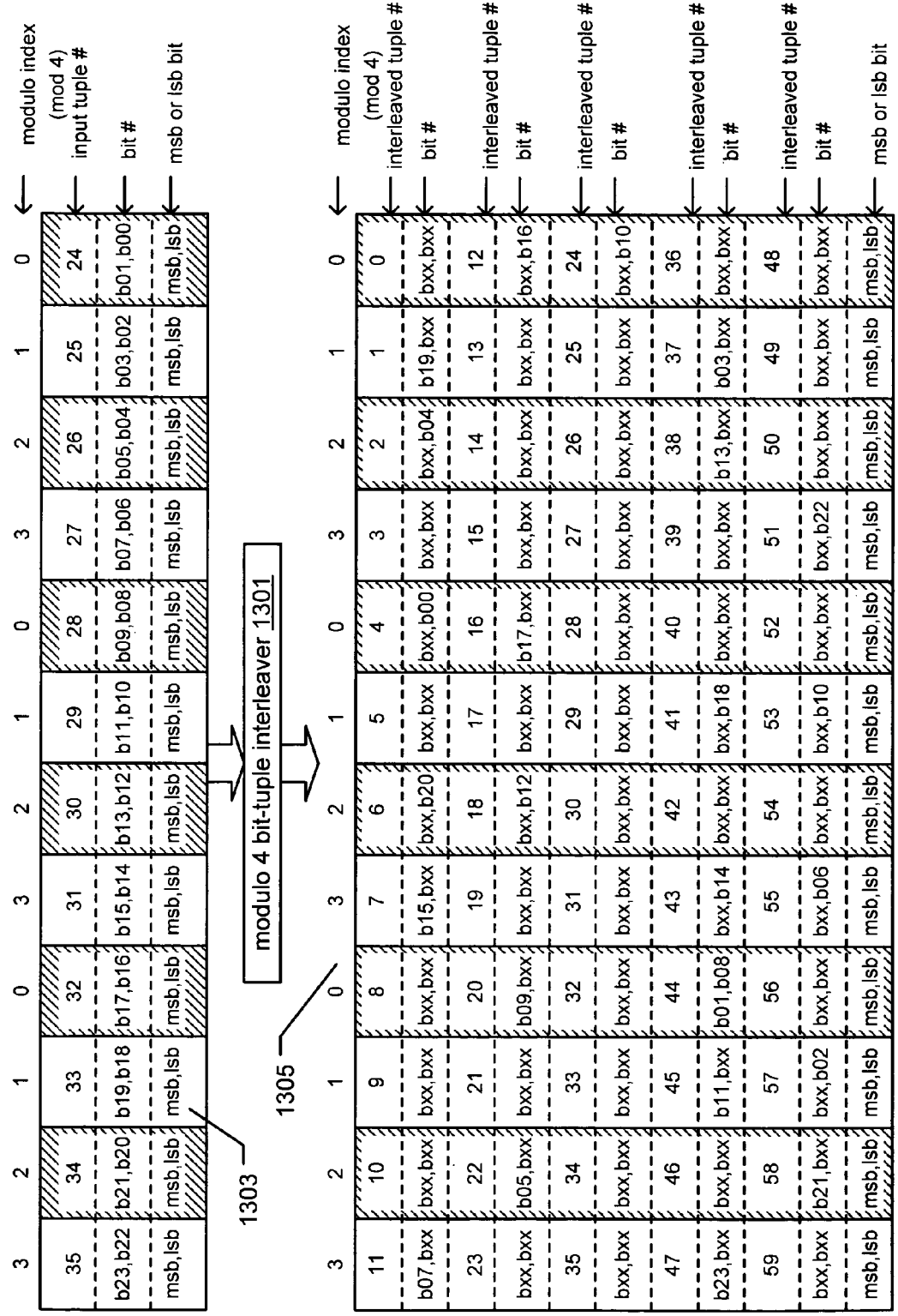
FIG. 13 is a graphical illustration of the functioning of a modulo-4 ST interleaver, according to an embodiment of the invention.

FIG. 13 is a graphic illustration of the functioning of a modulo-4 ST interleaver according to an embodiment of the invention. In the illustrated example, the modulo-4 ST interleaver 1301 interleaves a block of 60 tuples. That is the interleaver can accommodate 60 input tuples and perform and interleaving on them. Input tuples 24 through 35 are illustrated at 1303, to demonstrate an exemplary interleaving. Interleaved tuples 0-59 are illustrated at 1305. Input tuples 24 through 35 are illustrated at 1303 as 2 bit tuples. Input tuple 24 includes bit $b_{00}$ which is the LSB or least significant bit of input tuple 24 and $b_{01}$ the MSB or most significant bit of input tuple 24. Similarly, input tuple 25 includes $b_{02}$ which is the least significant bit (LSB) of tuple 25 and $b_{03}$ which is the most significant bit of input tuple 25. Each input tuple 1303 is assigned a modulo sequence designation which is equal to the tuple number modulo-4. The modulo sequence designation of tuple 24 is 0, the modulo sequence designation of tuple 25 is 1, the modulo sequence designation of tuple 26 is 2, the modulo sequence designation of tuple 27 is 3, the modulo sequence designation of tuple 28 is 0 and so forth. Because 1301 is a ST interleaver, the bits of each tuple are interleaved separately. Although the bits of each tuple are interleaved separately, they are interleaved into an interleaved tuple having the same modulo sequence designation, i.e. tuple number mod 4 in the interleaved tuple as in the corresponding input tuple. Accordingly, bit $b_{00}$ the LSB of tuple 24 is interleaved to interleaved tuple number 4 in the least significant bit position. $b_{01}$ the MSB of input tuple 24 is interleaved to interleaved tuple 44 in the most significant bit position. Note that the modulo sequence designation of input tuple 24 is a 0 and modulo sequence designation of interleaved tuple 4 and interleaved tuple 44 are both 0. Accordingly, the criteria that bits of an input tuple having a given modulo sequence designation are interleaved to interleave positions having the same modulo sequence designation. Similarly, $b_{02}$ and $b_{03}$ of input tuple 25 are interleaved to interleaved tuple 57 and interleaved tuple 37 respectively. $B_{04}$ and $b_{05}$ of input tuple 26 are interleaved to interleaved tuples 2 and 22. In like manner the MSB and LSB of all illustrated input tuples 24 through 35 are interleaved to corresponding interleaved tuples having the same modulo sequence designation, as illustrated in FIG. 13.

Figure 14A:
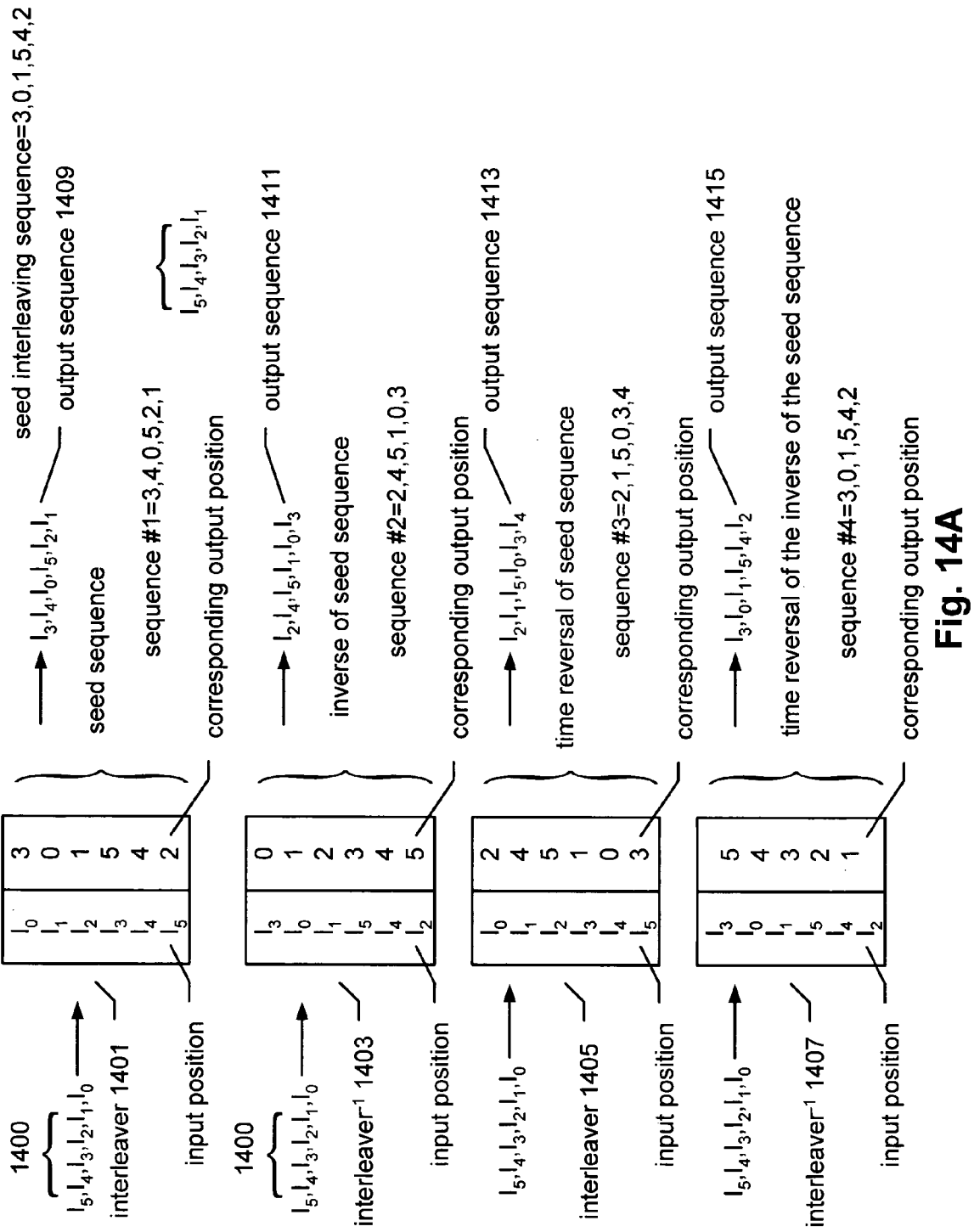
FIG. 14A is a graphical illustration of the generation of interleaver sequences from a seed interleaving sequence.

FIG. 14A is a graphical illustration of a method for generating an interleaving sequence from a seed interleaving sequence. Interleavers may be implemented in random access memory (RAM). In order to interleave an input sequence, an interleaving sequence may be used. Because interleavers can be quite large, it may be desirable that an interleaving sequence occupy as little storage space within a system as feasible. Therefore, it can be advantageous to generate larger interleaving sequences from smaller, i.e. seed interleaving sequences. FIG. 14A is a portion of a graphical illustration in which a seed interleaving sequence is used to generate four interleaving sequences each the size of the initial seed interleaving sequence. In order to illustrate the generation of sequences from the seed interleaving sequence, an interleaving matrix such as that 1401 may be employed. The interleaving matrix 1401 matches input positions with corresponding output positions. In the interleaving matrix 1401 the input positions $I_0$ through $I_5$ are listed sequentially. $I_0$ is the first interleaving element to enter the interleaving matrix 1401. $I_1$ is the second element, etc. As will be appreciated by those skilled in the art, the input elements $I_0$ through $I_5$ may be considered to be individual bits or tuples. The input positions in the interleaving matrix 1401 are then matched with the seed sequence. By reading through the interleaving matrix 1401 an input position is matched with a corresponding output position. In the illustrative example, of the interleaving matrix 1401, input $I_0$ is matched with the number 3 of the seed sequence. This means that the $I_0$ or first element into the interleaving matrix 1401 occupies position 3 in the resulting first sequence. Similarly, $I_1$ will be matched with a 0 position in sequence 1 and so forth. In other words, the input sequence $I_0, I_1, I_2, I_3, I_4, I_5$ is reordered according to the seed sequence so that the resulting sequence output from the interleaving matrix 1401 is $I_1, I_2, I_5, I_0, I_4, I_3$ where the output sequence is obtained by listing the sequence of the output in the usual ascending order $I_0, I_1, I_2, I_3, I_4, I_5$, where the left most position is the earliest. Put another way, the resulting sequence number 1 is {3, 4, 0, 5, 2, 1}, which corresponds to the subscript of the output sequence 1409. Similarly, in interleaving matrix 1403 also called the inverse interleaving matrix or INTLV$^{-1}$ the input sequence 1400 is accepted by the interleaving matrix 1403 but instead of being written into this interleaving matrix sequentially, as in the case with interleaving matrix 1401, the elements are written into the interleaving matrix according to the seed sequence. The interleaving matrix 1403 is known as the inverse of interleaving matrix 1401 because by applying interleaving matrix 1401 and then successively applying inverse interleaving matrix 1403 to any input sequence, the original sequence is recreated. In other words, the two columns of the interleaving matrix 1401 are swapped in order to get interleaving matrix 1403. Resulting output sequence 1411 is $I_3, I_0, I_1, I_5, I_4, I_2$. Therefore, sequence number 2 is equal to 2, 4, 5, 1, 0, 3.

The seed interleaving sequence can also be used to create an additional two sequences. The interleaving matrix 1405 is similar to interleaving matrix 1401 except that the time reversal of the seed sequence is used to map the corresponding output position. The output then of interleaver reverse (IN-TLVR 1405) is then $I_4, I_3, I_0, I_5, I_1, I_2$. Therefore, sequence 3 is equal to 2, 1, 5, 0, 3, 4.

Next an interleaving matrix 1407 which is similar to interleaving matrix 1403 is used. Interleaving matrix 1407 has the same input position elements as interleaving matrix 1403, however, except that the time reversal of the inverse of the seed sequence is used for the corresponding output position within interleaving matrix 1407. In such a manner, the input sequence 1400 is reordered to $I_2, I_4, I_5, I_1, I_0, I_3$. Therefore, sequence number 4 is equal to 3, 0, 1, 5, 4, 2, which are, as previously, the subscripts of the outputs produced. Sequences 1 through 4 have been generated from the seed interleaving sequence. In one embodiment of the invention the seed interleaving sequence is an S random sequence as described by S. Dolinar and D. Divsalar in their paper "Weight Distributions for Turbo Codes Using Random and Non-Random Permeations," TDA progress report 42-121, JPL, August 1995.

Figure 14B:
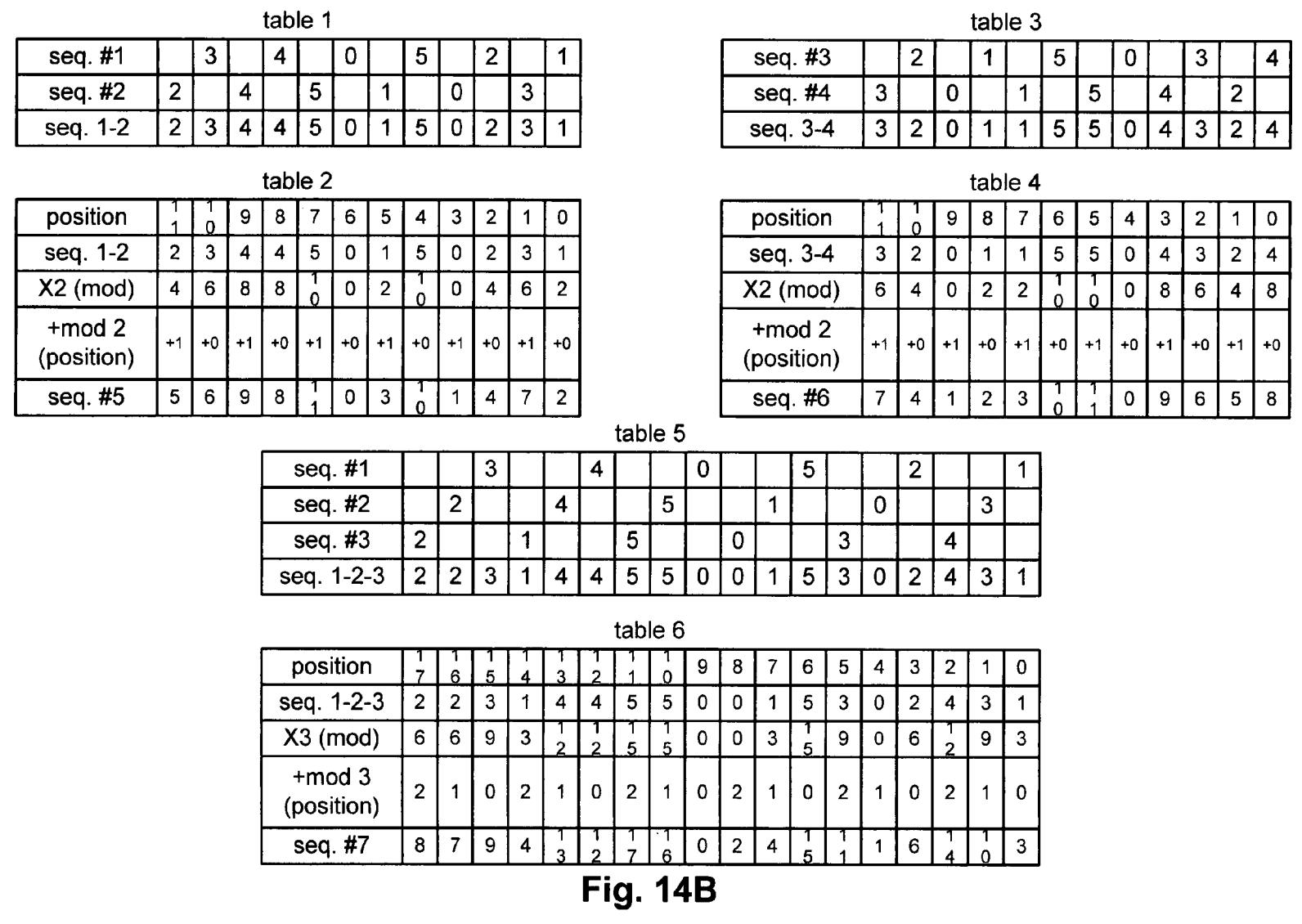

FIG. 14B is a series of tables illustrating the construction of various modulo interleaving sequences from sequence 1 through 4 (as illustrated in FIG. 14A). Table 1 illustrates the first step in creating an interleaving sequence of modulo-2, that is an even/odd interleaving sequence, from sequence 1 and 2 as illustrated in FIG. 14A. Sequence 1 is illustrated in row 1 of table 1. Sequence 2 is illustrated in row 2 of table 1. Sequence 1 and sequence 2 are then combined in row 3 of table 1 and are labeled sequence 1-2. In sequence 1-2 elements are selected alternatively, i.e. sequentially from sequence 1 and 2 in order to create sequence 1-2. That is element 1, which is a 1, is selected from sequence 1 and placed as element 1 in sequence 1-2. The first element in sequence 2, which is a 3, is next selected and placed as the second element in sequence 1-2. The next element of sequence 1-2 is selected from sequence 1, the next element is selected from sequence 2, etc. Once sequence 1-2 has been generated, the position of each element in sequence 1-2 is labeled. The position of elements in sequence 1-2 is labeled in row 1 of table 2. The next step in generating the interleaving sequence, which will be sequence 5 is to multiply each of the elements in sequence 1-2 by the modulo of the sequence being created. In this case, we are creating a modulo-2 sequence and therefore, each of the elements in sequence 1-2 will be multiplied by 2. If a modulo-3 sequence had been created in the multiplication step, the elements would be multiplied by 3 as will be seen later. The multiplication step is a step in which the combined sequences are multiplied by the modulo of the interleaving sequence desired to be created.

This methodology can be extended to any modulo desired. Once the sequence 1-2 elements have been multiplied times 2, the values are placed in row 3 of table 2. The next step is to add to each element, now multiplied by modulo-N (here N equals 2) the modulo-N of the position of the element within the multiplied sequence i.e. the modulo sequence designation. Therefore, in a modulo-2 sequence (such as displayed in table 2) in the 0th position the modulo-2 value of 0 (i.e. a value of 0) is added. To position 1 the modulo-2 value of 1 (i.e. a value of 1) is added, to position 2 the modulo-2 value of 2 (i.e. a value of 0) is added. To position 3 the modulo-2 value of 3 is (i.e. a value of 1) is added. This process continues for every element in the sequence being created. Modulo position number as illustrated in row 4 of table 2 is then added to the modulo multiplied number as illustrated in row 3 of table 2. The result is sequence 5 as illustrated in row five of table 2. Similarly, in table 3, sequence 3 and sequence 4 are interspersed in order to create sequence 3-4. In row 1 of table 4, the position of each element in sequence 3-4 is listed. In row 3 of table 4 each element in the sequence is multiplied by the modulo (in this case 2) of the sequence to be created. Then a modulo of the position number is added to each multiplied element. The result is sequence 6 which is illustrated in row 5 of table 4.

It should be noted that each component sequence in the creation of any modulo interleaver will contain all the same elements as any other component sequence in the creation of a modulo interleaver. Sequence 1 and 2 have the same elements as sequence 3 and 4. Only the order of the elements in the sequence are changed. The order of elements in the component sequence may be changed in any number of a variety of ways. Four sequences have been illustrated as being created through the use of interleaving matrix and a seed sequence, through the use of the inverse interleaving of a seed sequence, through the use of a timed reversed interleaving of a seed sequence and through the use of an inverse of a time interleaved reverse of a seed sequence. The creation of component sequences are not limited to merely the methods illustrated. Multiple other methods of creating randomized and S randomized component sequences are known in the art. As long as the component sequences have the same elements (which are translated into addresses of the interleaving sequence) modulo interleavers can be created from them. The method here described is a method for creating modulo interleavers and not for evaluating the effectiveness of the modulo interleavers. Effectiveness of the modulo interleavers may be dependent on a variety of factors which may be measured in a variety of ways. The subject of the effectiveness of interleavers is one currently of much discussion in the art.

Table 5 is an illustration of the use of sequence 1, 2, and 3 in order to create a modulo-3 interleaving sequence. In row 1 of table 5 sequence 1 is listed. In row 2 of table 5 sequence 2 is listed and in row 3 sequence 3 is listed. The elements of each of the three sequences are then interspersed in row 4 of table 5 to create sequence 1-2-3.

In table 6 the positions of the elements in sequence 1-2-3 are labeled from 0 to 17. Each value in sequence 1-2-3 is then multiplied by 3, which is the modulo of the interleaving sequence to be created, and the result is placed in row 3 of table 6. In row 4 of table 6 a modulo-3 of each position is listed. The modulo-3 of each position listed will then be added to the sequence in row 3 of table 3, which is the elements of sequence 1-2-3 multiplied by the desired modulo, i.e. 3. Sequence 7 is then the result of adding the sequence 1-2-3 multiplied by 3 and adding the modulo-3 of the position of each element in sequence 1-2-3. The resulting sequence 7 is illustrated in table 7 at row 5. As can be seen, sequence 7 is a sequence of elements in which the element in the 0 position mod 3 is 0. The element in position 1 mod 3 is 1. The element in position 2 mod 3 is 2. The element in position 3 mod 3 is 0 and so forth. This confirms the fact that sequence 7 is a modulo-3 interleaving sequence. Similarly, sequence 5 and 6 can be confirmed as modulo-2 interleaving sequences by noting the fact that each element in sequence 5 and sequence 6 is an alternating even and odd (i.e. modulo-2 equals 0 or modulo-2 equals 1) element.

FIG. 14C is a graphical illustration of creating a modulo-4 sequence from four component sequences. In table 7 sequences 1, 2, 3 and 4 from FIG. 14A are listed. The elements of sequence 1, 2, 3 and 4 are then interspersed to form sequence 1-2-3-4.

In table 8 row 1 the positions of each element in sequence 1-2-3-4 are listed. In row 3 of table 8 each element of sequence 1-2-3-4 is multiplied by a 4 as it is desired to create a modulo-4 interleaving sequence. Once the elements of sequence 1-2-3-4 have been multiplied by 4 as illustrated in row 3 of table 8, each element has added to it a modulo-4 of the position number, i.e. the modulo sequence designation of that element within the 1-2-3-4 sequence. The multiplied value of sequence 1-2-3-4 is then added to the modulo-4 of the position in sequence 8 results. Sequence 8 is listed in row 5 of table 8. To verify that the sequence 8 generated is a modulo-4 interleaving sequence each number in the sequence can be divided mod 4. When each element in sequence 6 is divided modulo-4 sequence of 0, 1, 2, 3, 0, 1, 2, 3, 0, 1, 2, 3 etc. results. Thus, it is confirmed that sequence 8 is a modulo-4 interleaving sequence, which can be used to take an input sequence of tuples and create a modulo interleaved sequence of tuples.

Figure 15:
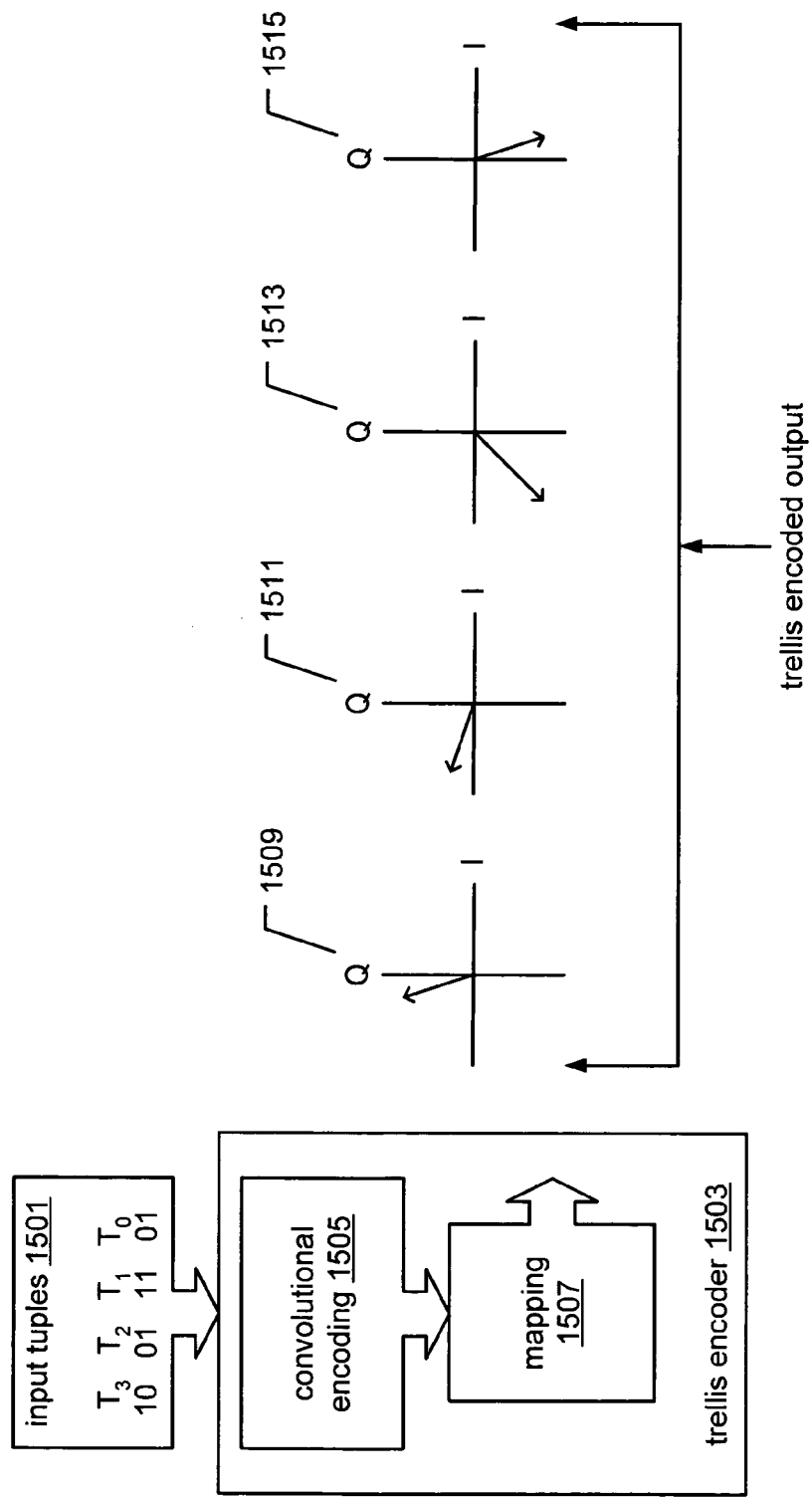
FIG. 15 is a graphical illustration of trellis encoding.

FIG. 15 is a general graphical illustration of trellis-coded modulation (TCM). In FIG. 15, input tuples designated 1501 are coupled into a trellis encoder 1503. Input tuples, for illustration purposes are designated $T_0$, $T_1$, $T_2$ and $T_3$. Within the trellis encoder 1503 the input tuples 1501 are accepted by a convolutional encoder 1505. The input tuples that have been convolutionally encoded are mapped in a mapper 1507. The TCM process yields a signal constellation represented as a set of amplitude phase points (or vectors) on an In phase Quadrature (I-Q) plane. An example of such vectors illustrated at 1509, 1511, 1513, and 1515. The vector represented in the I-Q (In phase and Quadrature) illustration is well known in the art. The process of convolutionally encoding and mapping when taken together is generally referred to as trellis-coded modulation. A similar process called turbo trellis-coded modulation (TTCM) is illustrated in FIG. 16.

Figure 16:
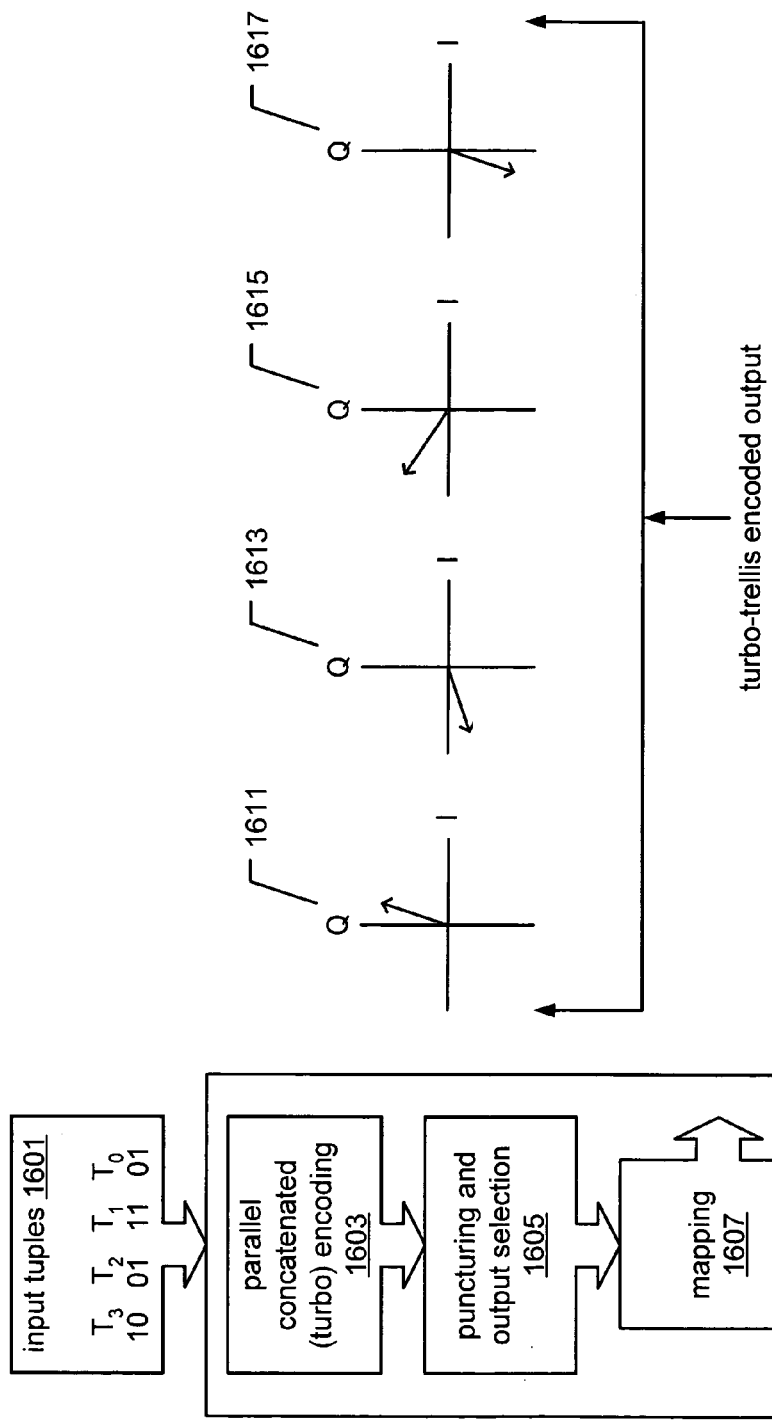
FIG. 16 is a graphical illustration of Turbo Trellis Coded Modulation (TTCM) encoding.

FIG. 16 is a graphical illustration of TTCM (Turbo Trellis Coded Modulation) encoding. In FIG. 16 input tuples 1601 are provided to a parallel concatenated (turbo) encoding module 1603. The parallel concatenated turbo encoding module 1603 may comprise a number of encoders and interleavers. Alternatively, the parallel concatenated encoder 1603 may comprise a minimum of two encoders and one interleaver. The output of the turbo encoder is then provided to an output selection and puncturing module. In module 1605 outputs are selected from the constituent encoders of the module 1603. The selection of outputs of the different encoders is sometimes termed puncturing by various sources in the art, because some of the code bits (or parity bits) may be eliminated). Selection of outputs of the constituent encoders within the present disclosure will be referred to herein as selecting. The term selecting is used because, in embodiments of the present invention, encoded tuples are selected from different encoders, but encoded tuples corresponding to each of the input tuples are represented. For example, there may be an encoder designated the odd encoder from which tuples corresponding to encoded versions of odd input tuples are selected. The other encoder may be termed an even encoder in which the coded versions of the even tuples are selected. This process is termed selecting because even though alternating encoded tuples are selected from different encoders a coded version of each input is represented. That is, in the selection process though some encoded symbols are discarded from one encoder and some encoded symbols are discarded from other constituent encoder(s) the selection and modulo interleaving process is such that encoded versions of all input elements are represented. By modulo encoding and selecting sequentially from all encoders, encoded versions of all input bits are represented. The term puncturing as used herein will be used to describe discarding parts or all of encoded tuples which have already been selected. The selected tuples are provided to a mapping 1607. In embodiments of the present invention the mapping may be dependent on the source of the tuple being mapped. That is, the mapping may be changed for example depending on whether the tuple being mapped has been encoded or not. For example, a tuple from one of the encoders may be mapped in a first mapping. An uncoded tuple which has bypassed the encoder however may be mapped in a second mapping. Combination tuples in which part of the tuple is encoded and part of it is uncoded may also have different mappings. A combination of 3 blocks—block 1603, parallel concatenated encoding, block 1605, output selection and puncturing, and block 1607 mapping comprise what is known as the turbo trellis-coded modulation (TTCM) encoder 1609. The output of the TTCM encoder is a series of constellation vectors as illustrated by examples at 1611, 1613, 1615 and 1617.

Figure 17:
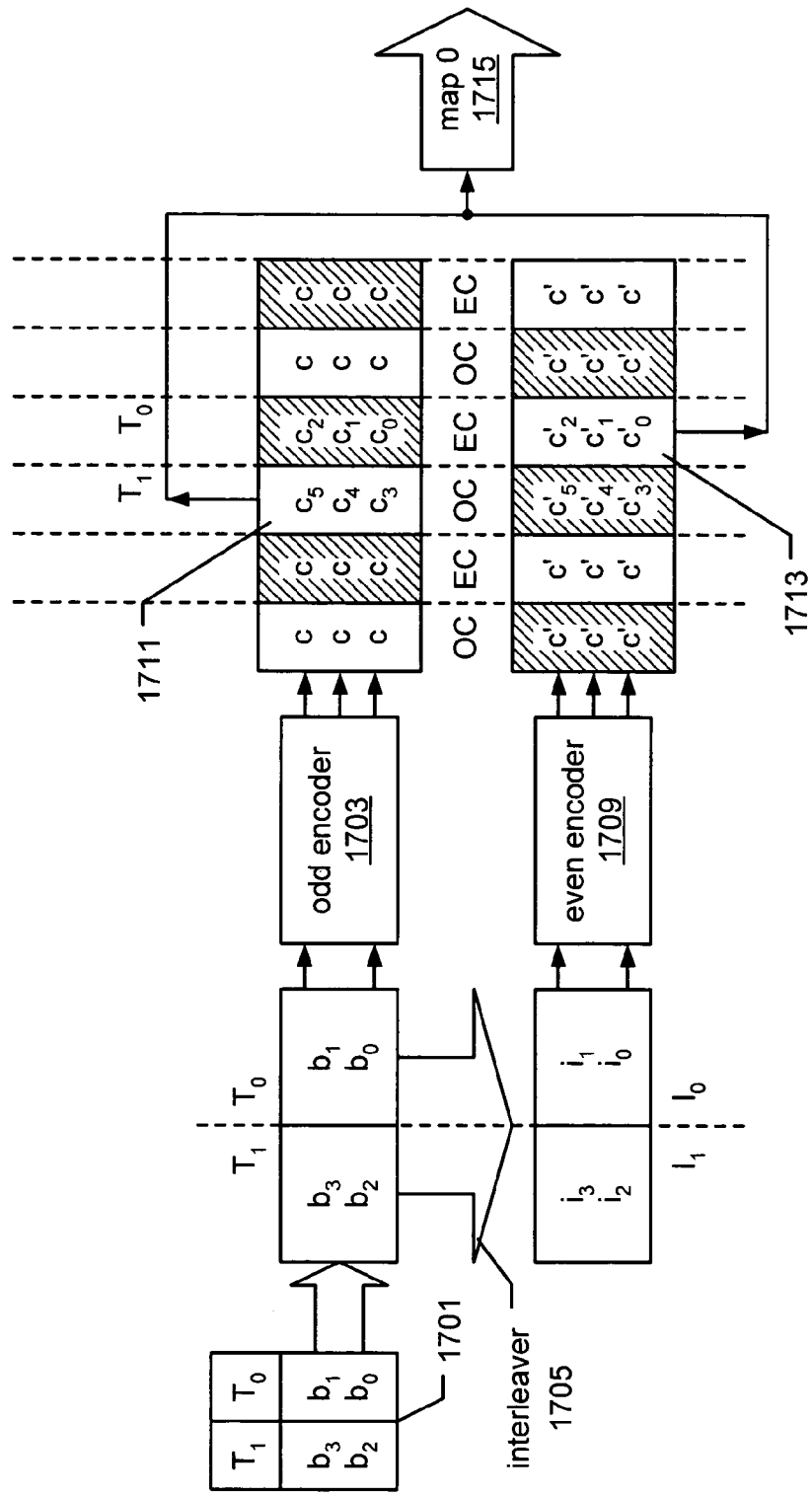
FIG. 17 is a graphical illustration of a rate ⅔ TTCM encoder according to an embodiment of the invention.

FIG. 17 is a graphical illustration of a rate ⅔ encoder according to an embodiment of the invention. In FIG. 17, input tuples $T_0$ and $T_1$ represented at 1701 are provided to odd encoder 1703. Tuple $T_0$ comprises bits, $b_0$ and $b_1$ tuple $T_1$ comprises bits $b_2$ and $b_3$. The input tuples $T_0$ and $T_1$ are also provided to an interleaver 1705. Interleaver 1705 accepts input tuples (such as $T_0$ and $T_1$) and after interleaving, provides the interleaved tuples to the even encoder 1709. When odd encoder 1703 is accepting tuple $T_0$, comprising bits $b_0$ and $b_1$, even encoder 1709 is accepting an interleaved tuple comprising bits $i_0$ and $i_1$. Similarly, when odd encoder 1703 is accepting tuple $T_1$ comprising bits $b_2$ and $b_3$ even encoder 1709 is accepting an interleaved tuple comprising bits $i_2$ and $i_3$. At each encoder clock (EC) both encoders accept an input tuple. The interleaver 1703 is a modulo-2 (even/odd) ST interleaver. Each encoder accepts every input tuple. The even/odd designation refers to which encoded tuple is selected to be accepted by the mapper 1715. By maintaining an even/odd interleaving sequence and by selecting encoded tuples alternatively from one then the other encoder, it can be assured that an encoded version of every input tuple is selected and passed on to the mapper 1715. For example, the encoded tuple 1711, comprising bits $c_3$ and $c_4$, and $c_5$ and corresponding to tuple $T_1$ is selected and passed onto mapper 1715, which maps both even and odd selections according to map 0.

The encoded tuple $c_0$, $c_1$ and $c_2$, corresponding to input tuple $T_0$ is not selected from the odd encoder 1703. Instead, the tuple comprising bits $c'_0$, $c'_1$, and $c'_0$, which corresponds to the interleaved input $i_0$ and $i_1$ is selected and passed on to mapper 1715, where it is mapped using map 0.

Accordingly, all the components of each tuple are encoded in the odd encoder and all components of each tuple are also encoded in the even encoder. However, only encoded tuples corresponding to input tuples having an odd modulo sequence designation are selected from odd encoder 1703 and passed to the mapper 1715. Similarly only encoded tuples corresponding to input tuples having an even modulo sequence designation are selected from even encoder 1709 and passed to mapper 1703. Therefore, the odd and even designation of the encoders designate which tuples are selected from that encoder for the purposes of being mapped.

Both encoder 1703 and 1709 in the present example of FIG. 17 are convolutional, nonsystematic, recursive encoders according to FIG. 5. Although only encoded versions of odd tuples are selected from encoder 1703, and only encoded versions of even tuples are selected from encoder 1709, because both encoders have memory, each encoded output tuple not only contains information from the tuple encoded, but also from previous tuples.

The even/odd encoder of FIG. 17 could be modified by including modulo-N interleaving, modulo-N interleaving could be accomplished by adding the appropriate number of both interleavers and encoders, to form a modulo-N TTCM encoder. Additionally, other configurations may be possible. For example, interleaver 1705 may be a ST interleaver. As an alternate another interleaver may be added prior to odd encoder 1703. For example, if a bit interleaver, to separate the input tuple bits were added prior to encoder 1703, and interleaver 1705 were an IT interleaver, the overall effect would be similar to specifying interleaver 1705 to be an ST interleaver.

Both encoders 1703 and 1709 are rate ⅔ encoders. They are both nonsystematic convolutional recursive encoders but are not be limited to such.

The overall TTCM encoder is a ⅔ encoder because both the odd encoder 1703 and the even encoder 1709 accept an input tuple comprising 2 bits and output an encoded output tuple comprising 3 bits. So even though the output to mapper 0 switches between even and odd encoders, both encoders are rate ⅔ and the overall rate of the TTCM encoder of FIG. 17 remains at ⅔.

FIG. 18 is a graphical illustration of a rate ½ TTCM encoder implemented using the constituent rate ⅔ base encoders, according to an embodiment of the invention. In FIG. 18, exemplary input tuples $T_0$ and $T_1$ are provided to the TTCM encoder 1800. The $T_0$ tuple comprises a single bit $b_0$ and the $T_1$ tuple comprises a single bit $b_1$. $b_0$ and $b_1$ corresponding to tuples $T_0$ and $T_1$ are provided to odd encoder 1803. Both $b_0$ and $b_1$ are also provided to interleaver 1805. At the time when odd encoder 1803 is accepting $b_0$ even encoder is accepting $i_0$. $i_0$ is an output of the interleaver 1805. Similarly, $i_1$ is a output of interleaver 1805 that is provided to even encoder 1809 at the same time that bit $b_1$ is provided to odd encoder 1803. The interleaver 1805 is an odd/even interleaver (modulo-2). In such a manner when an odd tuple is being provided to odd encoder 1803, an interleaver odd tuple is being provided to even encoder 1809. When an even tuple is being provided to odd 1803, an even interleaved tuple is being provided to even encoder 1809. In order to achieve a rate ½ code from rate ⅔ constituent encoders, in addition to an input comprising a single input bit, a constant bit value provided to 1811 is a second input of each of the constituent rate ⅔ encoders 1803 and 1809. In FIG. 18A the input bit is shown as being a 0 but could just as easily be set to a constant value of 1. Additionally, each encoder input bit might be inputted twice to the odd encoder 1803 and the even encoder 1809 as illustrated in FIG. 18B. Multiple other configurations are possible. For example both encoders might receive both input tuples as illustrated in FIG. 18C, or one of the inputs might be inverted as in FIG. 18E. Additionally hybrid combinations, such as illustrated in FIG. 18D are possible.

Figure 24:
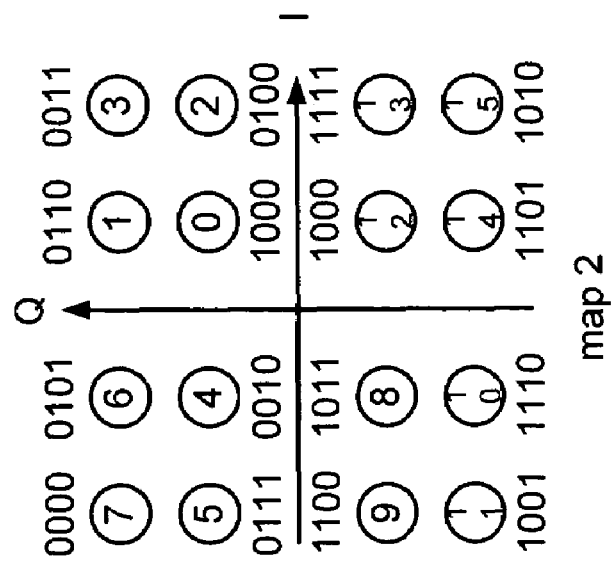
FIG. 24 is a graphical illustration of map 2 according to an embodiment of the invention.
Figure 25:
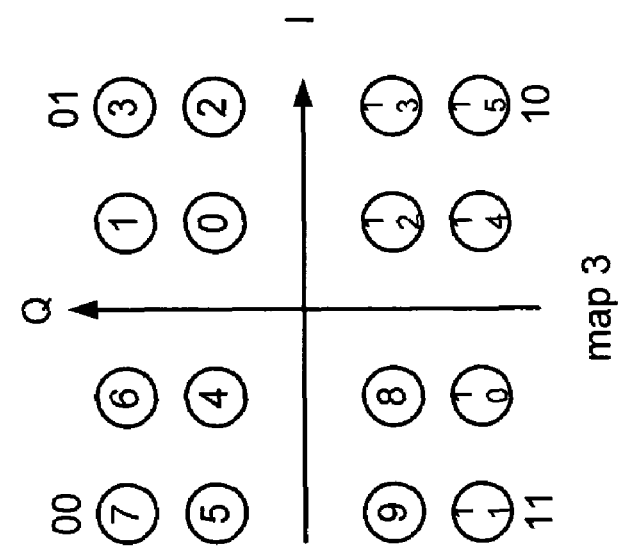
FIG. 25 is a graphical illustration of map 3 according to an embodiment of the invention.

The output of odd encoder 1803, which corresponds to input tuple $T_0$, comprises bits $c_0$, $c_1$, $c_2$. The output tuple of odd encoder 1803 corresponding to tuple $T_1$ comprises bits $c_3$, $c_4$, and $c_5$. At encoder clock $EC_0$ the even encoder 1809 has produced an encoded output tuple having bits $c'_0$, $c'_1$ and $c'_2$. One of the three encoded bits, in the present illustration $c'_2$, is punctured i.e. dropped and the remaining 2 bits are then passed through to mapper 1813. During the odd encoder clock $OC_1$ two of three of the encoded bits provided by odd encoder 1803 are selected and passed to mapper 1813. Output bit $c_4$ is illustrated as punctured, that is being dropped and not being passed through the output mapper 1813. Mapper 1813 employs map number 3 illustrated further in FIG. 24. For each encoder clock a single input tuple comprising 1 bit is accepted into the TTCM encoder 1800. For each clock a 2-bit encoded quantity is accepted by mapper 1813. Because for each one bit provided to the encoder, 2 bits are outputted, therefore the encoder is a rate ½ encoder. The odd and even encoders in the present embodiment are nonsystematic, convolutional, recursive encoders, but are not limited to such. The encoders may be any combination, for example such as systematic, block encoders. Interleaver 1805 is an odd/even interleaver and so odd output tuples are accepted by the mapper 1813 from odd encoder 1803 and even encoded tuples are accepted by the mapper 1813 from even encoder 1809. In such a manner, all input tuples are represented in the output accepted by mapper 1813, even though some of the redundancy is punctured. Mapper 1813 utilizes map 3 as illustrated in FIG. 25 for use by rate ½ TTCM encoder 1800.

FIG. 19 is a graphical illustration of a rate 3/4 TTCM encoder, having constituent ⅔ rate encoders, according to an embodiment of the invention. In FIG. 19 the input tuples $T_0$ and $T_1$, illustrated at 1901, comprise 3 bit input tuples. Input tuple $T_0$ comprises bits $b_0$, $b_1$ and $b_2$. Input tuple $T_1$ comprises bits $b_3$, $b_4$ and $b_5$. Bit $\underline{b_2}$ of input tuple $T_0$ is underlined as is $\underline{b_5}$ of input tuple $T_1$. Bits $\underline{b_2}$ and $\underline{b_5}$ are underlined because neither of these bits will pass through either encoder. Instead, these bits will be concatenated to the output of the even or odd encoder and the resulting in a 4 bit tuple provided to mapper 1911. $b_0$ and $b_1$ of input tuple $T_0$ are provided to odd encoder 1903. At the same time that $b_0$ and $b_1$ are being accepted by the odd encoder 1903, interleaved bits $i_0$ and $i_1$ are being accepted by even encoder 1909. Interleaver 1905 is an odd/even (module-2) type interleaver. The encoders illustrated at 1903 and 1909 are the encoders illustrated in FIG. 5. Encoders 1903 and 1909 are the same as the encoders illustrated at 1803 and 1809 in FIG. 18, 1703 and 1709 in FIG. 17 and as will be illustrated at 2003 and 2009 in FIG. 20A and 2103 and 2109 in FIG. 21A In other words, the odd encoder and even encoder are rate ⅔, nonsystematic, convolutional recursive encoders. Other types of encoders may however be used, and types may be mixed and matched as desired.

FIGS. 17 through 21 are encoding arrangements that utilize the same basic encoder as illustrated in FIG. 5. In FIG. 19, encoders 1903 and 1909 are illustrated as separate encoders for conceptual purposes. Those skilled in the art will realize that a single encoder may be used and may be time-shared. FIG. 17 through FIG. 21 are conceptual type FIGURES and are FIGURES that represent general concepts. They depict the general concept accurately regardless of the particular implementation of circuitry chosen. In the rate ¾ encoder of FIG. 19, the input tuples $T_0$, $T_1$ (and all other input tuples to the encoder of FIG. 19) comprise 3 bits. Since encoders 1903 and 1909 are rate ⅔ encoders with 2 input bits, then only 2 bits can be accommodated at a particular time. Accordingly, bit $\underline{b}_2$ of tuple $T_0$ and bit $\underline{b}_5$ of tuples $T_1$ bypass the encoders completely. $\underline{b}_5$ is concatenated to the output of odd encoder 1903, i.e. $c_3$, $c_4$ and $c_5$ the combination of encoder tuple $c_3$, $c_4$, $c_5$ and $\underline{b}_5$ are then provided to mapper 1911 which maps the output according to map 2. Map 2 is illustrated in FIG. 24. Similarly, the output of even encoder 1909, comprising encoded bits $c'_0$, $c'_1$ and $c'_2$, is combined with bit $\underline{b}_2$ of input tuple $T_0$ and then the combination of $\underline{b}_2$, $c'_0$, $c'_1$, $c'_2$ is provided to mapper 1911. In such a way the three bits of encoded tuples are converted into four bits for mapping in mapper 1911. The four bits mapped comprise the three encoded bits from either the odd or even encoder plus a bit from the input tuple which has by passed both encoders.

FIG. 20A is a graphical illustration of a rate ⅚ TTCM encoder, having constituent ⅔ rate basic encoders, according to an embodiment of the invention. In FIG. 20A the input tuples $T_0$ and $T_1$ are illustrated at 2001. Input tuple $T_0$ comprises five bits, $b_0$ through $b_4$. Input tuple $T_1$ also comprises five bits, $b_5$ through $b_9$. $\underline{b}_4$ of tuple $T_0$ and $\underline{b}_9$ of tuple $T_1$ are underlined to illustrate that they do not pass through either encoder. The odd encoder 2003 accepts $b_0$ and $b_1$ during a first encoder clock time during which even encoder 2009 is accepting interleaved bits $i_0$ and $i_1$. Bits $i_0$ and $i_1$ are the outputs of the interleaver 2005 that correspond to the same time during which inputs $b_0$ and $b_1$ are accepted from the odd encoder. Similarly, the odd encoder 2003 is accepting bits $b_2$ and $b_3$ at a time when the even encoder 2009 is accepting bits $i_2$ and $i_3$. Similarly, input tuple $T_1$, is separated into 2 bit encoder input tuples because the constituent encoders are rate ⅔ encoders which accept 2 bits input and produce three encoded bits out. Because each input tuple 2001 is five bits and because each encoder allows only a 2 bit input, input tuple $T_0$ is separated into encoder tuple $b_0$ and $b_1$ and encoder tuple $b_2$ and $b_3$. The encoder therefore, must process two encoder input tuples for each input tuple 2001. Therefore, a single input tuple 2001 will require two encoder clocks for processing. The even encoder 2009 encodes tuple $i_0$ and $i_1$ and produces corresponding output code bits $c'_0$, $c'_1$ and $c'_2$ After processing $i_0$ and $i_1$ the even encoder 2009 processes $i_2$ and $i_3$. The output of even encoder 2009, which corresponds to input bits $i_2$ and $i_3$ is $c'_3$, $c'_4$ and $c'_5$. The odd encoder 2003 processes a first tuple $b_0$ and $b_1$ and then processes a second tuple $b_2$ and $b_3$. Tuple $b_0$ and $b_1$ are accepted by encoder 2003 which produces a corresponding encoded 3 bit tuple $c_0$, $c_1$ and $c_2$. After accepting $b_0$ and $b_1$, the odd encoder 2003 accepts second tuple $b_2$ and $b_3$ and produces a corresponding output $c_3$, $c_4$, and $c_5$. Encoder output $c'_0$, $c'_1$ and $c'_2$ corresponding to encoder tuple $i_1$ and $i_0$ are provided to mapper 2011. Mapper 2011 uses map 0 to map $c'_0$, $c'_1$ and $c'_2$. Subsequently to producing $c'_0$, $c'_1$ and $c'_2$ even encoder 2009 accepts $i_2$ and $i_3$ and produces output $c_3$, $c_4$, and $c_5$. Instead of selecting $c_3$, $c_4$, $c_5$ to be mapped, uncoded bit $\underline{b}_4$ is combined with interleaved bits $i_2$ and $i_3$ and selected. $i_2$, $i_3$ and $b_4$ are then accepted by mapper 2011, which employs map 1 to map bits $i_2$, $i_3$ and $\underline{b}_4$. Therefore, with respect to the overall input tuple $T_0$ five bits are input into the TTCM encoder 2000 and six bits are passed to mapper 2011. In other words, a coding rate of ⅚ is generated. Similarly, odd encoder 2003 encodes bits $b_5$ and $b_6$ and produces coded bits $c_6$, $c_7$ and $c_8$. Subsequently odd encoder 2003 encodes bits $b_7$ and $b_8$ and produces coded bits $c_9$, $c_{10}$ and $c_{11}$. $c_6$, $c_7$ and $c_8$ are passed to the encoder 2001 as is where they are mapped using map 0. Encoded bit $c_9$, $c_{10}$ and $c_{11}$, however, are punctured, i.e. they are dropped and instead bits $b_7$, $b_8$ and $\underline{b}_9$ are substituted. $b_7$, $b_8$ and $\underline{b}_9$ are passed to encoder 2011 which uses map 1 to map $b_7$, $b_8$, and $\underline{b}_9$. A graphical illustration of map 0 can be found in FIG. 22 and a graphical illustration of Map 1 can be found in FIG. 23. In the manner just described, a rate ⅚ TTCM encoder is realized from two component rate ⅔ encoders. Interleaver 2005 is similar to interleaver 1705, 1805, 1905, 2005 and 2105 which also are even/odd or modulo-2 type interleavers. Other modulo interleavers, just as with all other embodiments illustrated in FIG. 17 through FIG. 21, can be realized by adding additional interleavers and encoders and by selecting outputs and uncoded bits in a straight format manner similar to that illustrated in FIG. 20A.

FIG. 20B represents an alternate encoding that will yield the same coding rate as FIG. 20A.

Figure 21A:
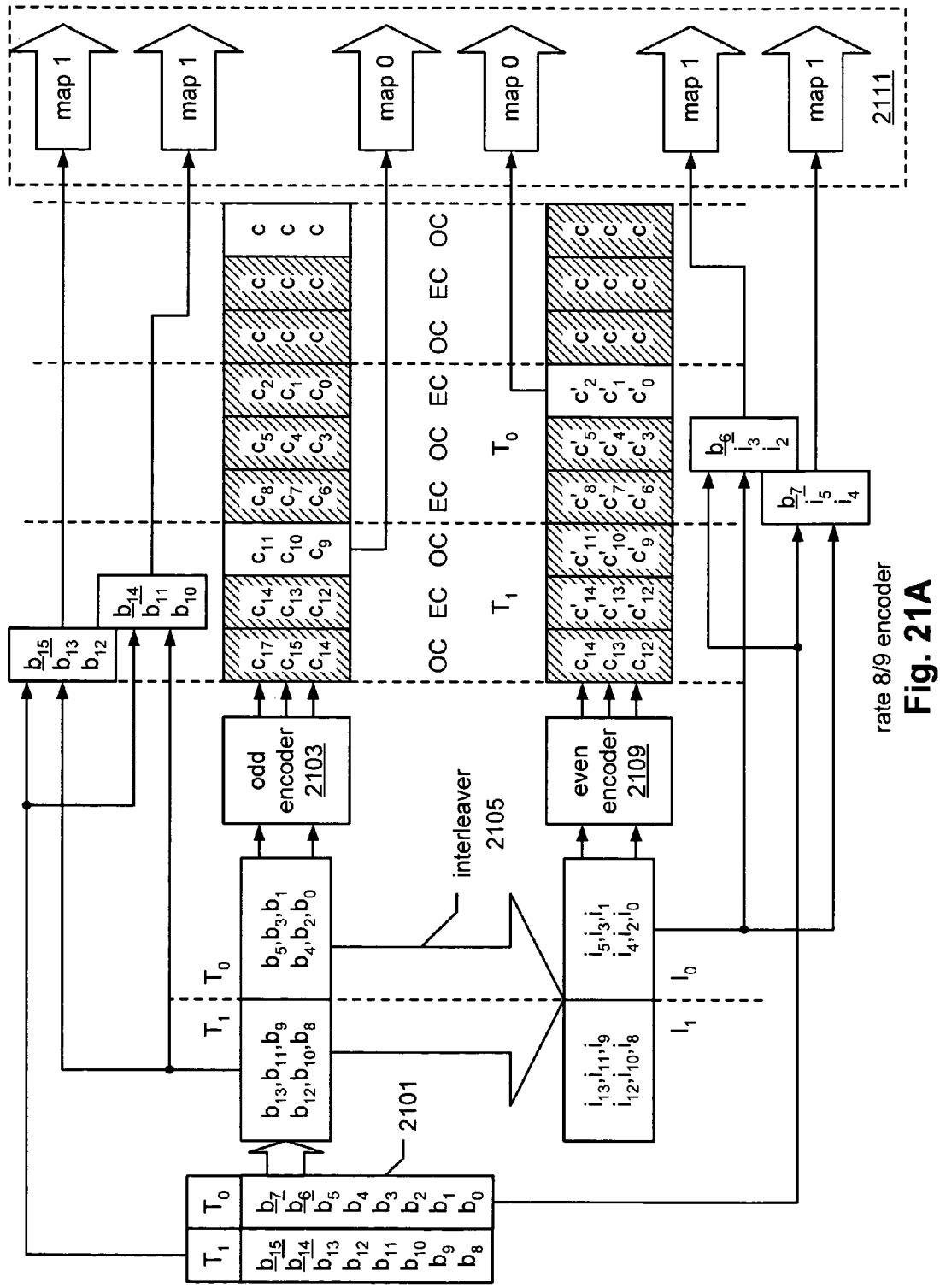
FIG. 21A is a graphical illustration of a rate ⅚ TTCM encoder, with constituent ⅔ rate encoders, according to an embodiment of the invention.

FIG. 21A is a graphical illustration of a rate 8/9 TTCM encoder realized using constituent rate ⅔ encoder, according to an embodiment of the invention. To illustrate the functioning of TTCM rate 8/9 encoder 2100 two sequential input tuples $T_0$ and $T_1$, illustrated at 2101, will be considered. Since the constituent encoders are rate ⅔ having two bits as input and three bits as output, the input tuples will have to be subdivided into encoder tuples. In other words, the input tuples will be divided into tuple pairs which can be accepted by odd encoder 2103 and even encoder 2109. Odd encoder 2103 accepts tuple pair $b_0$ and $b_1$, pair $b_2$ and $b_3$, pair $b_4$ and $b_5$, pair $b_8$ and $b_9$, pair $b_{10}$ and $b_{11}$, and pair $b_{12}$ and $b_{13}$ sequentially, since the basic ⅔ rate encoder can only accept one pair of input bits at a time. Even encoder correspondingly accepts input pairs $i_0$ and $i_1$, input pair $i_2$ and $i_3$, input pair $i_4$ and $i_5$, input pair $i_8$ and $i_9$, input pair $i_{10}$ and $i_{11}$, and input pair $i_{12}$ and $i_{13}$ sequentially. The pairs accepted by the even encoder correspond to tuple pairs having the same numbering accepted by the odd encoder at the same time. That is $i_0$ and $i_1$ are accepted by the even encoder 2109 during the same time period as input pair $b_0$ and $b_1$ is accepted by the odd encoder 2103. Odd and even encoders then produce encoded outputs from the input pairs accepted. Even encoder 2909 produces a first encoded output triplet $c'_0$, $c'_1$ and $c'_2$ followed by a second output triplet $c'_3$, $c'_4$ and $c'_5$ followed by a third output triplet $c'_6$, $c'_7$ and $c'_8$ (a triplet is a 3 bit tuple). The first output triplet $c'_0$, $c'_1$ and $c'_2$ is accepted by the mapper 2111. The mapper 2111 utilizes map 0 to map encoded output $c'_0$, $c'_1$ and $c'_2$. Encoded output bits $c'_3$, $c'_4$ and $c'_5$ however are punctured, that is not sent to the mapper. Instead of sending $c'_3$, $c'_4$ and $c'_5$ to the mapper 2111 the triplet of bits comprising $i_2$, $i_3$ and $\underline{b}_6$ are sent to the mapper 2111. The mapper 2111 utilizes map 1 as the mapping for the triplet $i_2$, $i_3$, $b_6$. Encoded triplet $c'_6$, $c'_7$ and $c'_8$ is also punctured. That is, it is not sent to the mapper 2111. Instead, $i_4$, $i_5$ and $\underline{b}_7$ is sent to the mapper 2111 which uses map 1 to map input triplet $i_4$, $i_5$ and $\underline{b}_7$. Because eight bits corresponding to tuple $T_0$ are accepted by the even encoder 2109 and nine bits are output into the mapper 2111 the overall encoder 2100 is a rate 8/9 encoder. Similarly, input tuple $T_1$ is encoded by the odd encoder 2103. The output triplet from the odd encoder $c_9$, $c_{10}$ and $c_{11}$ corresponds to input tuple $b_8$ and $b_9$. Next, odd encoder 2103 produces an encoded output triplet $c_{12}$, $c_{13}$ and $c_{14}$, which is an output triplet corresponding to input pair $b_{10}$ and $b_{11}$. Subsequently odd encoder 2103 produces output triplet $c_{15}$, $c_{16}$ and $c_{17}$. Output triplet $c_{15}$, $c_{16}$ and $c_{17}$ corresponds to input pair $b_{12}$ and $b_{13}$. Output triplet $c_9$, $c_{10}$ and $c_{11}$ are sent to the mapper 2111 which uses map 0 to map output triplet $c_9$, $c_{10}$ and $c_{11}$. Output triplet $c_{12}$, $c_{13}$ and $c_{14}$ however is punctured and in its place $b_{10}$, $b_{11}$ and $\underline{b}_{14}$ is sent to mapper 2111 where map 1 is employed to map the input triplet $b_{10}$, $b_{11}$ and $\underline{b}_{14}$. The encoder triplet $c_{15}$, $c_{16}$ and $c_{17}$ is also punctured and a triplet comprising $b_{12}$, $b_{13}$ and $\underline{b}_{15}$ is provided to mapper 2111. Map 1 is used to map the input triplet $b_{12}$, $b_{13}$ and $\underline{b}_{15}$. In the manner just described an ⅝ encoder is fabricated from two constituent rate ⅔ encoder.

From the foregoing TTCM encoder examples of FIG. 17 through FIG. 21 it is seen that the basic rate ⅔ encoders can be used in a variety of configurations to produce a variety of coding rates.

The basic constituent encoders illustrated in FIG. 17 through FIG. 21 are rate ⅔, nonsystematic, convolutional recursive encoders. These illustrations represent a few examples. Different types of encoders and even different rates of encoders may yield many other similar examples. Additionally, encoder types can be mixed and matched; for example, a recursive nonsystematic convolution encoder may be used with a nonrecursive systematic block encoder.

Additionally, the interleavers illustrated in FIG. 17 through FIG. 21 are modulo-2 (even/odd) ST interleavers. Those skilled in the art will realize that IT type interleavers may be used alternatively in the embodiments of the invention illustrated in FIG. 17 through FIG. 21.

Additionally the TTCM encoders illustrated in FIG. 17 through FIG. 21 may employ modulo-N encoding systems instead of the modulo-2 (even/odd) encoding systems illustrated. For example, each of the constituent encoder—modulo-2 interleaver subsystems may be replaced by modulo-N subsystems such as illustrated in FIG. 8A. By maintaining the same type puncturing and selecting with each encoder as displayed with the even/odd encoders of FIG. 17 through FIG. 21 and extending it to modulo-N systems, such as illustrated in FIG. 8A, the same coding rates can be maintained in a modulo-N system for any desired value N.

Figure 21B:
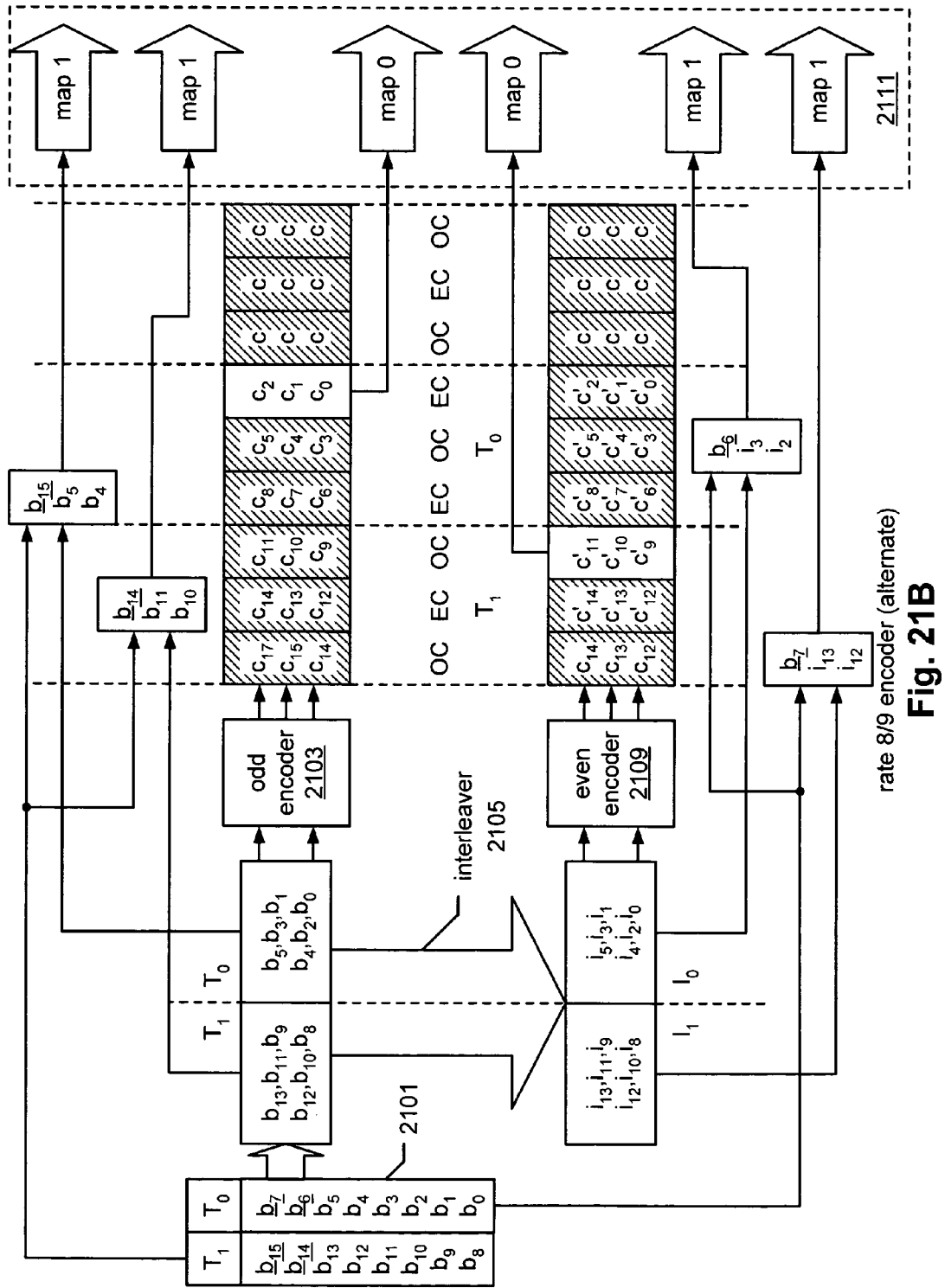
FIG. 21B is a graphical illustration which represents an alternate encoding that will yield the same coding rate as FIG. 21A.

FIG. 21B represents an alternate encoding that will yield the same coding rate as FIG. 21A.

Figure 22:
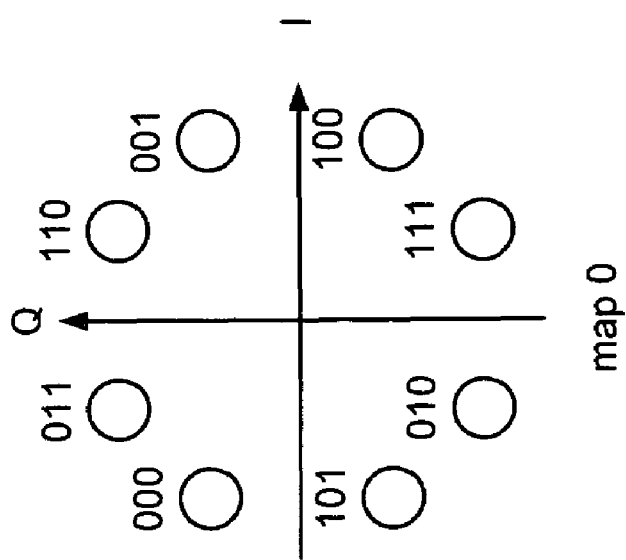
FIG. 22 is a graphical illustration of map 0 according to an embodiment of the invention.

FIG. 22 is a graphical illustration of map 0 according to an embodiment of the invention. Map 0 is used in the implementation of the rate ⅔ encoder as illustrated in FIG. 17. Map 0 is also utilized in rate ⅚ encoder illustrating in FIG. 20A and rate ⅝ encoder illustrated in FIG. 21A.

Figure 23:
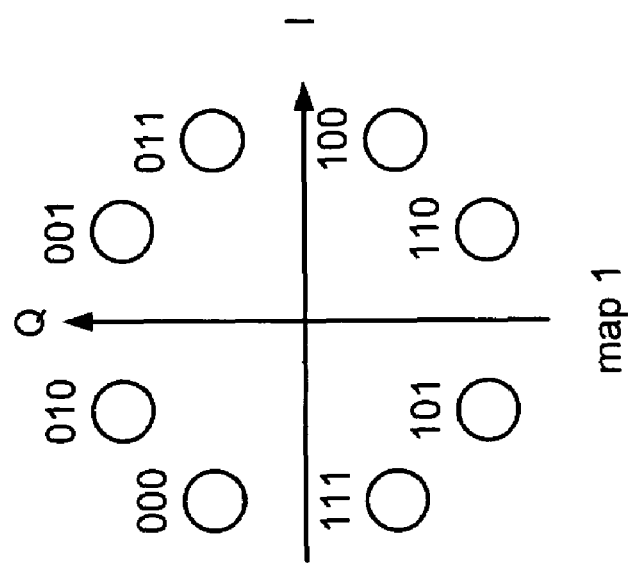
FIG. 23 is a graphical illustration of map 1 according to an embodiment of the invention.

FIG. 23 is a graphical illustration of map 1 according to an embodiment of the invention. Map 1 is used by the mapper in the rate ⅚ encoder in FIG. 20A, and in the mapper in the rate ⅝ encoder in FIG. 21A.

FIG. 24 is a graphical illustration of map 2 according to an embodiment of the invention. Map 2 is utilized in the fabrication of the rate ¾ encoder as illustrated in FIG. 19.

FIG. 25 is a graphical illustration of map 3 according to an embodiment of the invention. Map 3 is used in the rate ½ encoder as depicted in FIG. 18.

Maps 0 through 3 are chosen through a process different from the traditional approach of performing an Ungerboeck mapping (as given in the classic work "Channel Coding with Multilevel/Phase Signals" by Gottfried Ungerboeck, IEEE Transactions on Information Theory Vol. 28 No. 1 January 1982). In contrast in embodiments of the present invention, the approach used to develop the mappings was to select non Ungerboeck mappings, then to measure the distance between the code words of the mapping. Mappings with the greatest average effective distance are selected. Finally the mappings with the greatest average effective distance are simulated and those with the best performance are selected. Average effective distance is as described by S. Dolinar and D. Divsalar in their paper "Weight Distributions for Turbo Codes Using Random and Non-Random Permeations," TDA progress report 42-121, JPL, August 1995.

Figure 26:
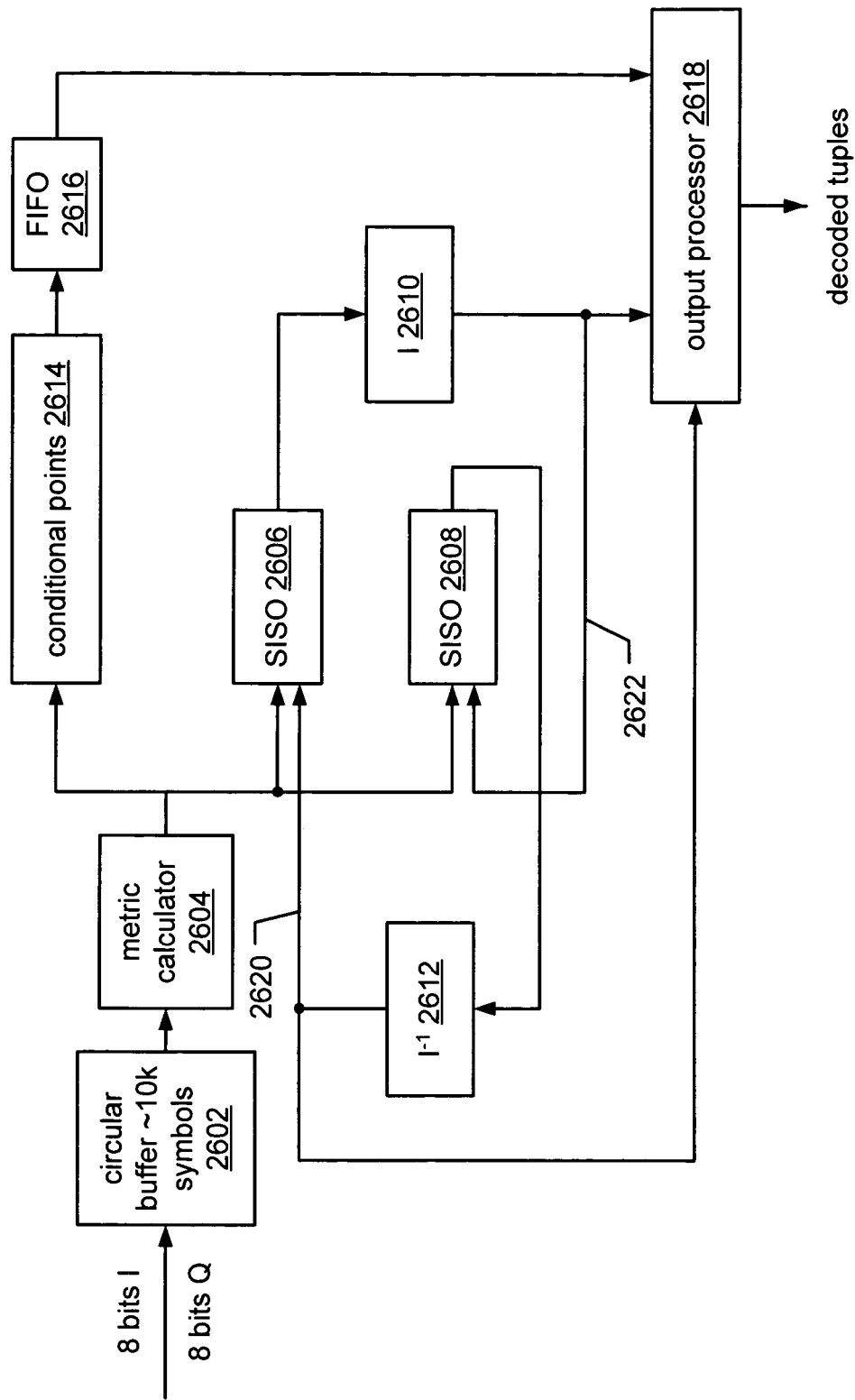
FIG. 26 is a block diagram of a modulo-2 (even/odd) TTCM decoder according to an embodiment of the invention.

FIG. 26 is a TTCM decoder according to an embodiment of the invention. FIG. 26 illustrates a block diagram of the TTCM decoder corresponding to the TTCM encoder described above. The TTCM decoder includes a circular buffer 2602, a metric calculator module 2604, two soft-in soft-out (SISO) modules 2606, 2608, two interleavers 2610, 2612, a conditional points processing module 2614, a first-in first-out (FIFO) register 2616, and an output processor 2618.

The TTCM decoder of FIG. 26 implements a MAP (Maximum A Posteriori) probability decoding algorithm.

The MAP Algorithm is used to determine the likelihood of the possible particular information bits transmitted at a particular bit time.

Turbo decoders, in general, may employ a SOVA (Soft Output Viterbi Algorithm) for decoding. SOVA is derived from the classical Viterbi Decoding Algorithm (VDA). The classical VDA takes soft inputs and produces hard outputs a sequence of ones and zeros. The hard outputs are estimates of values, of a sequence of information bits. In general, the SOVA Algorithm takes the hard outputs of the classical VDA and produces weightings that represent the reliability of the hard outputs.

The MAP Algorithm, implemented in the TTCM decoder of FIG. 26, does not produce an intermediate hard output representing the estimated values of a sequence of transmitted information bits. The MAP Algorithm receives soft inputs and produces soft outputs directly.

The input to the circular buffer i.e. input queue 2602 is a sequence of received tuples. In the embodiments of the invention illustrated in FIG. 26, each of the tuples is in the form of 8-bit in-phase (I) and 8-bit quadrature (Q) signal sample where each sample represents a received signal point or vector in the I-Q plane. The circular buffer 2602 outputs one tuple at a time to the metric calculator 2604.

The metric calculator 2604 receives I and Q (In-phase, Quadrature) values from the circular buffer 2602 and computes corresponding metrics representing distances form each of the 8 members of the signal constellation (using a designated MAP) to the received signal sample. The metric calculator 2604 then provides all eight distance metrics (soft inputs) to the SISO modules 2606 and 2608. The distance metric of a received sample point from each of the constellation points represents the log likelihood probability that the received sample corresponds to a particular constellation point. For rate ⅔, there are 8 metrics corresponding to the points in the constellation of whatever map is used to encode the data. In this case, the 8 metrics are equivalent to the Euclidean square distances between the value received and each of the constellation whatever map is used to encode the data.

SISO modules 2606 and 2608 are MAP type decoders that receive metrics from the metric calculator 2604. The SISOs then perform computations on the metrics and pass the resulting A Posteriori Probability (APoP) values or functions thereof (soft values) to the output processor 2618.

The decoding process is done in iterations. The SISO module 2606 decodes the soft values which are metrics of the received values of the first constituent code corresponding to the constituent encoder for example 1703 (FIG. 17). The SISO module 2608 decodes the soft values which are the APoP metrics of the received values of the second constituent code corresponding to the constituent encoder for example 1709 (FIG. 17). The SISO modules simultaneously process both codes in parallel. Each of the SISO modules computes the metrics corresponding to the input bits for every bit position of the in the block of 10K tuples (representing a exemplary block of date), and for each of the trellis states that the corresponding encoder could have been in.

One feature of the TTCM decoder is that, during each iteration, the two SISO modules 2606, 2608 are operating in parallel. At the conclusion of each iteration, output from each SISO module is passed through a corresponding interleaver and the output of the interleaver is provided as updated or refined A Priori Probability (APrP) information to the input of other cross coupled SISO modules for the next iteration.

After the first iteration, the SISO modules 2706, 2708 produce soft outputs to the interleaver 2610 and inverse interleaver 2612, respectively. The interleaver 2610 (respectively, inverse interleaver 2612) interleaves the output from the SISO module 2606 (respectively, 2608) and provides the resulting value to the SISO module 2608 (respectively, 2606) as a priori information for the next iteration. Each of the SISO modules use both the metrics from the metric calculator 2604 and the updated APrP metric information from the other cross coupled SISO to produce a further SISO Iteration. In the present embodiment of the invention, the TTCM decoder uses 8 iterations in its decoding cycle. The number of iterations can be adjusted in firmware or can be changed depending on the decoding process.

Because the component decoders SISO 2606 and 2608 operate in parallel, and because the SISO decoders are cross coupled, no additional decoders need to be used regardless of the number of iterations made. The parallel cross coupled decoders can perform any number of decoding cycles using the same parallel cross coupled SISO units (e.g. 2606 and 2608).

At the end of the 8 iterations the iteratively processed APoP metrics are passed to the output processor 2618. For code rate ⅔, the output processor 2618 uses the APoP metrics output from the interleaver 2610 and the inverse interleaver 2612 to determine the 2 information bits of the transmitted tuple. For code rate ⅚ or ⅞, the output from the FIFO 2616, which is the delayed output of the conditional points processing module 2614, is additionally needed by the output processor 2618 to determine the uncoded bit, if one is present.

For rate ⅔, the conditional points processing module 2614 is not needed because there is no uncoded bit. For rate ⅚ or ⅞, the conditional points processing module 2614 determines which points of the received constellation represent the uncoded bits. The output processor 2618 uses the output of the SISOs and the output of the conditional points processor 2614 to determine the value of the uncoded bit(s) that was sent by the turbo-trellis encoder. Such methodology of determining the value of an uncoded bit(s) is well known in the art as applied to trellis coding.

Figure 27:
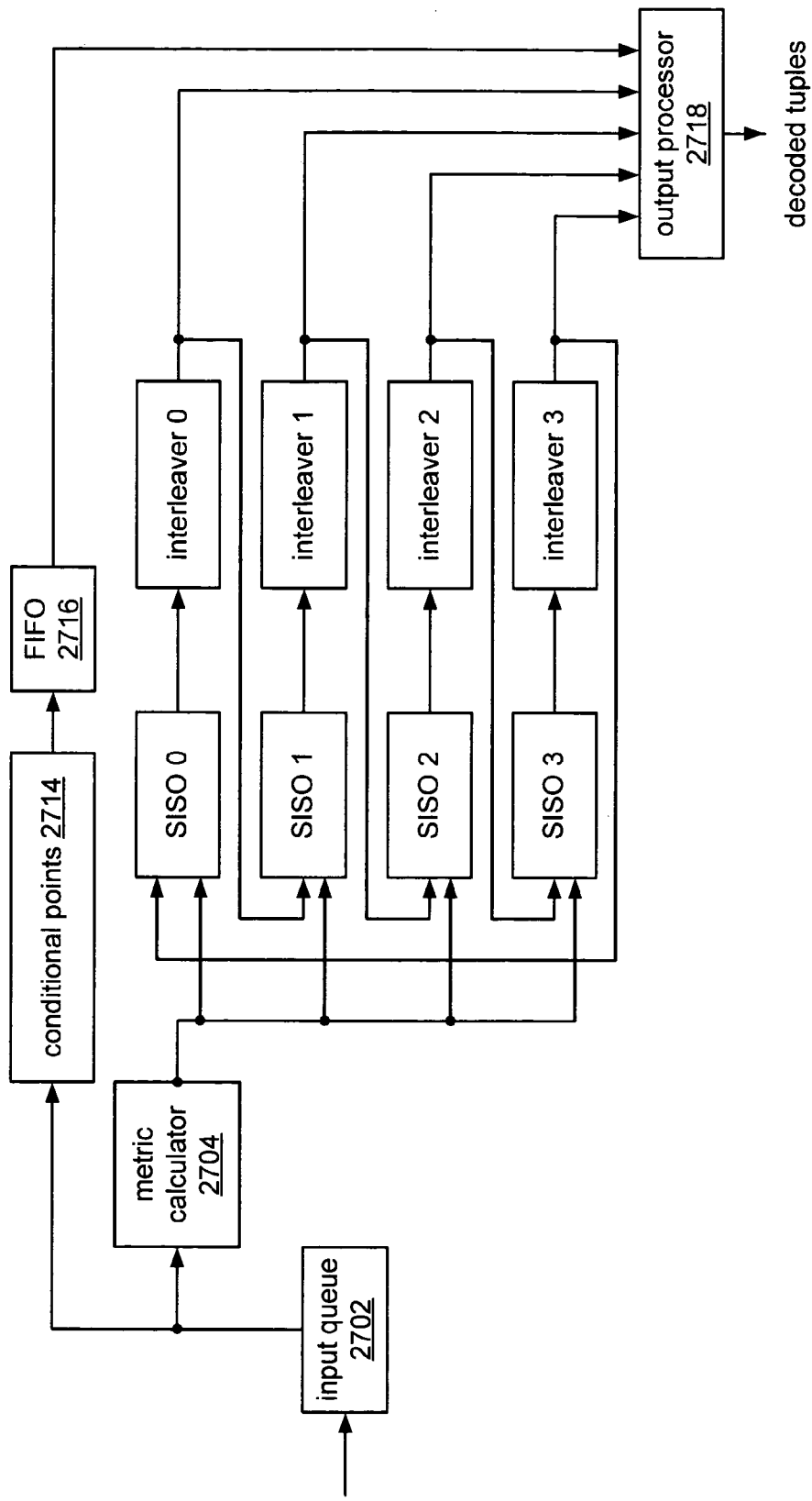
FIG. 27 is a TTCM modulo-4 decoder according to an embodiment of the invention.

FIG. 27 is a TTCM modulo-4 decoder according to an embodiment of the invention. The modulo four decoder of FIG. 27 is similar to the modulo-2 decoder illustration in FIG. 26. The functions of the input queue 2802, metric calculator 2804, conditional points processor 2814, and first in first out (FIFO) 2816 are similar to their counterparts in FIG. 26. The signals that will be decoded by the TTCM modulo-4 decoder FIG. 27 is one that has been coded in a modulo-4 interleaving system. Therefore, instead of having merely even and odd SISOs and interleavers, SISO 0, 1, 2 and 3 are used as are interleaver 0, 1, 2 and 3. Because the data has been encoded using a modulo-4 interleaving system, SISOs 0, 1, 2 and 3 can operate in parallel using interleaver 0, 1, 2 and 3. Once the SISOs 0 through 3 have processed through the points corresponding to the metrics of the points received in the input queue, the points can then be passed on to output process 2818. Output process 2818 will then provide decoded tuples.

Figure 28:
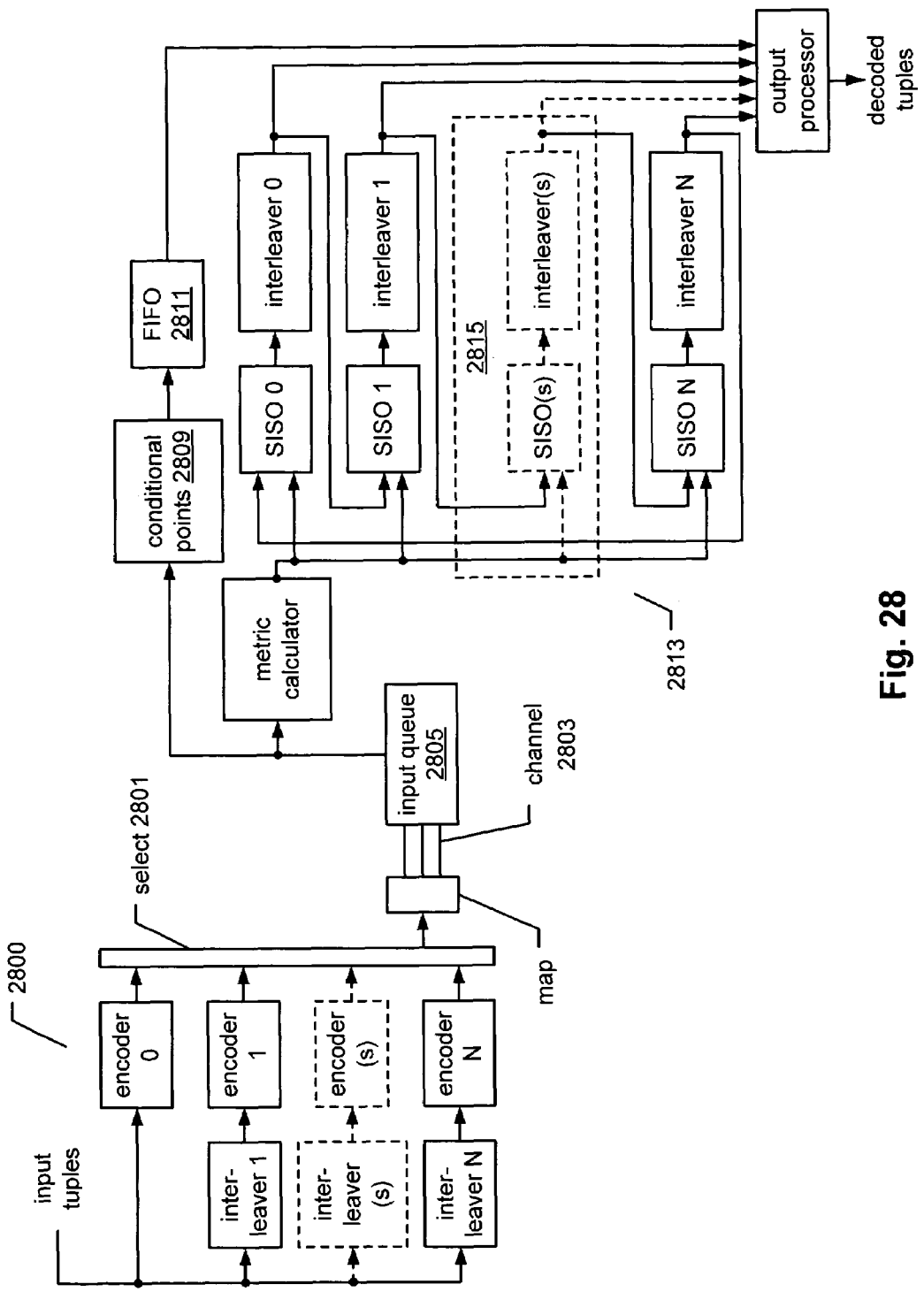
FIG. 28 is a graphical illustration of a modulo-N encoder/decoder system according to an embodiment of the invention.

FIG. 28 is a graphical illustration of a modulo-N and encoding and decoding system according to an embodiment of the invention. In FIG. 28, the encoder 2800 is a modulo-N encoder. The modulo-N encoder illustrated has N encoders and N−1 interleavers. The selector, 2801 selects encoded tuples sequentially from the output of encoders 0 through N. Selector 2801 then passes the selection onto the mapper which applies the appropriate mapping. The appropriately mapped data is then communicated over a channel 2803 to an input queue 2805. The functions of input 2805, metric calculator 2807, conditional points processor 2809 and FIFO 2811 are similar to those illustrated in FIG. 26 and 2478. The decoder 2813 has N SISOs corresponding to the N encoders. Any desired amount of parallelism can be selected for the encoder decoder system with the one caveat that the modulo-N decoding must match the modulo-N encoding. By increasing the modulo of the system, more points which have been produced by the metric calculator 2807 can be processed at the same time.

SISOs 0 through N process the points provided by the metric calculator in parallel. The output of one SISO provides A Priori values for the next SISO. For example SISO 0 will provide an A Priori value for SISO 1, SISO 1 will provide an A Priori value for SISO 2, etc. This is made possible because SISO 0 implements a Map decoding algorithm and processes points that have a modulo sequence position of 0 within the block of data being processed, SISO 1 implements a Map decoding algorithm and processes points that have a modulo sequence position of 1 within the block of data being processed, and so forth. By matching the modulo of the encoding system to the modulo of the decoding system the decoding of the data transmitted can be done in parallel. The amount of parallel processing available is limited only by the size of the data block being processed and the modulo of the encoding and decoding system that can be implemented.

Figure 29:
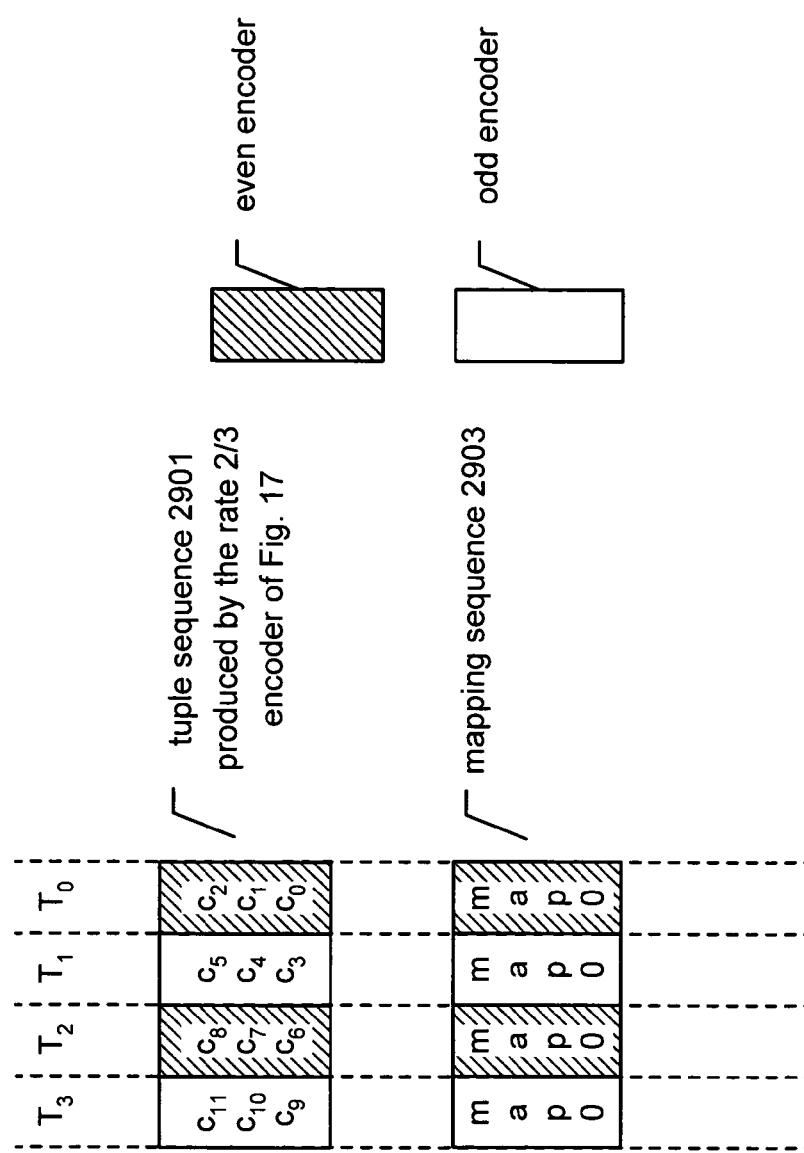
FIG. 29 is a graphical illustration of the output of the TTCM encoder illustrated in FIG. 17.

FIG. 29 is a graphical illustration of the output of the TTCM encoder illustrated in FIG. 17. FIG. 29 retains the same convention that C stands for a coded bit. The output of the TTCM encoder of FIG. 17 is represented by the sequences 2901 and 2903. The tuple sequence 2901 represents the actual output of rate ⅔rds encoder illustrated in FIG. 17. During a first time period $T_0$, bits $C_0$, $C_1$ are output from the encoder. The source of bits $C_0$, $C_1$ and $C_2$ represent 3 bits encoded by the even encoder 1709. These first 3 bits are mapped according to mapping sequence 2903. According to mapping sequence 2903 bits $C_0$, $C_1$ and $C_2$ are mapped using map 0 as illustrated in FIG. 22. Together the tuple sequence and mapping identify the type of output of the rate ⅔rds encoder illustrated in FIG. 17.

The tuple $C_3$, $C_4$ and $C_5$ is provided by the encoder of FIG. 17 immediately after the tuple comprising $C_0$, $C_1$ and $C_2$. The tuple $C_3$, $C_4$ and $C_5$ is been encoded in the odd encoder. The tuple sequence 2901 corresponding to time $T_1$ is the result of an encoding performed in the odd encoder 1703.

Figure 33:
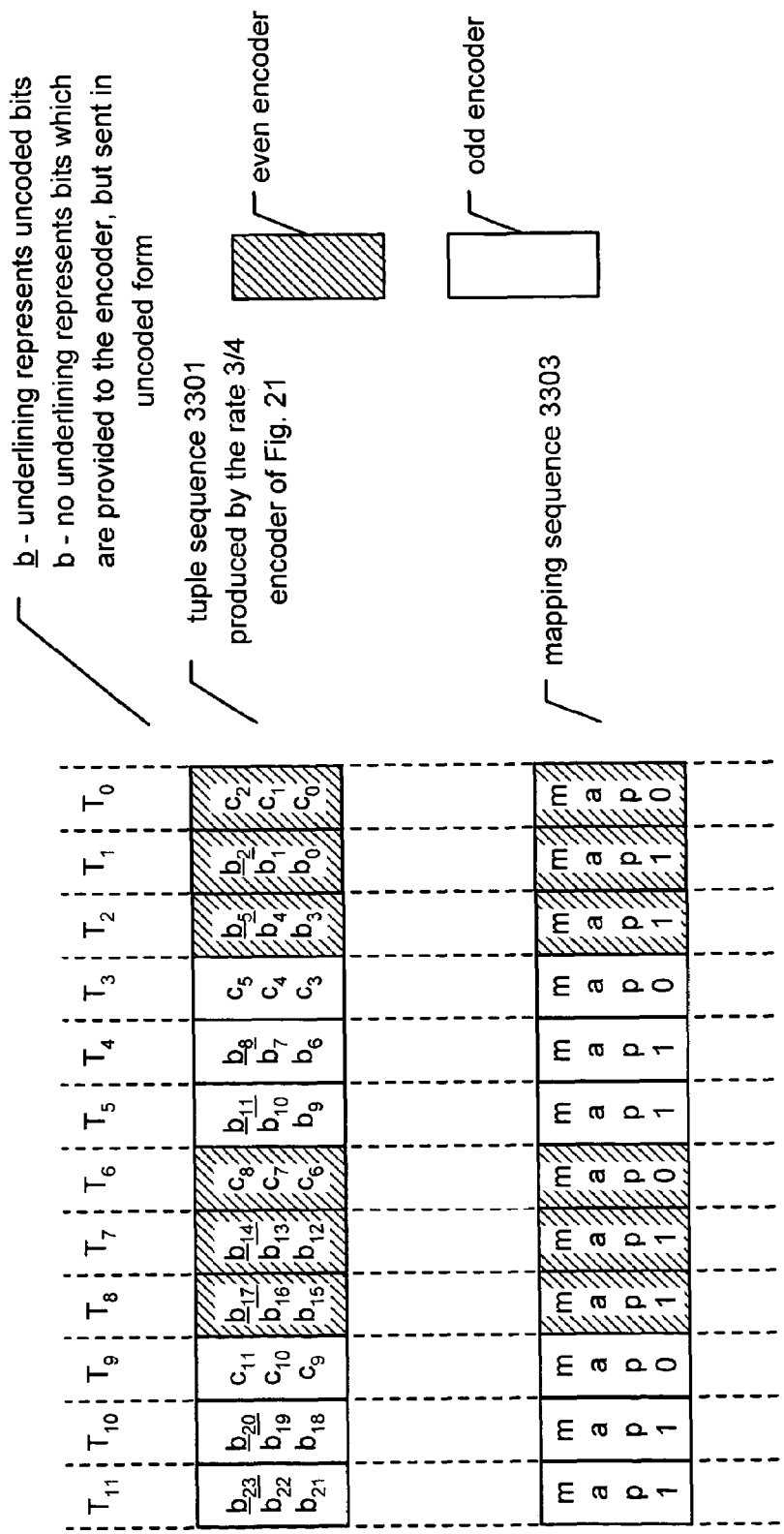
FIG. 33 is a chart defining the types of outputs produced by the ⅚ th encoder illustrated in FIG. 21A.

In FIG. 29 through and including FIG. 33 the following conventions are adopted. Even encoder outputs will be shaded a light gray. The odd encoder outputs have no shading. In such a way the tuple sequence which comprises the output of the corresponding TTCM encoder can be identified. The gray shading denotes that the tuple was encoded in the even constituent encoder, and the lack of shading indicates that the tuple was encoded in the odd convolutional constituent encoder. Additionally uncoded bits that are associated with the even encoder data stream are shaded.

A letter C will represent a coded bit which is sent and an underlined letter $\underline{B}$ will represent unencoded (or simply "uncoded") bits which have not passed through either constituent encoder and a B without the underline will represent a bit which is encoded, but transmitted in unencoded form.

In time sequence $T_2$ the TTCM output is taken from the even encoder, accordingly the bit $C_6$, $C_7$ and $C_8$ appear as a gray shaded tuple sequence indicating that they were encoded by the even encoder. At time T3 output tuple sequence 2901 comprises $C_9$, $C_{10}$ and $C_{11}$ which had been encoded by the odd encoder. All members of the tuple sequence for the rate ⅔rds encoder illustrated in FIG. 17 are mapped using map 0 as shown at mapping sequence 2903. The characterization of TTCM encoders output tuples using tuple sequence and mapping sequence will be used later when considering the decoding. For the present it is only necessary to realize that the combination of the tuple sequence and mapping sequence correspond to its type. The tuple type completely specifies the output of the TTCM encoder for the purposes of decoding.

Figure 18A:
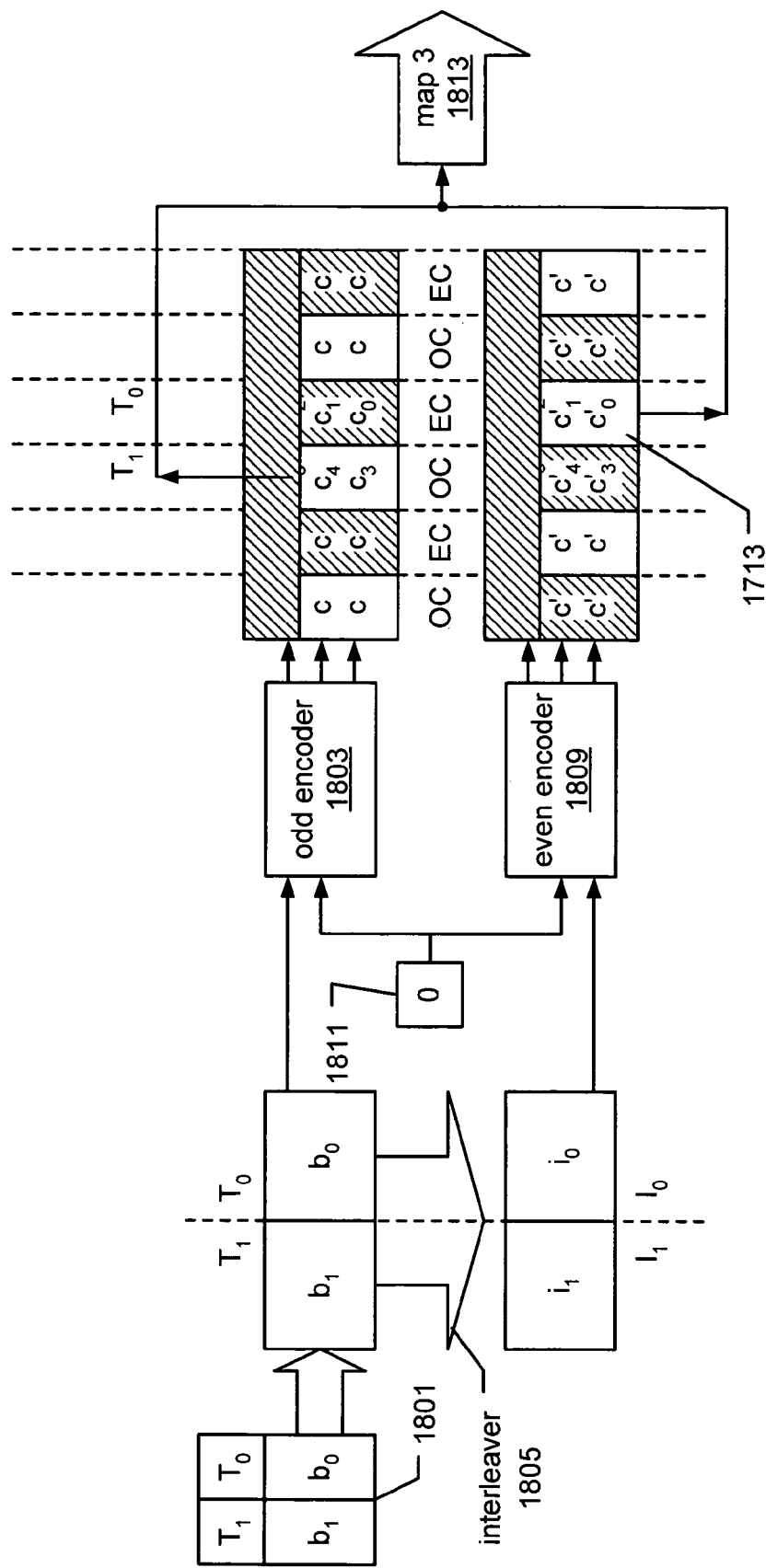
FIG. 18A is a graphical illustration of a rate ½ TTCM encoder, with constituent ⅔ rate encoders, according to an embodiment of the invention.
Figure 18C:
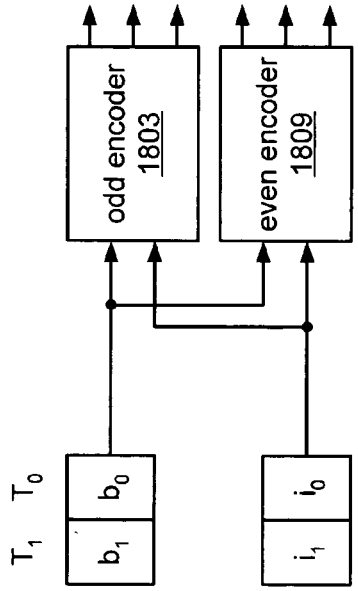
FIG. 18C is a graphical illustration of alternate configurations of the rate ½ TTCM encoder illustrated in FIG. 18A.
Figure 18E:
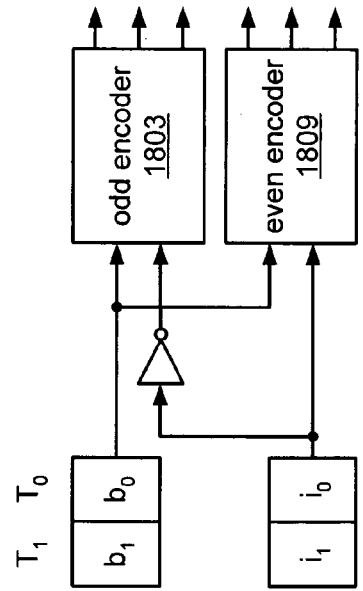
FIG. 18E is a graphical illustration of alternate configurations of the rate ½ TTCM encoder illustrated in FIG. 18A.
Figure 18B:
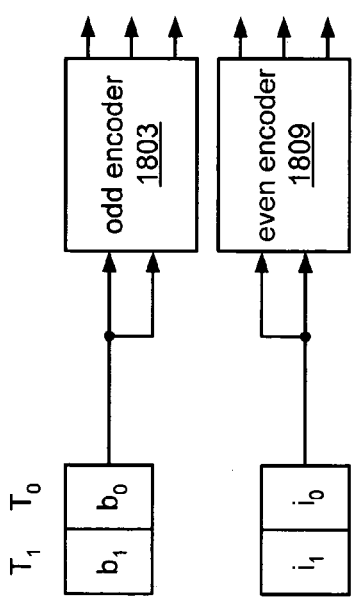
FIG. 18B is a graphical illustration of alternate configurations of the rate ½ TTCM encoder illustrated in FIG. 18A.
Figure 18D:
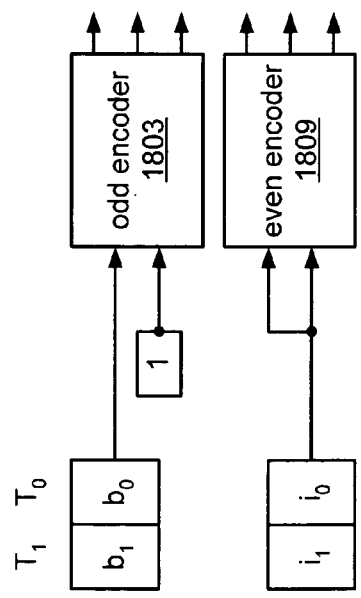
FIG. 18D is a graphical illustration of alternate configurations of the rate ½ TTCM encoder illustrated in FIG. 18A.
Figure 30:
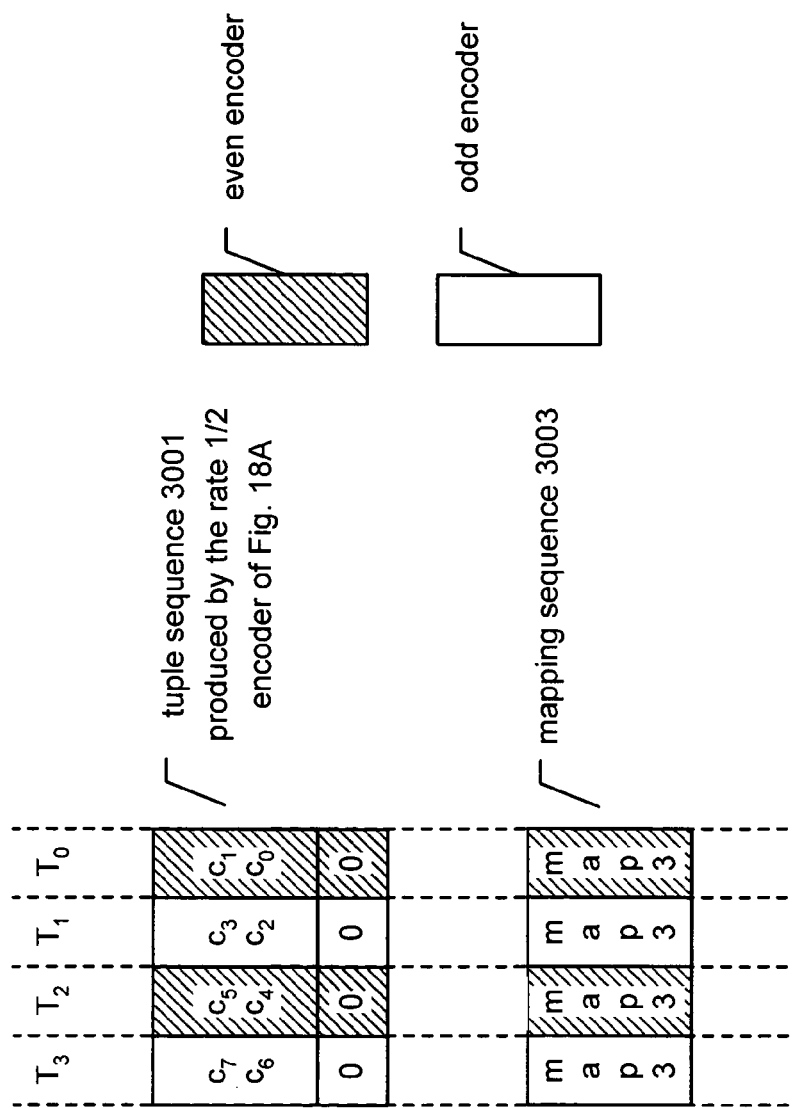
FIG. 30 is a graphical illustration of the tuple types produced by the TTCM encoder illustrated in FIG. 18A.

FIG. 30 is a graphical illustration of the tuple types produced by the TTCM encoder illustrated in FIG. 18A. The TTCM encoder illustrated in FIG. 18A is a rate ½ encoder. The rate ½ encoder illustrated in FIG. 18A produces output tuples comprising 2 bits. The first tuple pair $C_0$ and $C_1$, corresponding to output time $T_0$, is produced by the even encoder 1809 as indicated by the shading of the tuple. The next tuple corresponding to output time $T_1$ comprises coded bits $C_2$ and $C_3$ which have been encoded by the odd encoder 1809. Similarly, the tuple corresponding to time $T_2$ is produced by the even encoder and the tuple corresponding to time $T_3$ is produced by the odd encoder. All tuple sequences 3001 are mapped using to map 0 as shown by the mapping sequence 3003. The combination of tuple sequence 3001 and mapping sequence 3003 comprise the type of the tuple produced by the rate ½ TTCM encoder of FIG. 18A. The type of tuples produced by the TTCM encoder of FIG. 18A will be useful for the purposes of decoding the output tuples.

Figure 31:
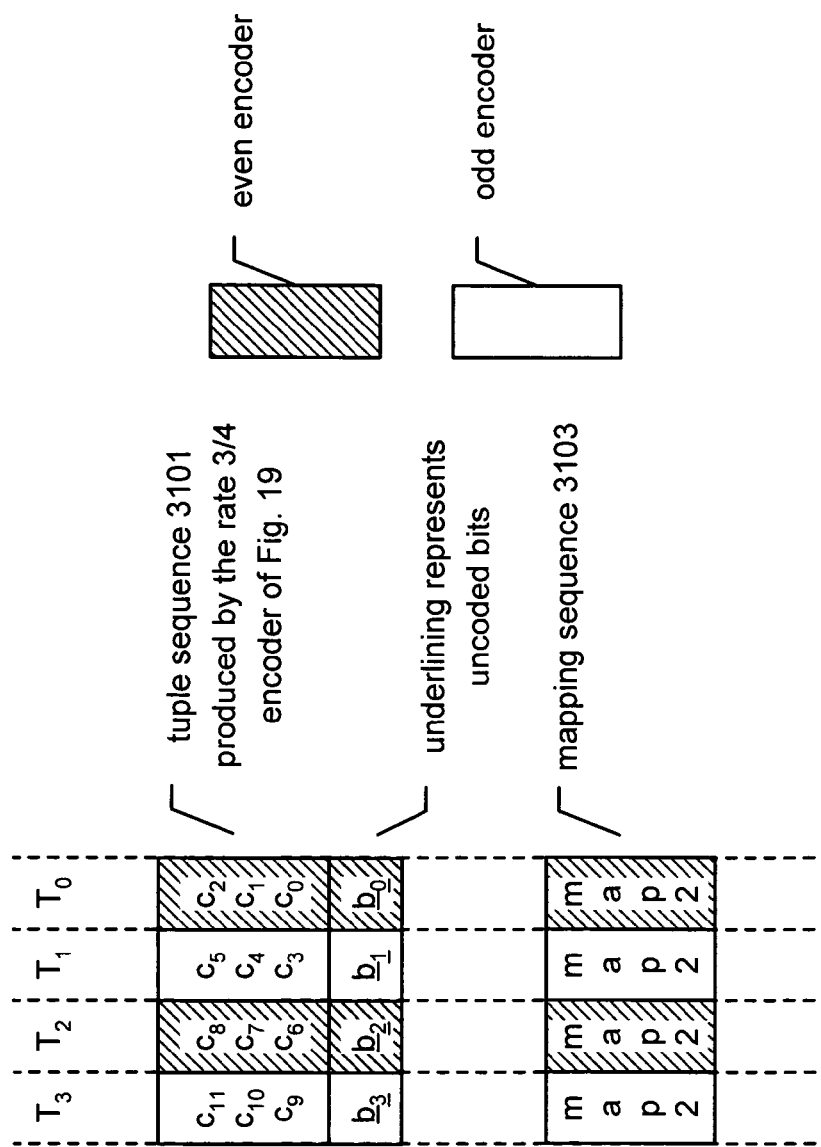
FIG. 31 is a graphical illustration illustrating the tuple types produced by the rate ¾ encoders of FIG. 19.

FIG. 31 is a graphical illustration illustrating the tuple types produced by the rate ¾ encoder of FIG. 19. The tuple sequence 3101, representing the output of the TTCM encoder of FIG. 19 is a sequence of 4 bit tuples. The output tuple corresponding to time $T_0$ is 4 bits. $C_0$, $C_1$, $C_2$ and unencoded bit $\underline{B}_0$. Tuple sequence corresponding to time $T_0$ is mapped by map 2 as shown by mapping sequence 3103. Additionally, the tuple sequence 3101 during time $T_0$ is mapped by the even encoder, as illustrated by the shading. In other words, the uncoded bit $\underline{B}_0$ does not pass through either the even or odd encoder. It is however shown shaded as the tuple sequence, to which it is paired, is produced by the even encoder 1909.

Similarly, the tuple sequence corresponding to $T_2$ has been produced by the even encoder. The tuple sequence corresponding to time $T_2$, i.e. $C_6$, $C_7$ and $C_8$, are produced by even encoder 1909 and paired with unencoded bit $\underline{B}_2$. $C_6$, $C_7$ and $C_8$ are produced by the even encoder. Combination $C_6$, $C_7$, $C_8$ and $\underline{B}_2$ are mapped according to map 2 as illustrated in FIG. 24.

Similarly, the tuple sequences produced by the TTCM encoder of FIG. 19 during times $T_1$ and $T_3$ are produced by the odd encoder and combined with an uncoded bit. During time $T_1$ the odd encoder encodes $C_3$, $C_4$ and $C_5$. $C_3$, $C_4$ and $C_5$ along with $B_1$, are mapped in map 2. The tuple sequence produced during time $T_3$ is also a combination of the odd encoder and an encoded bit. As illustrated in FIG. 31 all tuple sequences are mapped using map 2.

Figure 32:
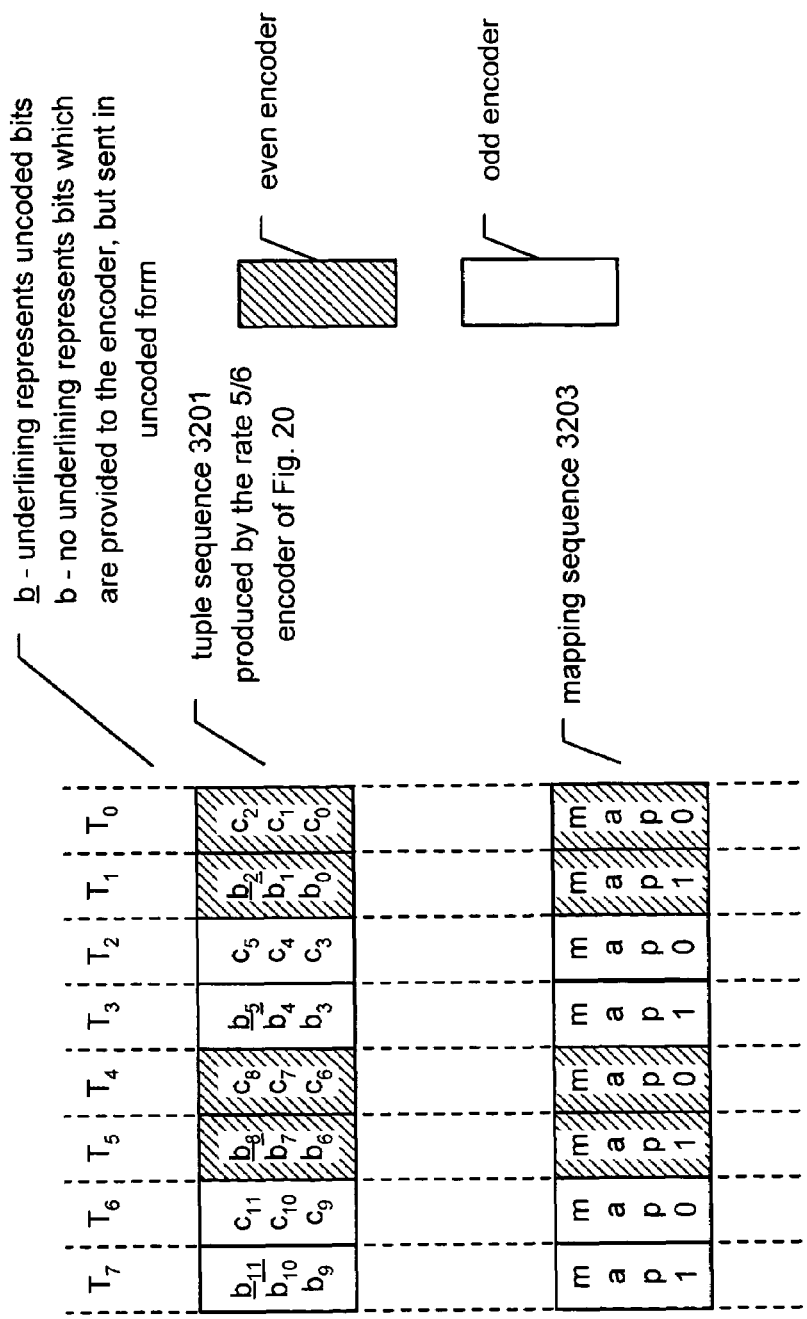
FIG. 32 is a graphical illustration of the tuple types produced by the rate ⅚ encoder illustrated in FIG. 20A.

FIG. 32 is a graphical illustration of the tuple types produced by the rate ⅚ encoder illustrated in FIG. 20A. The first tuple corresponding to time $T_0$ comprises coded bits $C_0$, $C_1$ and $C_2$. The coded bits $C_0$, $C_1$ and $C_2$ are mapped according to map 0. During time $T_1$, bits $B_0$, $B_1$ and $\underline{B}_2$ are produced by the encoder of FIG. 20A. $B_0$, $B_1$ and $B_2$ represent data that is sent uncoded they are however shown as being grayed out because bits $B_1$ and $B_0$ pass through the even encoder even though they are sent in uncoded form. The uncoded bits $B_0$, $B_1$ and $\underline{B}_2$ are mapped using map 1. Similarly, the output of the encoder at time $T_4$ comprises coded bits $C_6$, $C_7$ and $C_8$ which are mapped using map 0. During time period $T_5$ uncoded bits $B_6$, $B_7$ and $\underline{B}_8$ form the output of the encoder. $B_6$, $B_7$ and $\underline{B}_8$ are mapped using map 1.

During time period $T_2$, bits $C_3$, $C_4$ and $C_5$ are selected from the odd encoder as the output of the overall ⅚ encoder illustrated in FIG. 20A. Bits $C_3$, $C_4$ and $C_5$ are mapped in mapper 0 and form the turbo trellis coded modulated output. Similarly, during time $T_6$, bit $C_9$, $C_{10}$ and $C_{11}$ are selected from the odd encoder and mapped according to map 0. During time period $T_7$, uncoded bits $B_9$, $B_{10}$ and $B_{11}$ are selected as the output of the rate ⅚ encoder and are mapped according to map 1. The chart of FIG. 32 defines the types of output produced by the rate ⅚ encoder of FIG. 20A.

FIG. 33 is a chart defining the types of outputs produced by the ⅞th encoder illustrated in FIG. 21A All uncoded outputs are mapped according to map 1. All coded outputs are mapped according to map 0. During times $T_0$ and $T_6$ coded outputs from the even encoder are selected. During times $T_3$ and $T_9$ coded output from the odd encoder are selected. Accordingly, the tuple types produced by the rate ⅞ths encoder of FIG. 21 are completely described by the illustration of FIG. 33.

Figure 34:
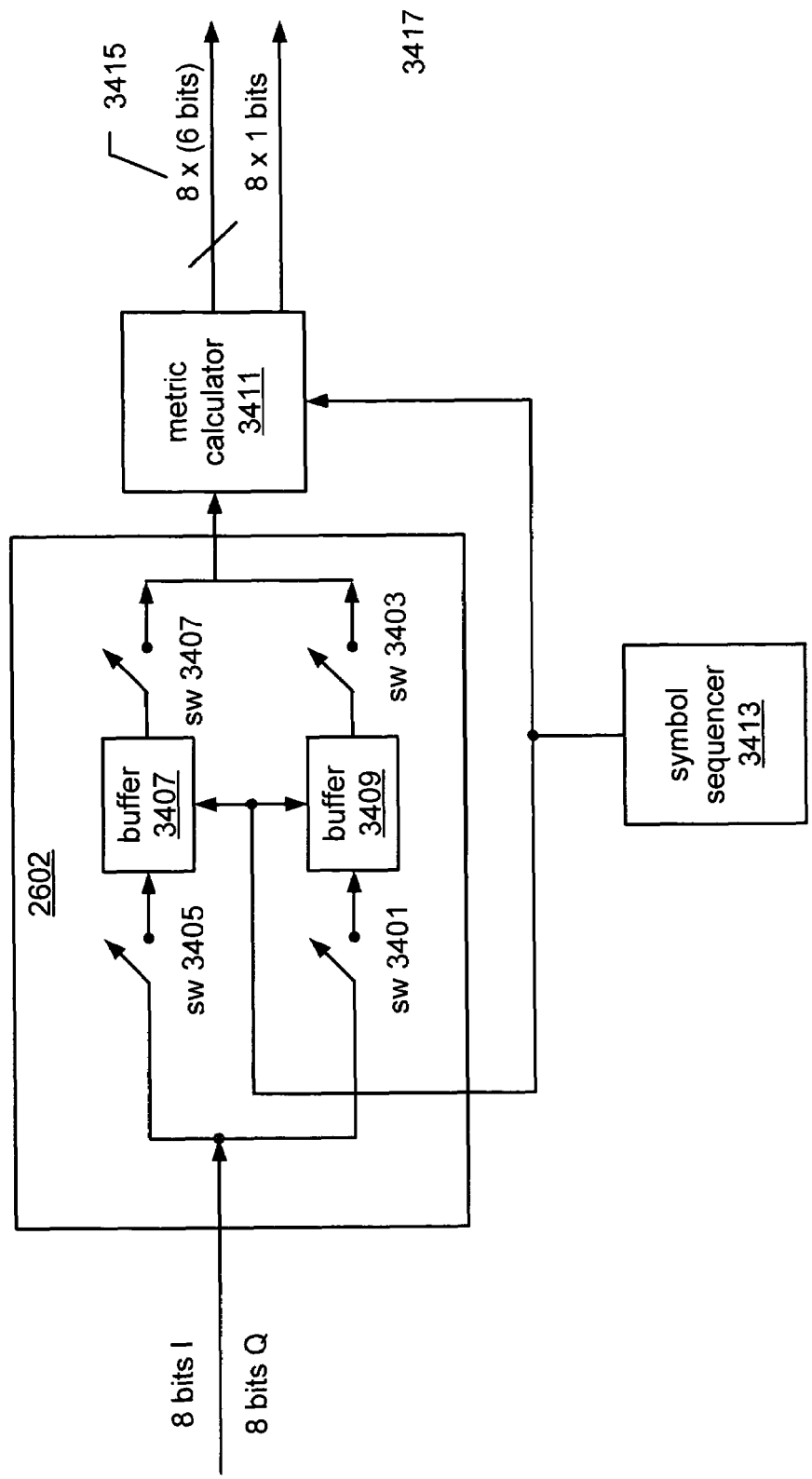
FIG. 34 is a further graphical illustration of a portion of the decoder illustrated in FIG. 26.

FIG. 34 is a further graphical illustration of a portion of the decoder illustrated in FIG. 26. In FIG. 34 the circular buffer 2602 is further illustrated as being a pair of buffers 3407 and 3409. Switches 3401, 3403, 3405 and 3407 operate in such a fashion as to enable the metric calculator 3411 to receive data from one buffer while the other buffer is accepting data. In such a fashion one buffer can be used for processing input data by providing it to the metric calculator and the second buffer can be used for receiving data. The metric calculator 3411 receives data, as required, from either buffer 3407 or buffer 3409 and calculates the distance between the received point and designated points of the data constellation produced by the source encoder. The symbol sequencer 3413 provides data to the metric calculator 3411 specifying the type of tuple, i.e. the constellation and bit encoding of the tuple, which is being decoded. The symbol sequencer also provides information to either buffer 3407 and 3409 regarding which data bits are to be provided to the metric calculator 3411. The symbol sequencer is generally provided information, regarding the symbol types to be received, during the initialization of the system. Symbol typing has been discussed previously with respect to FIG. 29 through FIG. 33. The metric calculator 3411 calculates the metrics for each received point. The metrics for a particular receive point will typically comprise 8 Euclidean distance squared values for each point as indicated at the output of metric calculator 3411. The Euclidean distance of a point is illustrated in FIG. 35.

The metric calculator 3411 of FIG. 34 has two outputs 3415 and 3417. The output 3415 represents eight metrics each of six bits corresponding to the Euclidian distance squared in the I-Q plane between a received point and all eight possible points of the signal constellation which represent valid received data points. Output 3417 represents the mapping of an encoded bit, if any is present. The output 3417 is an indicator of how to select the value of an uncoded bit. The value of the eight outputs at 3417 correspond to a 0 or 1 indicating whether the receive point is closer to an actual point in which the uncoded bit would assume a value of 0 or 1. The method of including uncoded bits within a constellation has been well known in the art and practiced in connection with trellis coded modulation. It is included here for the sake of completeness. The uncoded bit metrics will be stored in FIFO 2616 until the corresponding points are decoded in the output processor 2618. Once the corresponding points are decoded in the output processor 2618, they can be matched with the proper value for the uncoded bit as applied by FIFO 2616.

Figure 35:
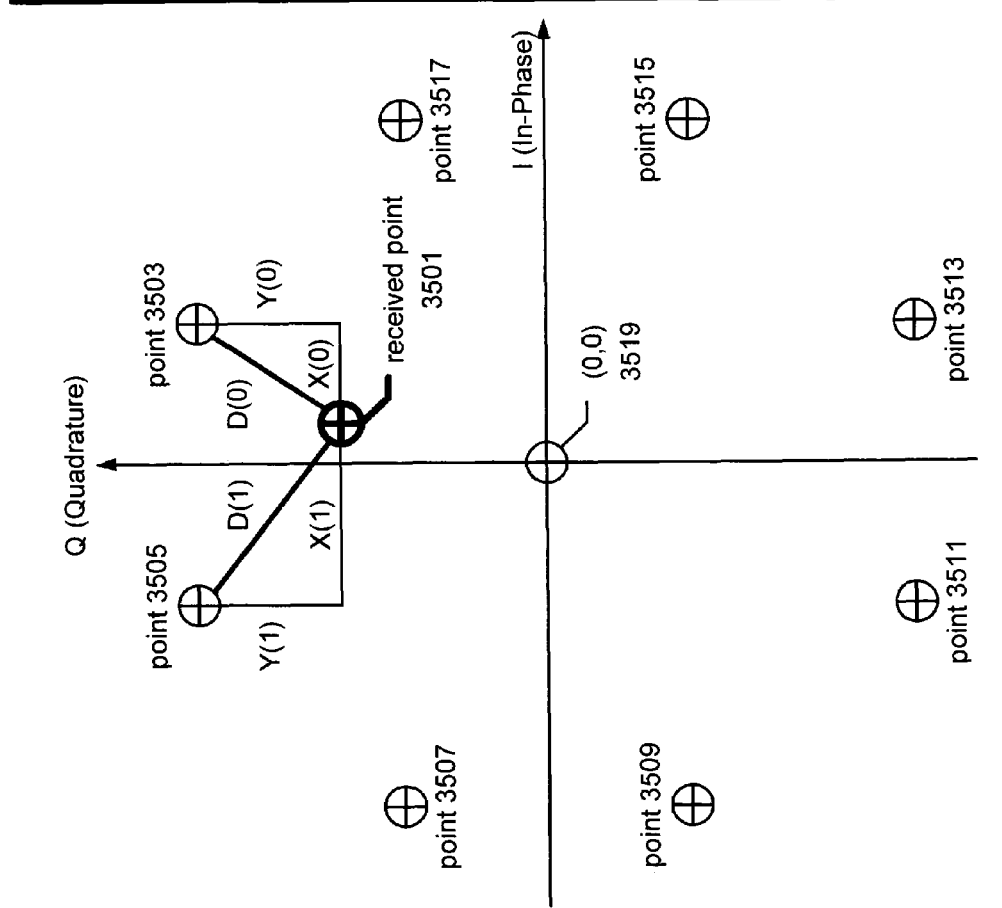
FIG. 35 is a graphical illustration of the process carried on within the metric calculator of the decoder.

FIG. 35 is a graphical illustration of the process carried on within the metric calculator of the decoder. In FIG. 35, a constellation of designated points is represented in the I-Q plain by points 3503, 3505, 3507, 3509, 3511, 3513, 3515 and 3517. The points just mentioned constitute an exemplary constellation of transmitted point values. In actual practice a received point may not match any of the designated transmission points of the transmitted constellation. Further a received point matching one of the points in the constellation illustrated may not coincide with the point that had actually been transmitted at the transmitter. A received point 3501 is illustrated for exemplary purposes in calculating Euclidean squared distances. Additionally, point 3519 is illustrated at the 00 point of the I-Q plain. Point 3519 is a point representing a received point having an equal probability of being any point in the transmitted constellation. In other words, point 3519 is a point having an equal likelihood of having been transmitted as any constellation point. Point 3519 will be used in order to provide a neutral value needed by the decoder for values not transmitted.

The metric calculator 3411 calculates the distance between a receive point, for example 3501, and all transmitted points in the constellation, for example, points 3503 and 3505. The metric calculator receives the coordinates for the receive points 3501 in terms of 8 bits I and 8 bits Q value from which it may calculate Euclidean distance squared between the receive point and any constellation point. For example, if receive point 3501 is accepted by the metric calculator 3411 it will calculate value X(0) and Y(0), which are the displacement in the X direction and Y direction of the receive point 3501 from the constellation pointer 3503. The values for X(0) and Y(0) can then be squared and summed and represent $D^2(0)$. The actual distance between a receive point 3501 and a point in the constellation, for example 3503 can then be computed from the value for $D^2(0)$. The metric calculator however, dispenses with the calculation of the actual value of D(0) and instead employs the value $D^2(0)$ in order to save the calculation time that would be necessary to compute D(0) from $D^2(0)$. In like manner the metric calculator then computes the distance between the receive point and each of the individual possible points in the constellation i.e. 3503 through 3517.

Figure 36:
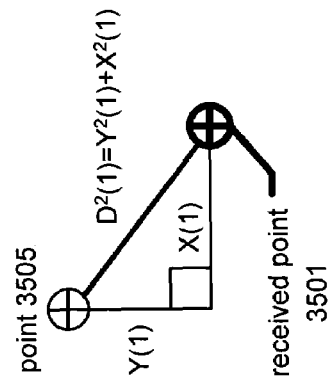
FIG. 36 is a graphical illustration of the calculation of a Euclidean squared distance metric.

FIG. 36 is a graphical illustration of the calculation of a Euclidean squared distance metric. Once the metric values representing the 8 metrics have been calculated, the metric calculator 2604 can then provide them to the SISOs 2606 and 2608.

SISOs 2606 and 2608 of FIG. 34 accept the values from the metric calculator 3411. SISO 2606 decodes points corresponding to the odd encoder an SISO 2608 decodes point corresponding to the even encoder. SISOs 2606 and 2608 operate according to a map decoding algorithm. Within each SISO is a trellis comprising a succession of states representing all of the states of the odd or even encoder. The values associated with each state represent that probability that the encoder was in that particular state during the time period associated with that particular state. Accordingly, SISO 2606 decodes the odd encoder trellis and SISO 2608 decodes the even encoder trellis. Because only the odd points are accepted for transmission from the odd encoder SISO 2606 may contain only points corresponding to odd sequence designations and SISO 2608 contains only points corresponding to even sequence designations. These are the only values supplied by the metric calculator because these are the only values selected for transmission. Accordingly, in constructing the encoder trellis for both the odd encoder within SISO 2606 and the even encoder within SISO 2608 every other value is absent. Because a trellis can only represent a sequence of values, every other point, which is not supplied to each SISO must be fabricated in some manner. Because every other point in each of the two SISOs is an unknown point, there is no reason to presume that one constellation point is more likely than any other constellation point. Accordingly, the points not received by the SISOs from the metric calculator are accorded the value of the 0 point 3519. The 00 point 3519 is chosen because it is equidistant, i.e. equally likely, from all the possible points in the encoded constellation.

Figure 37:
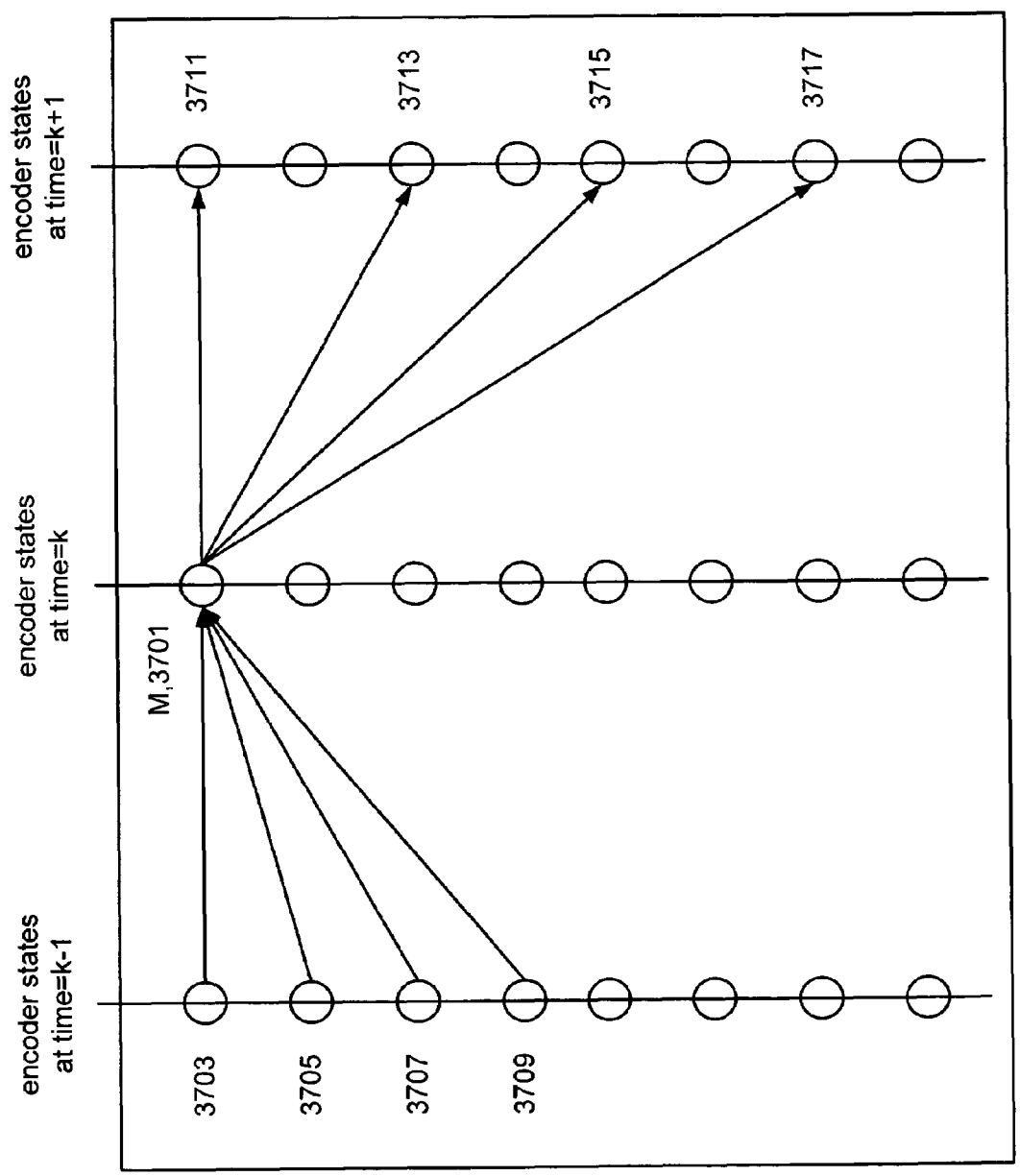
FIG. 37 is a representation of a portion of a trellis diagram as may be present in either SISO 2606 or SISO 2608.

FIG. 37 is a representation of a portion of a trellis diagram as may be present in either SISO 2606 or SISO 2608. The diagram illustrates a calculation of the likelihood of being in state M 3701. The likelihood of being in state M, 3701 is calculated in two different ways. The likelihood of being in state M 3701 at time k is proportional to the likelihood that a time K−1 that the encoder was in a state in which the next successive state could be state M (times the likelihood that the transmission was made into state M). In the trellis diagram state M may be entered from precursor states 3703, 3705, 3707 or 3709. Therefore, the likelihood of being in state M 3701 is equal to the likelihood of being in state 3701, which state 0 of the encoder, and is symbolized by $\alpha_k(0)$.

The likelihood of being in state M 3701 may be evaluated using previous and future states. For example, if state M 3701 is such that it may be entered only from states 3703, 3705, 3707 or 3709, then the likelihood of being in state M 3701 is equal to the summation of the likelihoods that it was in state 3703 and made a transition to state 3701, plus the likelihood that the decoder was in state 3705 and made the transition to state 3701, plus the likelihood that the decoder was in state 3707 and made the transition to state 3701, plus the likelihood that the decoder was in state 3709 and made the transition to state 3701.

The likelihood of being in state M 3701 at time k may also be analyzed from the viewpoint of time k+1. That is, if state M 3701 can transition to state 3711, state 3713, state 3715, or state 3717, then the likelihood that the decoder was in state M 3701 at time k is equal to a sum of likelihoods. That sum of likelihoods is equal to the likelihood that the decoder is in state 3711 at time k+1 and made the transition from state 3701, plus the likelihood that the decoder is in state 3713 at time k+1, times the likelihood that it made the transition from state M 3701, plus the likelihood that it is in state 3715 and made the transition from state 3701, plus the likelihood that it is in state 3717 and made the transition from state M 3701. In other words, the likelihood of being in a state M is equal to the sum of likelihoods that the decoder was in a state that could transition into state M, times the probability that it made the transition from the precursor state to state M, summed over all possible precursor states.

The likelihood of being in state M can also be evaluated from a post-cursor state. That is, looking backwards in time. To look backwards in time, the likelihood that the decoder was in state M at time k is equal to the likelihood that it was in a post-cursor state at time k+1 times the transition probability that the decoder made the transition from state M to the post-cursor state, summed over all the possible post-cursor states. In this way, the likelihood of being in a decoder state is commonly evaluated both from a past and future state. Although it may seem counter-intuitive that a present state can be evaluated from a future state, the problem is really semantic only. The decoder decodes a block of data in which each state, with the exception of the first time period in the block of data and the last time period in the block of data, has a precursor state and a post-cursor state represented. That is, the SISO contains a block of data in which all possible encoder states are represented over TP time periods, where TP is generally the length of the decoder block. The ability to approach the probability of being in a particular state by proceeding in both directions within the block of data is commonly a characteristic of map decoding.

The exemplary trellis depicted in FIG. 37 is an eight state trellis representing the eight possible encoder states. Additionally, there are a maximum of four paths into or out of any state, because the constituent encoders which created the trellis in FIG. 37 had 2-bit inputs. Such a constituent encoder is illustrated in FIG. 5. In fact, FIG. 37 is merely an abbreviated version of the trellis of the right two-thirds constituent encoder illustrated in FIG. 6, with an additional time period added.

The state likelihoods, when evaluating likelihoods in the forward direction, are termed the "forward state metric" and are represented by the Greek letter alpha ($\alpha$). The state likelihoods, when evaluating the likelihood of being in a particular state when evaluated in the reverse direction, are given the designation of the Greek letter beta ($\beta$). In other words, forward state metric is generally referred to as $\alpha$, and the reverse state metric is generally referred to as $\beta$.

Figure 38:
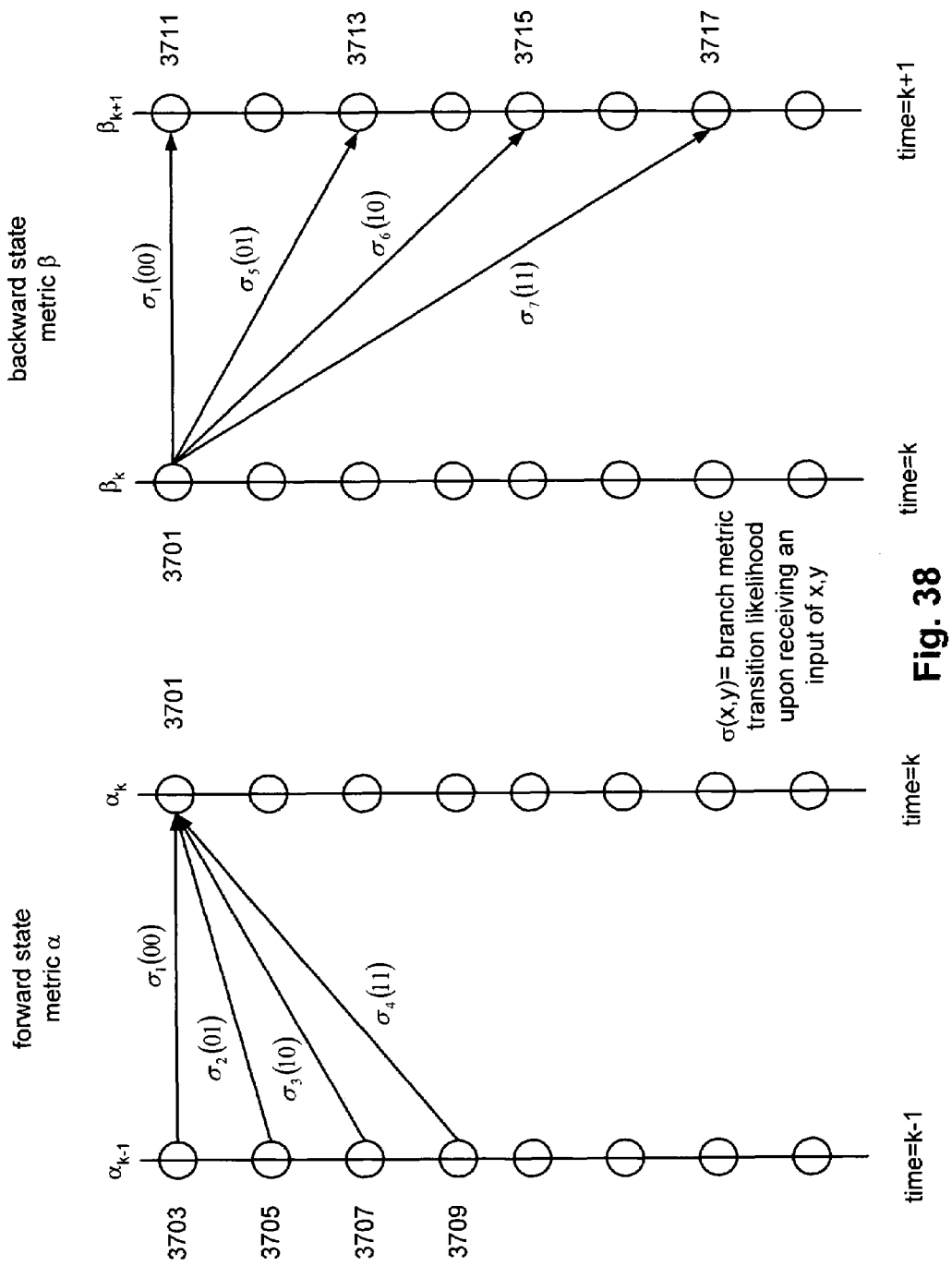
FIG. 38 is a generalized illustration of a forward state metric alpha and a reverse state metric beta.

FIG. 38 is a generalized illustration of a forward state metric alpha ($\alpha$) and a reverse state metric beta ($\beta$). The likelihood of being in state 3808 at time k is designated as $\alpha_k$. $\alpha_k$ designates the forward state metric alpha at time k for a given state. Therefore, $\alpha_k$ for state 3808 is the likelihood that the encoder was in a trellis state equivalent to state 3808 at time k. Similarly, at time k−1, the likelihood that the encoder was in a state equivalent to state 3801 at time $\alpha_{k-1}$ is designated as $\alpha_{k-1}$ (3801). The likelihood that the encoder was in state 3809 at time k−1 is equal to $\alpha_{k-1}$ (3809). Similarly, at time k−1, the likelihood that the encoder was in state 3818 at time k−1 is equal to $\alpha_{k-1}$ (3813). Similarly, the likelihood that the encoder was in a state equivalent to state 3817 at time k−1 is equal to $\alpha_{k-1}$ (3817). Therefore, to compute the likelihood that the encoder is in state 3803, the likelihood of being in a precursor state must be multiplied by the likelihood of making the transition from a precursor state into state 3803.

The input at the encoder that causes a transition from a state 3801 to 3803 is an input of 0,0. The likelihood of transition between state 3801 and state 3803 is designated as δ(0,0) (i.e. delta (0,0)). Similarly, the transition from state 3809 to 3803 represents an input of 0,1, the likelihood of transition between state 3809 and state 3803 is represented by delta (0,1). Similarly, the likelihood of transition between state 3813 and 3803 is represented by delta (1,0) as a 1,0 must be received by the encoder in state 3813 to make the transition to state 3803. Similarly, a transition from state 3817 to state 3803 can be accomplished upon the encoder receiving a 1,1, and therefore the transition between state 3817 and state 3803 is the likelihood of that transition, i.e. δ(1,1). Accordingly, the transition from state 3801 to 3803 is labeled $\delta_1$(0,0) indicating that this is a first transition probability and it is the transition probability represented by an input of 0,0. Similarly, the transition likelihood between state 3809 and 3803 is represented by $\delta_2$ (0,1), the transition between state 3813 and state 3803 is represented by $\delta_3$ (1,0), and the likelihood of transition between state 3817 and 3803 is represented by $\delta_4$ (1,1).

The situation is similar in the case of the reverse state metric, beta ($\beta$). The likelihood of being in state 3807 at time k+1 is designated $\beta_{k+1}$ (3807). Similarly, the likelihood of being in reverse metric states 3811, 3815, 3819 and 3805 are equal to $\beta_{k+1}$ (3811), $\beta_{k+1}$ (3815), $\beta_{k+1}$ (3819), and $\beta_k$ (3805). Likewise, the probability of transition between state 3805 and 3807 is equal to $\delta_1$ (0,0), the likelihood of transition between state 3805 and 3811 is equal to $\delta_5$ (0,1). The likelihood of transition from state 3805 to 3815 is equal to $\delta_6$ (1,0), and the likelihood of transition between state 3805 and 3819 is equal to $\delta_7$ (1,1). In the exemplary illustrated of FIG. 38, there are four ways of transitioning into or out of a state. The transitions are determined by the inputs to the encoder responsible for those transitions. In other words, the encoder must receive a minimum of two bits to decide between four different possible transitions. By evaluating transitions between states in terms of 2-bits inputs to the encoder at a given time, somewhat better performance can be realized than by evaluating the decoding in terms of a single bit at a time. This result may seem counter-intuitive, as it might be thought that evaluating a trellis in terms of a single bit, or in terms of multiple bits, would be equivalent. However, by evaluating the transitions in terms of how the input is provided at a given time, a somewhat better performance is obtained because the decoding inherently makes use of the noise correlation which exists between two, or more, simultaneous input bits.

Accordingly, the likelihood of being in state 3701 may be represented by expression 1 (Expr.1) as follows:

$$\alpha_k(3701)=\alpha_{k-1}(3703)\times\delta_1(00)\times app(00)+\alpha_{k-1}(3705)\times \delta_2(01)\times app(01)+\alpha_{k-1}(3707)\times\delta_3(10)\times app(10)+ \alpha_{k-1}(3709)\times\delta_4(11)\times app(11). \quad \text{(Expr.1)}$$

Similarly, $\beta_k$ can be represented by expression 2 (Expr.2) as follows:

$$\beta_k(3701)=\delta_1(00)\times\beta_{k+1}(3711)\times app(00)+\delta_5(01)\times\beta_{k+1}(3713)\times app(01)+\delta_6(10)\times\beta_{k+1}(3715)\times app(10)+\delta_7(11)\times\beta_{k+1}(3717)\times app(11). \quad \text{(Expr. 2)}$$

Figure 39A:
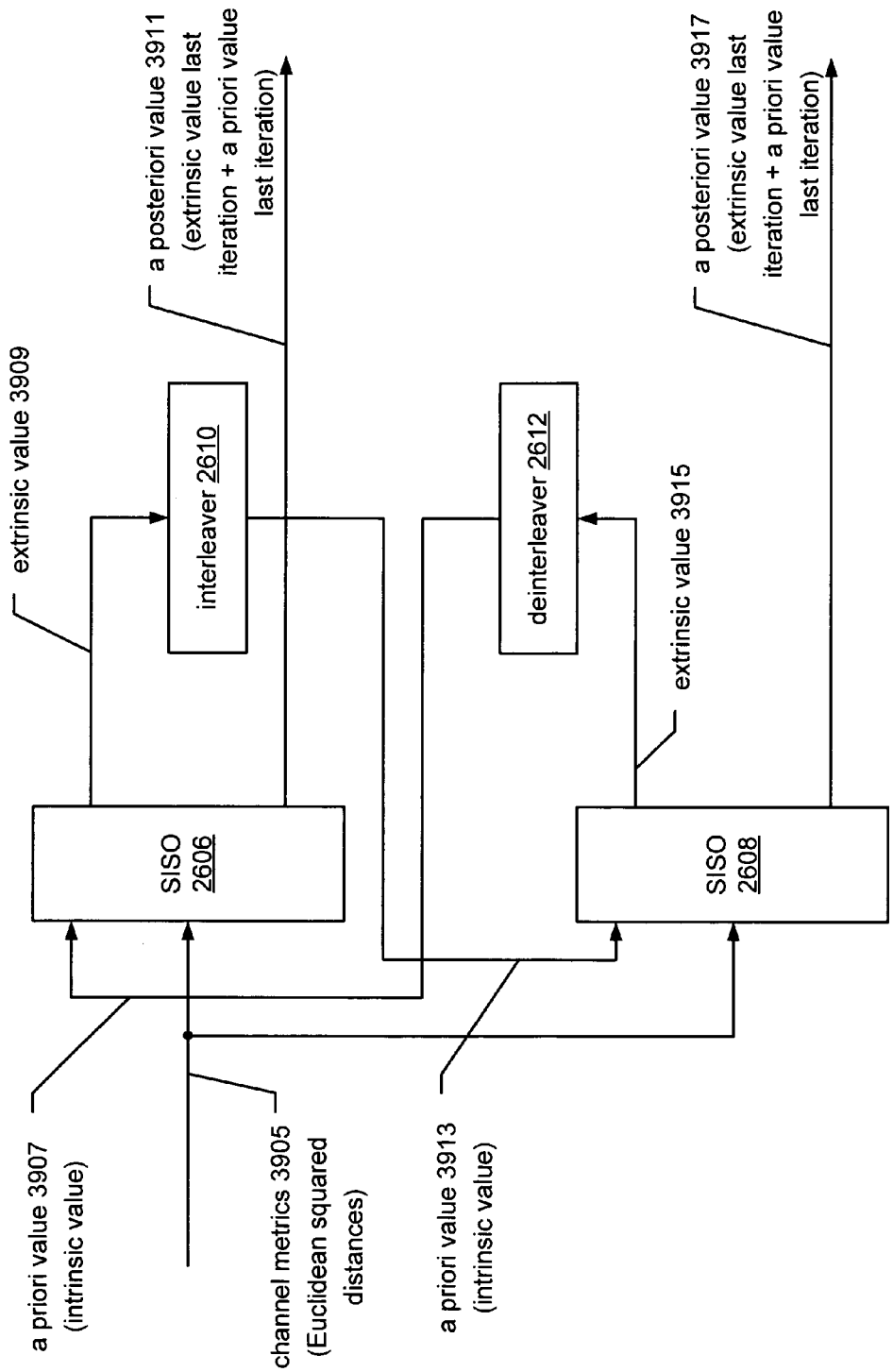
FIG. 39A is a block diagram folder illustrating the parallel SISO coupling illustrated in FIG. 26.

FIG. 39A is a block diagram further illustrating the parallel SISOs illustrated in FIG. 26. Both SISOs, 2606 and 2608, accept channel metrics 3905, which are provided by the metric calculator 2604. SISO 2606 decodes the trellis corresponding to the encoding of the odd encoder. SISO 2608 decodes the trellis corresponding to the even encoder. The even and odd encoders may be, for example, the even and odd encoders illustrated in FIG. 17 through FIG. 21. SISO 2606 will accept channel metrics corresponding to even encoded tuples and SISO 2608 will accept channel metrics corresponding to odd tuples. SISO 2606 assigns the zero point, i.e., the point with equally likely probability of being any of the transmitted points, as a metric for all the even points in its trellis. Similarly, SISO 2608 assigns the 0,0 point, a point equally likely to be any constellation point, to all odd points in its trellis. The extrinsic values 3909 computed by SISO 2606 become the A Priori values 3913 for SISO 2608. Similarly, the extrinsic values 3915, computed by SISO 2608, become the A Priori values 3907 for SISO 2606. After a final iteration, SISO 2606 will provide A Posteriori values 3911 to the output processor 2618. Similarly, SISO 2608 will provide A Posteriori values 3917 to the output processor 2618. The SISO pair of FIG. 39A comprise an even/odd, or modulo-2 decoder. As indicated earlier, neither the encoding nor the decoding systems disclosed herein, are limited to even and odd (modulo 2) implementations and may be extended to any size desired. To accommodate such modulo-N systems, additional SISOs may be added. Such systems may achieve even greater parallelism then can systems employing only 1 SISO.

Figure 39B:
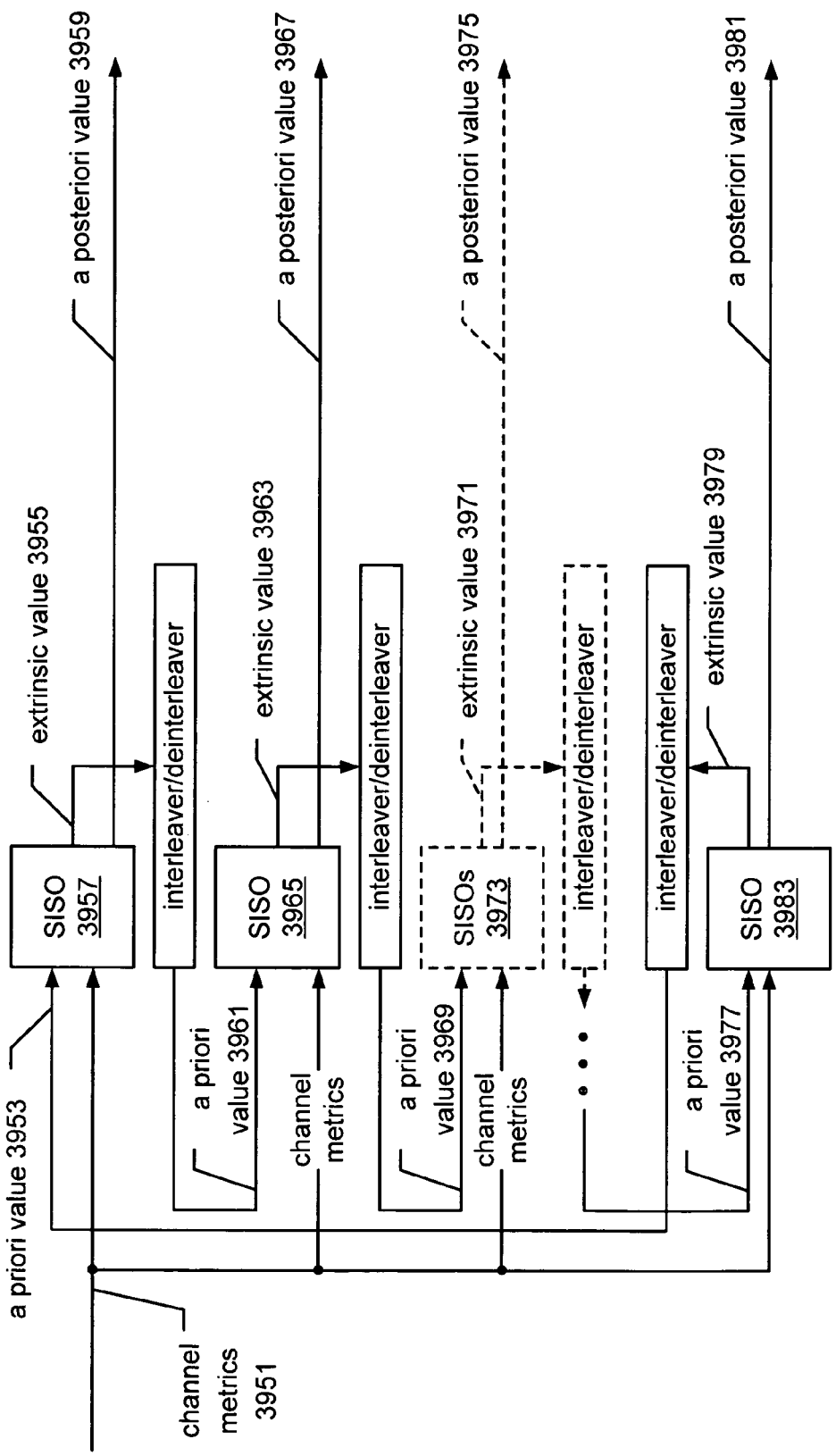
FIG. 39B is a block diagram of a modulo-N type decoder.

FIG. 39B is a block diagram of a modulo-N type decoder. A modulo-N decoder is one having N SISOs. A modulo-N decoder can provide parallel decoding for parallel encoded data streams, as previously discussed. Parallel decoding systems can provide more estimates of the points being decoded in the same amount of time as non-parallel type systems take. In FIG. 39B, channel metrics 3951 are provided to end SISOs 3957, 3965, 3973, and 3983. SISO 3973 may represent multiple SISOs. Such a modulo-N decoding system may have any number of SISOs desired. If a modulo-N encoding system is paired with a modulo-N decoding system, as disclosed herein, the decoding can take place in parallel, and may provide superior decoding for the same amount of time that a serial decoder would use. SISO 3957 computes an extrinsic value 3955, which becomes the A Priori value 3961 for SISO 3965. SISO 3965 computes an extrinsic value 3963, and then provides it as an A Priori value 3969 to SISO chain 3973. SISOs 3973 may comprise any number of SISOs configured similarly to SISO 3965. The final SISO in the SISO chain 3973 provides an extrinsic value 3971, which becomes an A Priori value 3977 for SISO 3983. The extrinsic value 3979, computed by SISO 3983, can provide an A Priori value 3953 for SISO 3957. Each SISO then can provide A Posteriori values, i.e., 3959, 3967, 3981, and the series of A Posteriori values 3975, to an output processor such as illustrated at 2718.

Figure 40:
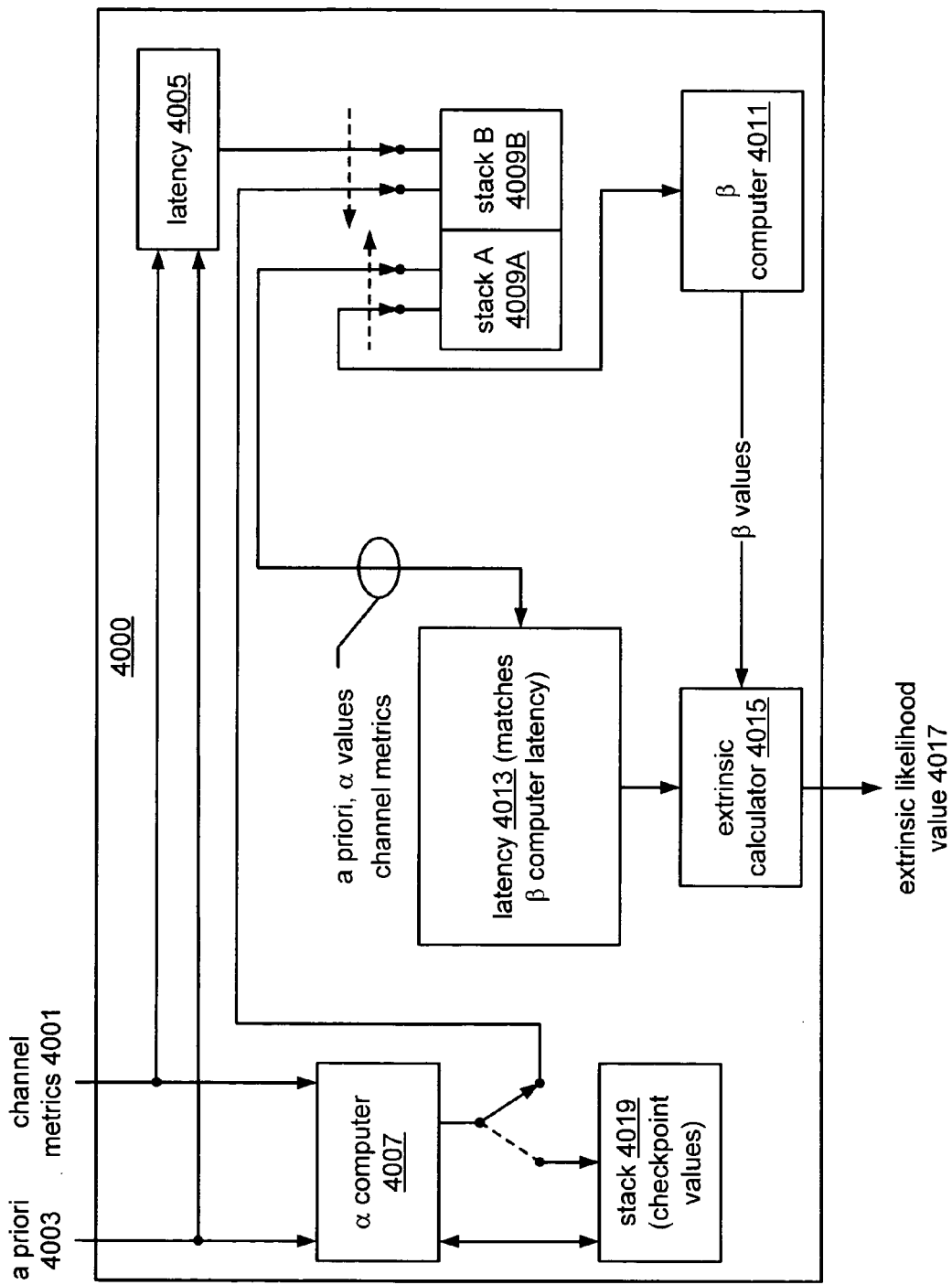
FIG. 40 is a block diagram illustrating the workings of a SISO such as that illustrated at 3901, 3957, 2606 or 2701.

FIG. 40 is a block diagram illustrating the workings of a SISO such as that illustrated at 2606, 3957, 2606 or 2701. The inputs to the SISO 4000 comprise the channel metrics 4001 and the A Priori values 4003. Both the A Priori value 4003 and the channel metrics 4001 are accepted by the alpha computer 4007. The A Priori values and channel metrics are also accepted by a latency block 4005, which provides the delays necessary for the proper internal synchronization of the SISO 4000. The alpha computer 4007 computes alpha values and pushes them on, and pops them from, a stack 4017. The output of the alpha computer also is provided to a dual stack 4009.

Latency block 4005 allows the SISO 4000 to match the latency through the alpha computer 4007. The dual stack 4009 serves to receive values from the latency block 4005 and the alpha computer 4007. While one of the dual stacks is receiving the values from the alpha computer and the latency block, the other of the dual stacks is providing values to the Ex. Beta values are computed in beta computer 4011, latency block 4013 matches the latency caused by the beta computer 4011, the alpha to beta values are then combined in metric calculator block 4015, which provides the extrinsic values 4017, to be used by other SISOs as A Priori values. In the last reiteration, the extrinsic values 4017 plus the A Priori values will provide the A Posteriori values for the output processor.

SISO 4000 may be used as a part of a system to decode various size data blocks. In one exemplary embodiment, a block of approximately 10,000 2-bit tuples is decoded. As can be readily seen, in order to compute a block of 10,000 2-bit tuples, a significant amount of memory may be used in storing the a values. Retention of such large amounts of data can make the cost of a system prohibitive. Accordingly, techniques for minimizing the amount of memory required by the SISOs computation can provide significant memory savings.

A first memory savings can be realized by retaining the I and Q values of the incoming constellation points within the circular buffer 2602. The metrics of those points are then calculated by the metric calculator 2604, as needed. If the metrics of the points retained in the circular buffer 2602 were all calculated beforehand, each point would comprise eight metrics, representing the Euclidian distance squared between the received point and all eight possible constellation points. That would mean that each point in circular buffer 2602 would translate into eight metric values, thereby requiring over 80,000 memory slots capable of holding Euclidian squared values of the metrics calculated. Such values might comprise six bits or more. If each metric value comprises six bits, then six bits times 10,000 symbols, times eight metrics per symbol, would result in nearly one-half megabit of RAM (Random Access Memory) being required to store the calculated metric values. By calculating metrics as needed, a considerable amount of memory can be saved. One difficulty with this approach, however, is that in a system of the type disclosed, that is, one capable of processing multiple types of encodings, the metric calculator must know the type of symbol being calculated in order to perform a correct calculation. This problem is solved by the symbol sequencer 3413 illustrated in FIG. 34.

The symbol sequencer 3413 provides to the metric calculator 3411, and to the input buffers 3407 and 3409, information regarding the type of encoded tuple received in order that the metric calculator and buffers 3407 and 3409 may cooperate and properly calculate the metrics of the incoming data. Such input tuple typing is illustrated in FIG. 29 through FIG. 33, and has been discussed previously.

Figure 41:
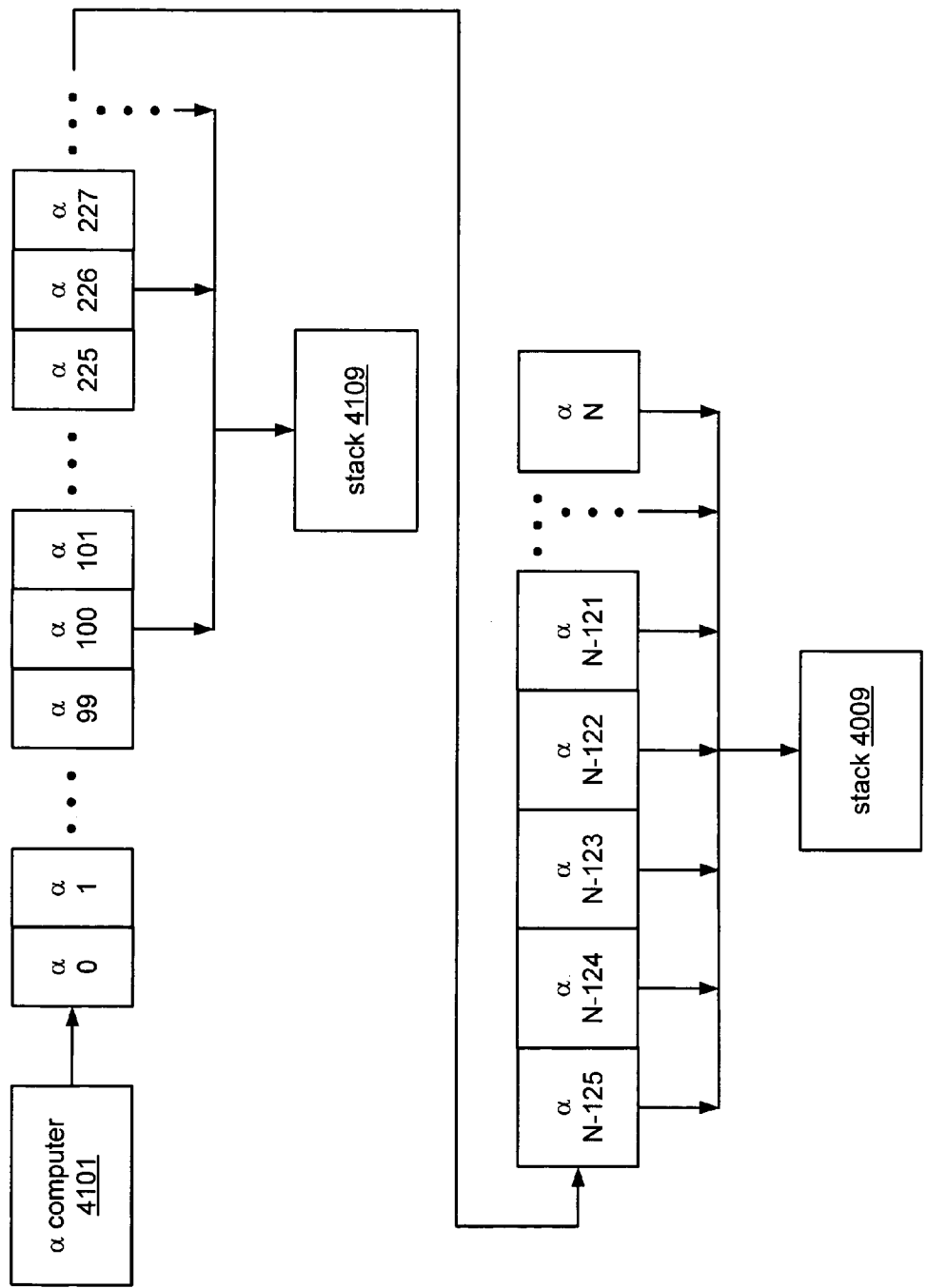
FIG. 41 is a graphical representation of the processing of alpha values within a SISO such as illustrated at 3901, 4000 or 2606.

FIG. 41 is a graphical representation of the processing of alpha values within a SISO such as illustrated at 2606, 4000 or 2606. One common method for processing alpha values is to compute all the alpha values in a block. Then the final alpha values can be used with the initial beta values in order to calculate the state metrics. If the block of data that is being processed is large, such as the exemplary 10,000 two-bit tuple block exemplarily calculated in SISO 4000, then a significant amount of memory must be allotted for storing the alpha values computed. An alternate method of processing alpha values is employed by the SISO unit 4000. In order to save memory, all the alpha values are not stored. The α value data matrix within the SISO is divided into a number of sub-blocks. Because the sub-block size may not divide equally into the data block size, the first sub-block may be smaller than all of the succeeding sub-blocks which are equally sized. In the example illustrated in FIG. 41, the sub-block size is 125 elements. The first sub-block numbered α 0 through α 100 is selected as having 101 elements in order that all the other sub-blocks may be of equal size, that is 125 elements. The alpha computer successively computes alpha values, α 0, α 1, etc. in succession. The alpha values are not all retained but are merely used to compute the successive alpha values. Periodically an α value is pushed on a stack 4103. So, for example, α value, α 100, is pushed on stack 4103 as a kind of a checkpoint. Thereafter, another 125 α values are computed and not retained. The next alpha value (alpha 225) is pushed on stack 4103. This process continues in succession with every $126^{th}$ value being pushed on stack 4103 until a point is reached in which the alpha computed is one sub-block size away from the end of the data block contained within the SISO. So, for example, in the present case illustrated in FIG. 42, the point is reached in a block of size N when α (N−125) is reached, i.e. 125 α values from the end of the block. When the beginning of this final sub-block within the SISO is encountered, all alpha values are pushed on a second stack 4009. The stack

4009 will then contain all alpha values of the last sub-block. This situation is illustrated further in FIG. 42.

Figure 42:
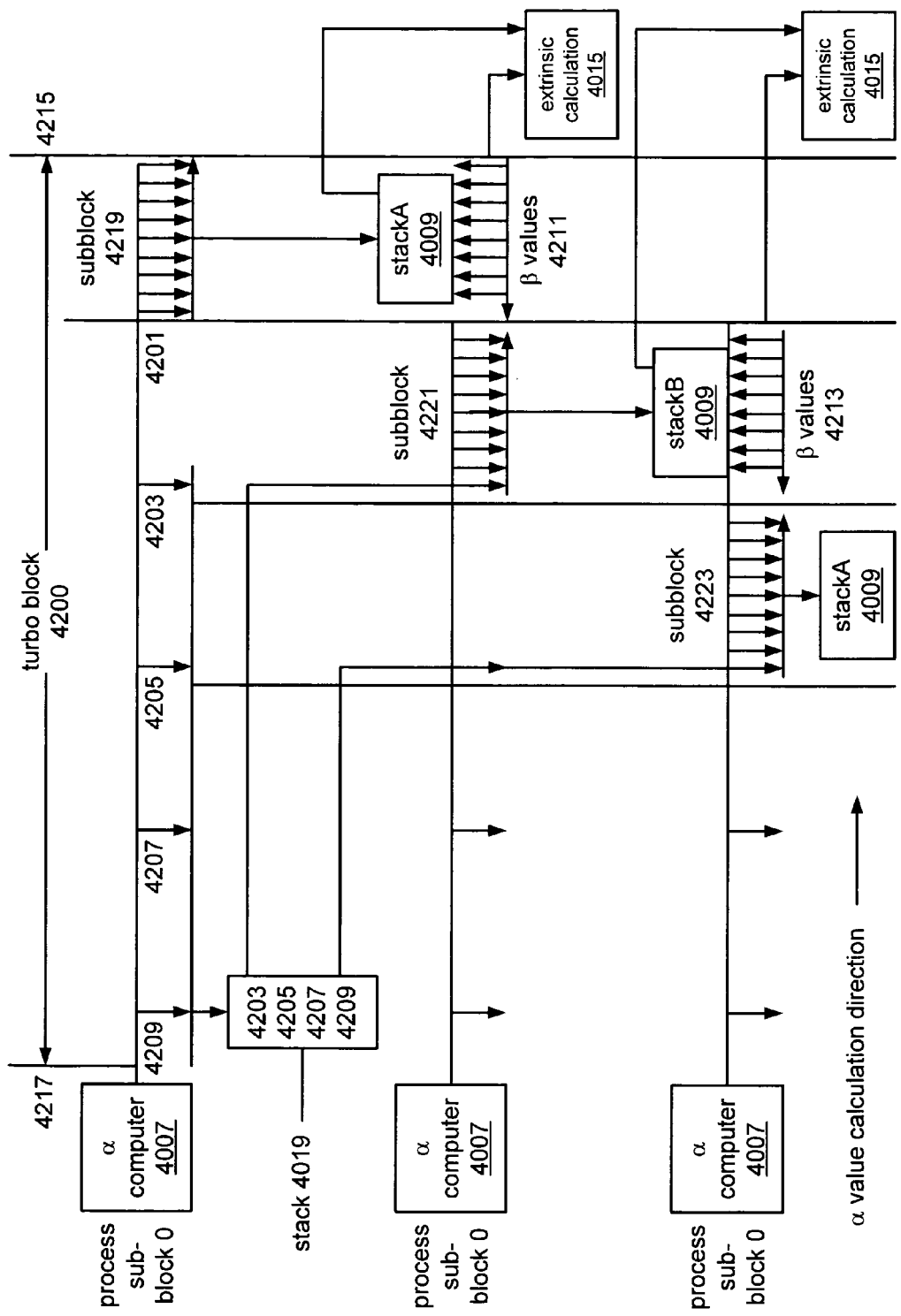
FIG. 42 is a graphical illustration of the alpha processing within the SISO 4000.

FIG. 42 is a graphical illustration of the alpha processing within the SISO 4000. The alpha values are processed in sub-blocks of data. For the purposes of illustration, a sub-block of data is taken to be 126 alpha values. A sub-block, however, may be of various sizes depending on the constraints of the particular implementation desired. The alpha block of data is illustrated at 4200 in FIG. 42. The first step in processing the alpha block 4200 is to begin at the end of block 4215 and divide the block 4200 into sub-blocks. Sub-blocks 4219, 4221 and 4223 are illustrated in FIG. 42. Once the block 4200 has been divided into sub-blocks marked by checkpoint values 4209, 4207, 4205, 4203 and 4201, the processing may begin. Alpha computer 4007 begins calculating alpha values at the beginning of the block, designated by 4217. Alpha values are computed successively and discarded until alpha value 4209, i.e., a checkpoint value, is computed. The checkpoint value 4209 is then pushed on stack 4019. Alpha computer 4007 then continues to compute alpha values until checkpoint value 4207 is reached. Once checkpoint value 4207 is reached, it is pushed on stack 4019. The distance between checkpoint value 4209 and checkpoint value 4207 is 125 values, i.e., one sub-block. Similarly, alpha values are computed from 4207 to 4205 and discarded. Checkpoint value 4205 is then pushed on stack 4019 and the process continues. The alpha computer then computes alpha values and continues to discard them until checkpoint value 4203 is reached. At which point, checkpoint value 4203 is pushed on the stack 4019. The alpha computer once again begins computing alpha values starting with alpha value 4203 until, 125 alpha values have been computed and the beginning of sub-block 4219 is reached. Sub-block 4219 is the final sub-block. The alpha computer 4007 computes alpha values for sub-block 4219 pushing every alpha value on stack A 4009. Because sub-block 4219 contains 125 elements, once the alpha computer has computed all of sub-block 4219, stack A will contain 125 alpha values. Once the alpha values for sub-block 4219 have been computed, the alpha computer will then pop value 4203 off stack 4019 and begin to compute each and every value for sub-block 4221. Values for sub-block 4221 are pushed on stack B 4009. While the values for sub-block 4221 are being pushed on stack B 4009, the previous values which had been pushed on stack A 4009 are being popped from the stack. Beta values 4211, which are computed in the opposite direction of the alpha values, are computed beginning with the end of block 4200 marked at 4215. The beta values 4211 are combined with the alpha values, as they are popped from stack A 4009, in the extrinsic calculator 4015. The beta values 4211 and the alpha values from stack A 4009 are combined until the last alpha element has been popped from stack A 4009. Once stack A 4009 has been emptied, it may once again begin receiving alpha values. Checkpoint alpha value 4205 is popped from stack 4019 and used as a starting value for the alpha computer 4007. The alpha computer may then compute the alpha values for sub-block 4223 are pushed onto the just emptied stack A 4009. While the alpha values are being computed and pushed on stack A 4009, the alpha values are being popped from stack B 4009 and combined with beta values 4213 in extrinsic calculator 4015.

In the manner just described, the SISO computes blocks of data one sub-block at a time. Computing blocks of data one sub-block at a time limits the amount of memory that must be used by the SISO. Instead of having to store an entire block of alpha values within the SISO for the computation, only the sub-block values and checkpoint values are stored. Additionally, by providing two stacks 4009 A and B, one sub-block can be processed while another sub-block is being computed.

Figure 43:
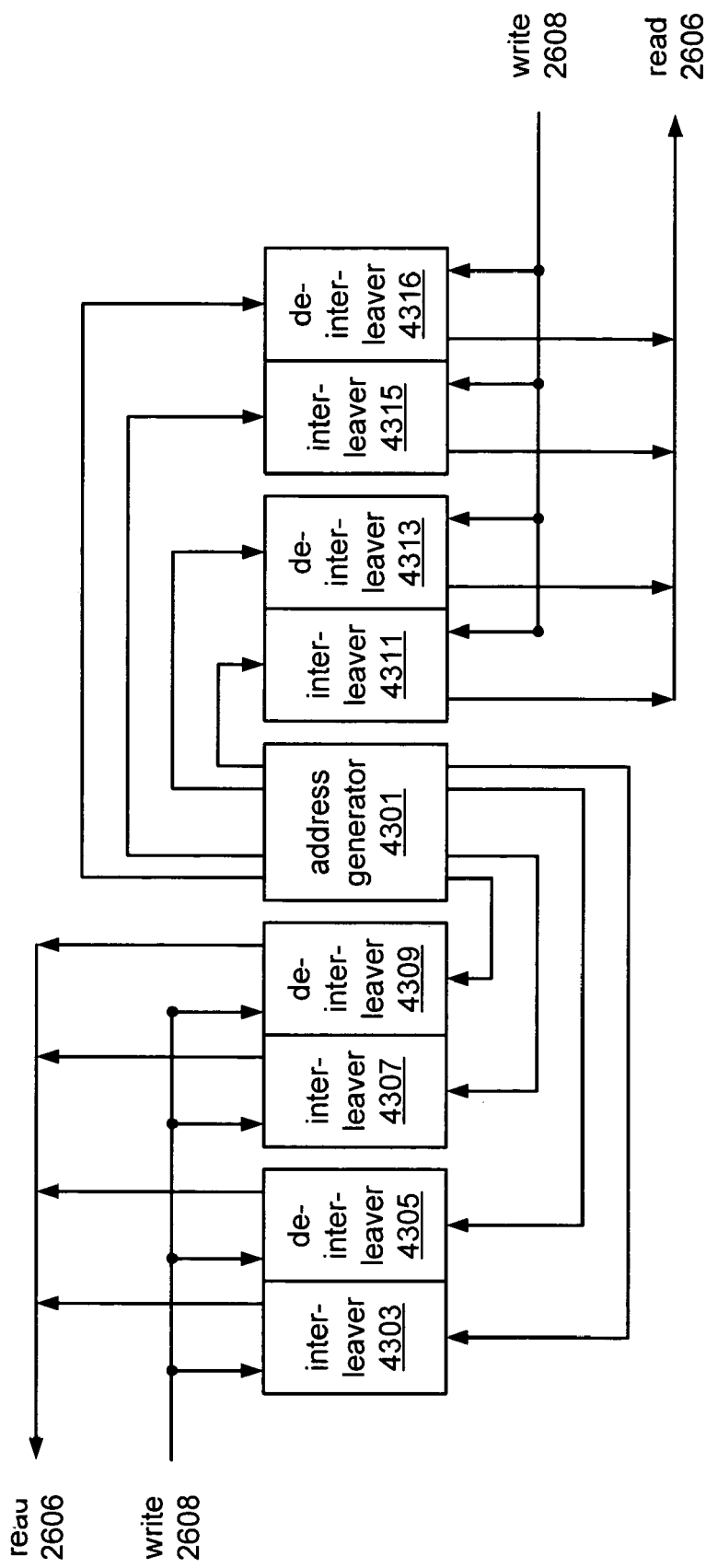
FIG. 43 is a block diagram further illustrating the read-write architecture of the decoder as illustrated in FIG. 2606.

FIG. 43 is a block diagram further illustrating the read-write architecture of the interleaver and deinterleaver of the decoder as illustrated in FIG. 26. The interleaver and deinterleaver are essentially combined utilizing eight RAM blocks 4303, 4305, 4307, 4309, 4311, 4313, 4315, and 4317. The addressing of the eight RAMs is controlled by a central address generator 4301. The address generator essentially produces eight streams of addresses, one for each RAM. Each interleaver and deinterleaver takes two sets of values and also produces two sets of values. There are eight RAM blocks because each input tuple data point, comprising two bits, has each bit interleaved and deinterleaved separately. As the alpha and beta computations are being performed in the SISOs, the a priori information is being read from an interleaver and deinterleaver. While the information is being read from an interleaver and deinterleaver, an iteration computation is proceeding and values are being written to the interleavers and deinterleavers. Therefore, at any time point, four separate RAMs may be in the process of being written to, and four separate RAMs may be in the process of being read. The generation of address sequences for the interleaver/deinterleavers of the SISO system is somewhat complex.

Figure 44:
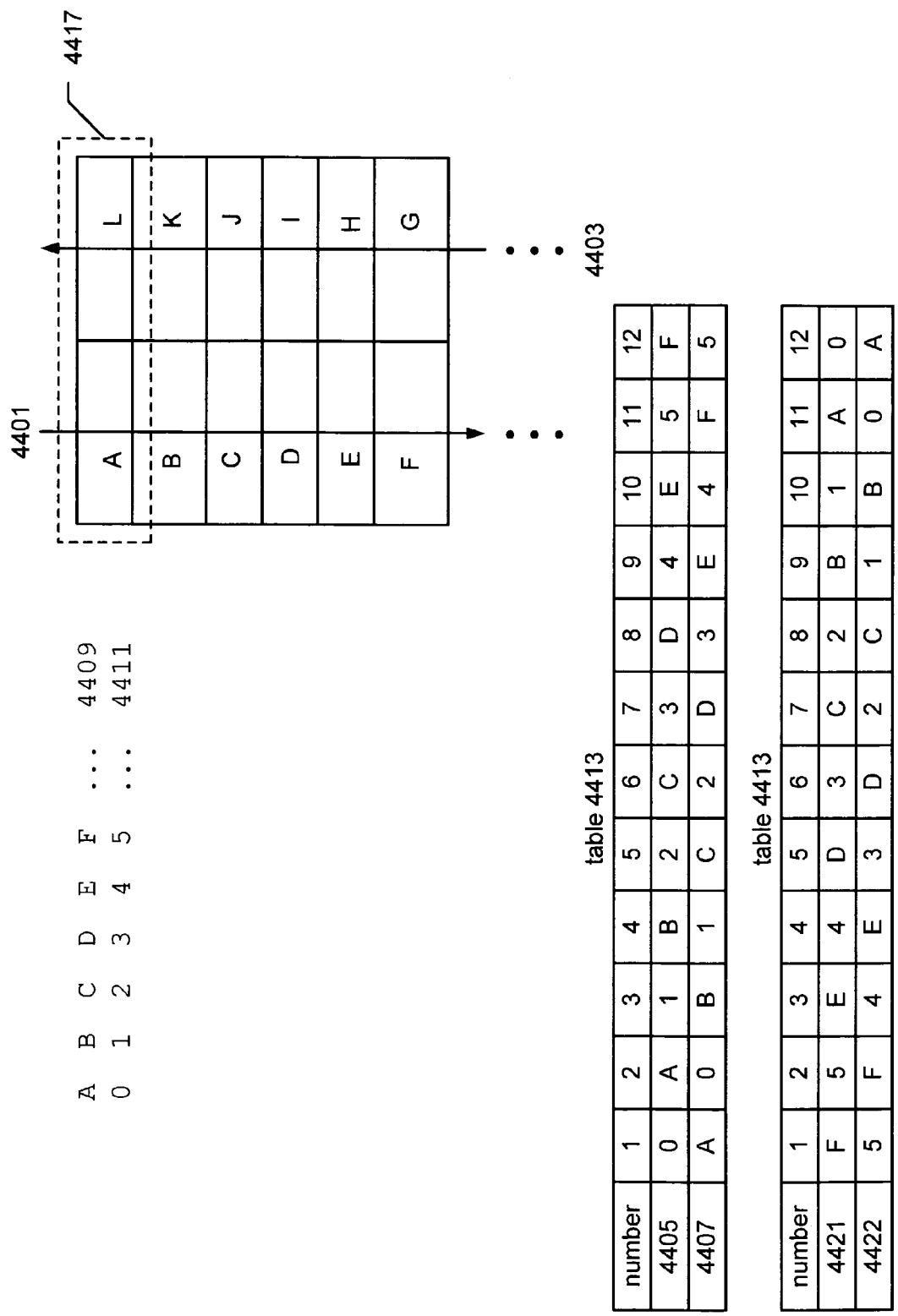
FIG. 44 is a graphical illustration illustrating the generation of decoder sequences.

FIG. 44 is a graphical illustration illustrating the generation of decoder sequences for the interleaver/deinterleaver addressing illustrated in FIG. 43. Since the decoder sequences are somewhat long, and may be greater than 10,000 addresses in length, short examples are used to illustrate the principles involved. A portion of the memory of address generator 4301 is illustrated at 4415. Within the memory 4415, an interleave sequence is stored. The interleave sequence is stored as illustrated by arrows 4401 and 4403. That is, the interleave sequence is stored in a first direction, then in a second direction. In such a manner, address 0, illustrated at 4417 stores the interleave position for the first and last words of the interleave sequence. The next memory location, after 4417 will store the interleave position for the second and the second to last words in the block, and so forth. The storage of sequences is done in this manner the interleave and deinterleave sequences for encoded bit 1 is the time reversal of the interleave sequence for encoded bit 0. In such a way, interleave sequences for the two information bits which are interleaved may be stored with no increased storage requirement over a sequence being stored for just one of the bits, i.e. a system in which the two information bits are it interleaved. In such a manner, a sequence for a bit interleaver can be achieved using the same amount of data to store that sequence as would be the case for a two-bit it interleaver. The interleaving/deinterleaving sequence for one of the two information bits is the time reversal of the interleaving/deinterleaving sequence for the other information bit. For the practical purposes of interleaving and deinterleaving, the sequences thus generated are effectively independent.

A second constraint that the interleave sequence has is that odd positions interleave to odd positions and even positions interleave to even positions in order to correspond to the encoding method described previously. The even and odd sequences are used by way of illustration. The method being described can be extended to a modulo N-type sequence where N is whatever integer value desired. It is also desirable to produce both the sequence and the inverse sequence without having the requirement of storing both. The basic method of generating both the sequence and the inverse sequence is to use a sequence in a first case to write in a permuted manner to RAM according to the sequence, and in the second case to read from RAM in a permuted manner according to the sequence. In other words, in one case the values are written sequentially and read in a permuted manner, and in the second case they are written in a permuted manner and read sequentially. This method is briefly illustrated in the following. For a more thorough discussion, refer to the previous encoder discussion. In other words, an address stream for the interleaving and deinterleaving sequence of FIG. 43 can be produced through the expedient of writing received data sequentially and then reading it according to a permuted sequence, as well as writing data according to a permuted sequence and then reading it sequentially. Additionally, even addresses must be written to even addresses and odd addresses must be written to odd addresses in the example decoder illustrated. Of course, as stated previously, this even odd, modulo 2, scheme may be extended to any modulo level.

As further illustration, consider the sequence of elements A, B, C, D, E, and F 4409. Sequence 4409 is merely a permutation of a sequence of addresses 0, 1, 2, 3, 4, and 5, and so forth, that is, sequence 4411. It has been previously shown that sequences may be generated wherein even positions interleave to even positions and odd positions interleave to odd positions. Furthermore, it has been shown that modulo interleaving sequences, where a modulo N position will always interleave to a position having the same modulo N, can be generated. Another way to generate such sequences is to treat the even sequence as a completely separate sequence from the odd sequence and to generate interleaving addresses for the odd and even sequences accordingly. By separating the sequences, it is assured that an even address is never mapped to an odd address or vice-versa. This methodology can be applied to modulo N sequences in which each sequence of the modulo N sequence is generated separately. By generating the sequences separately, no writing to or reading from incorrect addresses will be encountered.

In the present example, the odd interleaver sequence is the inverse permutation of the sequence used to interleave the even sequence. In other words, the interleave sequence for the even positions would be the deinterleave sequence for the odd positions and the deinterleave sequence for the odd positions will be the interleave sequence for the even positions. By doing so, the odd sequence and even sequence generate a code have the same distant properties. Furthermore, generating a good odd sequence automatically guarantees the generation of a good even sequence derived from the odd sequence. So, for example, examining the write address for one of the channels of the sequence as illustrated in 4405. The sequence 4405 is formed from sequences 4409 and 4411. Sequence 4409 is a permutation of sequence 4411, which is obviously a sequential sequence. Sequence 4405 would then represent the write addresses for a given bit lane (the bits are interleaved separately, thus resulting in two separate bit lanes). The inverse sequence 4407 would then represent the read addresses. The interleave sequence for the odd positions is the inverse of the interleave sequence for the odd positions. So while positions A, B, C, D, E and F are written to, positions 0, 1, 2, 3, 4, and 5 would be read from. Therefore, if it is not desired to write the even and odd sequence to separate RAMs, sequences 4405 and 4407 may each be multiplied by 2 and have a 1 added to every other position. This procedure of ensuring that the odd position addresses specify only odd position addresses and even position addresses interleave to only even position addresses is the same as discussed with respect to the encoder. The decoder may proceed on exactly the same basis as the encoder with respect to interleaving to odd and even positions. All comments regarding methodologies for creating sequences of interleaving apply to both the encoder and decoder. Both the encoder and decoder can use odd and even or modulo N interleaving, depending on the application desired. If the interleaver is according to table 4413 with the write addresses represented by sequence 4405 and the read addresses represented by 4407, then the deinterleaver would be the same table 4413 with the write addresses represented by sequence 4407 and the read addresses represented by sequence 4405. Further interleave and deinterleave sequences can be generated by time reversing sequences 4405 and 4407. This is shown in table 4419. That is, the second bit may have an interleaving sequence corresponding to a write address represented by sequence 4421 of table 4419 and a read address of 4422. The deinterleaver corresponding to a write sequence of 4421 and a read sequence of 4422 will be a read sequence of 4422 and a write sequence of 4421.

Figure 45:
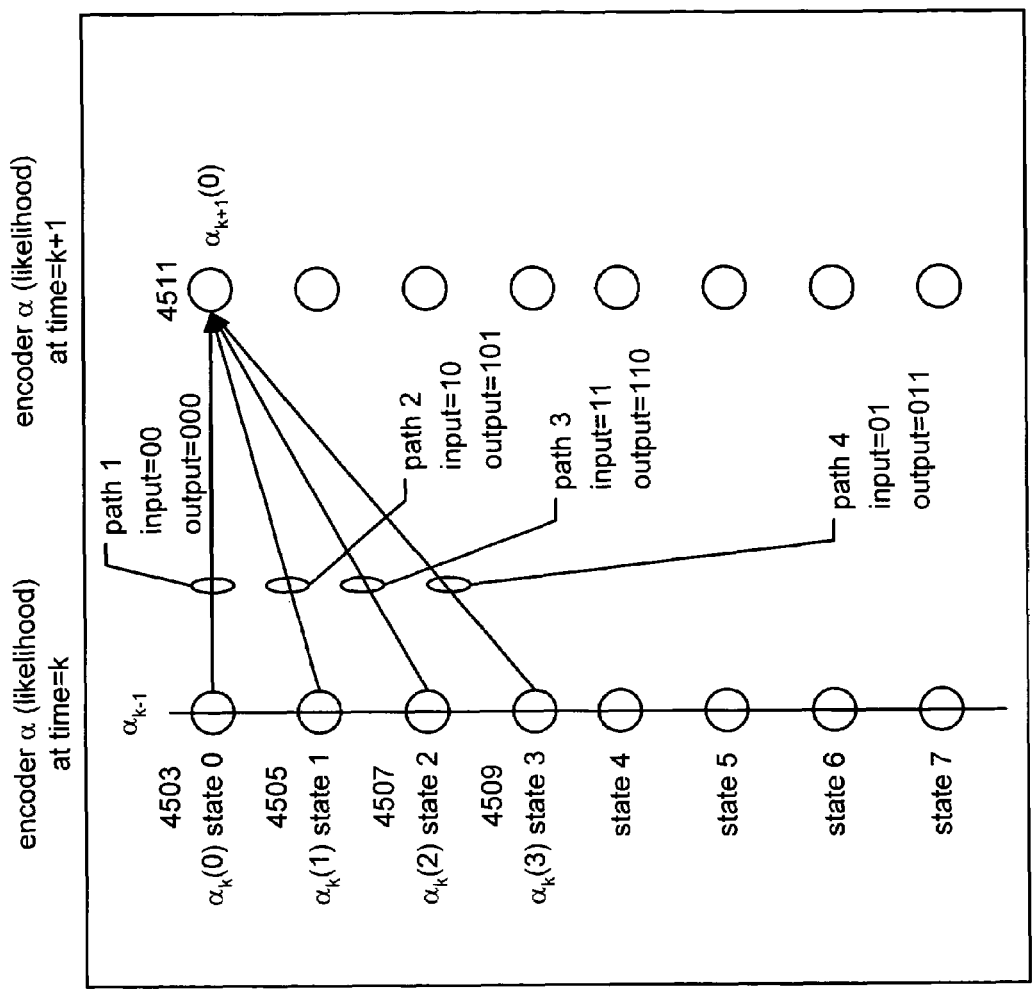
FIG. 45 is a graphical illustration of a decoder trellis according to an embodiment of the invention.

FIG. 45 is a graphical illustration of a decoder trellis according to an embodiment of the invention. A decoder trellis, in general, represents possible states of the encoder, the likelihood of being in individual states, and the transitions which may occur between states. In FIG. 45, the encoder represented is a turbo trellis coded modulation encoder having odd even interleaving and constituent encoders as illustrated in FIG. 5. In FIG. 45, a transition into state 0 at time equal to k+1 is illustrated. The likelihood that the encoder is in state 0 at time k+1 is proportional to $\alpha_{k+1}$ (0), i.e., state 4511. To end up in state 4511, at time k+1, the encoder had to be in state 0, state 1, state 2, or state 3 at time k. This is so because, as illustrated in FIG. 45, the precursor state for state 4511 is stated 4503, 4505, 4507 or 4509 only. These transitions are in accordance with the trellis diagram of FIG. 6. Accordingly, the enter state 4511 at time k+1, the encoder must be in state 4503 and transit along path number 1, or the encoder may be in state 4505 and transition along path 2 into state 4511, or the encoder may be in state 4507 and transit along path 3 to state 4511, or the encoder may be in state 4509 and transit into state 4511. If the encoder is in state 4503, that is, state 0, at time k and the encoder receives an input of 00, it will transition along path 1 and provide an output of 000 as indicated in FIG. 45. If the encoder is in state 1 at time k, that is, state 4505, and the encoder receives an input of 10, it will transition according to path 2 and output a value of 101. If the encoder is in state 2, corresponding to state 4507 at time k, and the encoder receives an input of 11, then the encoder will transition along path 3 into state 4511, outputting a 110. If the encoder is in state 3, corresponding to state 4509 at time k, and the encoder received an input of a 01, then the encoder will transition along path 4 into state 4511 and output a 011.

Therefore, to find the likelihood that the encoder is in state 0, i.e., 4511, at time k+1, it is necessary to consider the likelihood that the encoder was in a precursor state, that is, state 0-3, and made the transition into state 0 at time k+1.

Likelihoods within the decoder system are based upon the Euclidian distance mean squared between a receive point and a possible transmitted constellation point, as illustrated and discussed with reference to FIG. 35. The likelihood metrics used in the illustrative decoder (for example, as drawn in FIG. 26) are inversely proportional to the probability that a received point is equal to a constellation point. To illustrate the likelihood function, consider point 3501 of FIG. 35. Point 3501 represents a received signal value in the I-Q plane. Received point 3501 does not correspond to any point in the transmitted constellation, that is, point 3503 through point 3517. Received point 3501 may in have been transmitted as any of the points 3503 through 3517. The likelihood that the received point 3501 is actually point 3503 is equal to the Euclidian squared distance between received point 3501 and point 3503. Similarly, the likelihood that received point 3501 is any of the other points within FIG. 35 is equal to the distance between the received point 3501 and the candidate point squared. In other words, the metric representing the likelihood that received point 3501 is equal to a constellation point is proportional to the distance squared between the received point and any constellation point. Thus, the higher value for the metric, representing the distance between the received point and the constellation point, the less likely that the received point was transmitted as the constellation point. In other words, if the distance squared between the received point is 0, then it is highly likely that the received point and the constellation point are the same point.

NOTE: Even though the received point may coincide with one constellation point, it may have been in fact transmitted as another constellation point, and accordingly there is always a likelihood that the received point corresponds to each of the points within the constellation. In other words, no matter where received point 3501 is located in the I-Q plane, there is some finite likelihood that point 3503 was transmitted, there is some finite likelihood that point 3505 was transmitted, there is some finite likelihood that point 3507 was transmitted, and so forth. Because the map decoder illustrated in the present disclosure is a probabilistic decoder, all the points within a decoding trellis, such as illustrated at 45, have some likelihood. An iterative decoder generally assigns likelihoods to each of the given points and only in the last iteration are the likelihood values, that is, soft values, turned into hard values of 1 or 0. Probabilistic decoders in general make successive estimates of the points received and iteratively refine the estimates. Although there are many different ways of representing the probability or likelihood of points, for example Hamming distances, the decoder of the present embodiment uses the Euclidian distance squared. The min* operation is described and illustrated later in this disclosure. This min* operation may be alternatively described as being min* processing, operations performed by a min* circuit, operations performed by a min* operator, or other appropriate depiction as well without departing from the scope and spirit of the invention. Later on, the max* operation is also presented. Analogously, this max* operation may be alternatively described as being max* processing, operations performed by a max* circuit, operations performed by a max* operator, or other appropriate depiction as well without departing from the scope and spirit of the invention.

Because the Euclidean distance squared is used as the likelihood metric in the present embodiment of the decoder the higher value for the likelihood metrics indicate a lower probability that the received point is the constellation point being computed. That is, if the metric of a received point is zero then the received point actually coincides with a constellation point and thus has a high probability of being the constellation point. If, on the other hand, the metric is a high value then the distance between the constellation point and the received point is larger and the likelihood that the constellation point is equal to the received point is lower. Thus, in the present disclosure the term "likelihood" is used in most cases. The term "likelihood" as used herein means that the lower value for the likelihood indicates that the point is more probably equal to a constellation point. Put simply within the present disclosure "likelihood" is inversely proportional to probability, although methods herein can be applied regardless if probability or likelihood is used.

In order to decide the likelihood that the encoder ended up in state 4511 (i.e. state 0) at time k+1, the likelihood of being in state 0-3 must be considered and must be multiplied by the likelihood of making the transition from the precursor state into state 4511 and multiplied by the a priori probability of the input bits. Although there is a finite likelihood that an encoder in state 0 came from state 0. There is also a finite likelihood that the encoder in state 0 had been in state 1 as a precursor state. There is also a finite likelihood that the encoder had been in state 2 as a precursor state to state 0. There is also a finite likelihood that the encoder had been in state 3 as a precursor state to state 0. Therefore, the likelihood of being in any given state is a product with a likelihood of a precursor state and the likelihood of a transition from that precursor state summed over all precursor states. In the present embodiment there are four events which may lead to state 4511. In order to more clearly convey the method of processing the four events which may lead to state 4511 (i.e. state 0) will be given the abbreviations A, B, C and D. Event A is the likelihood of being in state 4503 times the likelihood of making the transition from state 4503 to 4511. This event can be expressed as $\alpha_k(0) \times \delta_k(00) \times$ the a priori probability that the input is equal to 00. $\alpha_k(0)$ is equal to the likelihood of being in state 0 at time k. $\delta_k(00)$ is the likelihood, or metric, of receiving an input of 00 causing the transition from $\alpha_k(0)$ to $\alpha_{k+1}(0)$. In like manner Event B is the likelihood of being in state 4505 times the likelihood of making the transition from state 4505 to state 4511. In other words, $\alpha_k(1) \times \delta_k(10) \times$ the a priori probability that the input is equal to 10. Event C is that the encoder was in state 4507 at time=k and made the transition to state 4511 at time=k+1. Similarly, this can be stated $\alpha_k(2) * \delta_k(11) \times$ the a priori probability that the input is equal to 11. Event D is that the encoder was in state 4509 and made the transition into state 4511. In other words, $\alpha_k(3) * \delta_k(01) \times$ the a priori probability that the input is equal to 01.

The probability of being in any given state therefore, which has been abbreviated by alpha, is the sum of likelihoods of being in a precursor state times the likelihood of transition to the given state and the a priori probability of the input. In general, probabilistic decoders function by adding multiplied likelihoods.

The multiplication of probabilities is very expensive both in terms of time consumed and circuitry used as when considered with respect to the operation of addition. Therefore, it is desirable to substitute for the multiplication of likelihoods or probabilities the addition of the logarithm of the probabilities or likelihoods which is an equivalent operation to multiplication. Therefore, probabilistic decoders, in which multiplications are common operations, ordinarily employ the addition of logarithms of numbers instead of the multiplications of those numbers.

The probability of being in any given state such as 4511 is equal to the sum probabilities of the precursor states times the probability of transition from the precursor states into the present state times the a prior probability of the inputs. As discussed previously, event A is the likelihood of being in state 0 and making the transition to state 0. B is the event probability equivalent to being in state 1 and making the transition to state 0. Event C is the likelihood of being in state 2 and making the transition to state 0. Event D is the likelihood of being in state 3 and making the transition into state 0. To determine the likelihood of all the states at time k+1 transitions must be evaluated. That is there are 32 possible transitions from precursor states into the current states. As stated previously, the likelihoods or probabilities of being in states and of having effecting certain transitions are all kept within the decoder in logarithmic form in order to speed the decoding by performing addition instead of multiplication. This however leads to some difficulty in estimating the probability of being in a given state because the probability of being in a given state is equal to the sum of events A+B+C+D as previously stated. Ordinarily these probabilities of likelihoods would be simply added. This is not possible owing to the fact that the probability or likelihoods within the decoder are in logarithmic form. One solution to this problem is to convert the likelihoods or probabilities from logarithmic values into ordinary values, add them, and then convert back into a logarithmic values. As might be surmised this operation can be time consuming and complex. Instead an operation of min* is used. The min* is a variation of the more common operation of Max*. The operation of Max* is known in the art. min* is an identity similar to the Max* operation but is one which may be performed in the present case on log likelihood values. The min* operation is as follows.

$$\min^*(A,B) = \min(A,B) - \ln(1 + e^{-*A-B*})$$

The min* operation can therefore be used to find the sum of likelihoods of values which are in logarithmic form.

Finally, the likelihood of being in state 4511 is equal to the min*(A,B,C,D). Unfortunately, however, min* operation can only take 2 operands for its inputs. Two operands would be sufficient if the decoder being illustrated was a bit decoder in which there were only two precursor states for any present state. The present decoder is of a type of decoder, generally referred to as a symbol decoder, in which the likelihoods are evaluated not on the basis of individual bits input to the encoder, but on the basis of a combination, in this case pairs, of bits. Studies have shown that the decoding is slightly improved in the present case when the decoder is operated as a symbol decoder over when the decoder is operated as a bit decoder. In reality the decoder as described is a hybrid combination symbol and bit decoder.

Figure 46A:
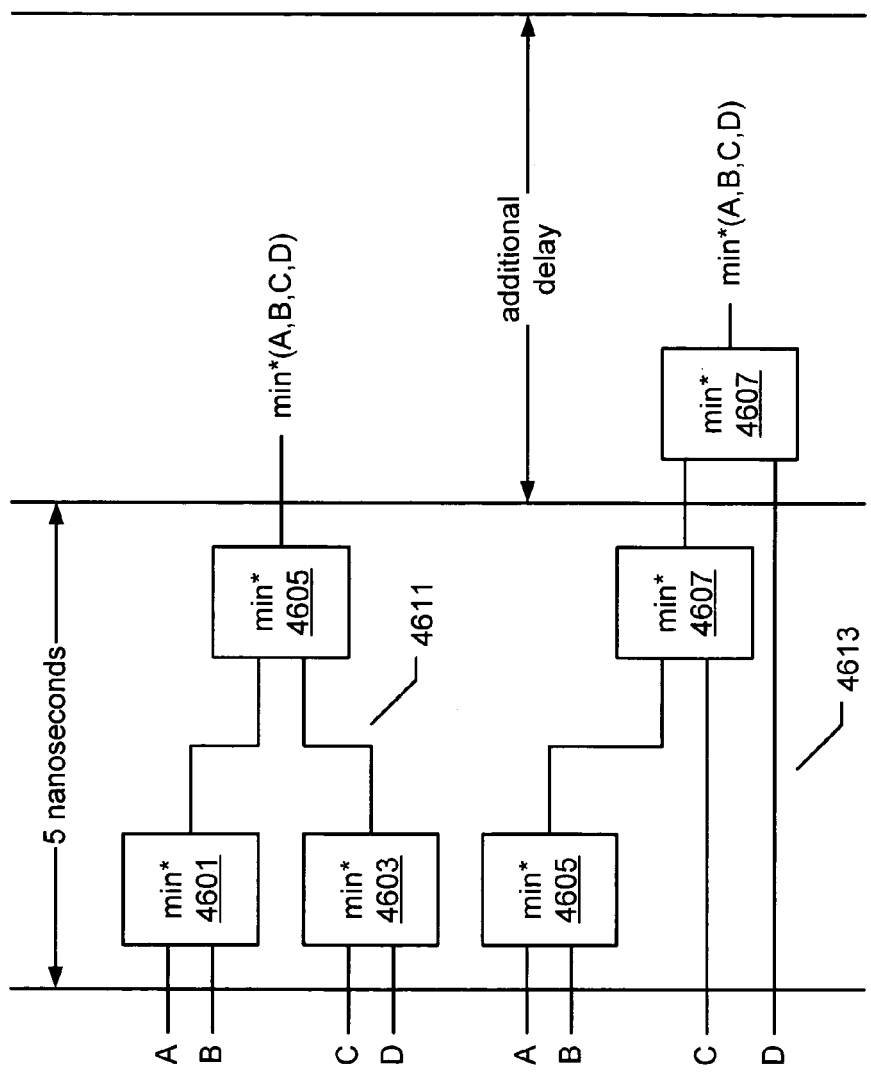
FIG. 46A is a graphical illustration of a method for applying the min* operation to four different values.

FIG. 46A is a graphical illustration of a method for applying the min* operation to four different values. The configuration of FIG. 46A illustrates a block diagram of a method for performing a min* operation on four separate values, A, B, C and D. As indicated in FIG. 46A a timing goal of the operation in one particular embodiment is to be able to perform a min* operation on four operands within five nanoseconds.

Figure 46B:
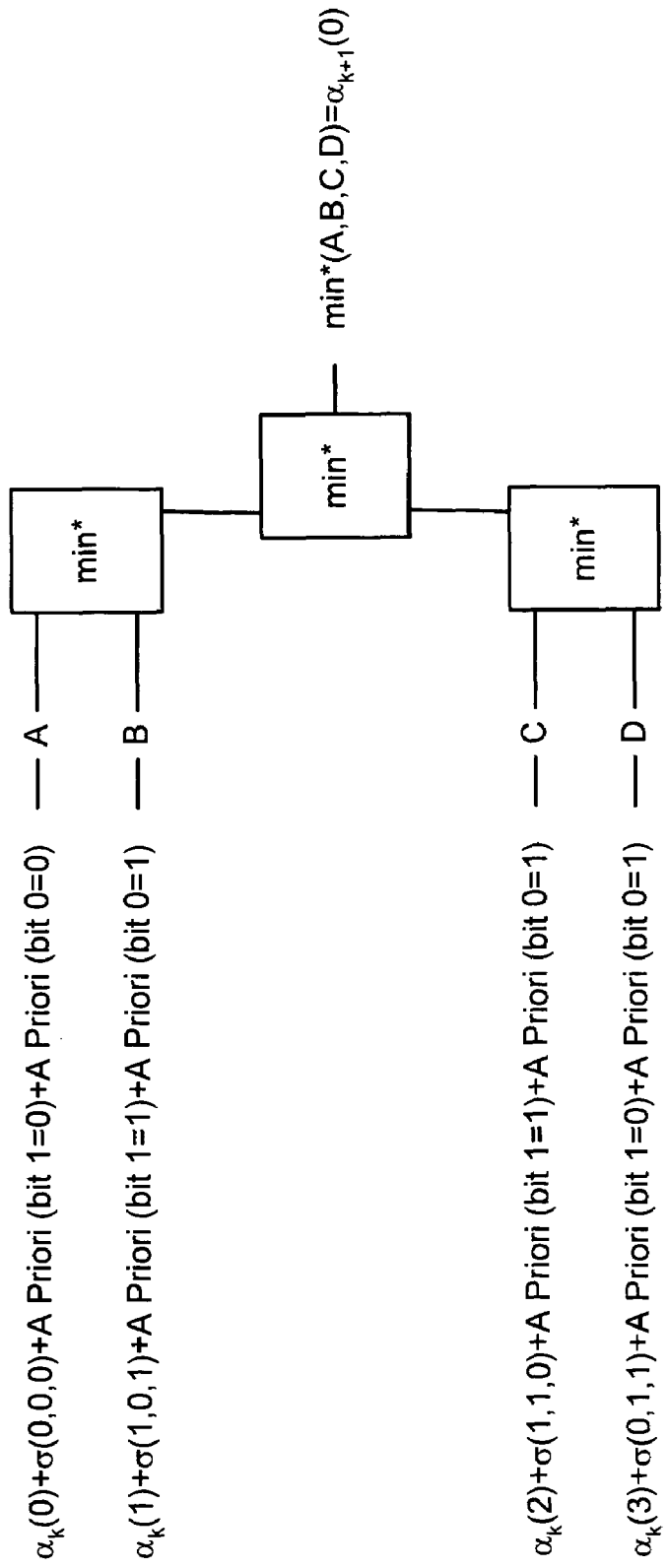
FIG. 46B is a graphical illustration further illustrating the use of the min* operation.

FIG. 46B is a graphical illustration further illustrating the use of the min* operation. The min* operation (pronounced min star) is a two operand operation, meaning that it is most conveniently implemented as a block of circuitry having 2 input operands. In order to perform a min* operation on more than two operations it is convenient to construct a min star structure. A min* structure is a cascade of two input min* circuits such that all of the operands over which the min* operation is to be performed enter the structure at one point only. The structure will have only one output which is the min* performed over all the operands, written min*(operand 1, operand 2 . . . operand N), where N is the number of operands. min* structures may be constructed in a variety of ways. For example a min* operation performed over operands A, B, C and D may appear as shown at 4611, 4613, or in several other configurations. Any min* structure will provide the correct answer over the operands, but as illustrated in FIG. 46A min* structures may have different amounts of propagation delay depending on how the two operand min* blocks are arranged. In an illustrative embodiment the min* structure 4611 can meet a maximum delay specification of 5 nanoseconds, while the min* structure 4613 cannot. This is so because structure 4611 is what is known as a "parallel" structure. In a parallel min* structure the operands enter the structure as early as possible. In a parallel structure the overall propagation delay through the structure is minimized.

FIG. 46B the min* configuration of FIG. 46A with the values for A, B. C, and D substituted, which is used to determine $\alpha_{k+1}(0)$, that is the likelihood of being in state 0. The Four inputs to the min* operation (that is A, B, C and D) are further defined in FIG. 46B. The A term is equal to $\alpha_k(0)$ plus δ (0, 0, 0, 0), which is a metric corresponding to the generation of an output of 000 i.e., the metric value calculated by the metric calculator, plus the a priori likelihood that bit 1 equal to 0 was received by the encoder plus the priori likelihood that bit 0 equal 0 was received by the encoder. Because all the values illustrated are in logarithmic scale adding the values together produces a multiplication of the likelihood.

Similarly, $B = \alpha_k(1) + \delta(1, 0, 1) + $a priori(bit 1=1)+a priori(bit 0=0)

Similarly $C = \alpha_k(2) + \delta(1, 1, 0) + $a priori(bit 1=1)+a priori(bit 0=1)

Similarly $D = \alpha_k(3) + \delta(0, 1, 1) + $a priori(bit 0=1)+a priori(bit 0=0).

FIG. 46B illustrates that prior to being able to perform a min* operation on the four quantifies A, B, C and D several sub quantities must be added. For example, in order to obtain the value A to provide it to the min* operations the values of $\alpha_k(0)$ must be added to the metric value δ (0, 0, 0) plus the a priori probability that bit 1=0 plus the a priori probability that bit 0=0. One way to add quantities is in a carry ripple adder as illustrated in FIG. 47.

Figure 47:
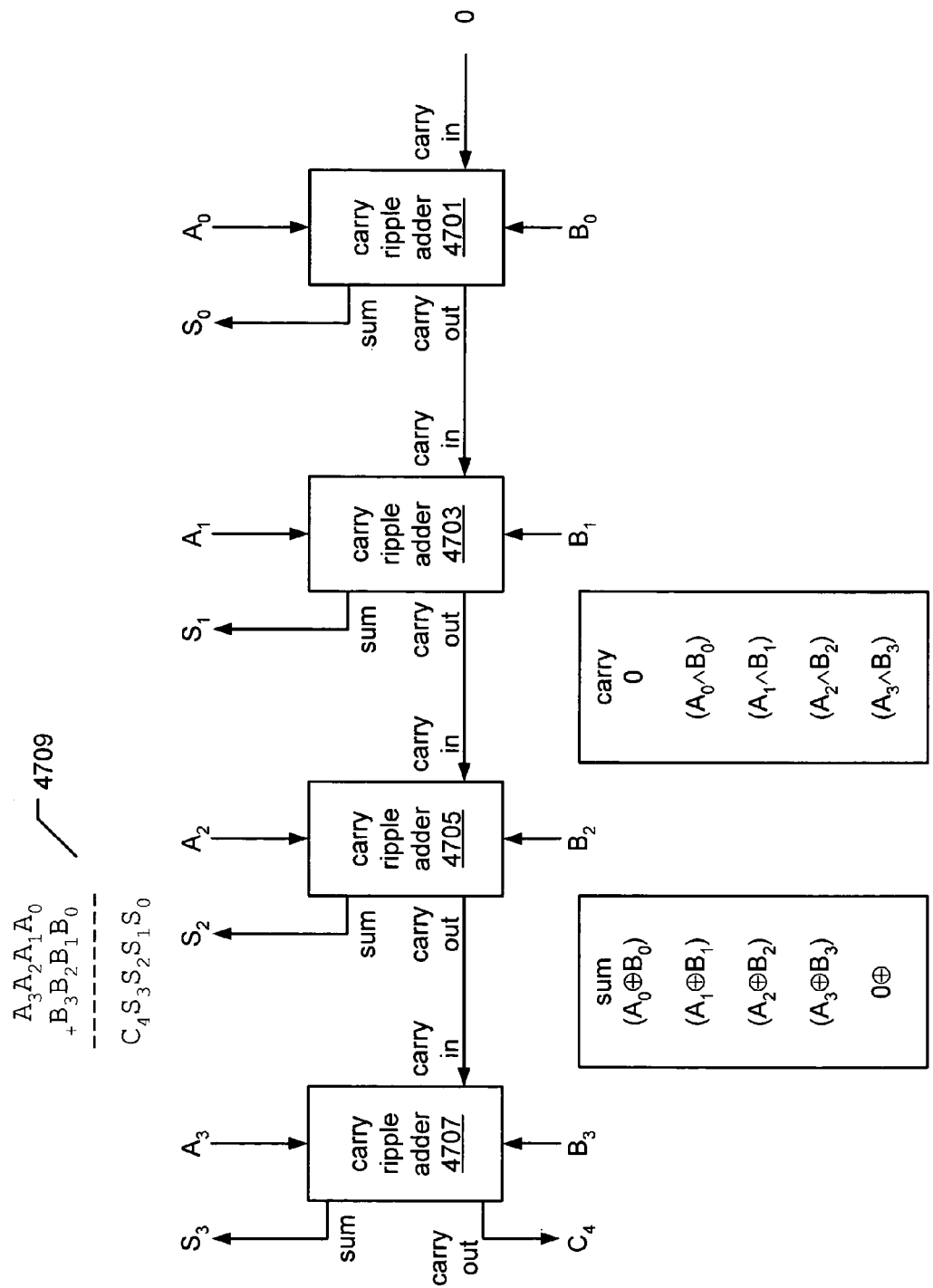
FIG. 47 is a graphical illustration of two methods of performing electronic addition.

FIG. 47 is a graphical illustration of two methods of performing electronic addition. The first method of performing electronic addition is through the use of the carry ripple adder. A carry ripple adder has basically three inputs. Two inputs for each bit to be added and a carry-in input. In addition to the three inputs the carry ripple adder has two outputs, the sum output and a carry-out output. Traditionally the carry-out output is tied to the carry in input of the next successive stage. Because the carry-out output from one stage is coupled to the carry-in input of a second stage the carry must ripple through the adders in order to arrive at a correct result. Performing the calculation illustrated at 4709 using a ripple carry adder four stages of ripple carry adders must be employed. These stages are illustrated at 4701, 4703, 4705 and 4707. It is obvious from the diagram that in order for a correct output to be achieved by a ripple carry adder a carry must ripple, or be propagated from the carry-out of ripple carry adder 4701 through ripple carry adder 4703, through ripple carry adder 4705 and finally into ripple carry adder 4707. Because the carry ripples earlier stages must complete their computation before the later stages can receive a valid input for the carry in and thus compute a valid output. In contrast using the process of carry sum addition can speed the addition process considerably. So in order to perform the addition 4709, carry save addition is performed using the format at 4711. Carry sum addition is a process known in the art. Carry ripple addition 4705 must have the final value ripple through 4 carry ripple adders in order to produce a valid result. In contrast with the carry sum adder, the computation of the sum and carry can be carried out simultaneously. Computation of the sum and carry equation will take only one delay period each. It should be obvious that a carry sum adder does not produce an output that is dependent on the numbers of digits being added because no ripple is generated. Only in the last stage of carry save add will a carry ripple effect be required. Therefore, the computation illustrated in FIG. 48B may be speeded up through the substitution of a carry look ahead for a ripple carry type adder.

Figure 48A:
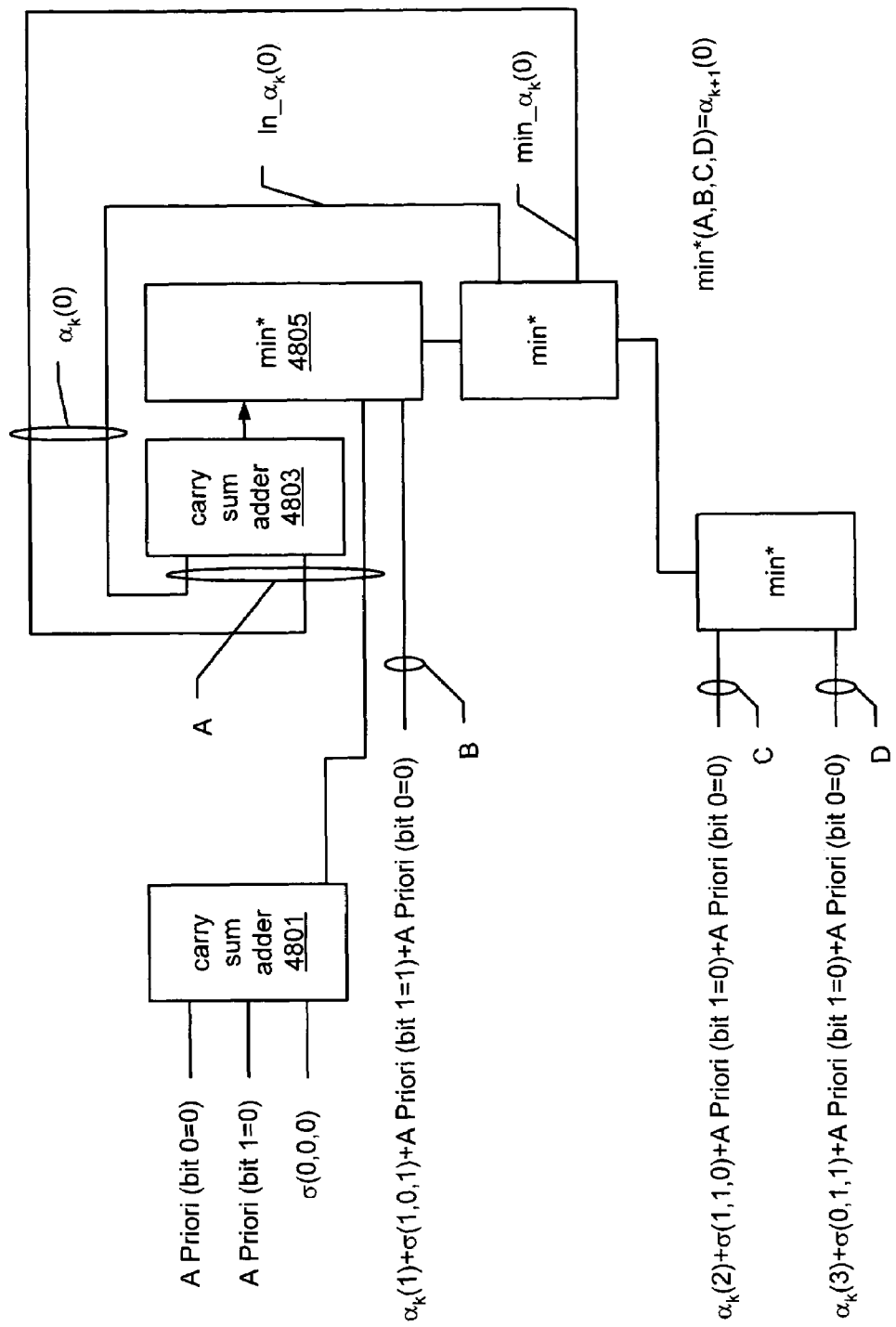
FIG. 48A is a block diagram in which a carry sum adder is added to a min* circuit according to an embodiment of the invention.

FIG. 48A is a block diagram in which a carry sum adder is added to a min* circuit according to an embodiment of the invention. FIG. 48A is essentially a copy of the circuit of FIG. 46B with the addition of carry ripple adder 4801 and carry save adder 4803. The carry ripple adder 4801 performs a carry sum add on the likelihood that an a priori (bit 0=0), the likelihood that an a priori (bit 1=0) and the likelihood of the transition metric Δ (0,0,0). The inputs for carry ripple adder 4801 may be added in carry sum adder 4803, however, since the inputs to the carry ripple adder are available earlier than the inputs to carry sum adder 4801, they may be precomputed (or predetermined) thereby increasing the speed of the overall circuit. In addition, in FIG. 48A the output of the min* operation has been split into two outputs.

Figure 48B:
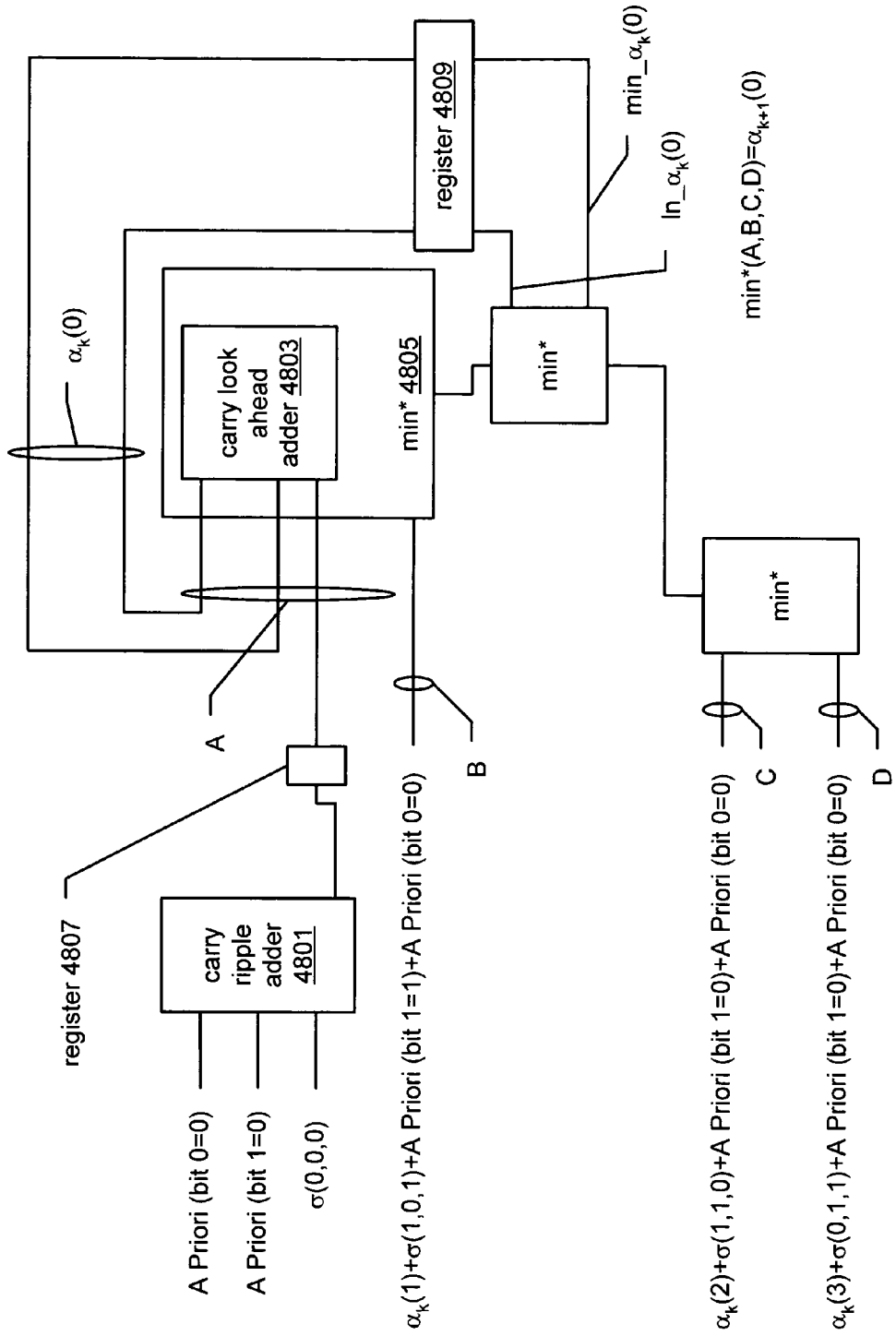
FIG. 48B is a block diagram in which a carry sum adder is added to a min* circuit according to an embodiment of the invention.

FIG. 48B is a block diagram in which a carry sum adder is added to a min* circuit according to an embodiment of the invention. In FIG. 48B register 4807 has been added. Register 4807 holds the values of the adder until they are needed in the min* block 4805. Since the inputs to adder 4801 re available before other inputs they can be combined to form a sum before the sum is needed thereby shortening the computation time over what would be the case if all the operands were combined only when they were all available. Register 4809 can hold values $Ln\_\alpha_k$ and $Min\_\alpha_k$ until they are needed. Carry look ahead adder 4803 is brought inside the min* block. Carry look ahead Adder is the fastest form of addition known. In addition, in FIG. 48B like FIG. 48A the output of the min* operation has been split into two outputs.

Figure 49:
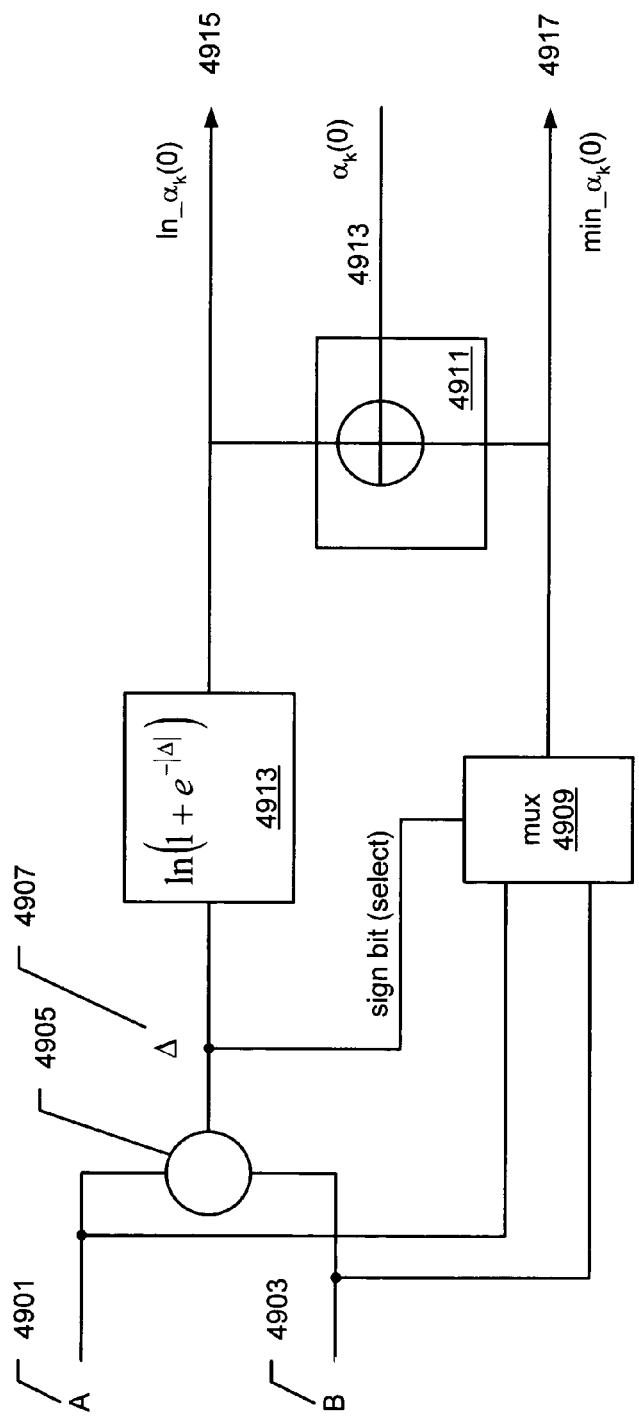
FIG. 49 is a graphical illustration of min* calculation.

The splitting of the min*output will be illustrated in successive drawings. To understand why the outputs of the min* is split into two separate outputs it is necessary to consider a typical min* type operation. Such a typical min* operation is illustrated in FIG. 49. FIG. 49 is an implementation of the min* operation. In FIG. 49 two inputs 4901 and 4903 receive the values on which the min* operation is to be performed. The values 4901 and 4903 are then subtracted in a subtractor 4905. Typically such a subtractor will involve negating one of the inputs and adding it to the other input. The difference between the A and B input is then provided at output 4907. The difference value Δ is used in both portions of the min* operation. That is the sign bit of Δ is used to select which of the inputs A or B is the minimum. This input is then selected in a circuit such as multiplexer 4909. Multiplexer 4909 is controlled by the sign bit of the Δ. The output of multiplexer 4909 is the minimum of A, B. In addition, the Δ is used in the log calculation of $Ln(1+e^{-*\Delta*})$ The output of the log calculation block 4913 is then summed with the minimum of A and B and the resulting summation is the min* of A, B. This operation too can be sped up by eliminating the adder 4911. Instead of making an addition in adder 4901, the output of the log calculation block 4913, also designated as $Ln\_\alpha_k(0)$ and the output of multiplexer 4909 abbreviated as $Min\_\alpha_k(0)$. By eliminating the addition in 4911 the operation of the min* will be speeded up. The addition operation must still be performed elsewhere. The addition operation is performed within the min* block 4805 in a carry save adder 4803 as illustrated in FIG. 48A.

With respect to FIG. 49, although the output of the min* operator, that is $Ln\_\alpha_k(0)$, i.e. 4915 and $Min\_\alpha_k(0)$, i.e. 4917 not combined until they are combined in adder 4911 two outputs are combined in block 4911 and form the $\alpha_k(0)$ values 4913. The values 4913 represent the values that are pushed on to stack 4019. As such, the operation 4911 can be relatively slow since the α values are being pushed on a stack for later usage in any instance. In other words, the output of the min* circuit of FIG. 49 is calculated twice. The first instance is the output of the log block 4913 and the multiplexer block 4909 are maintained as integral outputs 4915 and 4917. The integral outputs 4915 and 4917 are fed back to the input of the min* where they are combined with other values that are being added.

Figure 50A:
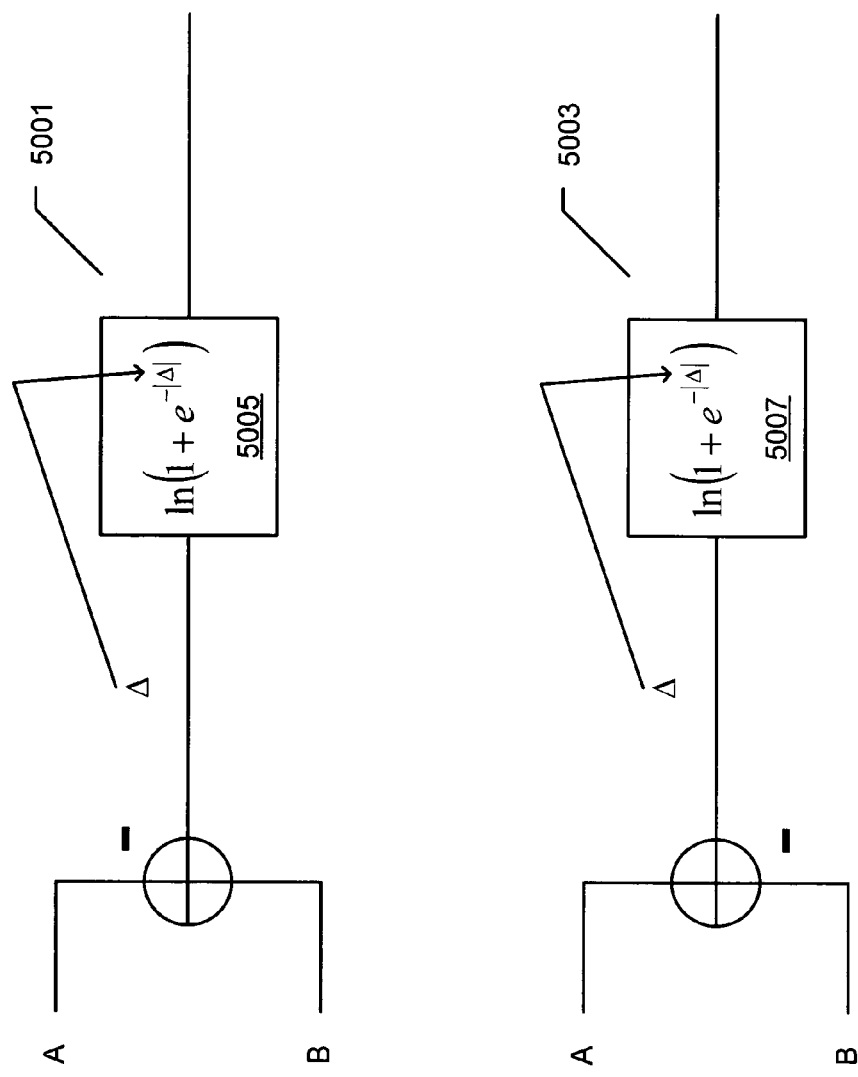
FIG. 50A is a graphical illustration of the computation of the log portion of the min* operation assuming that Δ is positive, as well as negative.

FIG. 50A is a graphical illustration of a portion of two min* circuits illustrated generally at 5001 and 5003. In the circuit of 5001 A and B are combined but it is assumed that B is larger than A and the value α will always be positive. In the second circuit it is assumed that the value of A will be larger than B and hence the α in circuit 5003 will always be positive. It is obvious that both assumptions cannot be correct. It is also obvious that one of the two assumptions must be correct. Accordingly, the circuit is duplicated and then a mechanism, which will be described later, is used to select the circuit that has made the correct assumption. Assuming both positive and negative values for α the process of computation of the log quantity of 5005 or 5007 can start when the first bit is produced by the subtraction of A and B. In other words, it is not necessary for the entire value to be computed in order to start the calculations in blocks 5005 and 5007. Of course, one of the calculations will be incorrect, and will have to be discarded. Once the least significant bit has been produced by the subtraction of A and B, the least significant bit of Δ can be placed in the calculation block 5005 or 5007 and the log calculation started. By not waiting until the entire Δ value has been produced, the process of computation can be further speeded up.

Figure 50B:
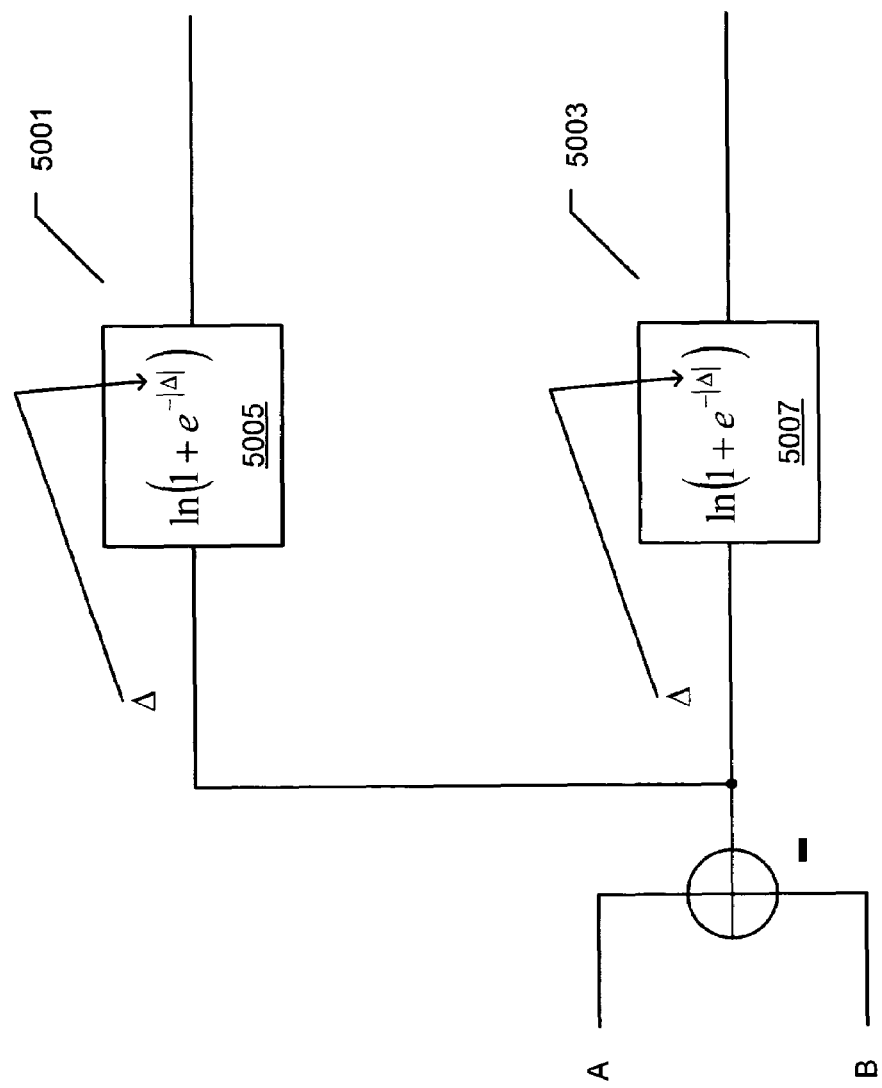
FIG. 50B is a graphical illustration of the computation of the log portion of the min* operation, a variation of FIG. 50A assuming that Δ is positive, as well as negative.

FIG. 50B is a graphical illustration of a portion of two min* circuits illustrated generally at 5001 and 5003. It is a variation of the circuit of FIG. 50A and either circuit may be used for the described computation.

Once the value of Δ 5107 is computed, it can be used in the calculation in block 5113. In order to properly compute the value in block 5113, the value of Δ needs to be examined. Since block 5113 the computation takes longer than the process of operating the multiplexer 5009 with the sign bit of the δ value of 5007. Since there is no way to determine a priori which value will be larger A or B, there is no way to know that the value of Δ will always be positive. However, although it is not known a priori which will be larger A or B duplicate circuits can be fabricated based on the assumption that A is larger than B and a second assumption that B is larger than A. Such a circuit is illustrated in FIG. 50.

The β values to be calculated in a similar fashion to the a value and all comments with respect to speeding up α calculations pertain to β calculations. The speed of the a computation and the speed of the beta computation should be minimized so that neither calculation takes significantly longer than the other. In other words, all speed-up techniques that are applied to the calculation of α values may be applied to the calculation of beta values in the reverse direction.

The calculation of the logarithmic portion of the min* operation represents a complex calculation. That is to say, the calculations needed to generate the log correction factor employed by either min* processing or max* processing is mathematically relatively complex, and hardware implementations of it can also be extremely difficult and cumbersome.

Figure 51:
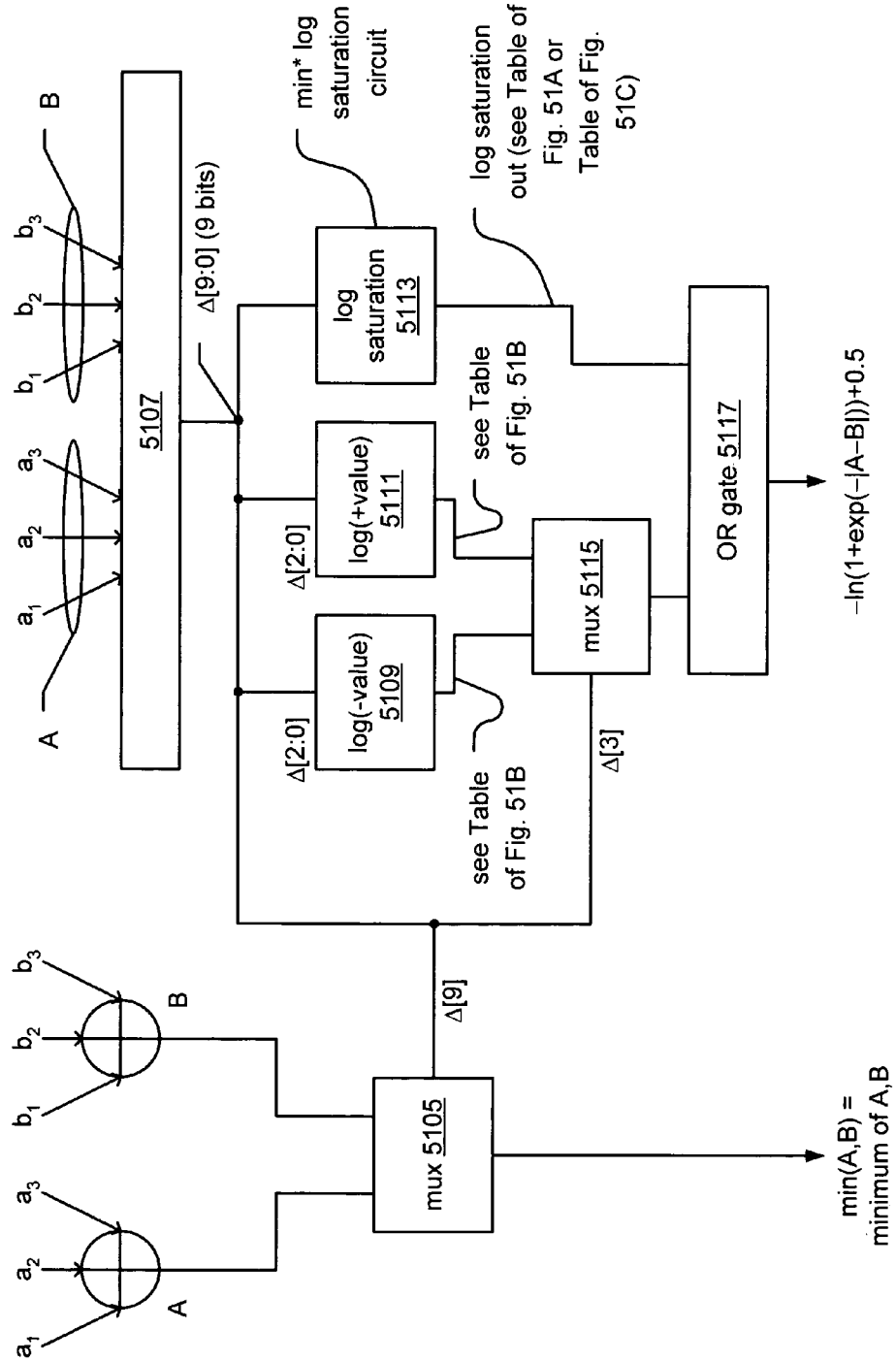
FIG. 51 is a graphical illustration of a min* circuit according to an embodiment of the invention.

FIG. 51A is a graphical illustration of the table used by the log saturation block of FIG. 51. This table illustrates a LUT (Look-Up Table) implementation of the log function. Realizing a function by using a LUT is one way of speeding a complex mathematical calculation. In the table it is seen that any value of delta larger than 1.25 or smaller than 1.25 will result in a log output equal to point 5. Therefore, instead of actually calculating the value of the logarithmic portion of the min* the table of FIG. 51A can be used. The table of 51A equivalently can be realized by Logic Equations 1 and 2. Logic Equation 1 represents the positive Δ values of the table of 51A, and Logic Equation 2 representing the negative Δ values of table 51A.

$$\text{Log-out} = -\log(\Delta) + 0.5 = \Delta(1) \text{ AND } \Delta(2) \quad \text{Logic Equation 1}$$

$$\text{Log-out} = -\log(-\Delta) + 0.5 = (\Delta(0) \text{ AND } \Delta(1)) \text{ NOR } \Delta(2) \quad \text{Logic Equation 2}$$

Those skilled in the art will realize that any equivalent Boolean expression will yield the same result, and that the lookup table may be equivalently replaced by logic implementing Logic Equation 1 and Logic Equation 2 or their equivalents.

FIG. 51A is a log table which contain look-up value for the calculation of the log portion of the min* operation. The table of FIG. 51A also illustrates that the value of delta (Δ) need only be known to the extent of its three least significant bits. Blocks 5109 and 5111 in FIG. 51 represent the calculation of the logarithm of the minus delta value and the calculation logarithm of the plus delta value. The outputs of these two block represent the simultaneously available negative log correction factor (ln(−value)) and positive log correction factor (ln(−value)), respectively. These two log correction factors are calculated simultaneously and in parallel, as is also described in more detail below.

The valid log correction factor calculation, between 5109 and 5111, is selected by multiplexer 5115 and OR gate 5117. The output of log saturation circuit 5113 is a 1 if all inputs are not equal to logic zero and all inputs are not equal to logic one.

Multiplexer 5105 also is controlled by the value of delta as is multiplexer 5115. Multiplexer 5115 can be controlled by bit 3 of delta. (Any error caused by the selection of the wrong block 5109 or 5111 by using Δ bit 3 instead of Δ 9, the sign bit, is made up for in the log saturation block 5113. How this works can be determined by consider FIG. 51C.

FIG. 51B is a graphical illustration of the table used by the log(−value) and log(+value) blocks of FIG. 51. This table shows how a log correction factor having only a single bit of precision (in the context of finite precision mathematics implemented using digital signal processing) may be employed. For example, when the calculated value of Δ[2:0] (having a 3 bit word width) is determined, then a predetermined value for each of the log correction factors (ln(−value)) and (ln(+value)) may be immediately selected. This approach provides for extremely fast processing. In addition, the use of this single bit precision provides for virtually no degradation is operational speed of these calculations employed when decoding coded signals. The use of this single bit of precision also provides for very improved performance.

Figure 51C:
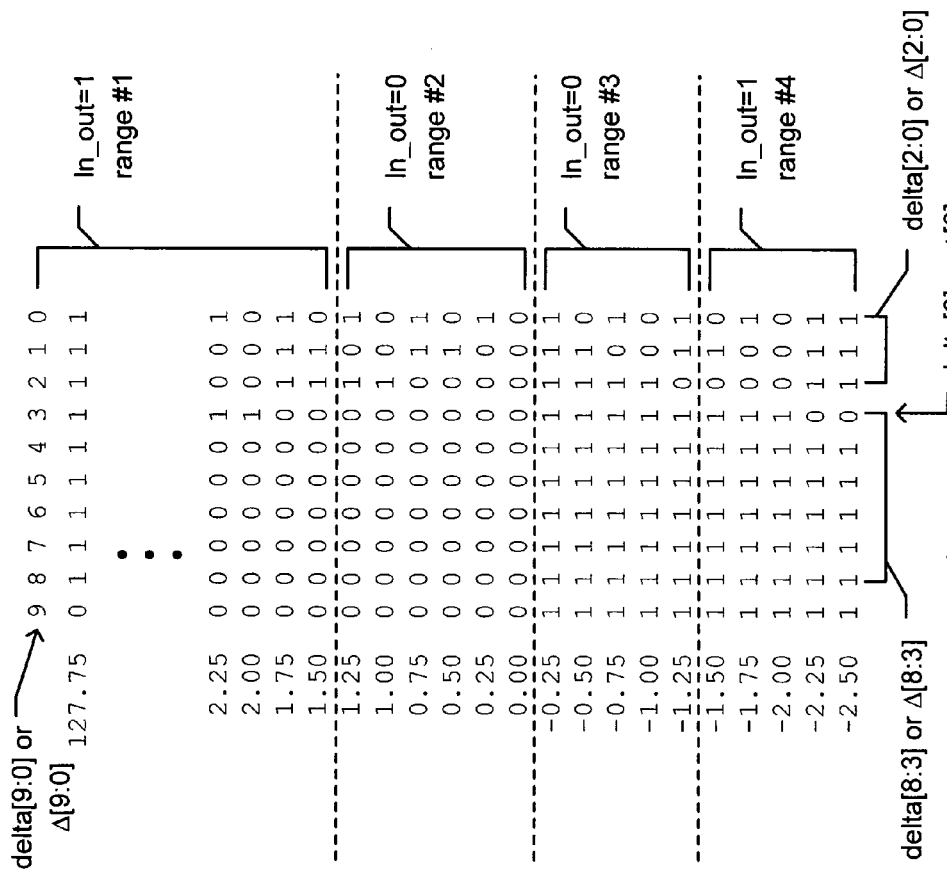
FIG. 51A is a graphical illustration of the table used by the log saturation block of FIG. 51.
FIG. 51B is a graphical illustration of the table used by the log(−value) and log(+value) blocks of FIG. 51.

FIG. 51C is a graphical illustration of a simplified version of the table of FIG. 51A. This diagram is a graphical illustration of a table used in the log saturation of FIG. 51. In RANGE#2 and RANGE#4 where ln_out is 0, Δ 3 selects the right range for ln_out (i.e., when it's 0, it select log(+value) for in/out to be 0, and when it's 1 it selects log(−value) for ln_out to be 0). In RANGE#1 (i.e., +value), when Δ 3 changes from 0 to 1, this would select incorrectly log(−value) for the MUX (Multiplexor) output. However, the selected (MUX) output is overwritten at the OR gate by the Log Saturation block. This Log Saturation block detects that Δ[8:3] is not all 0's (e.g., it's 000001) then it would force the ln_out to be 1 which is the right value of RANGE#1.

Similarly, for RANGE#4 (i.e., −value), when Δ 3 changes from 1 to 0, it would select in correctly the log(+value) for the MUX output. However, the selected (MUX) output is overwritten at the OR gate by the Log Saturation block. This Log Saturation block detects that Δ 8:3 is not all 1's (e.g., it's 111110) when it would force the in/out to be 1 which is the right value for RANGE #4. The sign bit of Δ controls whether A or B is selected be passed through the output. The input to the A and B adders 5101 and 5103 are the same as that shown in FIG. 48A. A and B form sums separately so that the correct sum may be selected by multiplexer 5105. In contrast the carry sum adder 5107 can accept all the inputs to A and B in order to calculate Δ. Of course, one of the inputs must be in two's compliment form so that the subtraction of A minus B can be accomplished. In other words, either the A or B values can be negated and two's complimented and then add to the other values in order to form the Δ value. The negating of a value is a simple one gate operation. Additionally, the forming of a two's compliment by adding one is relatively simple because in the carry sum addition first stage is assumed to have a carry of zero. By assuming that that carry is equal to one instead of a zero a two's complimentary value can be easily formed.

Figure 52A:
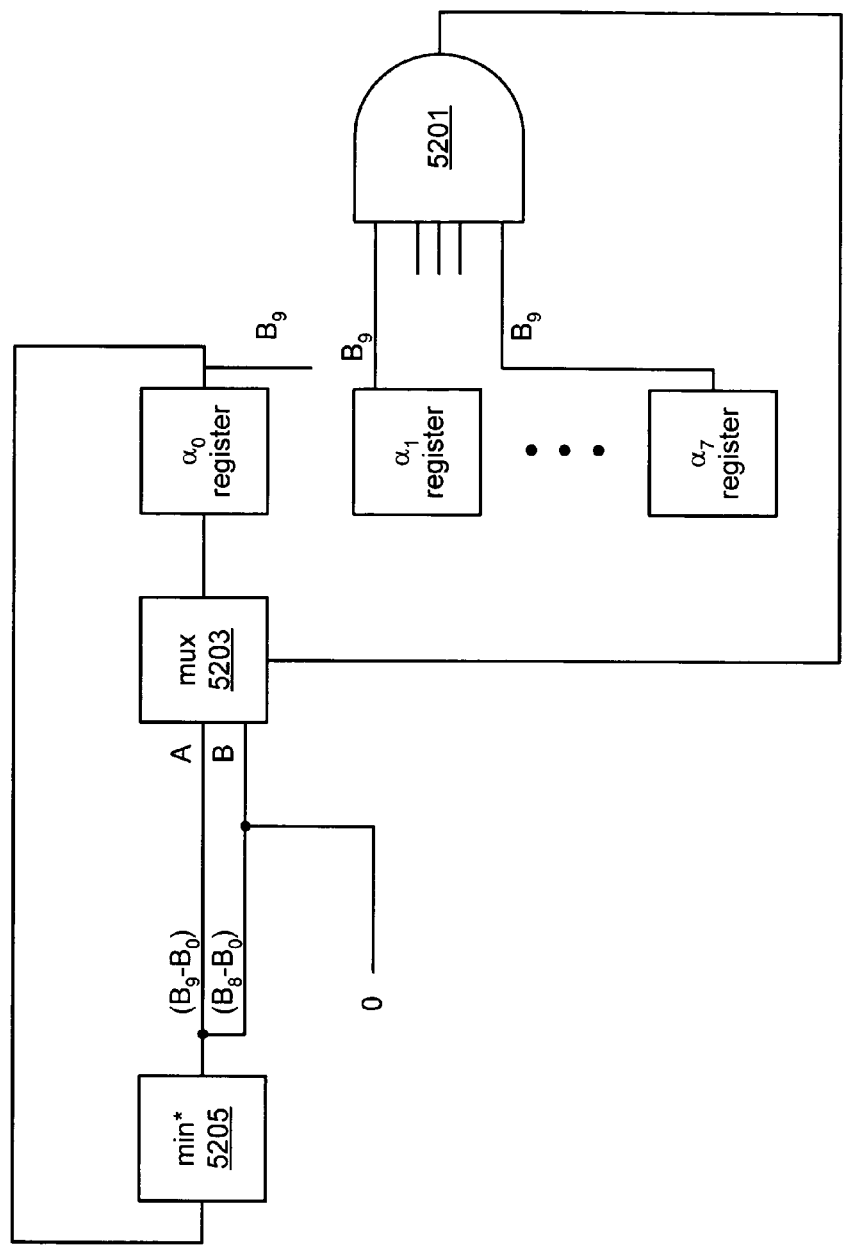
FIG. 52A is a graphical illustration and circuit diagram indicating a way in which alpha values within a SISO may be normalized.

FIG. 52A is a graphical illustration and circuit diagram indicating a way in which a values within the SISO may be normalized. As the α values within the SISOs tend to converge the values in the registers patrol the α values have a tendency to grow between iterations. In order to keep the operation of the SISO as economical as possible in terms of speed and memory usage, the value stored in the α register should be kept as small as only needed for the calculations to be performed. One method of doing this is the process called normalization. The process of normalization in the present embodiment occurs when the high order bit of the value in all the α registers is a 1. This condition indicates that the most significant bit in each α register is set. Once the condition where all of the most significant bits in all of the α registers are set then all of the most significant bits can be reset on the next cycle in order to subtract a constant value from each of the values within the α registers. Such a process can be done using subtraction of course, but that would involve substantially more delay and hardware. The process illustrated in FIG. 52 involves only one logic gate being inserted into the timing critical path of the circuit. Once the all most significant α bits condition is detected by AND gate 5201 multiplexer 5203 can be activated. Multiplexer 5203 may be implemented as a logic gate, for example, an AND gate. Bits $B_0$ through $B_8$ are provided to the $α_0$ register. Either $B_9$ or a zero is provided to the $α_0$ register depending on the output of AND gate 5201. Accordingly, only 1 gate delay is added by normalizing the α values. In such a manner a constant value can be subtracted from each of the α registers without increasing any cycle time of the overall decoder circuit.

Figure 52B:
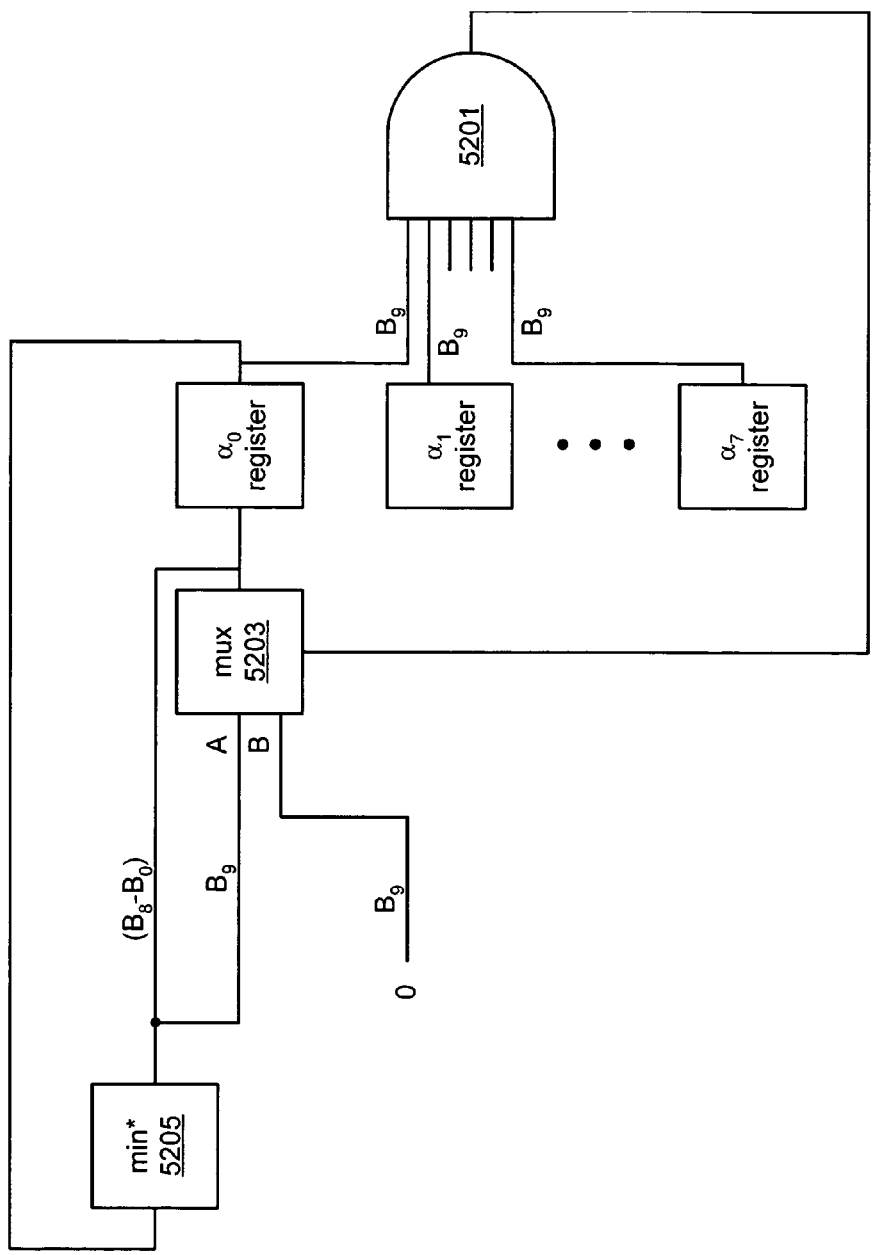
FIG. 52B is a graphical illustration and circuit diagram indicating an alternate way in which alpha values within a SISO may be normalized.

FIG. 52B is a graphical illustration and circuit diagram indicating an alternate way in which a values within the SISO may be normalized. The circuit is similar to that illustrated in FIG. 52A. The multiplexor 5203 selects only bit 9 (the most significant bit, as a being passed through or being normalized to 0.

The use of the min* circuit has been described above in some detail for use is assisting in the calculations to be performed when decoding various coded signals. It is noted that the operation of the min* circuit may be referred to as min* processing or calculations as being performed by a min* operator as well without departing from the scope and spirit of the invention. Another circuit is provided here that may be used for decoding of various coded signals. A relatively closely related operator is the min* operator. A quick review of min* processing is provided below and then min* processing is provided.

The min* processing functionality described herein may be better understood by the following description. The min* processing includes determining a minimum value from among two values (e.g., shown as min(A,B) in min* processing) as well as determining a logarithmic correction factor (e.g., shown as $\ln(1+e^{-|A-B|})$ in min* processing) in selecting the smaller metric; this logarithmic correction factor is also sometimes referred to as a log correction factor. There are two possible forms of the log correction factor, namely, a positive log correction factor and a negative log correction factor (sometimes referred to as ln(+value) and ln(−value) or as log(+value) and log(−value)). The ln(+value) corresponds to $\ln(1+e^{-(A-B)})$, and the ln(−value) is corresponds to $\ln(1+e^{-(B-A)})$.

Generally, regardless of by which convention these first log correction factor and the second log correction factor are depicted (e.g., by either "ln" or "log"), the calculations are typically performed within the natural logarithm domain (e.g., operating using the logarithm with base "e").

In addition, it is also noted that max* processing may alternatively be performed in place of min* processing. The max* processing operation also includes a corresponding log correction in selecting the larger metric. In contradistinction, min* processing operation includes a corresponding log correction in selecting the smaller metric. It is noted that the various embodiments of the invention may be implemented using the max* operations in lieu of the min* operation when preferred in a given implementation.

The min* processing, when operating on inputs A and B, may be expressed as follows:

$$\min^*(A,B) = \min(A,B) - \ln(1+e^{-|A-B|})$$

The min* processing result may be viewed as being the minimum value of the two inputs (A or B) minus a log correction factor ($\ln(1+e^{-|A-B|})$). In actual implementation embodiments, an offset may also be used to bias the result of the min* processing. For example, in these situations, the min* processing result may be viewed as being the minimum value of the two inputs (A or B) minus a log correction factor ($\ln(1+e^{-|A-B|})$) plus some offset constant value.

Again, as desired or appropriate, max* processing may alternatively be used in place of min* processing.

The max* processing, when operating on inputs A and B, may be expressed as follows:

$$\max^*(A,B) = \max(A,B) + \ln(1+e^{-|A-B|})$$

The max* processing result may be viewed as being the maximum value of the two inputs (A or B) plus a log correction factor ($\ln(1+e^{-|A-B|})$). Similar to the offset usage in min* processing, in an actual implementation, an offset may also be used to bias the result of the max* processing. For example, in these situations, the max* processing result may be viewed as being the maximum value of the two inputs (A or B) plus a log correction factor ($\ln(1+e^{-|A-B|})$) plus some offset constant value.

As can be seen, the log correction factor is added to the selection of the maximum value (A or B) within max* processing. In contradistinction, the log correction factor is subtracted from the selection of the minimum value (A or B) within min* processing.

Moreover, when multiple min* operations are to be performed on multiple values (e.g., more than 2), min* processing may be expressed as follows:

$$\min^*(x_1,\ldots,x_N) = \min^*(\min^*(x_1,\ldots,x_{N-1}),x_N)$$

This relationship is also true when multiple max* operations are to be performed on multiple values (e.g., more than 2). Such max* processing may be expressed as follows:

$$\max^*(x_1,\ldots,x_N) = \max^*(\max^*(x_1,\ldots,x_{N-1}),x_N)$$

Such a relationship can be valuable when performing some of the various calculations when decoding various coded signals.

It is also noted that simply max processing (e.g., max(A, B)=A if A≧B, otherwise B) or min processing (e.g., min(A, B)=A if A≦B otherwise B) may be employed in very simplistic embodiments in which speed is of an utmost concern and a degree of computational complexity is desired to be kept at a minimum. However, this desire to keep computational complexity at a minimum and hopefully to operate at the fastest possible speeds (by performing only min processing or max processing) can come at a significant cost in terms of performance degradation.

Various other embodiments are also presented below by which a compromise may be used to introduce virtually no degradation in operational and processing speed when decoding coded signals yet still providing a relatively high degree of performance in terms of a significantly lower BER (Bit Error Rate) that more closely approaches Shannon's limit when compared to performing only min processing or max processing (that includes no log correction factor).

In some embodiments, a log correction factor (calculated using finite precision mathematics) having only a single bit of precision is employed. This single bit of precision of the log correction factor introduces virtually no latency in the calculations required to perform decoding of such coded signals as presented herein, and yet it adds a significant degree of precision the calculations performed in accordance with min* processing or max* processing.

While much of the written description and FIGURES presented above and the corresponding FIGURES have depicted encoding and decoding of turbo coded signals and/or TTCM coded signals. It is also noted that many of the same circuits that are employed to perform decoding of these turbo coded signals and/or TTCM coded signals may also be adapted to assist and perform many of the various calculations within other types of coded signals.

For example, LDPC (Low Density Parity Check) coded signals are one type of coded signal whose decoding can benefit greatly from the very fast circuits and decoding approaches presented herein for decoding of other types of coded signals. Many of the various circuits and calculations performed when decoding turbo coded and TTCM coded signals may also be adapted to assist in decoding LDPC coded signals.

A presentation to LDPC coded signals and some approaches by which LDPC coded signals may be decoded according to the invention are presented below. In addition, various communication device embodiments and communication system embodiments are also presented below showing some of the many ways in which encoding and decoding of signals may be performed in accordance with the invention. Any of these embodiments may appropriately be adapted to perform processing of turbo coded signals or TTCM coded signals. Similarly, any of these embodiments may appropriately be adapted to perform processing of LDPC coded signals.

Many of the various functional blocks and circuits within devices that perform decoding of such coded signals may capitalize on the various types of fast and efficient circuitries presented herein. More specifically, some types of encoding that may be performed within such of these various communication device embodiments and communication system embodiments include 1. LDPC encoding or 2. turbo encoding or TTCM encoding. The corresponding types of decoding that may be performed within such of these various communication device embodiments and communication system embodiments include the corresponding 1. LDPC decoding, or 2. MAP decoding (e.g., some variations of which are sometimes referred to simply as turbo decoding or TTCM decoding). Any of these various decoding approaches may be performed using min* processing, max* processing, or max processing in accordance with various aspects of the invention.

Generally speaking, various aspects of the invention may be found in any number of devices that perform decoding of LDPC coded signals or decoding of turbo coded signals or TTCM coded signals. Sometimes, these devices support bidirectional communication and are implemented to perform both encoding and decoding of 1. LDPC coded signals or 2. turbo coded signals or TTCM coded signals.

In some instances of the invention, the turbo encoding or TTCM encoding is performed in such a way as to generate a variable modulation signal whose modulation may vary as frequently as on a symbol by symbol basis. That is to say, the constellation and/or mapping of the symbols of a turbo coded variable modulation signal (or TTCM coded variable modulation signal) may vary as frequently as on a symbol by symbol basis. In addition, the code rate of the symbols of the coded signal may also vary as frequently as on a symbol by symbol basis. In general, a turbo coded signal to TTCM coded signal generated according these encoding aspects may be characterized as a variable code rate and/or modulation signal.

Moreover, in some embodiments operating using LDPC coded signals, the encoding may be performed by combining LDPC encoding and modulation encoding to generate an LDPC coded signal. In some instances of the invention, the LDPC encoding is combined with modulation encoding in such a way as to generate a variable modulation signal whose modulation may vary as frequently as on a symbol by symbol basis. That is to say, the constellation and/or mapping of the symbols of an LDPC coded variable modulation signal may vary as frequently as on a symbol by symbol basis. In addition, the code rate of the symbols of the coded signal may also vary as frequently as on a symbol by symbol basis. In general, an LDPC signal generated according these encoding aspects may be characterized as a variable code rate and/or modulation signal.

The novel approaches to decoding of coded signals that is presented herein can be applied to any of these various types of coded signals (e.g., 1. LDPC coded signals or 2. turbo coded signals or TTCM coded signals). The simplified calculations required to perform decoding processing of such coded signals are significantly reduced in complexity by various aspects of the invention. Moreover, the fast operational speed of such of these various circuitries provides a means by which virtually no latency is introduced into the decoding processing of such coded signal while nevertheless providing a very high degree of performance of lower BER approaching ever closer to Shannon's limit.

Various communication devices and communication system embodiments are described below in which many of the various aspects of the invention may be implemented. In general, any communication device that performs encoding and/or decoding of signals may benefit from the invention. Some exemplary types of coded signals (e.g., 1. LDPC coded signals or 2. turbo coded signals or TTCM coded signals) are explicitly identified in many of the following diagrams. Generally speaking, communication devices at a transmitter end of a communication channel within many of these embodiments are described as performing encoding of signals using either 1. LDPC encoding or 2. turbo encoding (or TTCM encoding). Therefore, communication devices at a receiver end of such a communication channel within these various embodiments are described as performing decoding of signals using either the appropriately corresponding 1. LDPC decoding, or 2. MAP decoding. The MAP decoding approach may be appropriately adapted to performing decoding of turbo coded signal or TTCM coded signals.

While the LDPC coded signal type and the turbo coded signal type (as well as the TTCM coded signal type) are used for illustrative purposes as some of the particular signal types whose decoding processing may benefit from various aspects of the invention, it is nevertheless understood that decoding processing of any type of coded signal whose calculations may be performed using min* processing or max* processing may also benefit from various aspects of the invention. That is to say, the calculations employed within decoding processing can be performed in a much more efficient and fast manner by using the various aspects of the invention. This provides a means by which decoding processing can be performed in a way that is faster than approaches performed within the prior art, and a very high degree of performance can still be provided.

Figure 53:
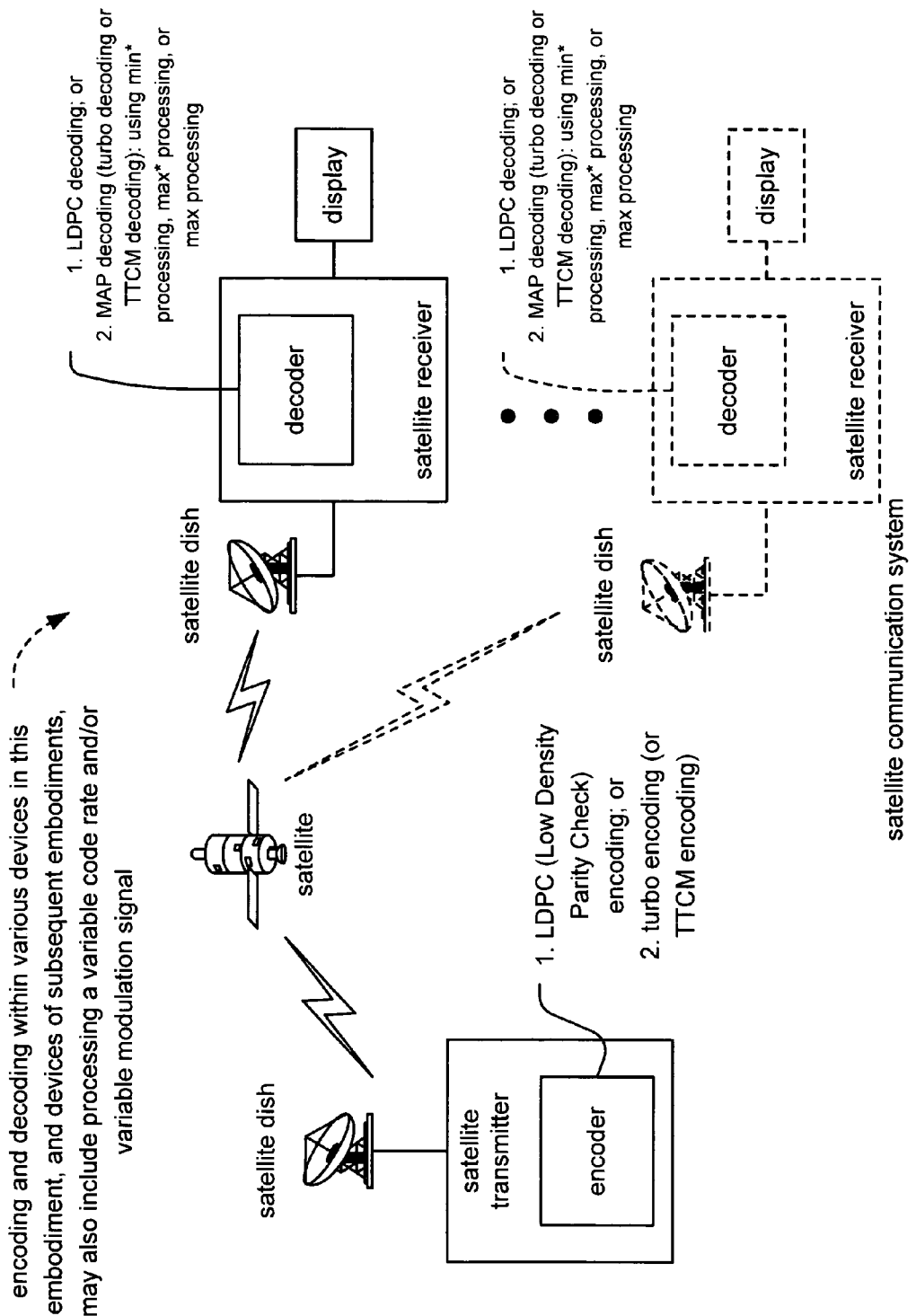
FIG. 53 is a system diagram illustrating an embodiment of a satellite communication system that is built according to the invention.

FIG. 53 is a system diagram illustrating an embodiment of a satellite communication system that is built according to the invention. A satellite transmitter is communicatively coupled to a satellite dish that is operable to communicate with a satellite. The satellite transmitter may also be communicatively coupled to a wired network. This wired network may include any number of networks including the Internet, proprietary networks, other wired networks and/or WANs (Wide Area Networks). The satellite transmitter employs the satellite dish to communicate to the satellite via a wireless communication channel. The satellite is able to communicate with one or more satellite receivers (each having a satellite dish). Each of the satellite receivers may also be communicatively coupled to a display.

Here, the communication to and from the satellite may cooperatively be viewed as being a wireless communication channel, or each of the communication links to and from the satellite may be viewed as being two distinct wireless communication channels.

For example, the wireless communication "channel" may be viewed as not including multiple wireless hops in one embodiment. In other multi-hop embodiments, the satellite receives a signal received from the satellite transmitter (via its satellite dish), amplifies it, and relays it to satellite receiver (via its satellite dish); the satellite receiver may also be implemented using terrestrial receivers such as satellite receivers, satellite based telephones, and/or satellite based Internet receivers, among other receiver types. In the case where the satellite receives a signal received from the satellite transmitter (via its satellite dish), amplifies it, and relays it, the satellite may be viewed as being a "transponder;" this is a multi-hop embodiment. In addition, other satellites may exist that perform both receiver and transmitter operations in cooperation with the satellite. In this case, each leg of an up-down transmission via the wireless communication channel would be considered separately.

In whichever embodiment, the satellite communicates with the satellite receiver. The satellite receiver may be viewed as being a mobile unit in certain embodiments (employing a local antenna); alternatively, the satellite receiver may be viewed as being a satellite earth station that may be communicatively coupled to a wired network in a similar manner in which the satellite transmitter may also be communicatively coupled to a wired network.

The satellite transmitter is operable to encode information (using an encoder) in a manner in accordance with the functionality and/or processing of at least some of the various aspects of the invention to assist in generating a signal that is to be launched into the communication channel coupling the satellite transmitter and the satellite receiver. The satellite receiver is operable to decode a signal (using a decoder) received from the communication channel in a manner in accordance with the functionality and/or processing of at least some of the various aspects of the invention. This diagram shows one embodiment where one or more of the various aspects of the invention may be found.

Figure 54:
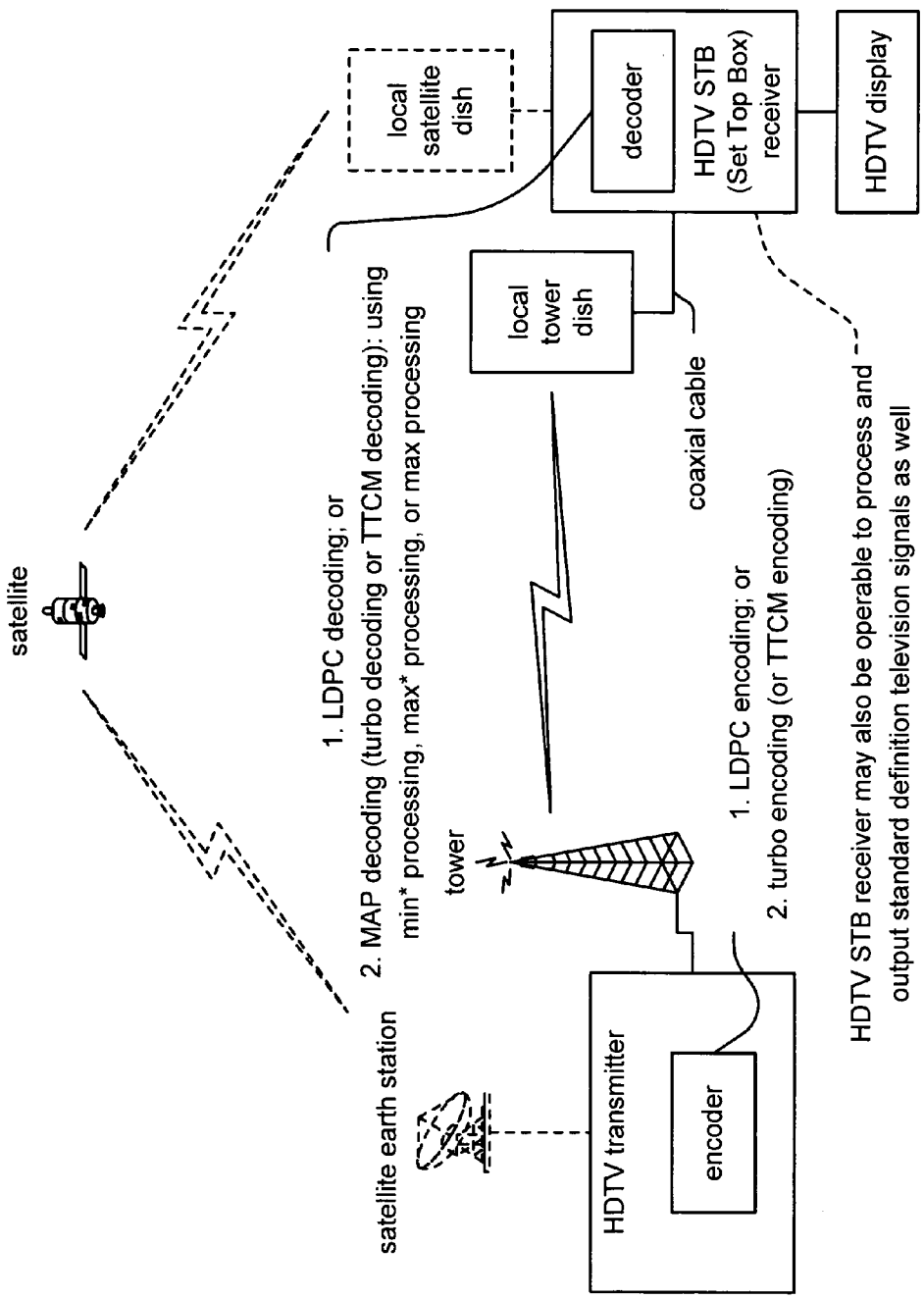
FIG. 54 is a system diagram illustrating an embodiment of an HDTV (High Definition Television) communication system that is built according to the invention.

FIG. 54 is a system diagram illustrating an embodiment of an HDTV (High Definition Television) communication system that is built according to the invention. An HDTV transmitter is communicatively coupled to a tower. The HDTV transmitter, using its tower, transmits a signal to a local tower dish via a wireless communication channel. The local tower dish may communicatively couple to an HDTV STB (Set Top Box) receiver via a coaxial cable. The HDTV STB receiver includes the functionality to receive the wireless transmitted signal that has been received by the local tower dish. This functionality may include any transformation and/or down-converting that may be needed to accommodate for any up-converting that may have been performed before and during transmission of the signal from the HDTV transmitter and its corresponding tower to transform the signal into a format that is compatible with the communication channel across which it is transmitted. For example, certain communication systems step a signal that is to be transmitted from a baseband signal to an IF (Intermediate Frequency) signal, and then to a carrier frequency signal before launching the signal into a communication channel. Alternatively, some communication systems perform a conversion directly from baseband to carrier frequency before launching the signal into a communication channel. In whichever case is employed within the particular embodiment, the HDTV STB receiver is operable to perform any down-converting that may be necessary to transform the received signal to a baseband signal that is appropriate for demodulating and decoding to extract the information there from.

The HDTV STB receiver is also communicatively coupled to an HDTV display that is able to display the demodulated and decoded wireless transmitted signals received by the HDTV STB receiver and its local tower dish. The HDTV STB receiver may also be operable to process and output standard definition television signals as well. For example, when the HDTV display is also operable to display standard definition television signals, and when certain video/audio is only available in standard definition format, then the HDTV STB receiver is operable to process those standard definition television signals for use by the HDTV display.

The HDTV transmitter (via its tower) transmits a signal directly to the local tower dish via the wireless communication channel in this embodiment. In alternative embodiments, the HDTV transmitter may first receive a signal from a satellite, using a satellite earth station that is communicatively coupled to the HDTV transmitter, and then transmit this received signal to the local tower dish via the wireless communication channel. In this situation, the HDTV transmitter operates as a relaying element to transfer a signal originally provided by the satellite that is ultimately destined for the HDTV STB receiver. For example, another satellite earth station may first transmit a signal to the satellite from another location, and the satellite may relay this signal to the satellite earth station that is communicatively coupled to the HDTV transmitter. In such a case the HDTV transmitter include transceiver functionality such that it may first perform receiver functionality and then perform transmitter functionality to transmit this received signal to the local tower dish.

In even other embodiments, the HDTV transmitter employs its satellite earth station to communicate with the satellite via a wireless communication channel. The satellite is able to communicate with a local satellite dish; the local satellite dish communicatively couples to the HDTV STB receiver via a coaxial cable. This path of transmission shows yet another communication path where the HDTV STB receiver may communicate with the HDTV transmitter.

In whichever embodiment and by whichever signal path the HDTV transmitter employs to communicate with the HDTV STB receiver, the HDTV STB receiver is operable to receive communication transmissions from the HDTV transmitter and to demodulate and decode them appropriately.

The HDTV transmitter is operable to encode information (using an encoder) in a manner in accordance with the functionality and/or processing of at least some of the various aspects of the invention to assist in generating a signal that is to be launched into the communication channel coupling the HDTV transmitter and the HDTV STB receiver. The HDTV STB receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

FIG. 55A and FIG. 55B are system diagrams illustrating embodiments of uni-directional cellular communication systems that are built according to the invention.

Referring to the FIG. 55A, a mobile transmitter includes a local antenna communicatively coupled thereto. The mobile transmitter may be any number of types of transmitters including a one way cellular telephone, a wireless pager unit, a mobile computer having transmission functionality, or any other type of mobile transmitter. The mobile transmitter transmits a signal, using its local antenna, to a cellular tower via a wireless communication channel. The cellular tower is communicatively coupled to a base station receiver; the receiving tower is operable to receive data transmission from the local antenna of the mobile transmitter that has been communicated via the wireless communication channel. The cellular tower communicatively couples the received signal to the base station receiver.

The mobile transmitter is operable to encode information (using an encoder) in a manner in accordance with the functionality and/or processing of at least some of the various aspects of the invention to assist in generating a signal that is to be launched into the communication channel coupling the mobile transmitter and the base station receiver. The base station receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Referring to the FIG. 55B, a base station transmitter includes a cellular tower communicatively coupled thereto. The base station transmitter, using its cellular tower, transmits a signal to a mobile receiver via a communication channel. The mobile receiver may be any number of types of receivers including a one-way cellular telephone, a wireless pager unit, a mobile computer having receiver functionality, or any other type of mobile receiver. The mobile receiver is communicatively coupled to a local antenna; the local antenna is operable to receive data transmission from the cellular tower of the base station transmitter that has been communicated via the wireless communication channel. The local antenna communicatively couples the received signal to the mobile receiver.

The base station transmitter is operable to encode information (using an encoder) in a manner in accordance with the functionality and/or processing of at least some of the various aspects of the invention to assist in generating a signal that is to be launched into the communication channel coupling the base station transmitter and the mobile receiver. The mobile receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 56:
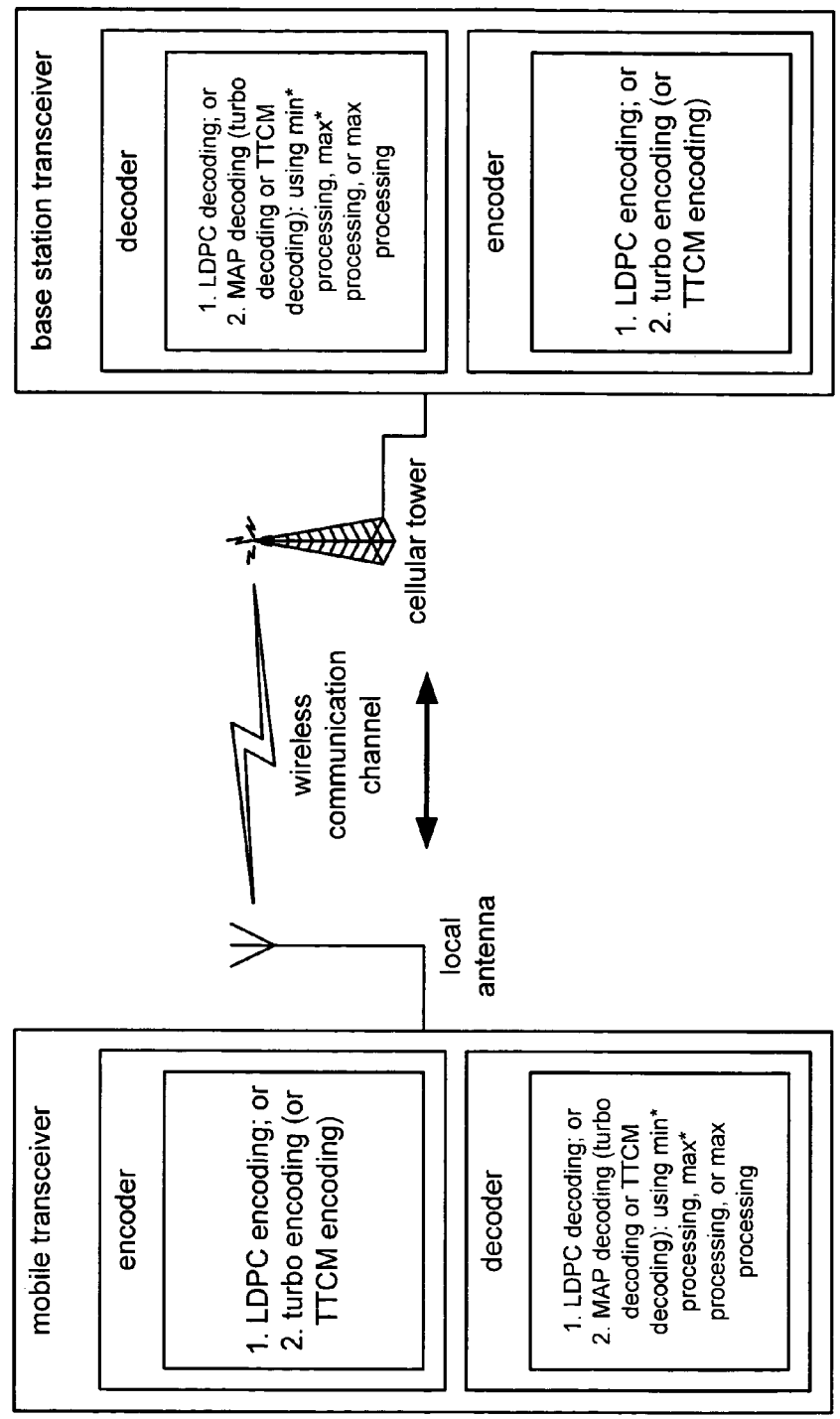
FIG. 56 is a system diagram illustrating an embodiment of a bi-directional cellular communication system that is built according to the invention.

FIG. 56 is a system diagram illustrating an embodiment of a bidirectional cellular communication system, built according to the invention, where the communication can go to and from the base station transceiver and to and from the mobile transceiver via the wireless communication channel.

Referring to the FIG. 56, a base station transceiver includes a cellular tower communicatively coupled thereto. The base station transceiver, using its cellular tower, transmits a signal to a mobile transceiver via a communication channel. The reverse communication operation may also be performed. The mobile transceiver is able to transmit a signal to the base station transceiver as well. The mobile transceiver may be any number of types of transceivers including a cellular telephone, a wireless pager unit, a mobile computer having transceiver functionality, or any other type of mobile transceiver. The mobile transceiver is communicatively coupled to a local antenna; the local antenna is operable to receive data transmission from the cellular tower of the base station transceiver that has been communicated via the wireless communication channel. The local antenna communicatively couples the received signal to the mobile transceiver.

The base station transceiver is operable to encode information (using its corresponding encoder) that is to be transmitted to the mobile transceiver. The mobile transceiver is operable to decode the transmitted signal (using its corresponding decoder). Similarly, mobile transceiver is operable to encode information (using its corresponding encoder) that is to be transmitted to the base station transceiver; the base station transceiver is operable to decode the transmitted signal (using its corresponding decoder).

As within other embodiments that employ an encoder and a decoder, the encoder of either of the base station transceiver or the mobile transceiver may be implemented to encode information (using its corresponding encoder) in a manner in accordance with the functionality and/or processing of at least some of the various aspects of the invention to assist in generating a signal that is to be launched into the communication channel coupling the base station transceiver and the mobile transceiver. The decoder of either of the base station transceiver or the mobile transceiver may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 57:
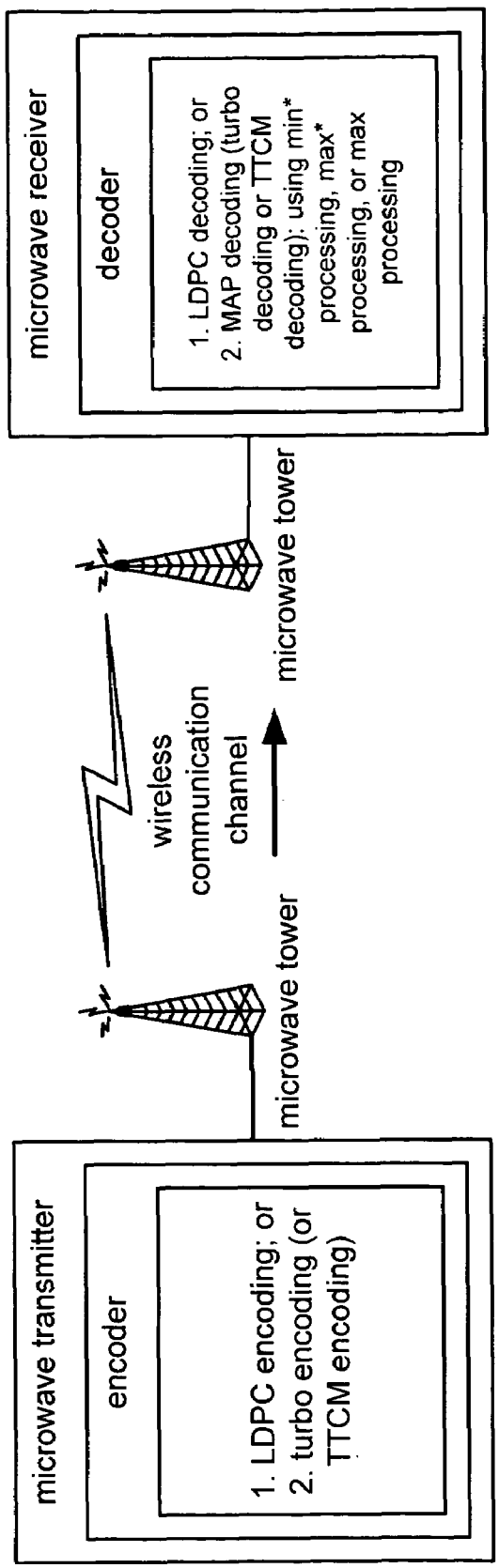
FIG. 57 is a system diagram illustrating an embodiment of a uni-directional microwave communication system that is built according to the invention.

FIG. 57 is a system diagram illustrating an embodiment of a unidirectional microwave communication system that is built according to the invention. A microwave transmitter is communicatively coupled to a microwave tower. The microwave transmitter, using its microwave tower, transmits a signal to a microwave tower via a wireless communication channel. A microwave receiver is communicatively coupled to the microwave tower. The microwave tower is able to receive transmissions from the microwave tower that have been communicated via the wireless communication channel.

The microwave transmitter is operable to encode information (using an encoder) in a manner in accordance with the functionality and/or processing of at least some of the various aspects of the invention to assist in generating a signal that is to be launched into the communication channel coupling the microwave transmitter and the microwave receiver. The microwave receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 58:
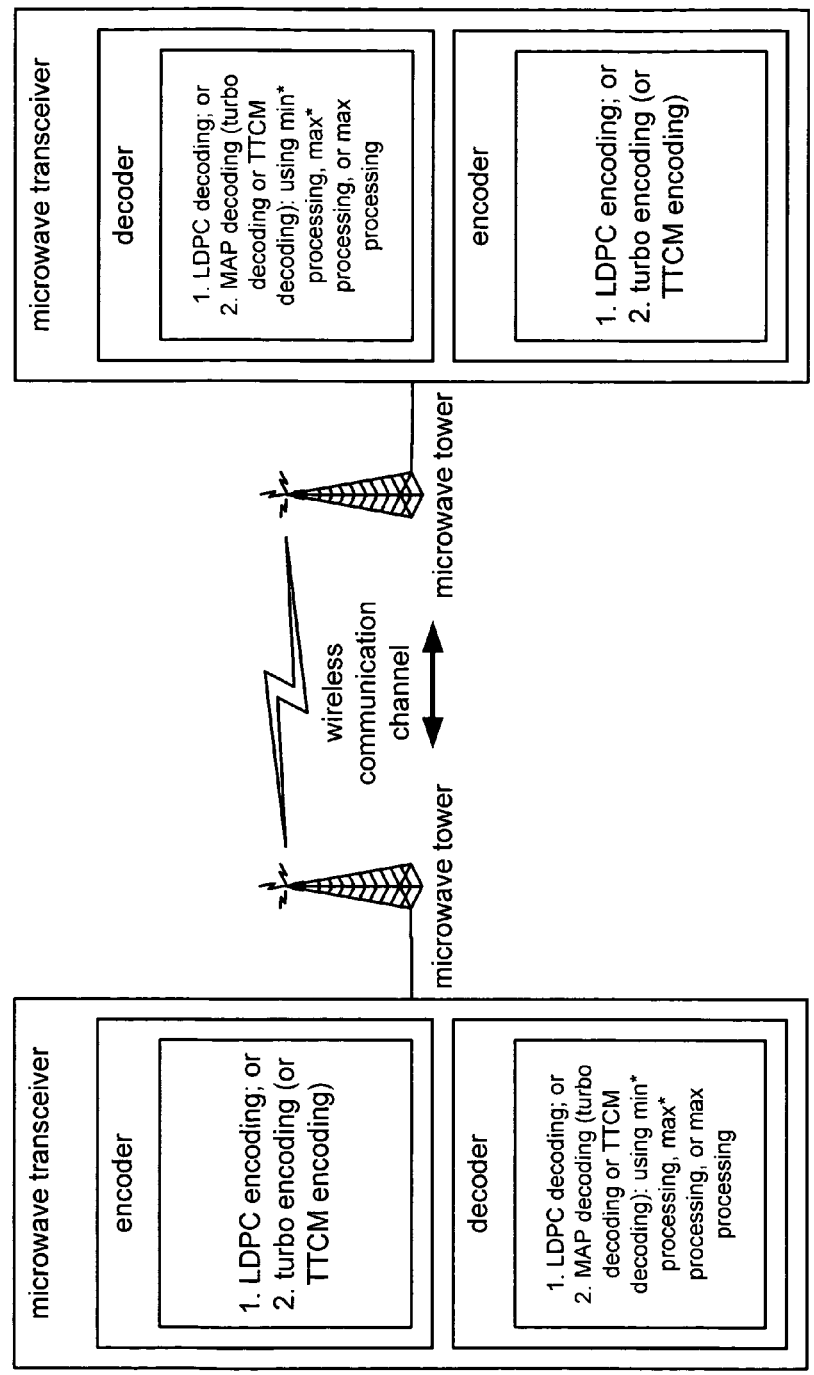
FIG. 58 is a system diagram illustrating an embodiment of a bi-directional microwave communication system that is built according to the invention.

FIG. 58 is a system diagram illustrating an embodiment of a bidirectional microwave communication system that is built according to the invention. Within the FIG. 58, a first microwave transceiver is communicatively coupled to a first microwave tower. The first microwave transceiver, using the first microwave tower (the first microwave transceiver's microwave tower), transmits a signal to a second microwave tower of a second microwave transceiver via a wireless communication channel. The second microwave transceiver is communicatively coupled to the second microwave tower (the second microwave transceiver's microwave tower). The second microwave tower is able to receive transmissions from the first microwave tower that have been communicated via the wireless communication channel. The reverse communication operation may also be performed using the first and second microwave transceivers.

Each of the microwave transceivers is operable to encode information (using its corresponding encoder) that is to be transmitted the other microwave transceiver. Each microwave transceiver is operable to decode the transmitted signal (using its corresponding decoder) that it receives. Each of the microwave transceivers includes an encoder and a decoder.

As within other embodiments that employ an encoder and a decoder, the encoder of either of the microwave transceivers may be implemented to encode information (using its corresponding encoder) in a manner in accordance with the functionality and/or processing of at least some of the various aspects of the invention to assist in generating a signal that is to be launched into the communication channel coupling the microwave transceivers. The decoder of either of the microwave transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 59:
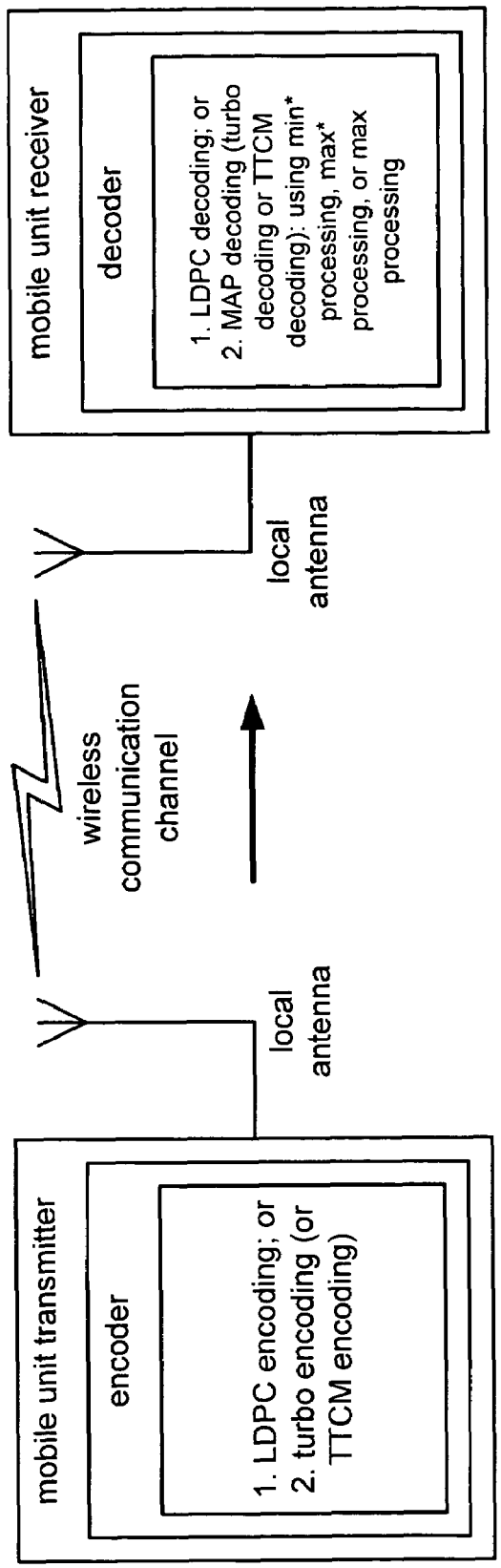
FIG. 59 is a system diagram illustrating an embodiment of a uni-directional point-to-point radio communication system that is built according to the invention.

FIG. 59 is a system diagram illustrating an embodiment of a uni-directional point-to-point radio communication system, built according to the invention, where the communication goes from a mobile unit transmitter to a mobile unit receiver via the wireless communication channel.

A mobile unit transmitter includes a local antenna communicatively coupled thereto. The mobile unit transmitter, using its local antenna, transmits a signal to a local antenna of a mobile unit receiver via a wireless communication channel.

The mobile unit transmitter is operable to encode information (using an encoder) in a manner in accordance with the functionality and/or processing of at least some of the various aspects of the invention to assist in generating a signal that is to be launched into the communication channel coupling the mobile unit transmitter and the mobile unit receiver. The mobile unit receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 60:
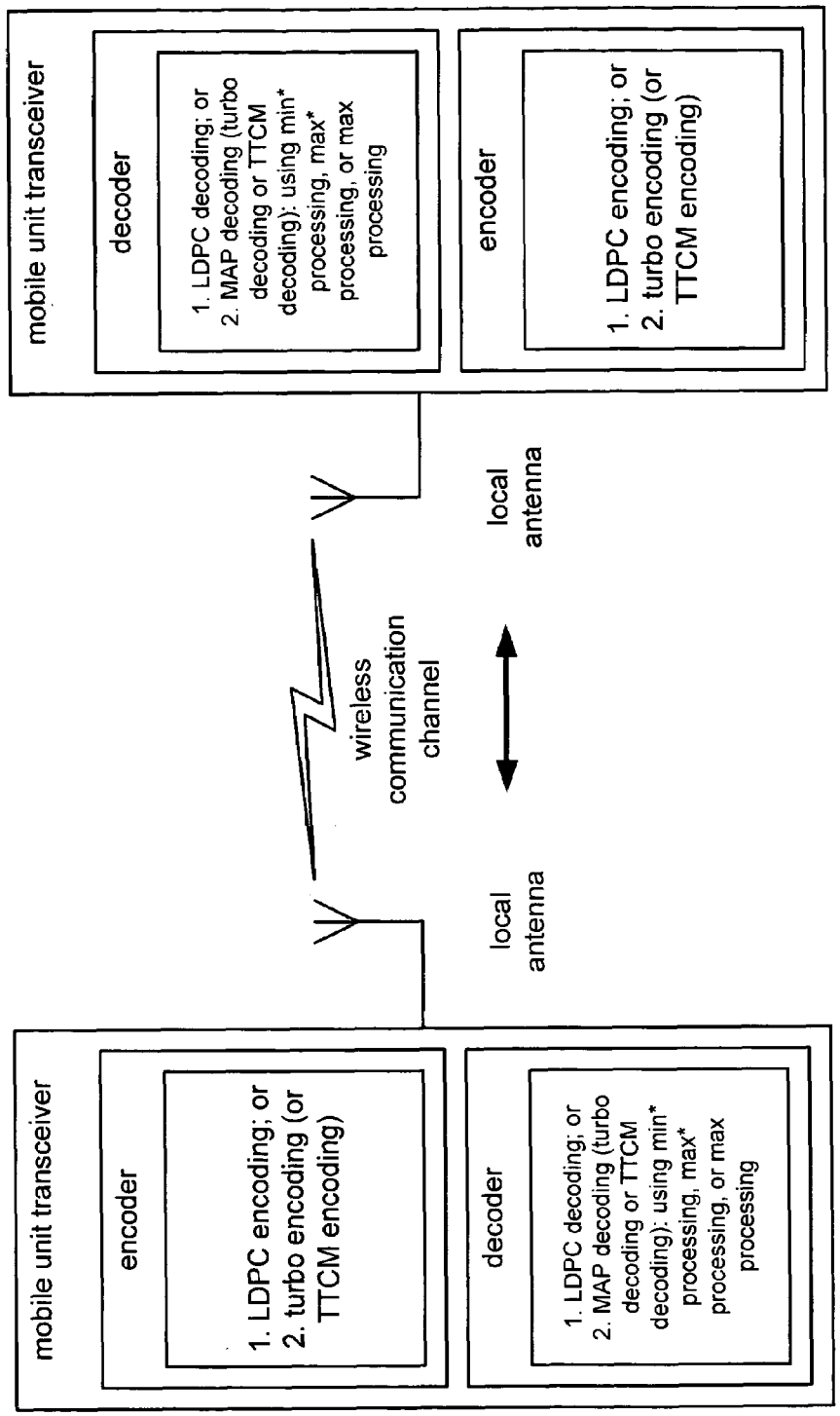
FIG. 60 is a system diagram illustrating an embodiment of a bi-directional point-to-point radio communication system that is built according to the invention.

FIG. 60 is a system diagram illustrating an embodiment of a bi-directional point-to-point radio communication system that is built according to the invention. A first mobile unit transceiver is communicatively coupled to a first local antenna. The first mobile unit transceiver, using the first local antenna (the first mobile unit transceiver's local antenna), transmits a signal to a second local antenna of a second mobile unit transceiver via a wireless communication channel. The second mobile unit transceiver is communicatively coupled to the second local antenna (the second mobile unit transceiver's local antenna). The second local antenna is able to receive transmissions from the first local antenna that have been communicated via the communication channel. The reverse communication operation may also be performed using the first and second mobile unit transceivers.

Each of the mobile unit transceivers is operable to encode information (using its corresponding encoder) that is to be transmitted the other mobile unit transceiver. Each mobile unit transceiver is operable to decode the transmitted signal (using its corresponding decoder) that it receives. Each of the mobile unit transceivers includes an encoder and a decoder.

As within other embodiments that employ an encoder and a decoder, the encoder of either of the mobile unit transceivers may be implemented to encode information (using its corresponding encoder) in a manner in accordance with the functionality and/or processing of at least some of the various aspects of the invention to assist in generating a signal that is to be launched into the communication channel coupling the mobile unit transceivers. The decoder of either of the mobile unit transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 61:
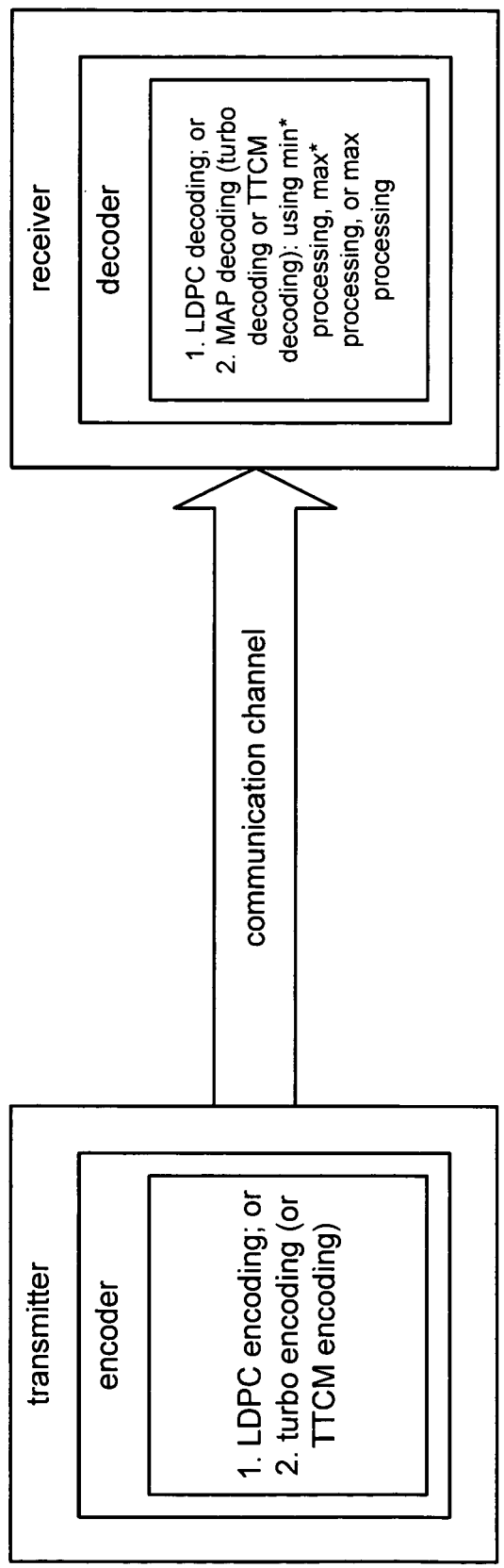
FIG. 61 is a system diagram illustrating an embodiment of a uni-directional communication system that is built according to the invention.

FIG. 61 is a system diagram illustrating an embodiment of a uni-directional communication system that is built according to the invention. A transmitter communicates to a receiver via a uni-directional communication channel. The uni-directional communication channel may be a wireline (or wired) communication channel or a wireless communication channel without departing from the scope and spirit of the invention. The wired media by which the uni-directional communication channel may be implemented are varied, including coaxial cable, fiber-optic cabling, and copper cabling, among other types of "wiring." Similarly, the wireless manners in which the uni-directional communication channel may be implemented are varied, including satellite communication, cellular communication, microwave communication, and radio communication, among other types of wireless communication.

The transmitter is operable to encode information (using an encoder) in a manner in accordance with the functionality and/or processing of at least some of the various aspects of the invention to assist in generating a signal that is to be launched into the communication channel coupling the transmitter and the receiver. The receiver is operable to decode a signal (using a decoder) received from the communication channel in a manner in accordance with the functionality and/or processing of at least some of the various aspects of the invention. This diagram shows yet another embodiment where one or more of the various aspects of the invention may be found.

Figure 62:
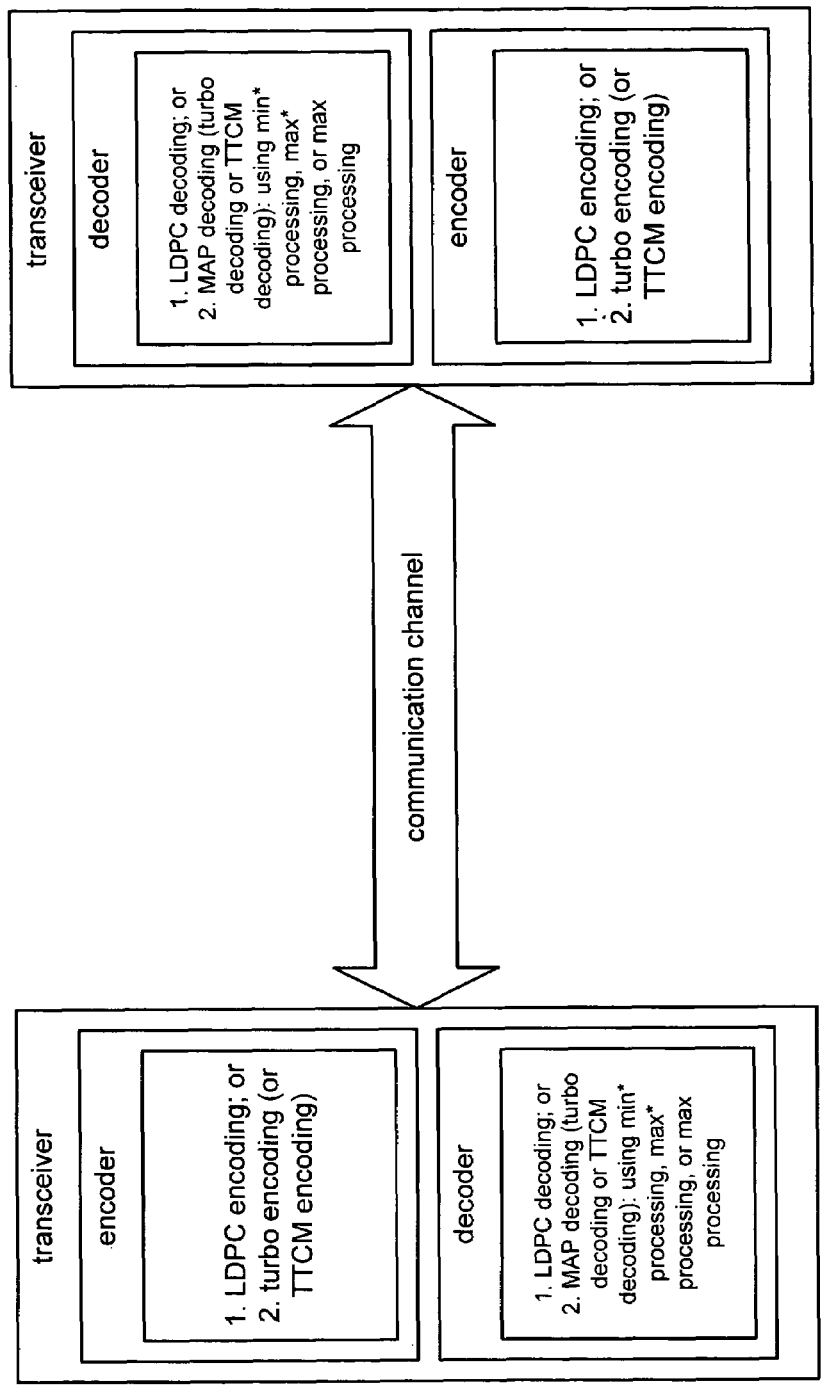
FIG. 62 is a system diagram illustrating an embodiment of a bi-directional communication system that is built according to the invention.

FIG. 62 is a system diagram illustrating an embodiment of a bi-directional communication system that is built according to the invention. A first transceiver is communicatively coupled to a second transceiver via a bi-directional communication channel. The bi-directional communication channel may be a wireline (or wired) communication channel or a wireless communication channel without departing from the scope and spirit of the invention. The wired media by which the bi-directional communication channel may be implemented are varied, including coaxial cable, fiber-optic cabling, and copper cabling, among other types of "wiring." Similarly, the wireless manners in which the bi-directional communication channel may be implemented are varied, including satellite communication, cellular communication, microwave communication, and radio communication, among other types of wireless communication.

Each of the transceivers is operable to encode information (using its corresponding encoder) that is to be transmitted the other transceiver. Each transceiver is operable to decode the transmitted signal (using its corresponding decoder) that it receives. Each of the transceivers includes an encoder and a decoder.

As within other embodiments that employ an encoder and a decoder, the encoder of either of the transceivers may be implemented to encode information (using its corresponding encoder) in a manner in accordance with the functionality and/or processing of at least some of the various aspects of the invention to assist in generating a signal that is to be launched into the communication channel coupling the transceivers. The decoder of either of the transceivers may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 63:
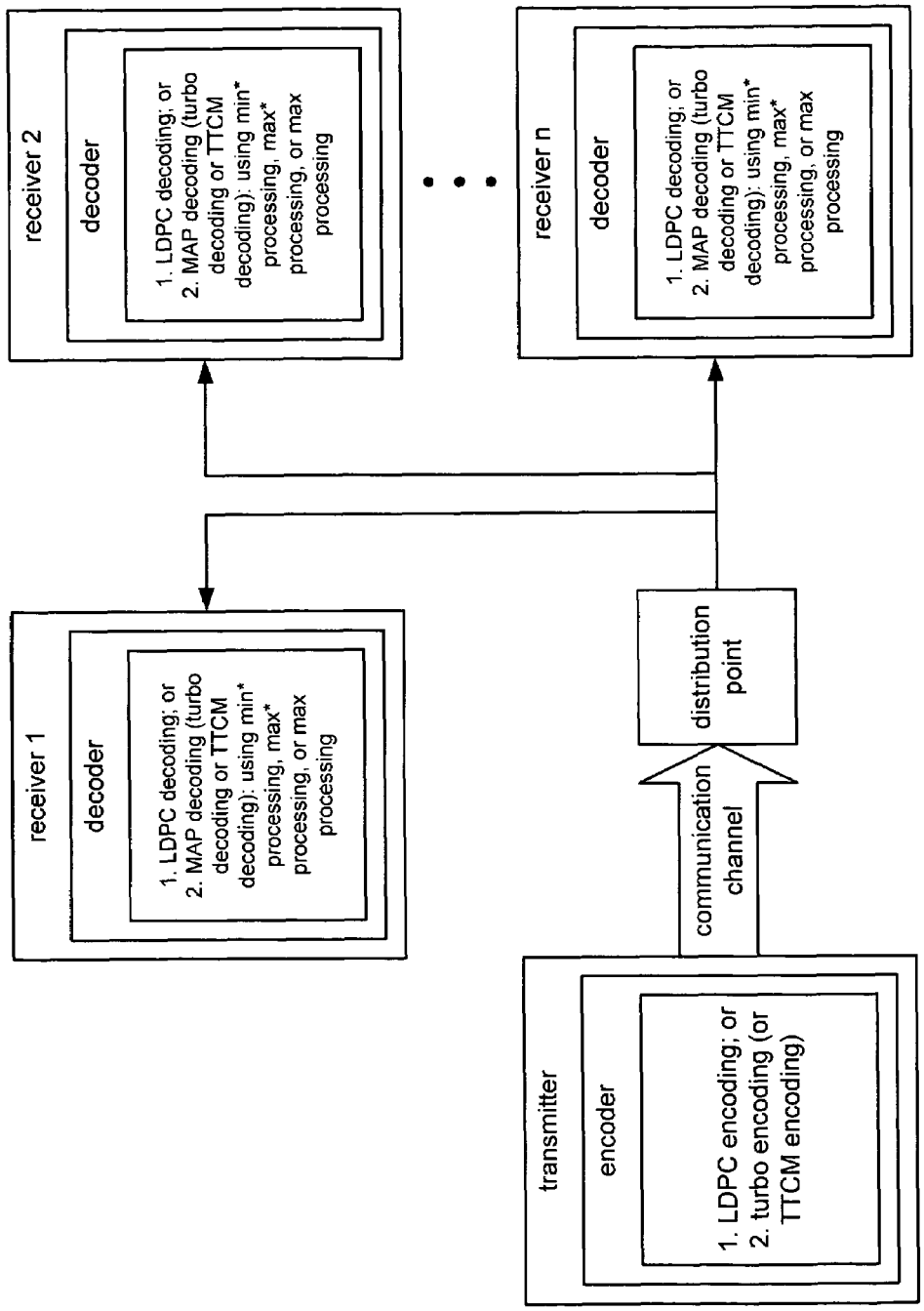
FIG. 63 is a system diagram illustrating an embodiment of a one to many communication system that is built according to the invention.

FIG. 63 is a system diagram illustrating an embodiment of a one to many communication system that is built according to the invention. A transmitter is able to communicate, via broadcast in certain embodiments, with a number of receivers, shown as receivers 1, 2, . . . , n via a uni-directional communication channel. The uni-directional communication channel may be a wireline (or wired) communication channel or a wireless communication channel without departing from the scope and spirit of the invention. The wired media by which the communication channel may be implemented are varied, including coaxial cable, fiber-optic cabling, and copper cabling, among other types of "wiring." Similarly, the wireless manners in which the communication channel may be implemented are varied, including satellite communication, cellular communication, microwave communication, and radio communication, among other types of wireless communication.

A distribution point is employed within the one to many communication system to provide the appropriate communication to the receivers 1, 2, . . . , and n. In certain embodiments, the receivers 1, 2, . . . , and n each receive the same communication and individually discern which portion of the total communication is intended for them.

The transmitter is operable to encode information (using an encoder) in a manner in accordance with the functionality and/or processing of at least some of the various aspects of the invention to assist in generating a signal that is to be launched into the communication channel coupling the transmitter and the receivers 1, 2, . . . , and n. Each of the receivers 1, 2, . . . , and n is operable to decode a signal (using a corresponding decoder) received from the communication channel in a manner in accordance with the functionality and/or processing of at least some of the various aspects of the invention. This diagram shows yet another embodiment where one or more of the various aspects of the invention may be found.

Figure 64:
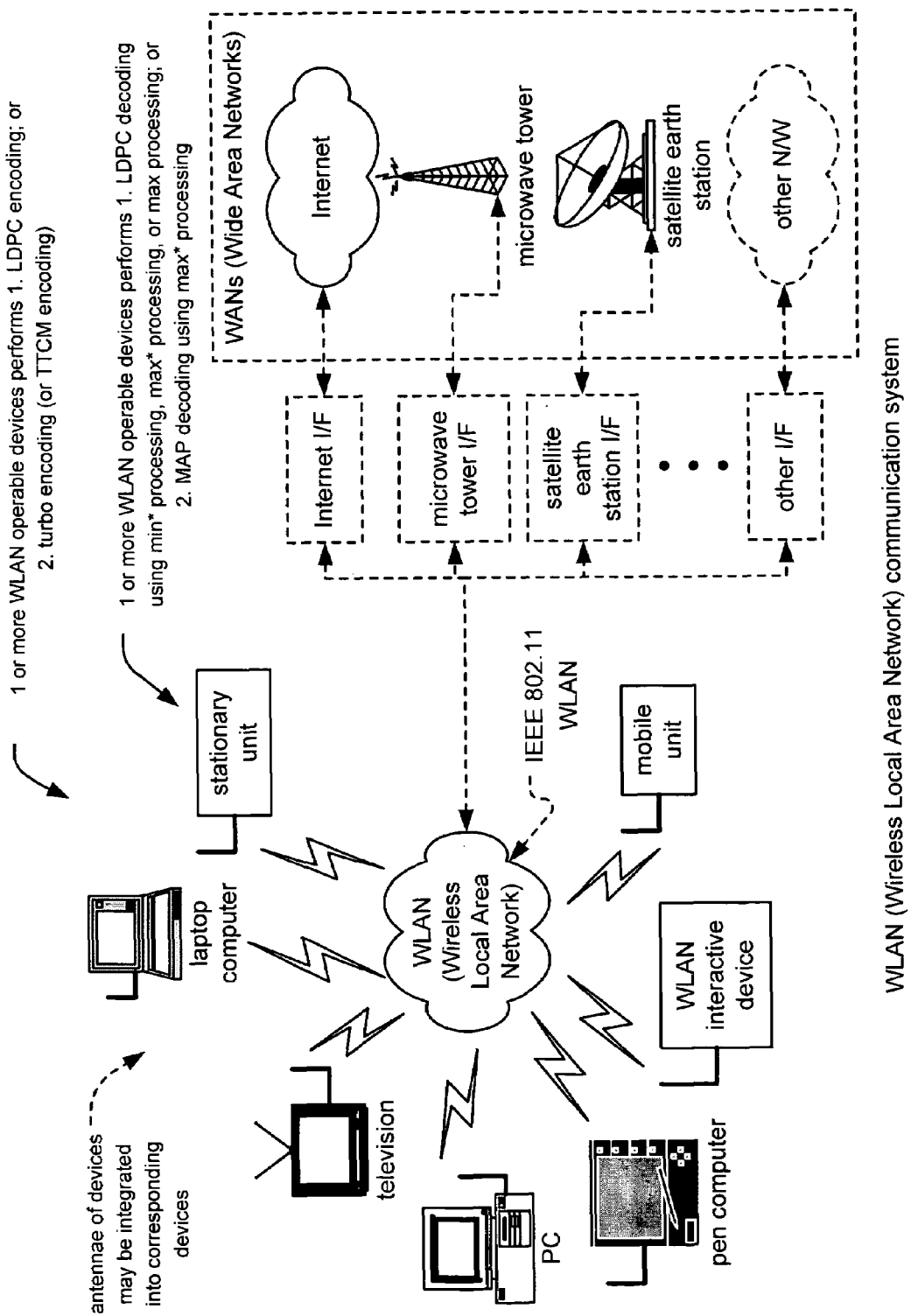
FIG. 64 is a diagram illustrating an embodiment of a WLAN (Wireless Local Area Network) that may be implemented according to the invention.

FIG. 64 is a diagram illustrating an embodiment of a WLAN (Wireless Local Area Network) communication system that may be implemented according to the invention. The WLAN communication system may be implemented to include a number of devices that are all operable to communicate with one another via the WLAN. For example, the various devices that each include the functionality to interface with the WLAN may include any 1 or more of a laptop computer, a television, a PC (Personal Computer), a pen computer (that may be viewed as being a PDA (Personal Digital Assistant) in some instances, a personal electronic planner, or similar device), a mobile unit (that may be viewed as being a telephone, a pager, or some other mobile WLAN operable device), and/or a stationary unit (that may be viewed as a device that typically resides in a single location within the WLAN). The antennae of any of the various WLAN interactive devices may be integrated into the corresponding devices without departing from the scope and spirit of the invention as well.

This illustrated group of devices that may interact with the WLAN is not intended to be an exhaustive list of devices that may interact with a WLAN, and a generic device shown as a WLAN interactive device represents any communication device that includes the functionality in order to interactive with the WLAN itself and/or the other devices that are associated with the WLAN. Any one of these devices that associate with the WLAN may be viewed generically as being a WLAN interactive device without departing from the scope and spirit of the invention. Each of the devices and the WLAN interactive device may be viewed as being located at nodes of the WLAN.

It is also noted that the WLAN itself may also include functionality to allow interfacing with other networks as well. These external networks may generically be referred to as WANs (Wide Area Networks). For example, the WLAN may include an Internet I/F (interface) that allows for interfacing to the Internet itself. This Internet I/F may be viewed as being a base station device for the WLAN that allows any one of the WLAN interactive devices to access the Internet.

It is also noted that the WLAN may also include functionality to allow interfacing with other networks (e.g., other WANs) besides simply the Internet. For example, the WLAN may include a microwave tower I/F that allows for interfacing to a microwave tower thereby allowing communication with one or more microwave networks. Similar to the Internet I/F described above, the microwave tower I/F may be viewed as being a base station device for the WLAN that allows any one of the WLAN interactive devices to access the one or more microwave networks via the microwave tower.

Moreover, the WLAN may include a satellite earth station I/F that allows for interfacing to a satellite earth station thereby allowing communication with one or more satellite networks. The satellite earth station I/F may be viewed as being a base station device for the WLAN that allows any one of the WLAN interactive devices to access the one or more satellite networks via the satellite earth station I/F.

This finite listing of various network types that may interface to the WLAN is also not intended to be exhaustive. For example, any other network may communicatively couple to the WLAN via an appropriate I/F that includes the functionality for any one of the WLAN interactive devices to access the other network.

Any of the various WLAN interactive devices described within this embodiment may include an encoder and a decoder to allow bi-directional communication with the other WLAN interactive device and/or the WANs. Again, as within other embodiments that includes bi-directional communication devices having an encoder and a decoder, the encoder of any of these various WLAN interactive devices may be implemented to encode information (using its corresponding encoder) in a manner in accordance with the functionality and/or processing of at least some of the various aspects of the invention to assist in generating a signal that is to be launched into the communication channel that couples to another WLAN interactive device. The decoder of any of the various WLAN interactive devices may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

In general, any one of the WLAN interactive devices may be characterized as being an IEEE (Institute of Electrical & Electronics Engineers) 802.11 operable device. For example, such an IEEE 802.11 operable device may be an IEEE 802.11a operable device, an IEEE 802.11b operable device, or an IEEE 802.11g operable device. Sometimes, an IEEE 802.11 operable device is operable to communicate according to more than one of the standards (e.g., both IEEE 802.11a and IEEE 802.11g in one instance). The IEEE 802.11g specification extends the rates for packet transmission in the 2.4 GHz (Giga-Hertz) frequency band. This is achieved by allowing packets, also known as frames, of two distinct types to coexist in this band. Frames utilizing DSSS/CCK (Direct Sequence Spread Spectrum with Complementary Code Keying) have been specified for transmission in the 2.4 GHz band at rates up to 11 Mbps (Mega-bits per second) as part of the IEEE 802.11b standard. The IEEE 802.11a standard uses a different frame format with OFDM (Orthogonal Frequency Division Multiplexing) to transmit at rates up to 54 Mbps with carrier frequencies in the 5 GHz range. The IEEE 802.11g specification allows for such OFDM frames to coexist with DSSS/CCK frames at 2.4 GHz.

Figure 65:
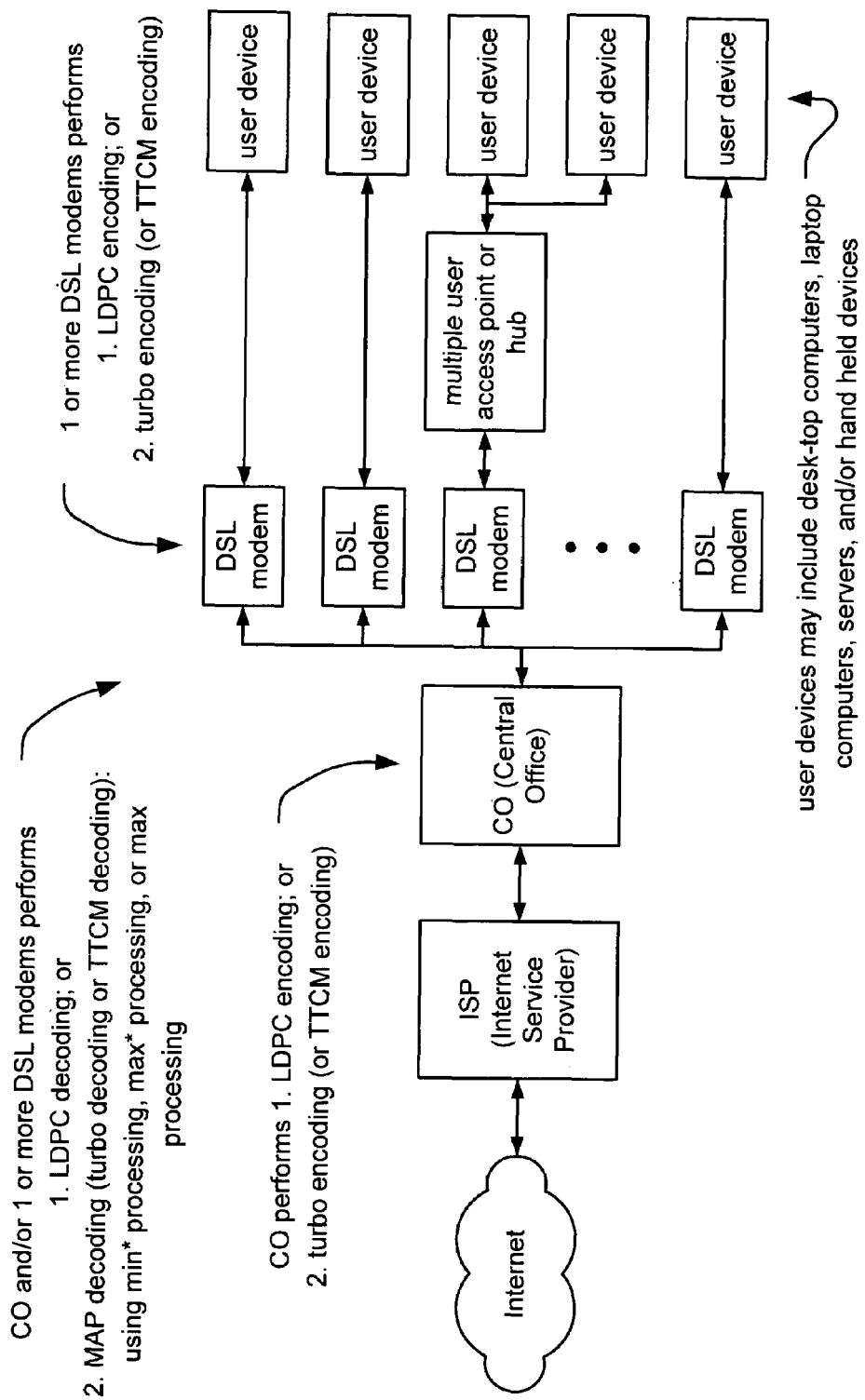
FIG. 65 is a diagram illustrating an embodiment of a DSL (Digital Subscriber Line) communication system that may be implemented according to the invention.

FIG. 65 is a diagram illustrating an embodiment of a DSL (Digital Subscriber Line) communication system that may be implemented according to the invention. The DSL communication system includes an interfacing to the Internet (or some other WAN). In this diagram, the Internet itself is shown, but other WANs may also be employed without departing from the scope and spirit of the invention. An ISP (Internet Service Provider) is operable to communicate data to and from the Internet. The ISP communicatively couples to a CO (Central Office) that is typically operated by a telephone services company. The CO may also allow for the providing of telephone services to one or more subscribers. However, the CO may. also be implemented to allow interfacing of Internet traffic to and from one or more users (whose interactive devices are shown as user devices). These user devices may be any device within a wide variety of devices including desk-top computers, laptop computers, servers, and/or hand held devices without departing from the scope and spirit of the invention. Any of these user devices may be wired or wireless type devices as well. Each of the user devices is operably coupled to the CO via a DSL modem. The DSL modem may also be communicatively coupled to a multiple user access point or hub to allow more than one user device to access-the Internet.

The CO and the various DSL modems may also be implemented to include an encoder and a decoder to allow bi-directional communication therein. For example, the CO is operable to encode and decode data when communicating to and from the various DSL modems and the ISP. Similarly, each of the various DSL modems is operable to encode and decode data when communicating to and from the CO and its respective one or more user devices.

As within other embodiments that employ an encoder and a decoder, the encoder of any of the CO and the various DSL modems may be implemented to encode information (using its corresponding encoder) in a manner in accordance with the functionality and/or processing of at least some of the various aspects of the invention to assist in generating a signal that is to be launched into the communication channel coupling the CO and the various DSL modems. The decoder of any of the CO and the various DSL modems may be implemented to decode the transmitted signal (using its corresponding decoder) in a manner in accordance with the functionality and/or processing of at least some of the various aspects of the invention. This diagram shows yet another embodiment where one or more of the various aspects of the invention may be found.

Figure 66:
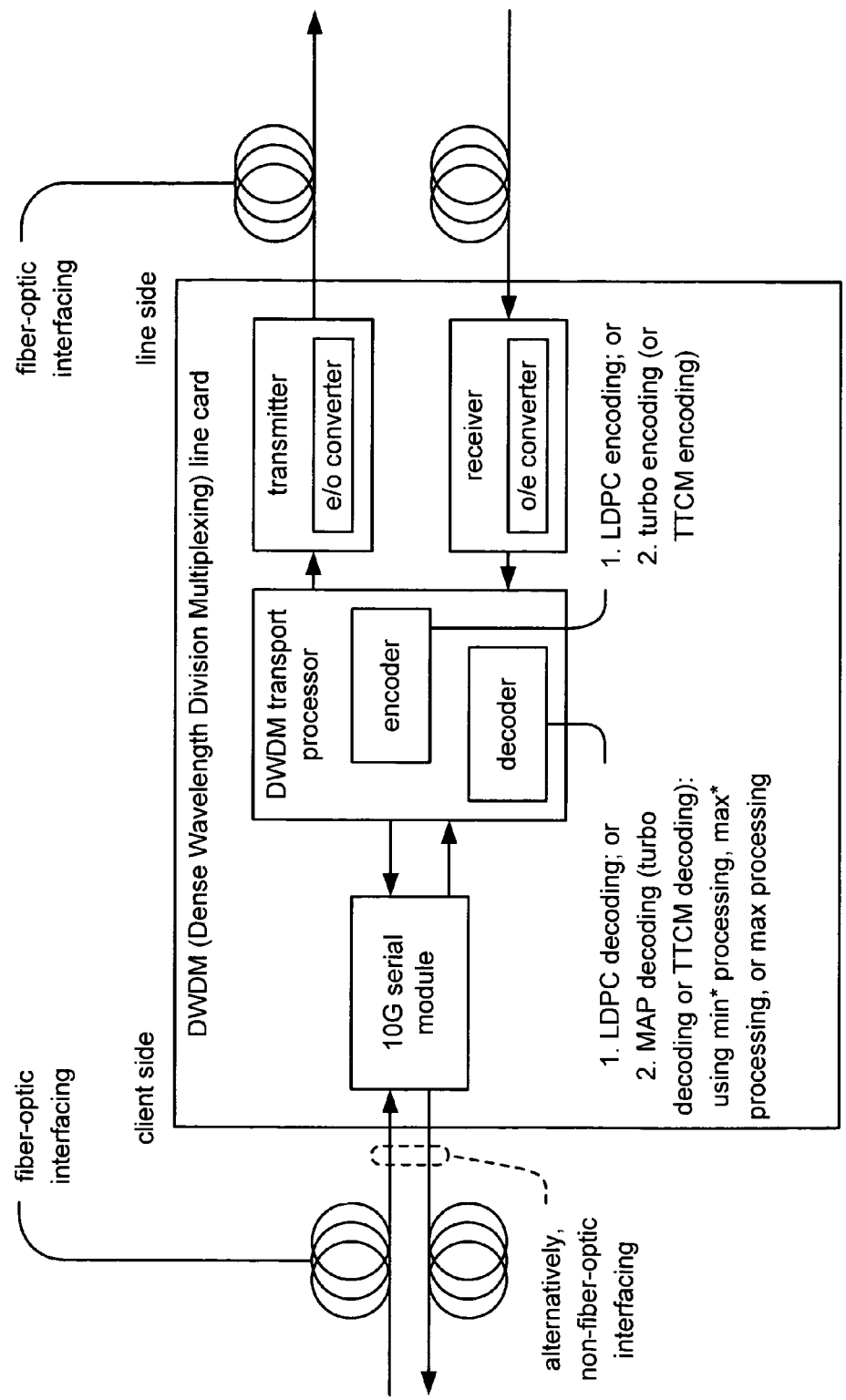
FIG. 66 is a system diagram illustrating an embodiment of a fiber-optic communication system that is built according to the invention.

FIG. 66 is a system diagram illustrating an embodiment of a fiber-optic communication system that is built according to the invention. The fiber-optic communication system includes a DWDM (Dense Wavelength Division Multiplexing, within the context of fiber optic communications) line card that is interposed between a line side and a client side. DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantages of DWDM can be summarized as follows:

1. The transparency of DWDM: Because DWDM is a PHY (PHYsical layer) architecture, it can transparently support both TDM (Time Division Multiplexing) and data formats such as ATM (Asynchronous Transfer Mode), Gigabit Ethernet, ESCON (Enterprise System CONnection), and Fibre Channel with open interfaces over a common physical layer.

2. The scalability of DWDM: DWDM can leverage the abundance of dark fiber in many metropolitan area and enterprise networks to quickly meet demand for capacity on point-to-point links and on spans of existing SONET/SDH (Synchronous Optical NETwork)/(Synchronous Digital Hierarchy) rings.

3. The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10 G serial module that is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides.

As within other embodiments that employ an encoder and a decoder, the encoder is operable to encode information in a manner in accordance with the functionality and/or processing of at least some of the various aspects of the invention to assist in generating a signal that is to be launched into the communication channel to which the DWDM line card is coupled. The decoder is operable to decode a signal received from the communication channel in a manner in accordance with the functionality and/or processing of at least some of the various aspects of the invention. This diagram shows yet another embodiment where one or more of the various aspects of the invention may be found.

Figure 67:
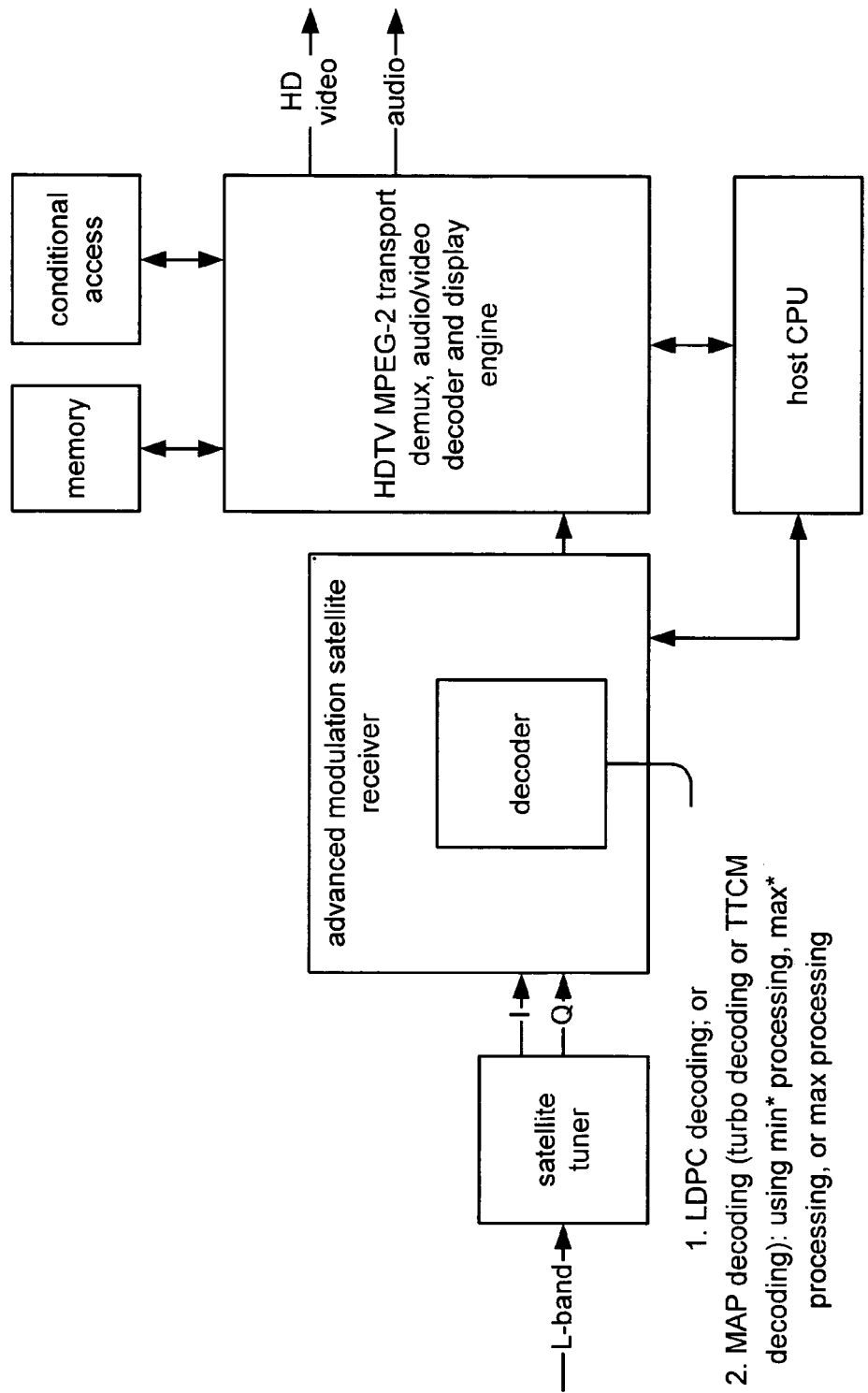
FIG. 67 is a system diagram illustrating an embodiment of a satellite receiver STB (Set Top Box) system that is built according to the invention.

FIG. 67 is a system diagram illustrating an embodiment of a satellite receiver STB (Set Top Box) system that is built according to the invention. The satellite receiver STB system includes an advanced modulation satellite receiver that is implemented in an all digital architecture. Moreover, the advanced modulation satellite receiver may be implemented within a single integrated circuit in some embodiments. The satellite receiver STB system includes a satellite tuner that receives a signal via the L-band (e.g., within the frequency range between 390-1550 MHz (Mega-Hertz) in the ultrahigh radio frequency range). The satellite tuner extracts I, Q (In-phase, Quadrature) components from a signal received from the L-band and provides them to the advanced modulation satellite receiver. The advanced modulation satellite receiver includes a decoder.

As within other embodiments that employ a decoder, the decoder is operable to decode a signal received from a communication channel to which the advanced modulation satellite receiver is coupled in a manner in accordance with the functionality and/or processing of at least some of the various aspects of the invention. This diagram shows yet another embodiment where one or more of the various aspects of the invention may be found.

The advanced modulation satellite receiver may be implemented to communicatively couple to an HDTV MPEG-2 (Motion Picture Expert Group, level 2) transport de-mux, audio/video decoder and display engine. The advanced modulation satellite receiver and the HDTV MPEG-2 transport de-mux, audio/video decoder and display engine communicatively couple to a host CPU (Central Processing Unit). The HDTV MPEG-2 transport de-mux, audio/video decoder and display engine also communicatively couples to a memory module and a conditional access functional block. The HDTV MPEG-2 transport de-mux, audio/video decoder and display engine provides HD (High Definition) video and audio output that may be provided to an HDTV display.

The advanced modulation satellite receiver may be implemented as a single-chip digital satellite receiver supporting the decoder that operates in a manner in accordance with the functionality and/or processing of at least some of the various aspects of the invention. The advanced modulation satellite receiver is operable to receive communication provided to it from a transmitter device that includes an encoder as well.

Figure 68:
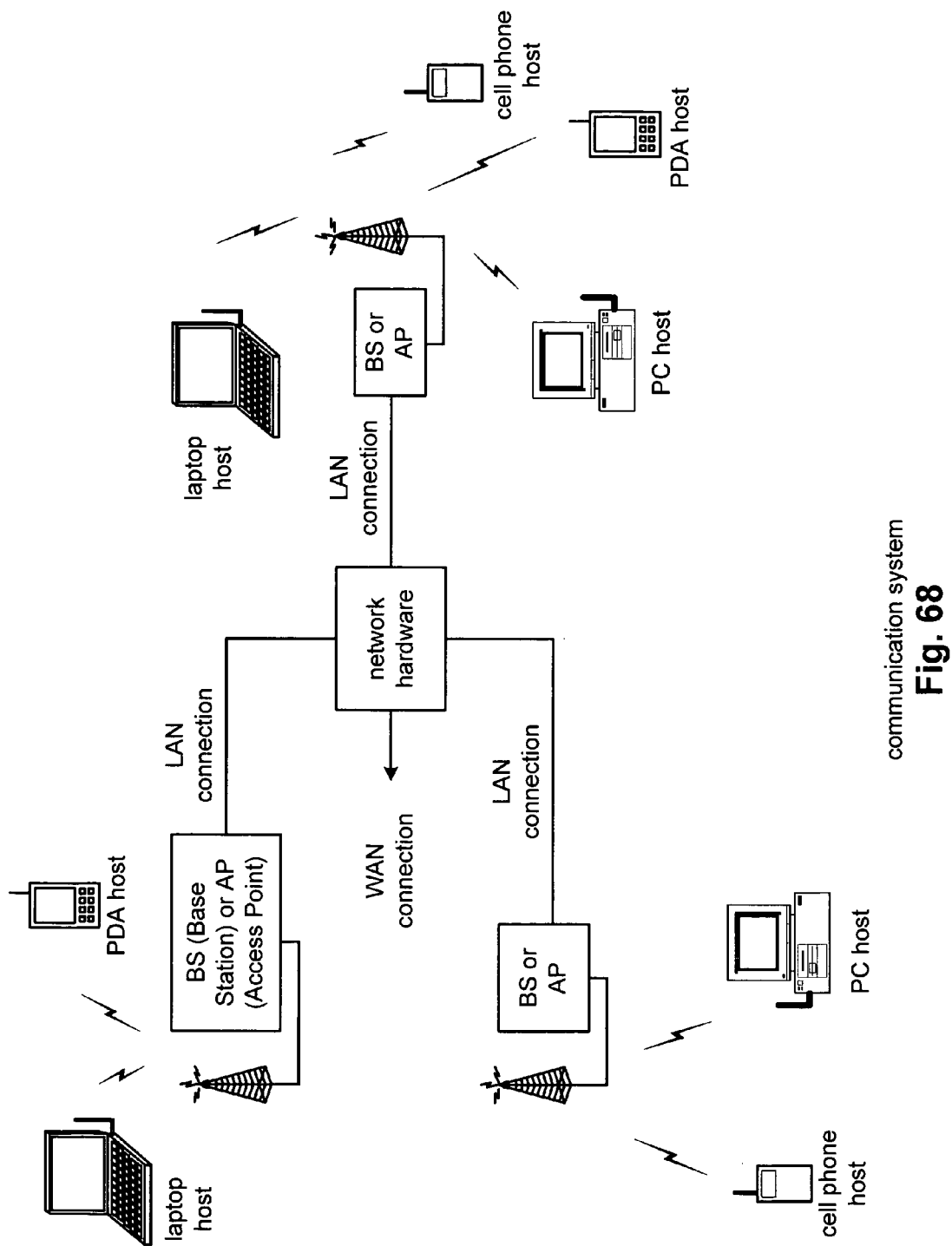
FIG. 68 is a schematic block diagram illustrating a communication system that includes a plurality of base stations and/or access points, a plurality of wireless communication devices and a network hardware component in accordance with certain aspects of the invention.

FIG. 68 is a schematic block diagram illustrating a communication system that includes a plurality of base stations and/or access points, a plurality of wireless communication devices and a network hardware component in accordance with certain aspects of the invention. The wireless communication devices may be laptop host computers, PDA (Personal Digital Assistant) hosts, PC (Personal Computer) hosts and/ or cellular telephone hosts. The details of any one of these wireless communication devices is described in greater detail with reference to FIG. 69 below.

The BSs (Base Stations) or APs (Access Points) are operably coupled to the network hardware via the respective LAN (Local Area Network) connections. The network hardware, which may be a router, switch, bridge, modem, system controller, et cetera, provides a WAN (Wide Area Network) connection for the communication system. Each of the BSs or APs has an associated antenna or antenna array to communicate with the wireless communication devices in its area. Typically, the wireless communication devices register with a particular BS or AP to receive services from the communication system. For direct connections (i.e., point-to-point communications), wireless communication devices communicate directly via an allocated channel.

Typically, BSs are used for cellular telephone systems and like-type systems, while APs are used for in-home or in-building wireless networks. Regardless of the particular type of communication system, each wireless communication device includes a built-in radio and/or is coupled to a radio. The radio includes a highly linear amplifier and/or programmable multi-stage amplifier to enhance performance, reduce costs, reduce size, and/or enhance broadband applications.

Figure 69:
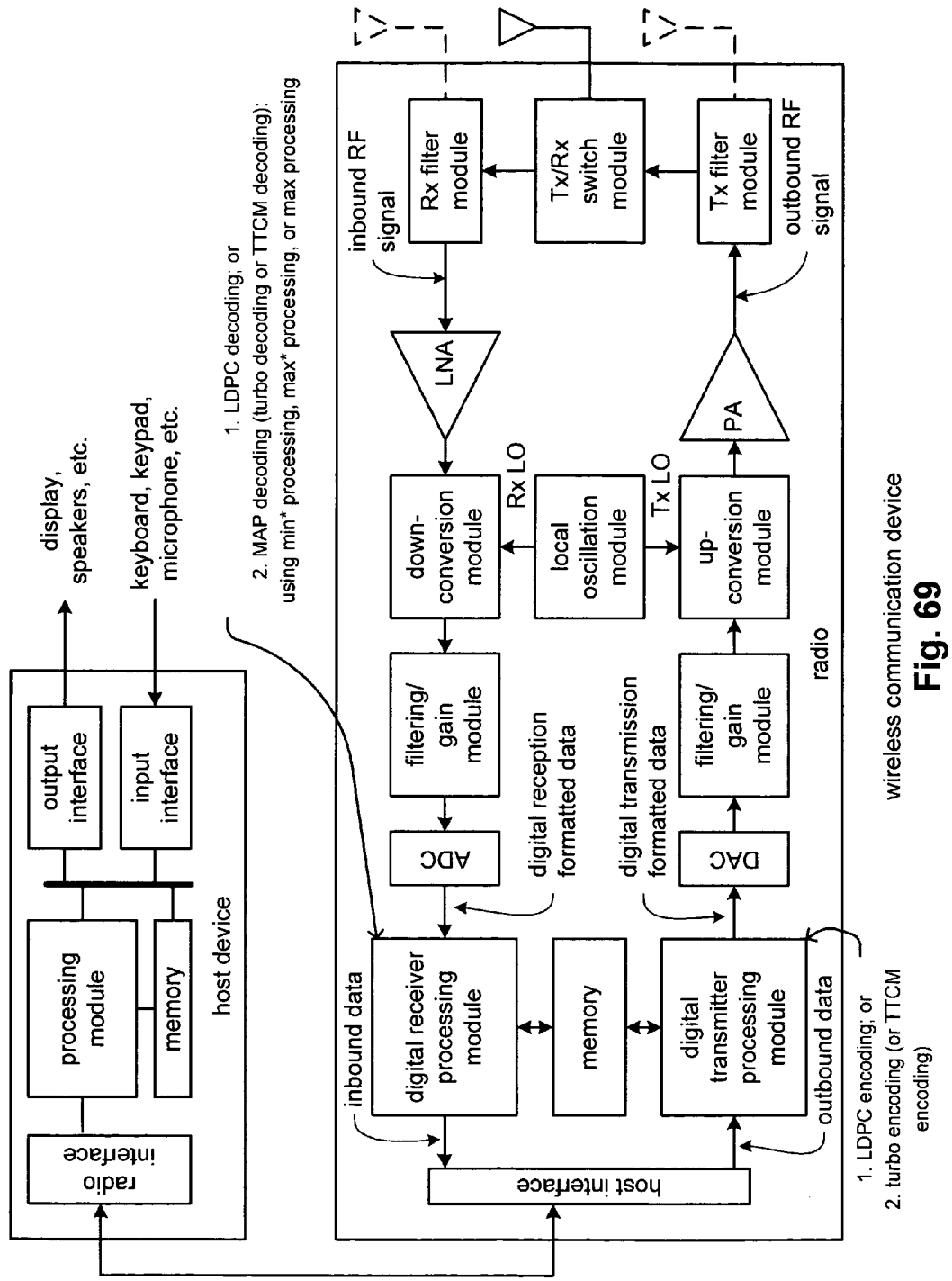
FIG. 69 is a schematic block diagram illustrating a wireless communication device that includes the host device and an associated radio in accordance with certain aspects of the invention.

FIG. 69 is a schematic block diagram illustrating a wireless communication device that includes the host device and an associated radio in accordance with certain aspects of the invention. For cellular telephone hosts, the radio is a built-in component. For PDA (Personal Digital Assistant) hosts, laptop hosts, and/or personal computer hosts, the radio may be built-in or an externally coupled component.

As illustrated, the host device includes a processing module, memory, radio interface, input interface and output interface. The processing module and memory execute the corresponding instructions that are typically done by the host device. For example, for a cellular telephone host device, the processing module performs the corresponding communication functions in accordance with a particular cellular telephone standard or protocol.

The radio interface allows data to be received from and sent to the radio. For data received from the radio (e.g., inbound data), the radio interface provides the data to the processing module for further processing and/or routing to the output interface. The output interface provides connectivity to an output display device such as a display, monitor, speakers, et cetera, such that the received data may be displayed or appropriately used. The radio interface also provides data from the processing module to the radio. The processing module may receive the outbound data from an input device such as a keyboard, keypad, microphone, et cetera, via the input interface or generate the data itself. For data received via the input interface, the processing module may perform a corresponding host function on the data and/or route it to the radio via the radio interface.

The radio includes a host interface, a digital receiver processing module, an ADC (Analog to Digital Converter), a filtering/gain module, an IF (Intermediate Frequency) mixing down conversion stage, a receiver filter, an LNA (Low Noise Amplifier), a transmitter/receiver switch, a local oscillation module, memory, a digital transmitter processing module, a DAC (Digital to Analog Converter), a filtering/gain module, an IF mixing up conversion stage, a PA (Power Amplifier), a transmitter filter module, and an antenna. The antenna may be a single antenna that is shared by the transmit and the receive paths as regulated by the Tx/Rx (Transmit/Receive) switch, or may include separate antennas for the transmit path and receive path. The antenna implementation will depend on the particular standard to which the wireless communication device is compliant.

The digital receiver processing module and the digital transmitter processing module, in combination with operational instructions stored in memory, execute digital receiver functions and digital transmitter functions, respectively. The digital receiver functions include, but are not limited to, digital IF (Intermediate Frequency) to baseband conversion, demodulation, constellation de-mapping, decoding, and/or descrambling. The digital transmitter functions include, but are not limited to, scrambling, encoding, constellation mapping, modulation, and/or digital baseband to IF conversion.

Similarly to other embodiments that employ an encoder and a decoder (or perform encoding and decoding), the encoding operations that may be performed by the digital transmitter processing module may be implemented in a manner in accordance with the functionality and/or processing of at least some of the various aspects of the invention to assist in generating a signal that is to be launched into the communication channel coupling to the wireless communication device. Analogously, the decoding operations of the operations that may be performed by the digital transmitter processing module may be implemented in a manner in accordance with the functionality and/or processing of at least some of the various aspects of the invention. For example, the encoding operations performed by the digital transmitter processing module may be performed using encoding as described and presented by various embodiments herein, and the decoding operations that may be performed by the digital receiver processing module may be performed as also described and presented by various embodiments herein.

The digital receiver and transmitter processing modules may be implemented using a shared processing device, individual processing devices, or a plurality of processing devices. Such a processing device may be a microprocessor, micro-controller, DSP (Digital Signal Processor), microcomputer, CPU (Central Processing Unit), FPGA (Field Programmable Gate Array), programmable logic device, state machine, logic circuitry, analog circuitry, digital circuitry, and/or any device that manipulates signals (analog and/or digital) based on operational instructions. The memory may be a single memory device or a plurality of memory devices. Such a memory device may be a ROM (Read Only Memory), RAM (Random Access Memory), volatile memory, non-volatile memory, static memory, dynamic memory, flash memory, and/or any device that stores digital information. It is noted that when either of the digital receiver processing module or the digital transmitter processing module implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry.

In operation, the radio receives outbound data from the host device via the host interface. The host interface routes the outbound data to the digital transmitter processing module, which processes the outbound data in accordance with a particular wireless communication standard (e.g., IEEE 802.11, Bluetooth ®, et cetera) to produce digital transmission formatted data. The digital transmission formatted data is a digital base-band signal or a digital low IF signal, where the low IF typically will be in the frequency range of one hundred kHz (kilo-Hertz) to a few MHz (Mega-Hertz).

The DAC converts the digital transmission formatted data from the digital domain to the analog domain. The filtering/gain module filters and/or adjusts the gain of the analog signal prior to providing it to the IF mixing stage. The IF mixing stage converts the analog baseband or low IF signal into an RF signal based on a transmitter local oscillation provided by local oscillation module. The PA amplifies the RF signal to produce outbound RF signal, which is filtered by the transmitter filter module. The antenna transmits the outbound RF signal to a targeted device such as a base station, an access point and/or another wireless communication device.

The radio also receives an inbound RF signal via the antenna, which was transmitted by a BS, an AP, or another wireless communication device. The antenna provides the inbound RF signal to the receiver filter module via the Tx/Rx switch, where the Rx filter bandpass filters the inbound RF signal. The Rx filter provides the filtered RF signal to the LNA, which amplifies the signal to produce an amplified inbound RF signal. The LNA provides the amplified inbound RF signal to the IF mixing module, which directly converts the amplified inbound RF signal into an inbound low IF signal or baseband signal based on a receiver local oscillation provided by local oscillation module. The down conversion module provides the inbound low IF signal or baseband signal to the filtering/gain module. The filtering/gain module filters and/or gains the inbound low IF signal or the inbound baseband signal to produce a filtered inbound signal.

The ADC converts the filtered inbound signal from the analog domain to the digital domain to produce digital reception formatted data. In other words, the ADC samples the incoming continuous time signal thereby generating a discrete time signal (e.g., the digital reception formatted data). The digital receiver processing module decodes, descrambles, demaps, and/or demodulates the digital reception formatted data to recapture inbound data in accordance with the particular wireless communication standard being implemented by radio. The host interface provides the recaptured inbound data to the host device via the radio interface.

As one of average skill in the art will appreciate, the wireless communication device of FIG. 69 may be implemented using one or more integrated circuits. For example, the host device may be implemented on one integrated circuit, the digital receiver processing module, the digital transmitter processing module and memory may be implemented on a second integrated circuit, and the remaining components of the radio, less the antenna, may be implemented on a third integrated circuit. As an alternate example, the radio may be implemented on a single integrated circuit. As yet another example, the processing module of the host device and the digital receiver and transmitter processing modules may be a common processing device implemented on a single integrated circuit. Further, the memories of the host device and the radio may also be implemented on a single integrated circuit and/or on the same integrated circuit as the common processing modules of processing module of the host device and the digital receiver and transmitter processing module of the radio.

Figure 70:
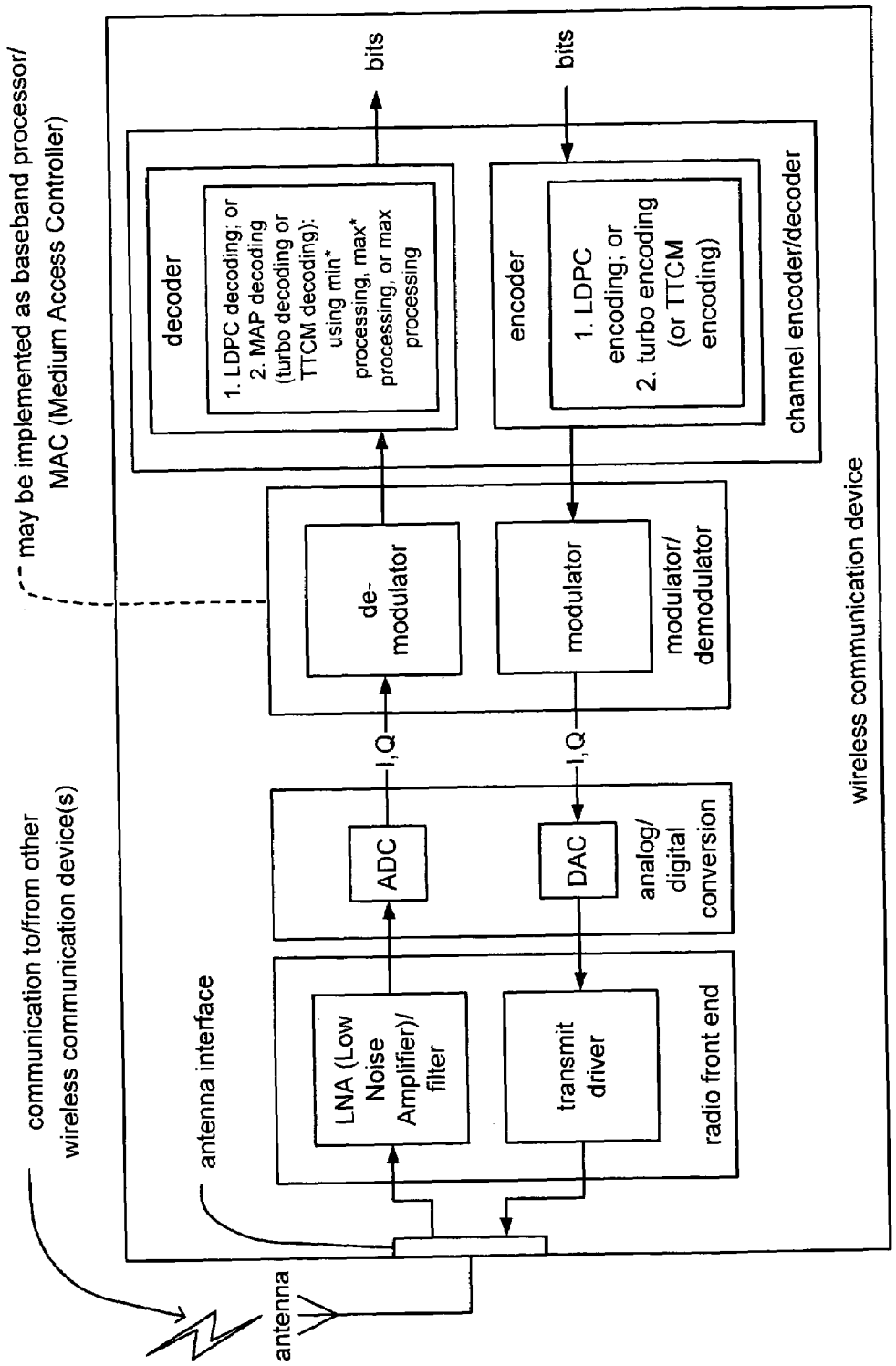
FIG. 70 is a diagram illustrating an alternative embodiment of a wireless communication device that is constructed according to the invention.

FIG. 70 is a diagram illustrating an alternative embodiment of a wireless communication device that is constructed according to the invention. This embodiment of a wireless communication device includes an antenna that is operable to communicate with any 1 or more other wireless communication devices. An antenna interface communicatively couples a signal to be transmitted from the wireless communication device or a signal received by the wireless communication device to the appropriate path (be it the transmit path or the receive path).

A radio front end includes receiver functionality and transmitter functionality. The radio front end communicatively couples to an analog/digital conversion functional block. The radio front end communicatively couples to a modulator/demodulator, and the radio front end communicatively couples to a channel encoder/decoder.

Along the Receive Path:

The receiver functionality of the front end includes a LNA (Low Noise Amplifier)/filter. The filtering performed in this receiver functionality may be viewed as the filtering that is limiting to the performance of the device, as also described above. The receiver functionality of the front end performs any down-converting that may be requiring (which may alternatively include down-converting directly from the received signal frequency to a baseband signal frequency). The general operation of the front end may be viewed as receiving a continuous time signal, and performing appropriate filtering and any down conversion necessary to generate the baseband signal. Whichever manner of down conversion is employed, a baseband signal is output from the receiver functionality of the front end and provided to an ADC (Analog to Digital Converter) that samples the baseband signal (which is also a continuous time signal, though at the baseband frequency) and generates a discrete time signal baseband signal (e.g., a digital format of the baseband signal); the ADC also extracts and outputs the digital I, Q (In-phase, Quadrature) components of the discrete time signal baseband signal.

These I, Q components are provided to a demodulator portion of the modulator/demodulator where any modulation decoding/symbol mapping is performed where the I, Q components of the discrete time signal baseband signal. The appropriate I, Q components are then mapped to an appropriate modulation (that includes a constellation and corresponding mapping). Examples of such modulations may include BPSK (Binary Phase Shift Key), QPSK (Quadrature Phase Shift Key), 8 PSK (8 Phase Shift Key), 16 QAM (16 Quadrature Amplitude Modulation), and even higher order modulation types. These demodulated symbols are then provided to a decoder portion of the channel encoder/decoder where best estimates of the information bits contained within the originally received continuous time signal are made.

Along the Transmit Path:

Somewhat analogous and opposite processing is performed in the transmit path when compared to the receive path. Information bits that are to be transmitted are encoded using an encoder of the channel encoder/decoder. These encoded bits are provided to a modulator of the modulator/demodulator where modulation encoding/symbol mapping may be performed according to the modulation of interest. These now I, Q components of the symbols are then passed to a DAC (Digital to Analog Converter) of the analog/digital conversion functional block to transform the I, Q components into a continuous time transmit signal (e.g., an analog signal). The now continuous time transmit signal to be transmitted is then passed to a transmit driver that performs any necessary up-converting/modification to the continuous time transmit signal (e.g., amplification and/or filtering) to comport it to the communication channel over which the signal is to be transmitted to another piconet operable device via the antenna.

As within other embodiments that employ an encoder and a decoder, the encoder of this wireless communication device may be implemented to encode information in a manner in accordance with the functionality and/or processing of at least some of the various aspects of the invention to assist in generating a signal that is to be launched into the communication channel coupling to the wireless communication device. The decoder of the wireless communication device may be implemented to decode a received signal in a manner in accordance with the functionality and/or processing of at least some of the various aspects of the invention. This diagram shows yet another embodiment where one or more of the various aspects of the invention may be found.

In addition, several of the following Figures describe particular embodiments (in more detail) that may be used to implement some of the various aspects of the invention that include processing of LDPC coded signals including decoding of LDPC coded signals. Several details of these various aspects are provided below. Initially, a general description of LDPC codes is provided.

Figure 71:
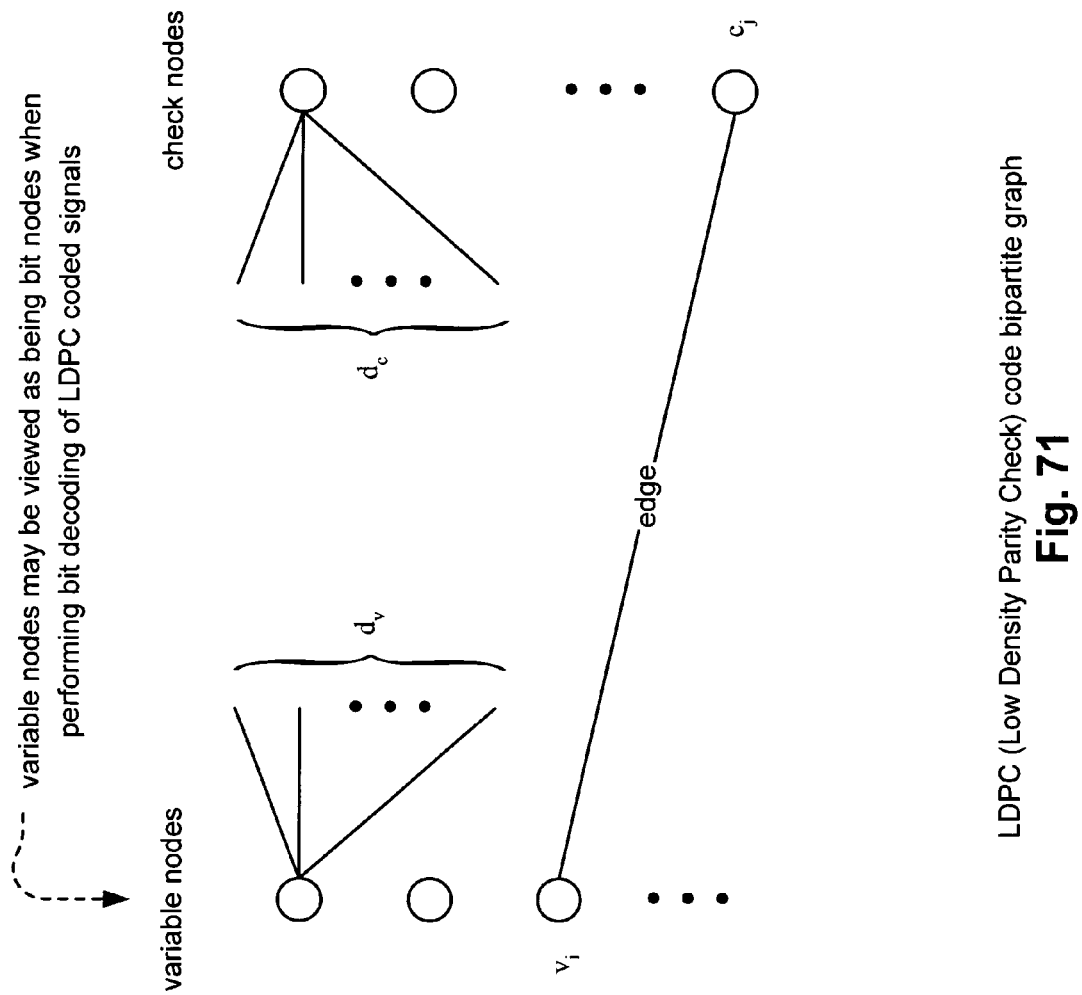
FIG. 71 is a diagram illustrating an embodiment of an LDPC (Low Density Parity Check) code bipartite graph.

FIG. 71 is a diagram illustrating an embodiment of an LDPC (Low Density Parity Check) code bipartite graph. An LDPC code may be viewed as being a code having a binary parity check matrix such that nearly all of the elements of the matrix have values of zeros (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced above and by M. Lugy et al. in [2] also referenced above.

A regular LDPC code can be represented as a bipartite graph by its parity check matrix with left side nodes representing variable of the code bits, and the right side nodes representing check equations. The bipartite graph of the code defined by H may be defined by N variable nodes (e.g., N bit nodes) and M check nodes. Every variable node of the N variable nodes has exactly $d_v(i)$ edges connecting this node to one or more of the check nodes (within the M check nodes). This number of $d_v$ edges may be referred to as the degree of a variable node i. Analogously, every check node of the M check nodes has exactly $d_c(j)$ edges connecting this node to one or more of the variable nodes. This number of $d_c$ edges may be referred to as the degree of the check node j.

An edge between a variable node $v_i$ (or bit node $b_i$) and check node $c_j$ may be defined by e=(i,j). However, on the other hand, given an edge e=(i,j), the nodes of the edge may alternatively be denoted as by e=(v(e),c(e)) (or e=(b(e),c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. One common manner by which LDPC coded signals are conventionally decoded involves using the SPA (Sum Product Algorithm). The novel aspects of performing calculations used during decoding of LDPC coded signals may be adapted to improve this conventional overall approach such that a new improved form of the SPA decoding approach performs decoding processing in a much faster manner than prior art implementations of the SPA decoding approach that operate using more logarithmic, slow, and cumbersome calculations within the iterative decoding processing. In addition, other approaches to performing decoding of LDPC coded signals may likewise benefit from the computational improvement in speed provided by various aspects of the invention.

It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Lugy et al. in [2] referenced above.

In general, with a graph of an LDPC code, the parameters of an LDPC code can be defined by a degree of distribution, as described within M. Lugy et al. in [2] referenced above and also within the following reference:

[5] T. J. Richardson and R. L. Urbanke, "The capacity of low-density parity-check code under message-passing decoding,"*IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that the invention is also operable to accommodate both regular LDPC codes and irregular LDPC codes.

The LLR (Log-Likelihood Ratio) decoding of LDPC codes may be described as follows: the probability that a bit within a received vector in fact has a value of 1 when a 1 was actually transmitted is calculated. Similarly, the probability that a bit within a received vector in fact has a value of 0 when a 0 was actually transmitted is calculated. These probabilities are calculated using the LDPC code that is use to check the parity of the received vector. The LLR is the logarithm of the ratio of these two calculated probabilities. This LLR will give a measure of the degree to which the communication channel over which a signal is transmitted may undesirably affect the bits within the vector.

The LLR decoding of LDPC codes may be described mathematically as follows:

Beginning with $C=\{v|v=(v_0, \ldots, v_{N-1}), vH^T=0\}$ being an LDPC code and viewing a received vector, $y=(y_0, \ldots, y_{N-1})$, with the sent signal having the form of $((-1)^{v_{0i}}, \ldots, (-1)^{v_{N-1}})$, then the metrics of the channel may be defined as $p(y_i|v_i=0)$, $p(y_i|v_i=1),i=0, \ldots, N-1$. The LLR of a metric will then be defined as follows:

$$L_{metric}(i) = \ln\frac{p(y_i \mid v_i = 0)}{p(y_i \mid v_i = 1)}$$

For every variable node $v_i$, its LLR information value will then be defined as follows:

$$\ln\frac{p(v_i = 0 \mid y_i)}{p(v_i = 1 \mid y_i)} = L_{metric}(i) + \ln\frac{p(v_i = 0)}{p(v_i = 1)}$$

Since the variable node, $v_i$, is in a codeword, then the value of the ratio of these, ln $$\ln\frac{p(v_i = 0)}{p(v_i = 1)},$$

may be replaced by the following $$\ln\frac{p(v_i = 0, vH^T = 0 \mid y)}{p(v_i = 1, vH^T = 0 \mid y)} = \sum_{(i,j) \in E_v(i)} \ln\frac{p(v_i = 0, vh_j^T = 0 \mid y)}{p(v_i = 1, vh_j^T = 0 \mid y)}$$

where $E_v(i)$ is a set of edges starting with $v_i$ as defined above.

When performing the BP (Belief Propagation) decoding approach in this context, then the value of ln $$\ln\frac{p(v_i = 0, vh_j^T = 0 \mid y)}{p(v_i = 1, vh_j^T = 0 \mid y)}$$

may be replaced by the following relationship $$L_{check}(i, j) = \ln\frac{p\left(\sum_{e \in E_c(j) \setminus \{(i,j)\}} v_{v(e)} = 0 \mid y\right)}{p\left(\sum_{e \in E_c(j) \setminus \{(i,j)\}} v_{v(e)} = 1 \mid y\right)}$$

The functionality of one possible implementation of a BP LLR decoder that is operable to decode an LDPC coded signal is described below within the FIG. 77.

$L_{check}(i,j)$ is called the EXT (extrinsic) information of the check node $c_j$ with respect to the edge (i,j). In addition, it is noted that $e \in E_c(j) \setminus \{(i,j)\}$ indicates all of the edges emitting from check node $c_j$ except for the edge that emits from the check node $c_j$ to the variable node $v_i$. Extrinsic information values may be viewed as those values that are calculated to assist in the generation of best estimates of actual bit values within a received vector. Also in a BP approach, then the extrinsic information of the variable node $v_i$ with respect to the edge (i,j) may be defined as follows:

$$L_{var}(i, j) = L_{metric}(i) + \sum_{(i,k) \in E_v(i) \setminus \{(i,j)\}} L_{check}(i, k).$$

From certain perspectives, the invention may also be implemented within communication systems that involve combining modulation coding with LDPC coding to generate LDPC coded modulation signals. These LDPC coded modulation signals may be such that they have a code rate and/or modulation (constellation and mapping) that varies as frequently as on a symbol by symbol basis.

Figure 72:
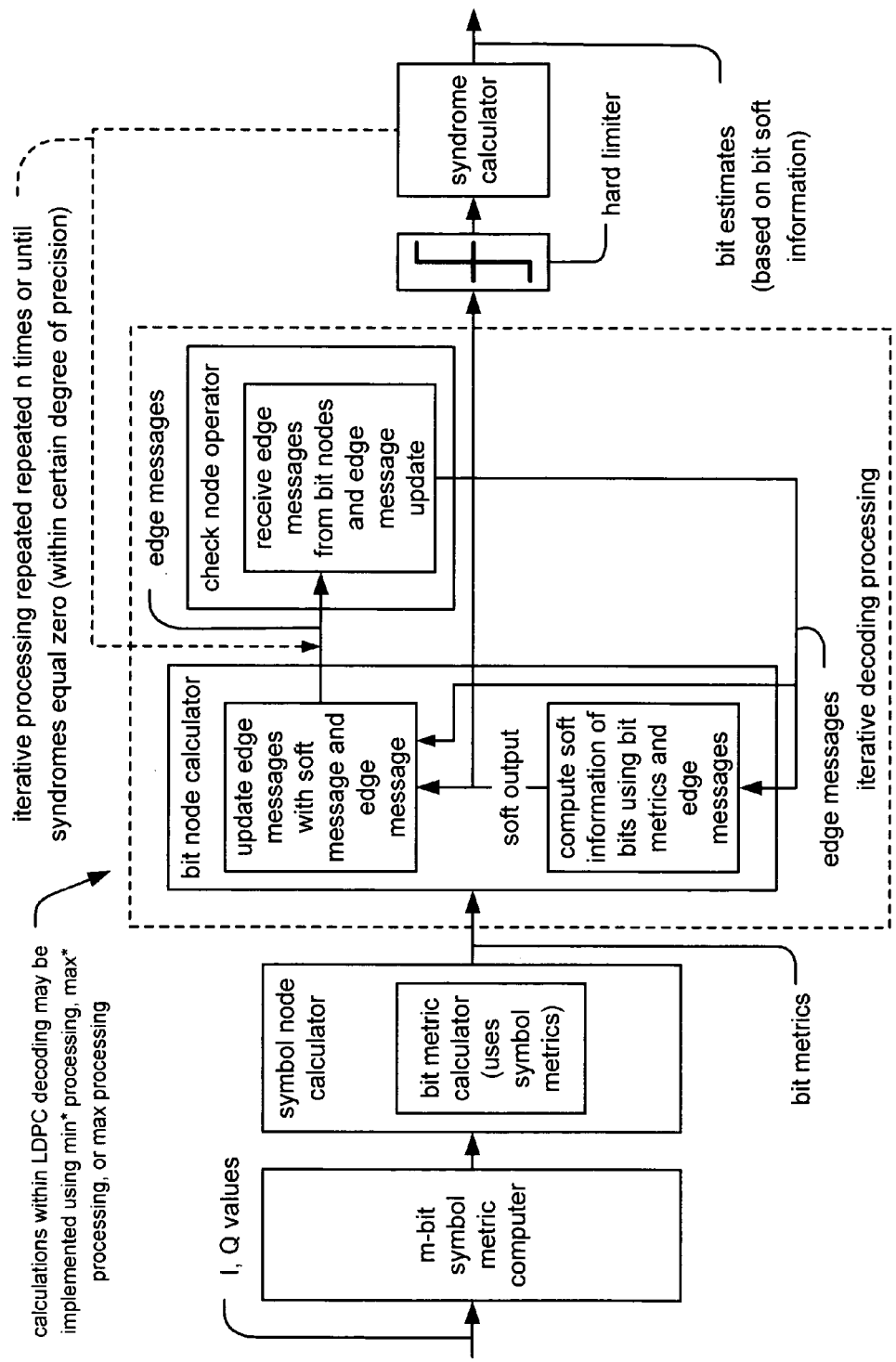
FIG. 72 is a diagram illustrating an embodiment of LDPC (Low Density Parity Check) decoding functionality using bit metric according to the invention.

FIG. 72 is a diagram illustrating an embodiment of LDPC (Low Density Parity Check) decoding functionality using bit metric according to the invention. To perform decoding of an LDPC coded signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. The iterative processing continues between the bit nodes and the check nodes according to the LDPC code bipartite graph that was employed to encode the signal that is being decoded.

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). That is to say, the syndrome calculator determines whether each syndrome associated with the LDPC code is substantially equal to zero as defined by some predetermined degree of precision. For example, when a syndrome has a mathematically non-zero value that is less than some threshold as defined by the predetermined degree of precision, then that syndrome is deemed to be substantially equal to zero. When a syndrome has a mathematically non-zero value that is greater than the threshold as defined by the predetermined degree of precision, then that syndrome is deemed to be substantially not equal to zero.

When the syndromes are not substantially equal to zero, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 73:
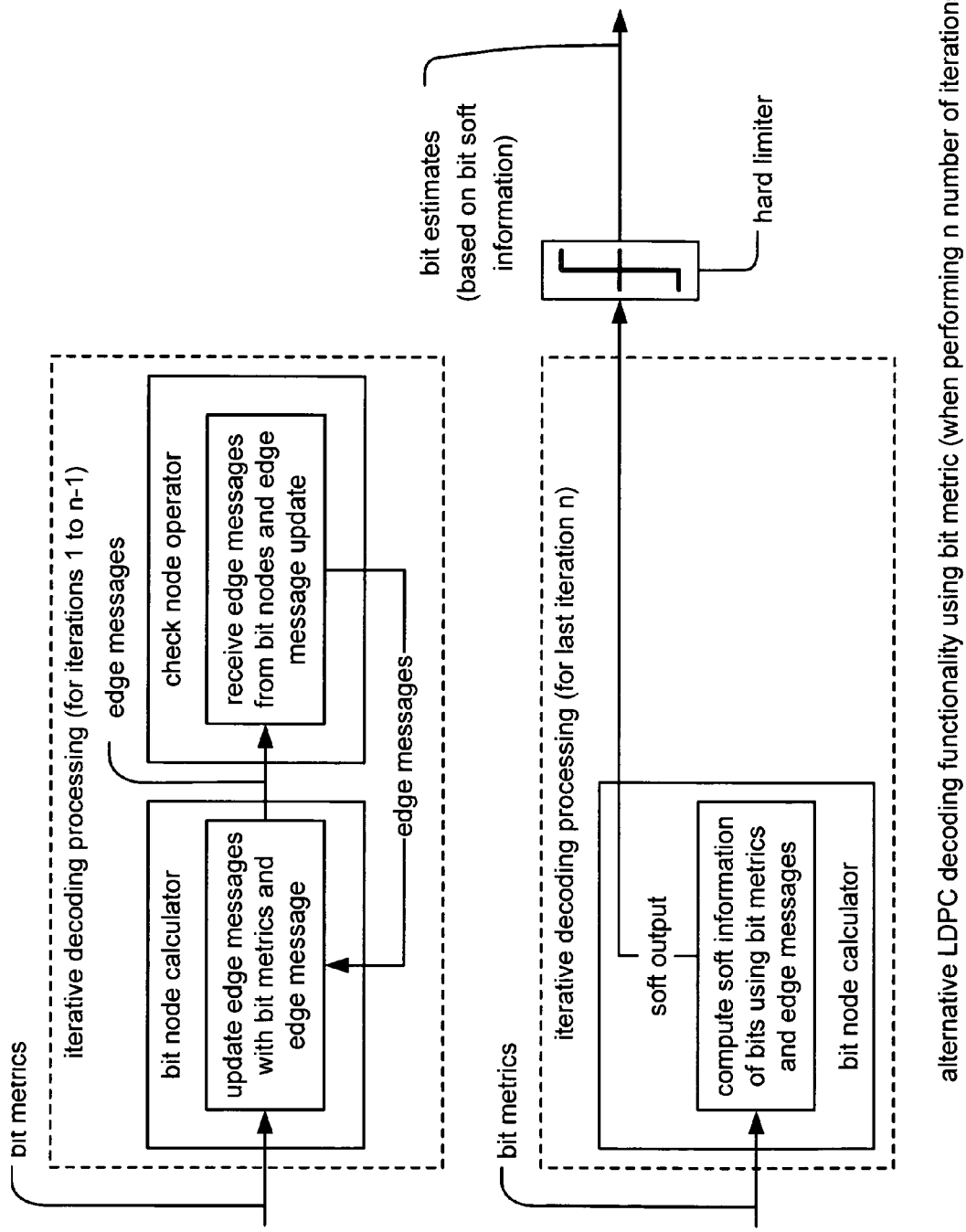
FIG. 73 is a diagram illustrating an alternative embodiment of LDPC decoding functionality using bit metric according to the invention (when performing n number of iterations).

FIG. 73 is a diagram illustrating an alternative embodiment of LDPC decoding functionality using bit metric according to the invention (when performing n number of iterations). This embodiment shows how the iterative decoding processing may be performed when a predetermined number of decoding iterations, shown as n, is performed. If the number of decoding iterations is known beforehand, as in a predetermined number of decoding iterations embodiment, then the bit node calculator functional block may perform the updating of its corresponding edge messages using the bit metrics themselves (and not the soft information of the bits as shown in the previous embodiment and described above). This processing may be performed in all but a final iterative decoding iteration (e.g., for iterations 1 through n−1). However, during the final iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 74:
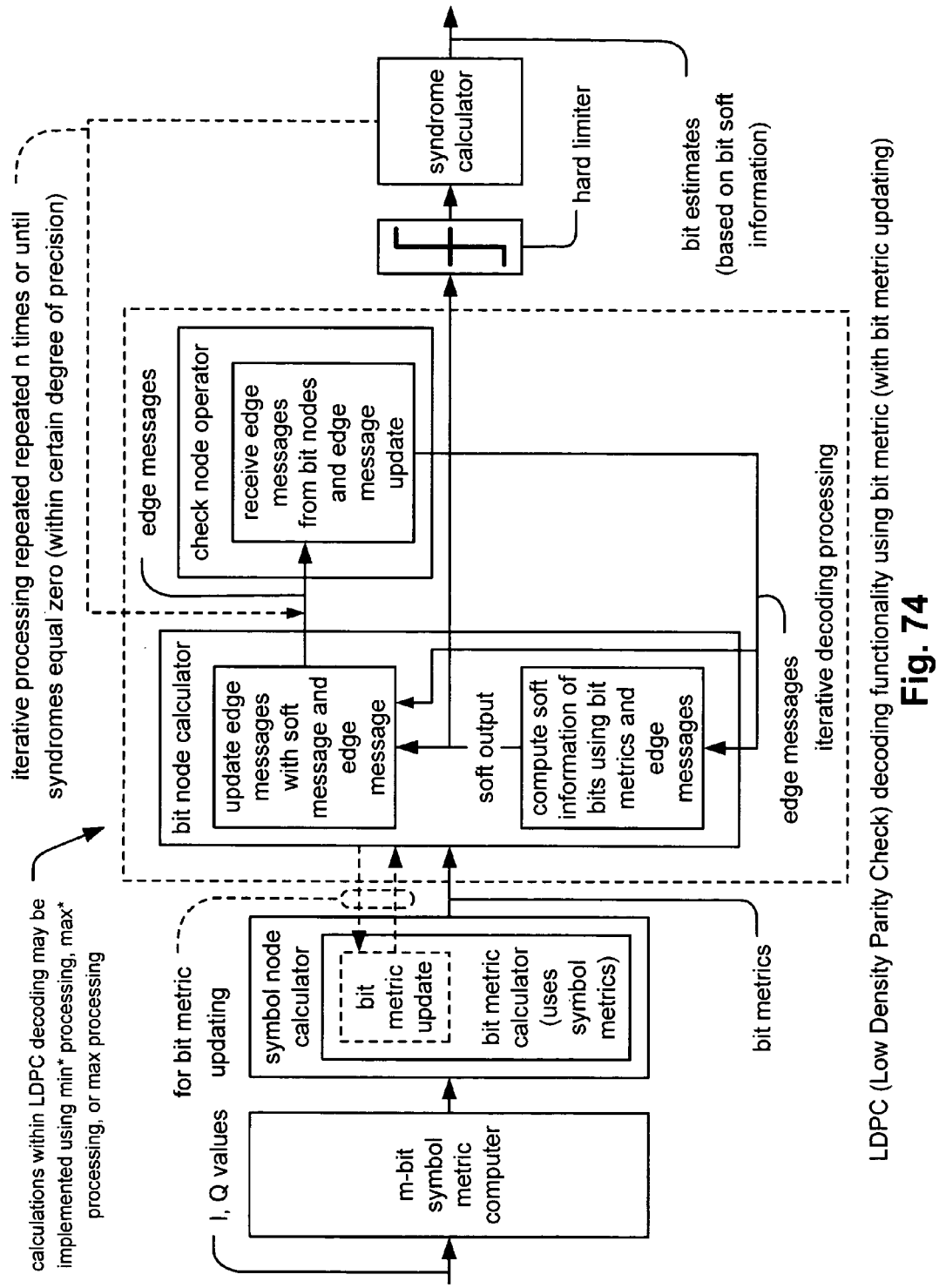
FIG. 74 is a diagram illustrating an alternative embodiment of LDPC (Low Density Parity Check) decoding functionality using bit metric (with bit metric updating) according to the invention.

FIG. 74 is a diagram illustrating an alternative embodiment of LDPC (Low Density Parity Check) decoding functionality using bit metric (with bit metric updating) according to the invention. To perform decoding of an LDPC coded signal having an m-bit signal sequence, the functionality of this diagram may be employed. After receiving the I, Q (In-phase, Quadrature) values of a signal at the symbol nodes, an m-bit symbol metric computer functional block calculates the corresponding symbol metrics. At the symbol nodes, these symbol metrics are then passed to a symbol node calculator functional block that uses these received symbol metrics to calculate the bit metrics corresponding to those symbols. These bit metrics are then passed to the bit nodes connected to the symbol nodes. The symbol node calculator functional block is also operable to perform bit metric updating during subsequent decoding iterations.

Thereafter, at the bit nodes, a bit node calculator functional block operates to compute the corresponding soft messages of the bits. Then, in accordance with iterative decoding processing, the bit node calculator functional block receives the edge messages from a check node operator functional block and updates the edge messages with the bit metrics received from the symbol node calculator functional block. This updating of the edge messages may be performed using the updated bit metrics during subsequent iterations. These edge messages, after being updated, are then passed to the check node operator functional block.

At the check nodes, the check node operator functional block then receives these edge messages sent from the bit nodes (from the bit node calculator functional block) and updates them accordingly. These updated edge messages are then passed back to the bit nodes (e.g., to the bit node calculator functional block) where the soft information of the bits is calculated using the bit metrics and the current iteration values of the edge messages. Thereafter, using this just calculated soft information of the bits (shown as the soft message), the bit node calculator functional block updates the edge messages using the previous values of the edge messages (from the just previous iteration) and the just calculated soft message. At the same time, as the just calculated soft information of the bits (shown as the soft message) has been calculated, this information may be passed back to the symbol nodes (e.g., to the symbol node calculator functional block) for updating of the bit metrics employed within subsequent decoding iterations. The iterative processing continues between the bit nodes and the check nodes according to the LDPC code bipartite graph that was employed to encode the signal that is being decoded (by also employing the updated bit metrics during subsequent decoding iterations).

These iterative decoding processing steps, performed by the bit node calculator functional block and the check node operator functional block, are repeated a predetermined number of iterations (e.g., repeated n times, where n is selectable). Alternatively, these iterative decoding processing steps are repeated until the syndromes of the LDPC code are all equal to zero (within a certain degree of precision).

Soft output information is generated within the bit node calculator functional block during each of the decoding iterations. In this embodiment, this soft output may be provided to a hard limiter where hard decisions may be made, and that hard information may be provided to a syndrome calculator to determined whether the syndromes of the LDPC code are all equal to zero (within a certain degree of precision). When they are not, the iterative decoding processing continues again by appropriately updating and passing the edge messages between the bit node calculator functional block and the check node operator functional block.

After all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 75:
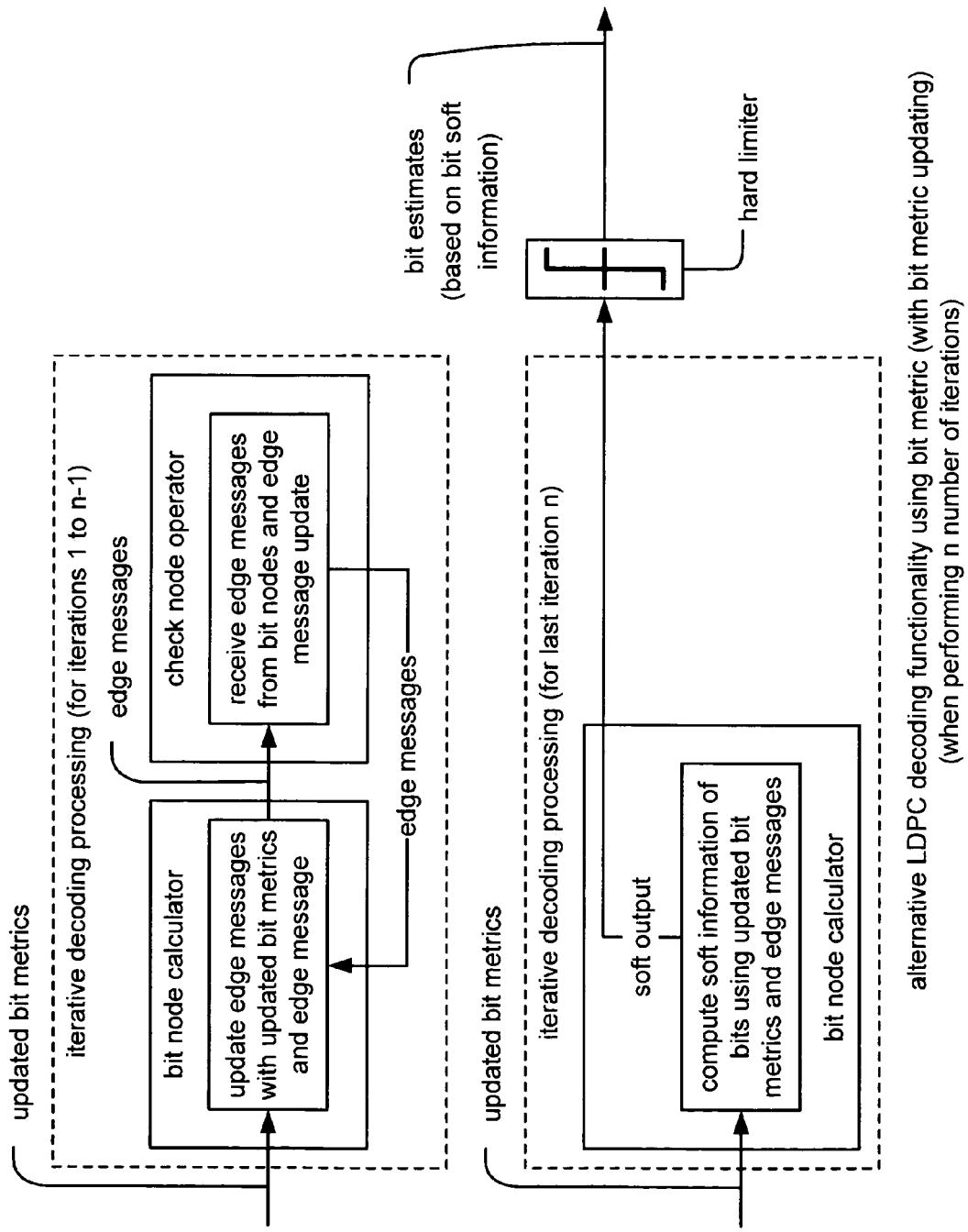
FIG. 75 is a diagram illustrating an alternative embodiment of LDPC decoding functionality using bit metric (with bit metric updating) according to the invention (when performing n number of iterations).

FIG. 75 is a diagram illustrating an alternative embodiment of LDPC decoding functionality using bit metric (with bit metric updating) according to the invention (when performing n number of iterations). This embodiment shows how the iterative decoding processing may be performed when a predetermined number of decoding iterations, shown as n, is performed (again, when employing bit metric updating). If the number of decoding iterations is known beforehand, as in a predetermined number of decoding iterations embodiment, then the bit node calculator functional block may perform the updating of its corresponding edge messages using the bit metrics/updated bit metrics themselves (and not the soft information of the bits as shown in the previous embodiment and described above). This processing may be performed in all but a final decoding iteration (e.g., for iterations 1 through n−1). However, during the final iteration, the bit node calculator functional block calculated the soft information of the bits (shown as soft output). The soft output is then provided to a hard limiter where hard decisions may be made of the bits. The syndromes need not be calculated in this embodiment since only a predetermined number of decoding iterations are being performed.

Figure 76A:
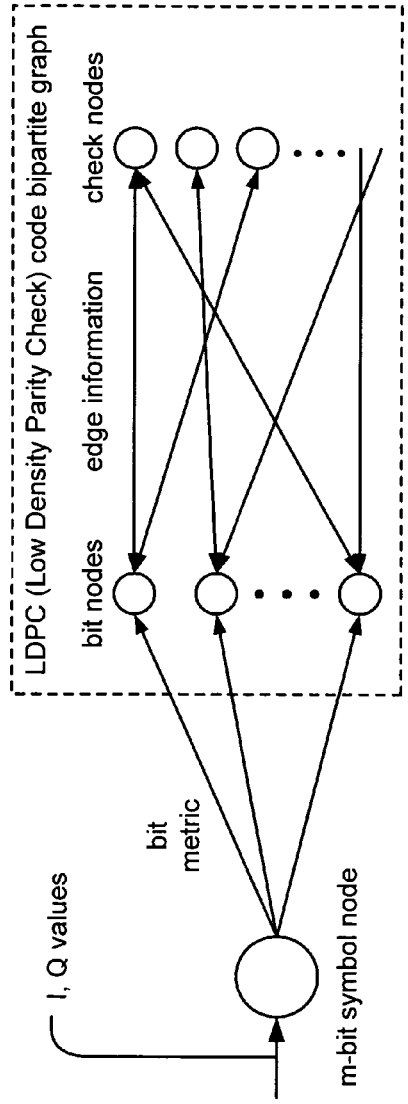
FIG. 76A is a diagram illustrating bit decoding using bit metric (shown with respect to an LDPC (Low Density Parity Check) code bipartite graph) according to the invention.

FIG. 76A is a diagram illustrating bit decoding using bit metric (shown with respect to an LDPC (Low Density Parity Check) code bipartite graph) according to the invention. Generally speaking, after receiving I, Q values of a signal at a symbol nodes, the m-bit symbol metrics are computed. Then, at the symbol nodes, the symbol metric is used to calculate the bit metric. The bit metric is then passed to the bit nodes connected to the symbol nodes. At the bit nodes, the soft messages of the bits are computed, and they are used to update the edge message sent from the check nodes with the bit metric. These edge messages are then passed to the check nodes. At the check nodes, updating of the edge messages sent from the bit nodes is performed, and these values are pass back the bit nodes.

As also described above with respect to the corresponding functionality embodiment, after all of these iterative decoding processing steps have been performed, then the best estimates of the bits are output based on the bit soft information. In the approach of this embodiment, the bit metric values that are calculated by the symbol node calculator functional block are fixed values and used repeatedly in updating the bit node values.

Figure 76B:
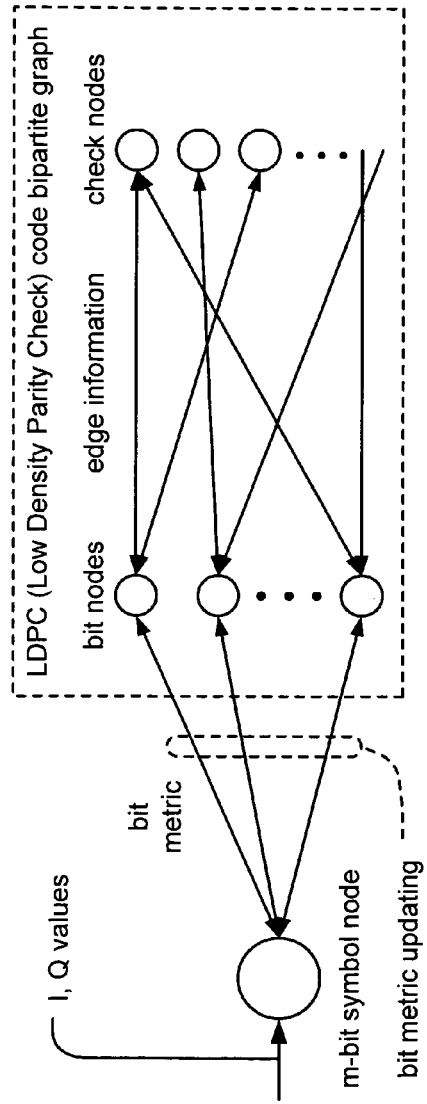
FIG. 76B is a diagram illustrating bit decoding using bit metric updating (shown with respect to an LDPC (Low Density Parity Check) code bipartite graph) according to the invention.

FIG. 76B is a diagram illustrating bit decoding using bit metric updating (shown with respect to an LDPC (Low Density Parity Check) code bipartite graph) according to the invention. With respect to this LDPC code bipartite graph that performs bit metric updating, the decoding processing may be performed as follows:

After receiving the I, Q value of the signal at the symbol nodes, the m-bit symbol metrics are computed. Then, at the symbol nodes, the symbol metrics are used to calculate the bit metrics. These values are then passed to the bit nodes connected to the symbol nodes. At the bit nodes, the edge message sent from the check nodes are updated with the bit metrics, and these edge messages are passed to the check nodes. In addition, at the same time the soft bit information is updated and passed back to the symbol nodes. At the symbol nodes, the bit metrics are updated with the soft bit information sent from the bit nodes, and these values are passed back to the variable nodes. At the check nodes, the edge information sent from the bit nodes is updated, and this information is passed back to the bit nodes.

As also described above with respect to the corresponding functionality embodiment, after all of these iterative decoding processing steps have been performed, then the best estimates of the bits are output based on the bit soft information. Again, it is shown in this embodiment that the bit metric values are not fixed; they are updated for use within subsequent decoding iterations. This is again in contradistinction to the embodiment described above where the bit metric values that are calculated only once and remain fixed values for all of the decoding iterations.

Figure 77:
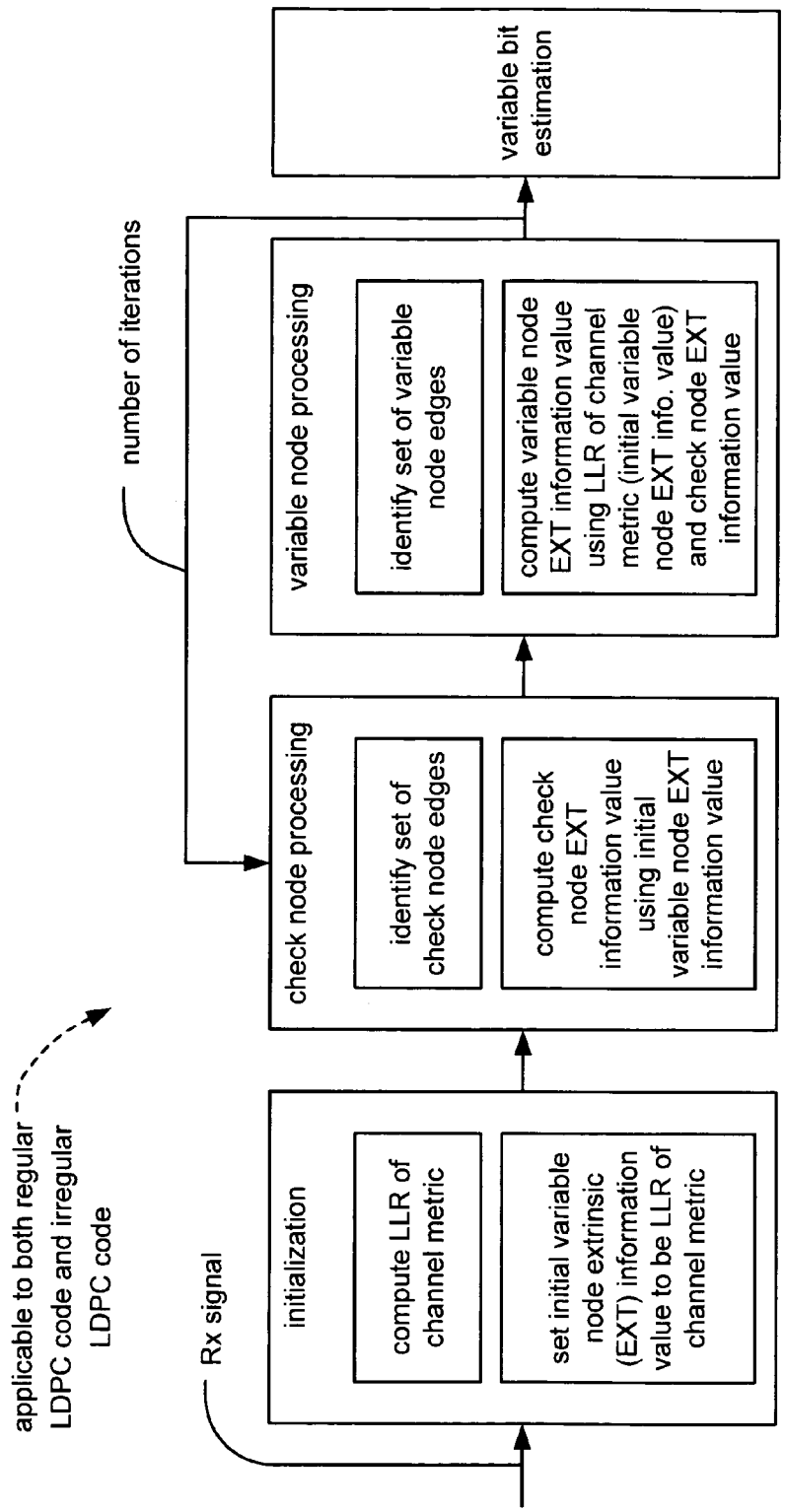
FIG. 77 is a functional block diagram illustrating an embodiment of LDPC code Log-Likelihood ratio (LLR) decoding functionality that is arranged according to the invention.

FIG. 77 is a functional block diagram illustrating an embodiment of LDPC code Log-Likelihood ratio (LLR) decoding functionality that is arranged according to the invention. The LLR decoding functionality includes a number of functional blocks that operate on a received signal (shown as Rx signal). The received signal is provided by an initialization functional block to establish the initial conditions of the decoding process, then to a check node processing functional block and on to a variable node processing functional block for determining the extrinsic information for the check and variable nodes, respectively, and finally to a variable bit estimation functional block where the actual best estimation of one or more bits within the received signal are made.

The initialization functional block computes the LLR of the channel metric over which the received signal has been transmitted. The initialization involves computing $L_{metric}(i)$ which is the LLR of the channel metric. In addition, the initialization functional block includes setting the initial variable node extrinsic value to be the LLR of the channel metric. This may be expressed mathematically as follows:

$$L_{var}^n(e) = L_{metric}(v(e)) \text{ for all the edges } e \text{ and } n=0.$$

The check node processing functional block involves identifying the set of all of the check node edges according to the bipartite graph shown above within the FIG. 71. This may be shown mathematically as follows:

For every check node $c_i$, $i=0,\ldots,M-1$, we define the check node edges as $E_c(i)=\{e_0,\ldots,e_{d_c-1}\}$.

In addition, the check node processing functional block also performs computation of the check node extrinsic information value ($L_{check}^n(e_j)$) using the initial variable node extrinsic value ($L_{var}^{n-1}(e_k)$).

The variable node processing functional block involves identifying the set of all variable node edges according to the bipartite graph shown within the FIG. 71.

This may be shown mathematically as follows:

For every variable node $v_i$, $i=0,\ldots,N-1$, we define the variable node edges as $E_v(i)=\{e_0,\ldots,e_{d_v-1}\}$.

In addition, a variable node extrinsic information value is computed using an LLR of channel metric and a check node extrinsic information value. This may be shown mathematically as follows:

$$\text{Compute } L_v^n(i) = L_{metric}(i) + \sum_{k=0}^{d_v-1} L_{check}^n(e_k)$$

$$\text{Compute } L_{var}^n(e_j) = L_{var}^n - L_{check}^n(e_j), \; e_j \in E_v(i)$$

In accordance with the iterative decoding described herein, multiple decoding iterations may be performed by feeding back the results provided by the variable node processing functional block to the check node processing functional block.

At the last iteration, a best estimate of a variable bit contained within the received signal may be made by the variable bit estimation functional block. The best estimate is made using the variable $L_v^n(i)$. When $L_v^n(i)$ is greater than or equal to zero, then the best estimate of a variable bit is made as being a value of 0; when $L_v^n(i)$ is less than zero, then the best estimate of a variable bit is made as being a value of 1.

$$v_i = \begin{cases} 0 & L_v^n(i) \geq 0 \\ 1 & L_v^n(i) < 0 \end{cases}$$

Alternatively, a reverse analysis may be performed if desired in certain embodiments.

$$v_i = \begin{cases} 1 & L_v^n(i) \geq 0 \\ 0 & L_v^n(i) < 0 \end{cases}$$

The prior art approaches of performing LDPC decoding typically prove to be very computationally intensive. The invention provides several embodiments that may significantly reduce the total number of operations that need be performed as well as the corresponding memory required to support those operations. This can result in a great deal of processing savings as well as speeding up of the decoding process.

Figure 78:
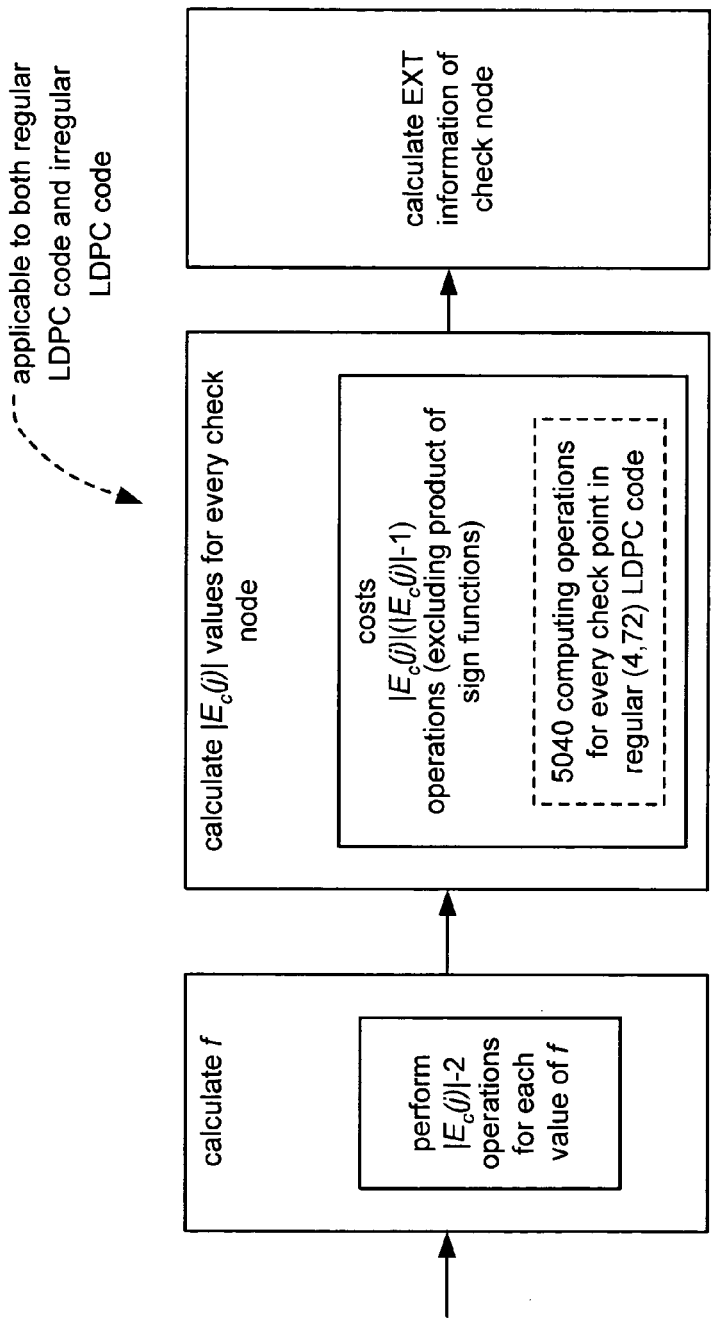
FIG. 78 is a functional block diagram illustrating an embodiment of straightforward check node processing functionality that is arranged according to the invention.
Figure 79:
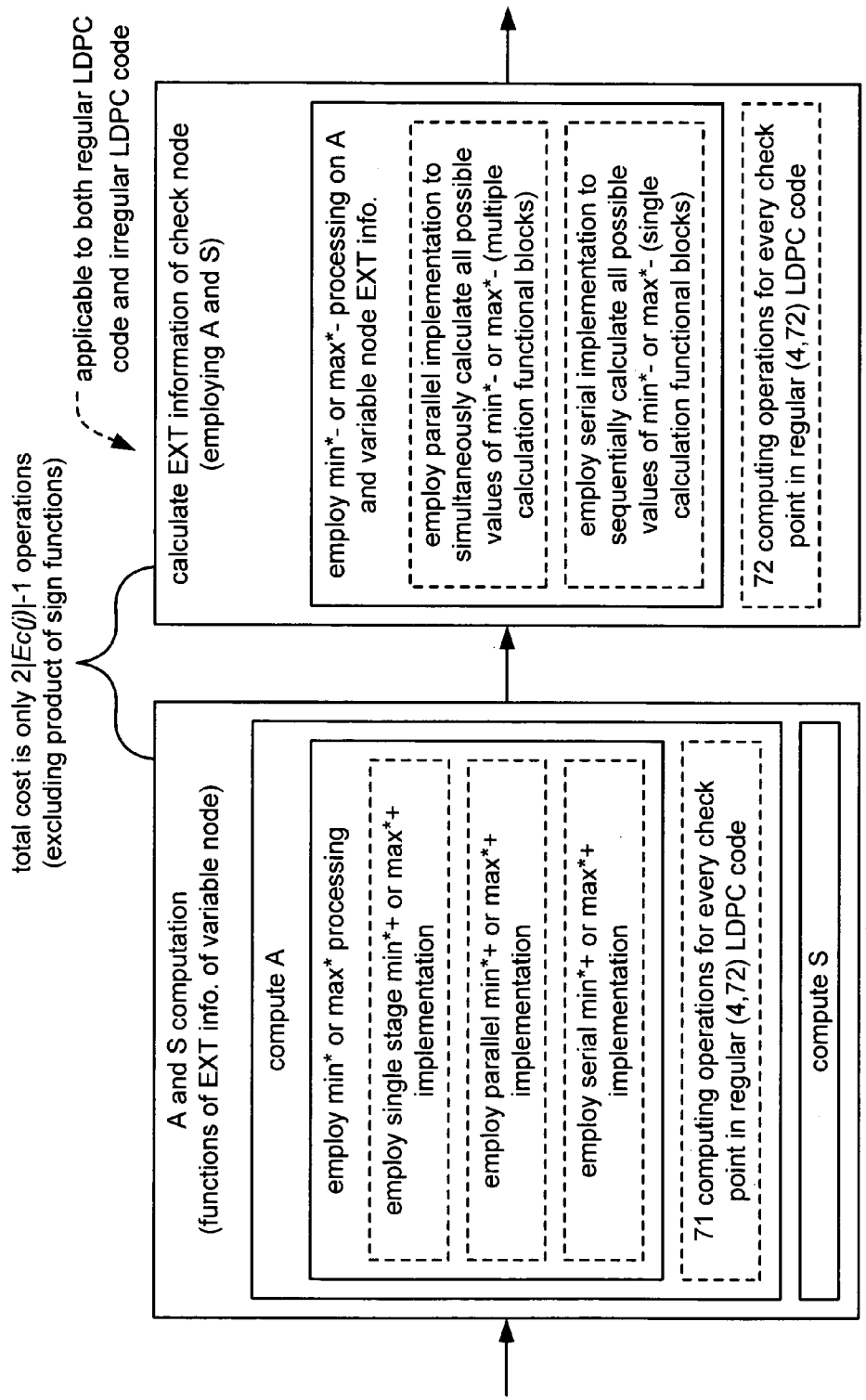
FIG. 79 is a functional block diagram illustrating an embodiment of min* (min*+ and min*−) or max* (max*+ and max*−) check node processing functionality that is arranged according to the invention.

The processing within the check node processing functional block shown above within the FIG. 77 may be performed using several computational optimizations provided by the invention. The FIG. 78 and FIG. 79 show some possible embodiments for performing the check node processing.

The following description is used to show basic computations that need be performed to calculate the check node extrinsic information value that is used in decoding a variable bit within a received signal. Afterwards, the FIG. 78 and FIG.

79 will show embodiments of functionality that may be implemented to perform these calculations employed within the decoding.

The basic computation may be may be described as beginning with the random variables, $v_1, v_2, \ldots, v_k$ having values in $\{0,1\}$ (zero or one) and with the probability $p_i(0)$ and $p_i(1)$, $i=1,2,\ldots,k$. The denotation of the logarithmic ratio of these probabilities is shown below:

$$L(v_i) = \ln[p_i(1)/p_i(0)], i=1,2,\ldots,k$$

It may also be shown, as by the authors in J. Hagenauer, E. Offer and L. Papke, "Iterative decoding of binary block and convolutional codes," *IEEE Trans. Inform. Theory*, Vol. 42, No. 2 March 1996, pp. 429-445, that the extrinsic information value for a sum of random variables may be shown as follows:

$$L(v_1 + v_2) = \ln \frac{p(v_1 + v_2 = 1)}{p(v_1 + v_2 = 0)} = \ln \frac{1 + \exp(L(v_1) + L(v_2))}{\exp(L(v_1)) + \exp(L(v_2))}$$

Using this relationship, the following relationship may be made.

$$L\left(\sum_{i=1}^{k} v_i\right) = \ln \frac{p\left(\sum_{i=1}^{k} v_i = 1\right)}{p\left(\sum_{i=1}^{k} v_i = 0\right)} = L\left(\left[\sum_{i=1}^{k-1} v_i\right] + v_k\right) \quad \text{EQ 1}$$

The computation of this function may be performed using the following function:

$$f(x, y) = \ln \frac{1 + \exp(x+y)}{\exp(x) + \exp(y)}$$

This function may be further simplified as follows:

$$f(x, y) = \text{sign}(x)\text{sign}(y)\ln \frac{1 + \exp(|x| + |y|)}{\exp(|x|) + \exp(|y|)}; \quad \text{EQ 2}$$

$$\text{where sign}(x) = \begin{cases} 1, & x \geq 0 \\ -1, & x < 0 \end{cases}.$$

Since $|x|, |y| \geq 0$, we have $\exp(|x|)(\exp(|y|)-1) \geq (\exp(|y|)-1)$, and therefore the following relationship may be made:

$$\ln \frac{1 + \exp(|x| + |y|)}{\exp(|x|) + \exp(|y|)} \geq 0 \quad \text{EQ 3}$$

By using the Equations 2 and 3 above, the following two relationships may be made.

$$\text{sign}(f(x,y)) = \text{sign}(x)\text{sign}(y)$$

$$|f(x,y)| = f(|x|,|y|)$$

Continuing on, the following relationships may be achieved:

$$f(x,y) = \text{sign}(x)\text{sign}(y)f(|x|,|y|) \quad \text{EQ 4}$$

To generalize this function to functions having more variable, the following relationship may be made:

$$f(x_1, x_2, \ldots, x_k) = f(f(x_1, \ldots, x_{k-1}), x_k) \quad \text{EQ 5}$$

In addition, the following relationships may be achieved as well:

$$f(x_1, \ldots, x_k) = \left(\prod_{i=1}^{n} \text{sign}(x_i)\right) f(|x_1|, \ldots, |x_k|) \quad \text{EQ 6}$$

The following two relationships may then be employed when performing the decoding of an LDPC code.

$$\text{sign}(f(x_1, \ldots, x_n)) = \left(\prod_{i=1}^{n} \text{sign}(x_i)\right), \text{ and}$$

$$|f((x_1, \ldots, x_k)| = f(|x_1|, \ldots, |x_k|)$$

A brief proof of the preceding relationship is shown below. In the earlier case, the value of k was 2. Continuing on, if we operate on the supposition that EQ 6 is in fact true when $k=n-1$. If we use Equations 4 and 5, and by also using the following relationship:

$$(f(x_1, \ldots, x_n) =$$

$$(\text{sign}\left(f(x_1, \ldots, x_{n-1})\text{sign}(x_n)f(|f(x_1, \ldots, x_{n-1})|, |x_n|) = \left[\prod_{i=1}^{n} \text{sign}(x_i)\right]\right.$$

$$f\left(f(|x_1|, \ldots, |x_{n-1}|, |x_n|) = \left[\prod_{i=1}^{n} \text{sign}(x_i)\right] f(|x_1|, \ldots, |x_n|)\right].$$

Now, the L function defined above within the EQ 1 may then be described by the relationship shown below.

$$L\left(\sum_{i=1}^{k} v_i\right) = \quad \text{EQ 7}$$

$$f(L(v_1), \ldots, L(v_k)) = \left[\prod_{i=1}^{k} \text{sign}(L(v_i))\right] f(|L(v_1)|, \ldots, |L(v_k)|)$$

A common calculation that is performed when decoding an LDPC signal includes the computation and approximation of the function: $f(|x|,|y|)$.

From the definition of $f(|x|,|y|)$, the following relationship may be made.

$$f(|x|, |y|) = \ln \frac{1 + \exp(-(|x| + |y|))}{\exp(-|x|) + \exp(-|y|)} \quad \text{EQ 8}$$

$$f(|x|, |y|) =$$

$$-\ln(\exp(-|x|) + \exp(-|y|)) + \ln(1 + \exp(-(|x| + |y|)))$$

$$f(|x|, |y|) = \min(|x|, |y|) = \ln\left[\frac{1 + \exp(-(|x| + |y|))}{1 + \exp(-||x| - |y||)}\right] = \min^{**}(|x|, |y|)$$

We denote the right side of the last equation by the min function, or more specifically shown as min(|x|,|y|). The min* function is provided here for comparison to the min** function.

For any real values x and y, the calculation of min* may be described as below. The min* calculation includes finding an actual minimum and also a natural log base e ($\log_e$=ln) correction factor.

$$\min^*(x, y) = -\ln(e^{-x} + e^{-y})$$

In general, we define min*$(x_1, \ldots, x_N)$=min*(min*$(x_1, \ldots, x_{N-1}), x_N)$. Using induction, one can prove the following relationship:

$$\min^*(x_1, \ldots, x_N) = -\ln(e^{-x_1} + e^{-x_2} + \ldots + e^{-x_N})$$

From the min* relationship shown above, we have $$\min^*(x, y) = \begin{cases} -\ln(e^{-x}(1 + e^{x-y})), & x \leq y \\ -\ln(e^{-y}(1 + e^{y-x})), & x > y \end{cases} = \min(x, y) - \ln(1 + e^{-|x-y|})$$

This equation may also be simplified as shown below:

$$\min^*(x,y) = \min(x,y) - \ln(1 + e^{-|x-y|})$$

It is noted that the min** function also has some similarities to the min* function. For example, similar to the definition of min*, part of the min** function, shown as $$\ln\left[\frac{1 + \exp(-(|x| + |y|))}{1 + \exp(-||x| - |y||)}\right],$$

may be considered as a natural log base e ($\log_e$=ln) correction factor that only needs a read-only memory (ROM), or some other memory storage device, to store some possible values of that portion. One example of how such storage may be performed may be found in E. Eleftheriou, T. Mittelholzer and A. Dholakia, "Reduced-complexity decoding algorithm for low-density parity-check codes," *IEEE Electronic Letters*, Vol. 37, pp. 102-104, January 2001.

Moreover, we denote min$(x_1, \ldots, x_n)$=min(min** $((x_1, \ldots, x_{n-1}), x_n))$ Using this relationship, then the relationship of EQ 7 may be described as the following relationship:

$$L\left(\sum_{i=1}^{k} v_i\right) = \left[\prod_{i=1}^{k} \text{sign}(L(u_i))\right] \min^{**}\{|L(v_1)|, \ldots, |L(v_k)|\}$$

In taking the first part of the right side of the second equation in EQ 8, the authors of J. Hagenauer, E. Offer, and L. Papke, "Iterative decoding of binary block and convolutional codes," *IEEE Trans. Inform. Theory*, Vol. 42, No. 2 March 1996, pp. 429-445 had suggested to use the approximation $f(|x|,|y|) \approx \min(|x|,|y|)$.

With this approximation, the EQ 7 may then be described as follows:

$$L\left(\sum_{i=1}^{k} v_i\right) \approx \left[\prod_{i=1}^{k} \text{sign}(L(u_i))\right] \min\{|L(v_1)|, \ldots, |L(v_k)|\}$$

However, this proposed solution is a very significant compromise of the accuracy of the calculation. As a result of such a significant compromise in accuracy, a great loss in performance is undesirably realized using such an approach. A much better approximation that includes the appropriate logarithmic correction may be employed as follows:

Approximate $f(|x|,|y|)$ as follows:

$$f(|x|,|y|) \approx \min^*(|x|,|y|) = \min(|x|,|y|) - \ln(1 + e^{-||x|-|y||})$$

It is especially noted here that this approximation shown above does not result in any performance loss. This way, a simplification may be made in the operations performed without any performance loss thereby achieving a more efficient implementation.

With this approximation, the relationship of the EQ 7 will then become $$L\left(\sum_{i=1}^{k} v_i\right) = \left[\prod_{i=1}^{k} \text{sign}(L(u_i))\right] \min^*\{|L(v_1)|, \ldots, |L(v_k)|\}$$

The following description employs the various relationships described above in performing LDPC decoding. The following FIG. 78 and FIG. 79 show embodiments of how the check node processing functionality of the FIG. 77 may be supported according to the invention.

The application of the EQ 7 is made to an LLR decoder. In doing so, the value of $L(v_i)$ is replaced by $L_{var}^{n-1}(i,j)$ with respect to the edge (i,j). In doing so, then the extrinsic information value of the check node with respect to the edge (i,j), shown as $L_{check}^n(i,j)$, will become:

$$L_{check}^n(i, j) = \left[\prod_{e \in E_c(j)\setminus\{(i,j)\}} \text{sign}(L_{var}^{n-1}(e))\right] \qquad \text{EQ 9}$$

$$f(\{|L_{var}^{n-1}(e)||e \in E_c(j)\setminus\{(i, j)\}\})$$

FIG. 78 is a functional block diagram illustrating an embodiment of straightforward check node processing functionality that is arranged according to the invention. The FIG. 78 employs a straightforward implementation of EQ 9. In doing so, the calculation of the function $f$ is performed in a first functional block. When referring to the EQ 9, it is seen that $f$ has $|E_c(j)|-1$ values. Therefore, $|E_c(j)|-2$ computational operations are then needed to compute one value of $f$.

In a second functional block, the $|E_c(j)|$ values are computed for every check node. This calculation will cost $|E_c(j)|(|E_c(j)|-1)$ computational operations without considering computing the product of sign functions, for example $$\left(\prod \text{sign}(L)\right).$$

We may look at one specific embodiment in order to see the computational requirements to support this straightforward check node processing functionality. In doing so, we consider decoding a regular (4,72) LDPC code. For every check point $c_i$, 5040 computational operations are needed to perform the decoding. While a regular LDPC code is used here for illustration, it is also noted that the invention is also operable to accommodate irregular LDPC codes as well.

After performing the calculation of the $|E_c(j)|$ values, then the extrinsic information for the check node is calculated according to the straightforward check node processing functionality of the FIG. 78.

FIG. 79 is a functional block diagram illustrating an embodiment of min* (min*+ and min*−) or max* (max*+ and max*−) check node processing functionality that is arranged according to the invention. The FIG. 79 may employ min* processing that is further broken down into min*+ and min*− operations. Alternatively, the FIG. 79 may employ max* processing that is further broken down into max*+ and max*− operations. This breakdown is also described in detail within, "Inverse function of min*: min*− (inverse function of max*: max*−)," that has been incorporated by reference above.

When breaking down the min* operation into min*+ and min*− (the inverse of min*+) operations, min* operation itself, defined above, is now renamed as being a min*+ operation. Furthermore, the following definition of the min*− operation may be shown on any real values x and y such that x<y as follows:

$$\text{min*−}(x,y) = -\ln(e^{-x} - e^{-y})$$

Then, we have min*−(x, y)=min(x, y)−ln(1−$e^{-|x-y|}$). The complexity of this min*− operation is that of min*(2 element) operation.

There is also a very useful property of the min*− operation when compared to the min*+ operation. As mentioned above, the min*− operation is an inverse of the min*+ operation. This operation may be shown below. Since $e^{-x}+e^{-y}>e^{-y}$, we have $-\ln(e^{-x}+e^{-y})<y$, thus, min*+(x,y)<y. Therefore, by employing the definitions of min*+ and min*−, the following relationship may be made as follows:

$$\text{min*−}(\text{min*+}(x,y),y) = -\ln(e^{\ln(e^{-x}+e^{-y})} - e^{-y}) = -\ln(e^{-x}) = x$$

This relationship and operation may be employed to provide for significantly reduced computationally complexity that performing straightforward min* or max* processing. Using the relationships introduced above, a min* processing functional block that employs both min*− and min*+ operations may be employed. Alternatively, by using analogous relationships corresponding to max* processing, a max* processing functional block that employs both max*− and max*+ operations may be employed.

The relationships between the max*− and max*+ operations of max* are described below in light of the decoding processing to be performed herein.

Some of the similar terms between the definitions of min* (x, y) and max* (x, y), can also be seen when the two terms are compared together as follows:

$$\text{min*}(x,y) = -\ln(\exp(-x) + \exp(-y))$$

$$\text{max*}(x,y) = \ln(\exp(x) + \exp(y))$$

Using these similarities, the following relationship may be made between min*(x, y) and max*(x, y):

$$\text{min*}(x,y) = -\text{max*}(-x,-y)$$

We then have the following relationship for calculating the term, $L_{check}^n(i,j)$. By capitalizing on the relationship between min* and −max* shown just above, the following $L_{check}^n(i,j)$ value may be calculated using max* processing.

$$L_{check}^n(i,j) =$$

$$(-1) \left[ \prod_{e \in E_c(j) \setminus \{(i,j)\}} \text{sign}(L_{var}^{n-1}(e)) \right] \text{max*}(\{-|L_{var}^{n-1}(e)| | e \in E_c(j) \setminus \{(i,j)\}\})$$

Similar to the manner in which min* may be broken down to the min*− and min*+ functions, the max* function may also be broken down into the max*− and max*+ functions as follows:

$$\text{min*+}(x,y) = \text{max*}(x,y) = \max(x,y) + \ln(1+\exp(-|x-y|))$$

$$\text{min*−}(x,y) = \ln(\exp(x) - \exp(y)) = \max(x,y) + \ln(1-\exp(-|x-y|))$$

Continuing on by looking at the min* approximation approach described above, the EQ 9 may then be shown as follows:

$$L_{check}^n(i,j) \approx \left[ \prod_{e \in E_c(j) \setminus \{(i,j)\}} \text{sign}(L_{var}^{n-1}(e)) \right] \text{min*}(\{|L_{var}^{n-1}(e)| | e \in E_c(j) \setminus \{(i,j)\}\})$$

The min*− operation also has a useful relationship as shown below:

$$\text{min*}(x_1, \ldots, x_{N-1}) = \text{min*−}(\text{min*+}(x_1, \ldots, x_N), x_N)$$

Therefore, the min* operation may be performed by performing both the min*− and min*+ operations.

When applying this property to check node processing functional block supported within an LLR decoder, the following detailed implementation may be performed for every given check node $c_i$. The calculation of two separate variables A and S is performed when calculating the extrinsic information of a check node.

$$\text{Compute } A = \text{min*}(\{|L_{var}^{n-1}(e)| | e \in E_c(j)\})$$

—this is performed using min* processing as described above; and $$\text{Compute } S = \prod_{e \in E_c(j)} \text{sign}(L_{var}^{n-1}(e)).$$

Alternatively, A may be computed using max* processing without departing from the scope and spirit of the invention. These two values of A and S are passed to the next functional block for calculation of the extrinsic (EXT) information of the check node. In doing so, min*−processing (or max*−processing when max*+ processing has been used to compute A) is performed using the value of A and the variable node extrinsic (EXT) information value. For example, for (i,j), starting from node $c_i$:

$$\text{Compute } L_{check}^n(i,j) = [S \cdot \text{sign}(L_{var}^{n-1}(i,j))] \text{min*−}(A, |L_{var}^{n-1}(i,j)|)$$

This min*− operation (or alternatively max*− operation) may be implemented in a number of ways. For example, several min*− or max*− functional blocks may be implemented to support simultaneous calculation of all of these values for all of the edges (as in a parallel implementation that includes multiple min*− or max*− functional blocks). Alternatively, a single min*– or max*– functional block may be implemented that sequentially calculates all of these values for all of the edges (as in a serial implementation that includes a single min*– or max*– functional block).

Without considering calculation of the product sign functions, this approach provides for a very large reduction in computational operations; this approach only needs $2|E_c(j)|-1$ computational operations.

We may look at one specific embodiment in order to see the computational requirements to support this min* (min*+ and min*–) check node processing functionality. In doing so, we consider decoding a regular (4,72) LDPC code. For every check point $c_i$, only 143 computational operations are needed to perform the decoding as compared to the 5040 computational operations are needed to perform the decoding in the straightforward approach. These 143 computational operations include performing 71 computing operations when calculating A and 72 computing operations when calculating the extrinsic (EXT) information of the check node. Again, while a regular LDPC code is used here for illustration, it is also noted that the invention is also operable to accommodate irregular LDPC codes as well.

When considering several of the various decoding approaches provided above that may be used to process LDPC coded signal to make best estimates of the information bits contained therein, it is oftentimes necessary to determine the maximum or minimum value from among a number of values. Many of these calculations may be performed in the log domain using min* processing or max* processing. For example, when performing the iterative decoding processing of updating edge messages with respect to check nodes and updating edge messages with respect to bit nodes, and the subsequent extracting of soft information corresponding to the most recently updated edge messages with respect to bit nodes, it is again oftentimes necessary to determine the maximum or minimum value from among a number of values. Clearly, such determination is also sometimes necessary when performing MAP decoding as described in more detail above when decoding turbo coded or TTCM coded signals. Many of the calculations employed when decoding these coded signals (of whichever coding type) are implemented in the log domain where multiplications can be replaced with additions and where divisions may be replaced with subtractions. When operating in the log domain, to maintain a high degree of accuracy, the min operation and the max operation are implemented using min* processing and max* processing. The calculation of the appropriate log correction factor presents a difficulty in the prior art approaches to perform such calculations in hardware.

In view of this need to perform such calculations, several embodiments are presented below by which such min* and max* calculations may be performed in a relatively much faster manner that within prior art approaches. The simultaneous and parallel calculation of many values is performed such that virtually no latency in introduced when compared to calculating only a min or max value. That is to say, the calculation of the appropriate log correction factor is performed in parallel to the calculations that are used to determine the difference between two inputs values (which is then used to determine the max or min value from among the two input values).

Figure 80:
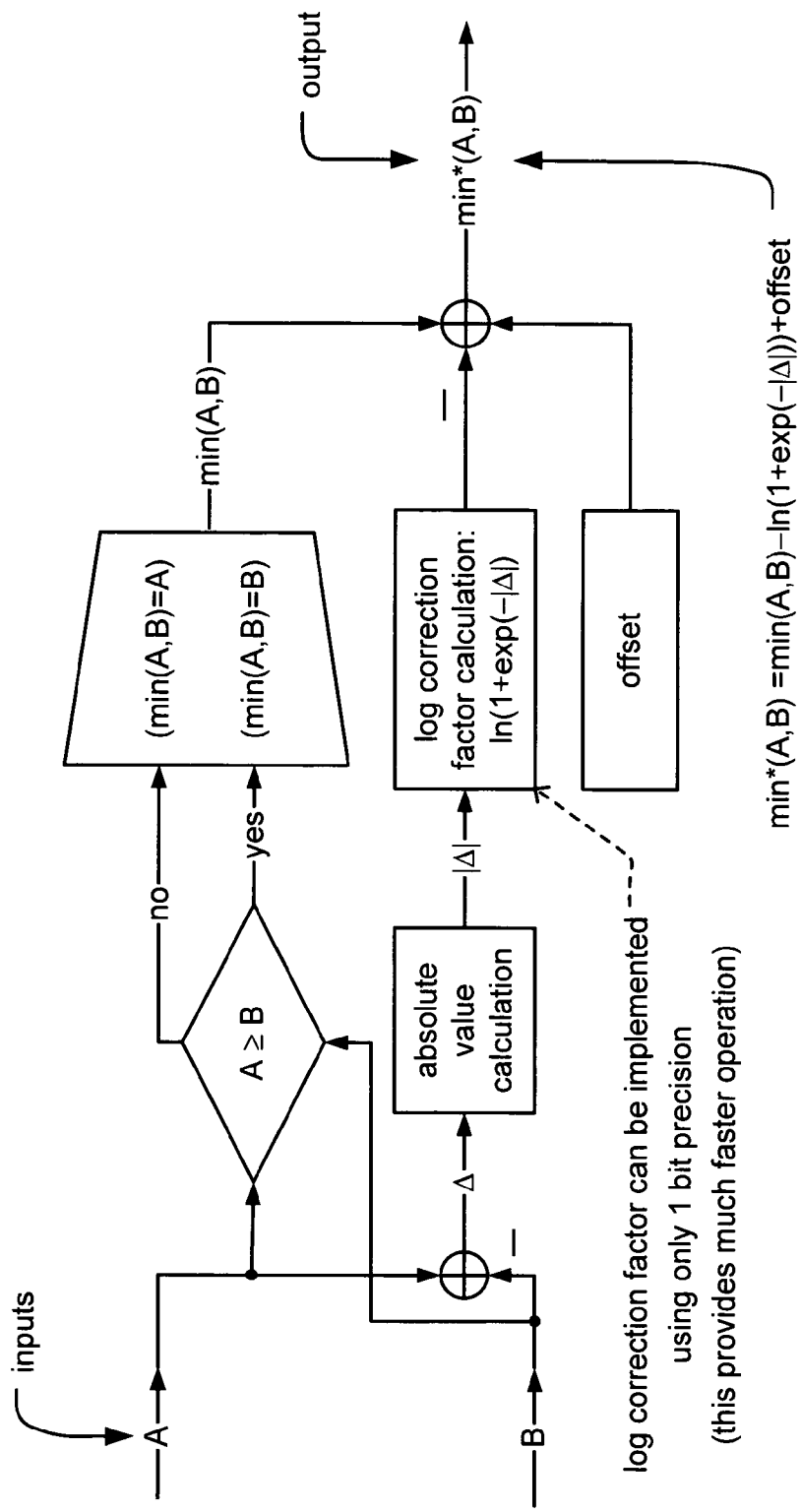
FIG. 80 is a diagram illustrating an embodiment of processing of a min* circuit (or min* processing functional block) that performs the operation of a min* operator in accordance with certain aspects of the invention.

FIG. 80 is a diagram illustrating an embodiment of processing of a min* circuit (or min* processing functional block) that performs the operation of a min* operator in accordance with certain aspects of the invention. This diagram shows the various components that are employed when performing min* processing. The operation is shown as operating on two inputs A and B values.

A minimum value (or min value) is determined from among these two A and B. For example, is $A \geq B$. then the min value from among the inputs is selected as being B. Alternatively, the min value from among the inputs is selected as being A. This minimum value is output as being indicated as $\min(A,B)$.

These two input values, A and B, such that a difference, $\Delta$, between the two values is determined. The absolute value of this difference, $\Delta$, is determined. Using the absolute value of difference, $|\Delta|$, a log correction factor is calculated, $\ln(1+\exp(-|\Delta|))$.

This log correction factor, $\ln(1+\exp(-|\Delta|))$, is subtracted to the minimum value whose output is indicated as $\min(A,B)$.

$$\min^*(A,B)=\min(A,B)-\ln(1+\exp(-|\Delta|)).$$

If desired, a constant valued offset may be employed to bias the min* processing result in a particular direction. For example, an offset may be added to the min* processing result as follows:

$$\min^*(A,B)=\min(A,B)-\ln(1+\exp(-|\Delta|))+\text{offset}.$$

Moreover, the log correction factor, $\ln(1+\exp(-|\Delta|))$, that is employed may be implemented using only a single bit of precision when implementing this min* processing in hardware. This provides for a much faster operation that using multiple bits of precision. It is also noted that, even with a single bit of precision for the log correction, a significant improvement in performance can be achieved over prior art approaches that use only a min calculation (or min processing).

Figure 81:
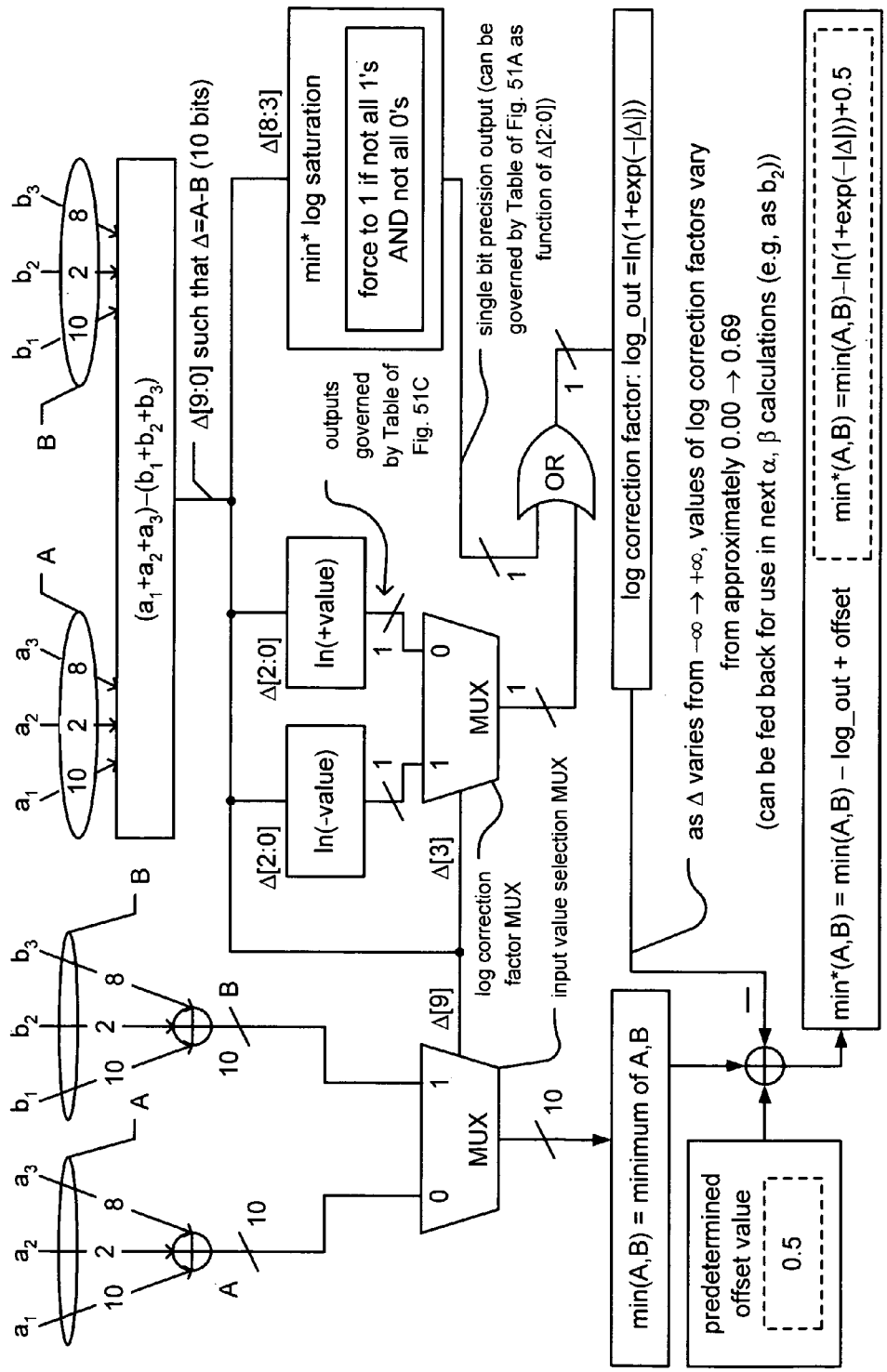
FIG. 81 is a diagram illustrating an embodiment of a min* circuit (or min* processing functional block) that performs the operation of a min* operator in accordance with certain aspects of the invention (in an alternative representation of the FIG. 51).

FIG. 81 is a diagram illustrating an embodiment of a min* circuit (or min* processing functional block) that performs the operation of a min* operator in accordance with certain aspects of the invention (in an alternative representation of the FIG. 51). This diagram also may be viewed as being a more detailed depiction and an actual way in which the min* processing of the preceding diagram may be performed. The min* processing is shown as operating on two separate groups of numbers. For example, a first input value A is actually representative of a group of numbers including, $a_1$, $a_2$, and $a_3$. Similarly, a second input value B is actually representative of a group of numbers including, $b_1$, $b_2$, and $b_3$. These individual components of the first input value, A, and the second input value, B, are subtracted from one another.

$A=a_1+a_2+a_3$, and $B=b_1+b_2+b_3$. The use of 10 bit precision is shown in this embodiment for the resultant values of the first input value, A, and the second input value, B. The resultant values of the first input value, A, and the second input value, B, are provided to a first MUX (which may be referred to as an input value selection MUX) whose selection is provided by the MSB (Most Significant Bit) of the difference ($\Delta[9:0]$) between the first input value, A, and the second input value, B., is depicted simply as $\Delta[9]$. This difference, $\Delta$, may be viewed as being calculated using a subtraction block. This MSB of the difference, $\Delta$, between the first input value, A, and the second input value, B, is the sign bit of the difference between the two input values. Depending on whether the sign bit is positive or negative indicates which of the first input value, A, and the second input value, B, is larger or smaller.

However, before this sign bit of the difference between the two input values is available, $\Delta[9]$, a number of other calculations are being performed simultaneously and in parallel. For example, the initial calculation of the LSBs (Least Significant Bits) of the difference between the two input values is being made. These LSBs are depicted as $\Delta[2:0]$ and are the first 3 bits available of the entire 10 bit precision of the difference (Δ[9:0]) between the two input values, A and B.

Once these first 3 bits of the difference are available, Δ[2:0], these values are provided to two separate functional blocks that determine a positive log correction factor and a negative log correction factor, respectively. The positive log correction factor is ln(1+exp(−|A−B|)) or ln(+value), and the negative log correction factor is ln(1+exp(−|B−A|)) or ln(−value). These two log correction factors may also be viewed as being a first log correction factor and a second log correction factor. The determination of the first log correction factor and the second log correction factor may be determined using predetermined values looked-up from a LUT in some embodiments. Moreover, a single bit of precision may also be used for the possible values of the first log correction factor and the second log correction factor within such a LUT. Regardless of the manner in which the first log correction factor and the second log correction factor are determined (e.g., either by actual calculation using the first 3 bits of the difference, Δ[2:0], or by using these 3 bits to select particular values from among possible predetermined values within a LUT, these determined values for the first log correction factor and the second log correction factor are provided to a second MUX (which may be referred to a log correction factor MUX).

During this time in which the determination of the first log correction factor and the second log correction factor are being made, the calculation of the difference (Δ) between the first input value, A, and the second input value, B, continues to be made. For example, several of the remaining bits of precision of the difference (Δ) continue to be made and are provided to a min* log saturation block. This min* log saturation block uses the next 6 bits of precision of the difference, namely Δ[8:3], to force the appropriate value of the log correction factor. If all of the bits of these 6 bits of the difference, Δ[8:3], are not all 1's or not all 0's, then the min* log saturation block forces an output there from of a value of 1.

Also, the MSB of these next 6 bits, namely Δ[3], is also used to perform the selection of either the first log correction factor or the second log correction factor that are provided to the log correction factor MUX. The selected log correction factor (being either the first log correction factor or the second log correction factor) and the output from the min* log saturation block are provided to a logic OR gate where the final and actual log correction factor, ln(1+exp(−|Δ|)), is actually determined.

It is noted that the final and actual log correction factor, ln(1+exp(−|Δ|)), and the minimum value of A or B are available at substantially the same time from the min* circuit of this diagram. If desired, these two values (min(A,B) and ln(1+exp(−|Δ|))) may be kept separate in an actual hardware implementation. However, they may also be combined, along with a predetermined offset value, to generate the final min* resultant. For example, the final log correction factor, ln(1+exp(−|Δ|)), may be subtracted from the minimum value of A,B. This resultant may also by summed with a predetermined offset value to generate a final min* resultant employed within the calculations of an actual hardware device that performs decoding of coded signals. In some embodiments, the predetermined offset value has a value of 0.5. In such instances, the final min* resultant would appear as follows:

$$\mathrm{min}^*(A,B)=\mathrm{min}(A,B)-\ln(1+\exp(-|\Delta|))+0.5$$

It is also noted that single bit precision may be employed for many of the intermediate values used within this embodiment to arrive at the final min* resultant. This significantly increases the operation of the min* processing. Moreover, LUTs may also be used to determine many of these intermediate values as well in an effort to achieve even faster operation. For example, the tables of FIG. 51A, FIG. 51B, and/or FIG. 51C may be used to determine the outputs of the min* log saturation block and the two separate functional blocks that determine the positive log correction factor (ln(1+exp(−|A−B|)) or ln(+value)) and the log correction factor (ln(1+exp(−|B−A|)) or ln(−value)), respectively. By using predetermined values (that are stored in LUTs) for each of these intermediate values, the min* circuit presented herein can operate very, very quickly. This very fast operation is supported, at least in part, by the use of single bit precision for the log correction factor. Moreover, the simultaneous and in parallel determination of many of the intermediate values also operate, at least in part, to support this very fast operation of min* processing.

Many of the principles that provide for very fast min* processing may also be applied, after appropriate modification (where necessary), to support very fast max* processing as well. Several embodiments of performing max* processing are also provided below.

Figure 82:
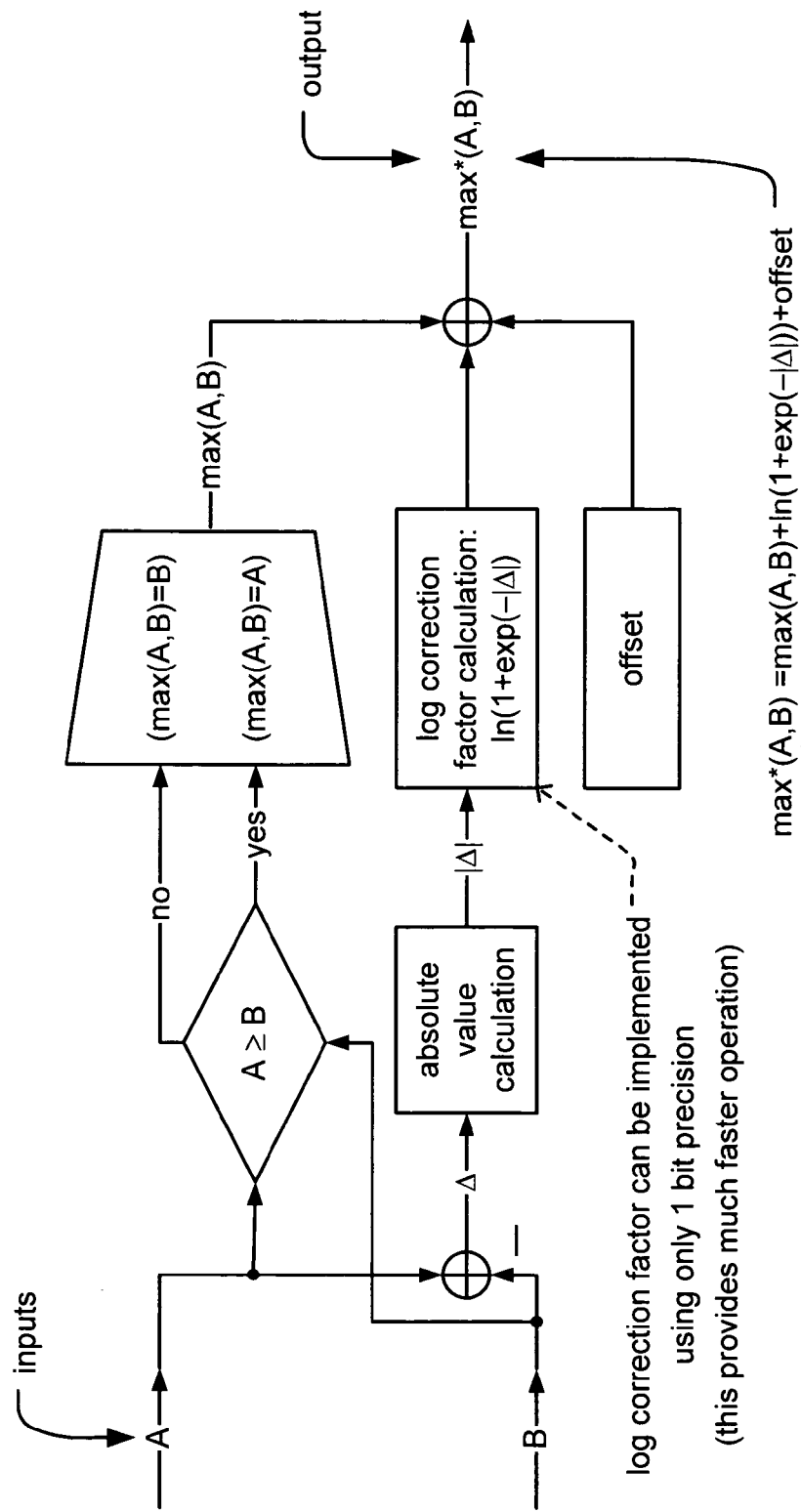
FIG. 82 is a diagram illustrating an embodiment of processing of a max* circuit (or max* processing functional block) that performs the operation of a max* operator in accordance with certain aspects of the invention.

FIG. 82 is a diagram illustrating an embodiment of processing of a max* circuit (or max* processing functional block) that performs the operation of a max* operator in accordance with certain aspects of the invention. This diagram shows the various components that are employed when performing max* processing. The operation is shown as operating on two inputs A and B.

A maximum value (or max value) is determined from among these two A and B values. For example, is A≧B, then the max value from among the inputs is selected as being A. Alternatively, the max value from among the inputs is selected as being B. This maximum value is output as being indicated as max(A,B).

These two input values, A and B, such that a difference, Δ, between the two values is determined. The absolute value of this difference, Δ, is determined. Using the absolute value of difference, |Δ|, a log correction factor is calculated, ln(1+exp(−|Δ|)).

This log correction factor, ln(1+exp(−|Δ|)), is added to the maximum value whose output is indicated as max(A,B).

$$\mathrm{max}^*(A,B)=\mathrm{max}(A,B)+\ln(1+\exp(-|\Delta|)).$$

If desired, a constant valued offset may be employed to bias the max* processing result in a particular direction. For example, an offset may be added to the max* processing result as follows:

$$\mathrm{max}^*(A,B)=\mathrm{max}(A,B)+\ln(1+\exp(-|\Delta|))+\mathrm{offset}.$$

Moreover, the log correction factor, ln(1+exp(−|Δ|)), that is employed may be implemented using only a single bit of precision when implementing this max* processing in hardware. This provides for a much faster operation that using multiple bits of precision. It is also noted that, even with a single bit of precision for the log correction, a significant improvement in performance can be achieved over prior art approaches that use only a max calculation (or max processing).

Figure 83:
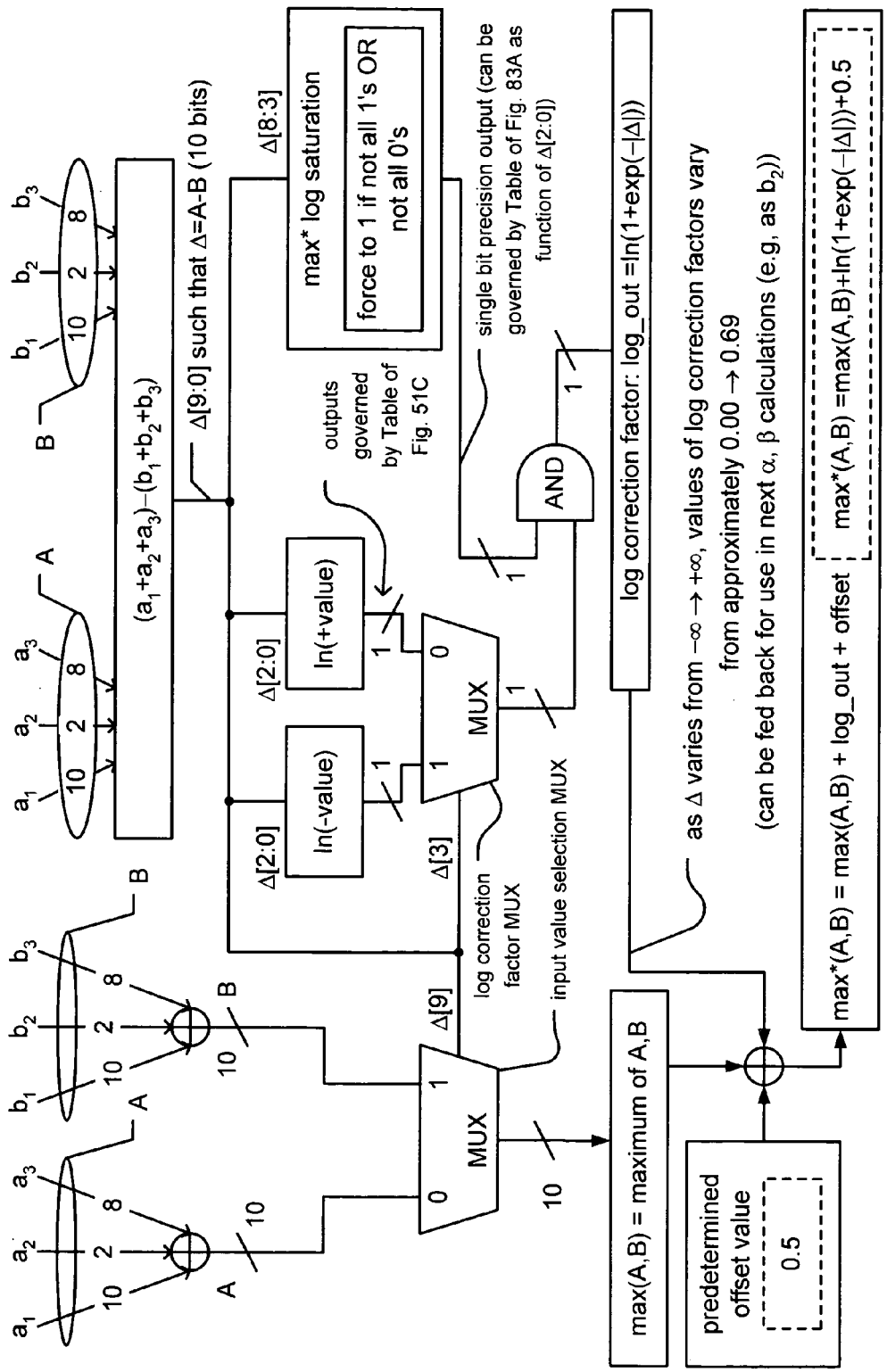
FIG. 83 is a diagram illustrating an embodiment of a max* circuit (or max* processing functional block) that performs the operation of a max* operator in accordance with certain aspects of the invention.

FIG. 83 is a diagram illustrating an embodiment of a max* circuit (or max* processing functional block) that performs the operation of a max* operator in accordance with certain aspects of the invention. This diagram also may be viewed as being a more detailed depiction and an actual way in which the max* processing of the preceding diagram may be performed. The max* processing is shown as operating on two separate groups of numbers. For example, a first input value A is actually representative of a group of numbers including, $a_1$, $a_2$, and $a_3$. Similarly, a second input value B is actually representative of a group of numbers including, $b_1$, $b_2$, and $b_3$. These individual components of the first input value, A, and the second input value, B, are subtracted from one another.

$A=a_1+a_2+a_3$, and $B=b_1+b_2+b_3$. The use of 10 bit precision is shown in this embodiment for the resultant values of the first input value, $\Delta$, and the second input value, B. The resultant values of the first input value, $\Delta$, and the second input value, B, are provided to a first MUX (which may be referred to as an input value selection MUX) whose selection is provided by the MSB (Most Significant Bit) of the difference ($\Delta[9:0]$) between the first input value, A, and the second input value, B., is depicted simply as $\Delta[9]$. This difference, $\Delta$, may be viewed as being calculated using a subtraction block. This MSB of the difference, $\Delta$, between the first input value, A, and the second input value, B, is the sign bit of the difference between the two input values. Depending on whether the sign bit is positive or negative indicates which of the first input value, $\Delta$, and the second input value, B, is larger or smaller.

However, before this sign bit of the difference between the two input values is available, $\Delta[9]$, a number of other calculations are being performed simultaneously and in parallel. For example, the initial calculation of the LSBs (Least Significant Bits) of the difference between the two input values is being made. These LSBs are depicted as $\Delta[2:0]$ and are the first 3 bits available of the entire 10 bit precision of the difference ($\Delta[9:0]$) between the two input values, A and B.

Once these first 3 bits of the difference are available, $\Delta[2:0]$, these values are provided to two separate functional blocks that determine a positive log correction factor and a negative log correction factor, respectively. The positive log correction factor is $\ln(1+\exp(-|A-B|))$ or $\ln(+value)$, and the negative log correction factor is $\ln(1+\exp(-|B-A|))$ or $\ln(-value)$. These two log correction factors may also be viewed as being a first log correction factor and a second log correction factor. The determination of the first log correction factor and the second log correction factor may be determined using predetermined values looked-up from a LUT in some embodiments. Moreover, a single bit of precision may also be used for the possible values of the first log correction factor and the second log correction factor within such a LUT. Regardless of the manner in which the first log correction factor and the second log correction factor are determined (e.g., either by actual calculation using the first 3 bits of the difference, $\Delta[2:0]$, or by using these 3 bits to select particular values from among possible predetermined values within a LUT, these determined values for the first log correction factor and the second log correction factor are provided to a second MUX (which may be referred to a log correction factor MUX).

During this time in which the determination of the first log correction factor and the second log correction factor are being made, the calculation of the difference ($\Delta$) between the first input value, A, and the second input value, B, continues to be made. For example, several of the remaining bits of precision of the difference ($\Delta$) continue to be made and are provided to a max* log saturation block. This max* log saturation block uses the next 6 bits of precision of the difference, namely $\Delta[8:3]$, to force the appropriate value of the log correction factor. If all of the bits of these 6 bits of the difference, $\Delta[8:3]$, are not all 1's or not all 0's, then the max* log saturation block forces an output there from of a value of 1.

Also, the MSB of these next 6 bits, namely $\Delta[3]$, is also used to perform the selection of either the first log correction factor or the second log correction factor that are provided to the log correction factor MUX. The selected log correction factor (being either the first log correction factor or the second log correction factor) and the output from the max* log saturation block are provided to a logic AND gate where the final and actual log correction factor, $\ln(1+\exp(-|\Delta|))$, is actually determined.

It is noted that the final and actual log correction factor, $\ln(1+\exp(-|\Delta|))$, and the maximum value of A or B are available at substantially the same time from the max* circuit of this diagram. If desired, these two values (max(A,B) and $\ln(1+\exp(-|\Delta|))$) may be kept separate in an actual hardware implementation. However, they may also be combined, along with a predetermined offset value, to generate the final max* resultant. For example, the final log correction factor, $\ln(1+\exp(-|\Delta|))$, may be added to the maximum value of A,B. This resultant may also by summed with a predetermined offset value to generate a final max* resultant employed within the calculations of an actual hardware device that performs decoding of coded signals. In some embodiments, the predetermined offset value has a value of 0.5. In such instances, the final max* resultant would appear as follows:

$$\max{}^*(A,B)=\max(A,B)+\ln(1+\exp(-|\Delta|))+0.5$$

It is also noted that single bit precision may be employed for many of the intermediate values used within this embodiment to arrive at the final max* resultant. This significantly increases the operation of the max* processing. Moreover, LUTs may also be used to determine many of these intermediate values as well in an effort to achieve even faster operation. For example, the tables that are presented later within the FIG. 83A and the FIG. 83B may be used to determine the outputs of the max* log saturation block and the two separate functional blocks that determine the positive log correction factor ($\ln(1+\exp(-|A-B|))$ or $\ln(+value)$) and the negative log correction factor ($\ln(1+\exp(-|B-A|))$ or $\ln(-value)$), respectively. In addition, the FIG. 51C (being a simplified version of FIG. 51A) may also employed within this particular embodiment of a max* circuit to assist in the operation of the max* log saturation block.

By using predetermined values (that are stored in LUTs) for each of these intermediate values, the max* circuit presented herein can operate very, very quickly. This very fast operation is supported, at least in part, by the use of single bit precision for the log correction factor. Moreover, the simultaneous and in parallel determination of many of the intermediate values also operate, at least in part, to support this very fast operation of max* processing.

FIG. 83A is a diagram illustrating an embodiment of an alpha/beta ($\alpha/\beta$) max* table that may be employed by the max* log saturation block of FIG. 83 in accordance with certain aspects of the invention. This table that is used for max* processing is identical to the table within the FIG. 51A for min* processing. This diagram shows how the value of the difference between the two input values of A and B need only be known to the 3 LSBs to determine the output value for the max* log saturation block; this portion of the difference ($\Delta$) is depicted as $\Delta[2:0]$.

The max* circuit of FIG. 83 includes two separate functional blocks that determine the positive log correction factor ($\ln(1+\exp(-|A-B|))$ or $\ln(+value)$) and the negative log correction factor $\ln(1+\exp(-|B-A|))$ or $\ln(-value)$, respectively. The outputs of these two separate functional blocks block represent the simultaneously available negative log correction factor ($\ln(-value)$) and positive log correction factor ($\ln(-value)$), respectively. These two log correction factors are determined simultaneously and in parallel.

As mentioned above, the final and actual log correction factor, $\ln(1+\exp(-|\Delta|))$, is actually determined using the log correction factor MUX and the AND gate within the FIG. 83.

The output of the max* log saturation block is a 1 if all of the inputs are not equal to logical zero and all inputs are not equal to logical one.

The selection of the log correction factor MUX is controlled by the MSB of the Δ[8:3] bits, namely, Δ[3]. Any improper selection by this log correction factor MUX of the positive log correction factor or the negative log correction factor is corrected by the operation of the max* log saturation block. As also described in more detail above with respect to min* processing, the use of the more detailed table of the FIG. 51C may also be employed to describe the operation of how the max* log saturation block operates to ensure that the appropriate and proper value of the log correction factor is made.

FIG. 83B is a diagram illustrating an embodiment of an alpha/beta (α/β) max* table that may be employed by the ln(−value) and ln(+value) functional blocks of FIG. 83 in accordance with certain aspects of the invention. This table shows how a log correction factor having only a single bit of precision (in the context of finite precision mathematics implemented using digital signal processing) may be employed. For example, when the calculated value of Δ[2:0] (having a 3 bit word width) is determined, then a predetermined value for each of the log correction factors (ln(−value)) and (ln(+value)) may be immediately selected. This approach provides for extremely fast processing. In addition, the use of this single bit precision provides for virtually no degradation is operational speed of these calculations employed when decoding coded signals. The use of this single bit of precision also provides for very improved performance. This table that is used for max* processing is analogous (though the individual bit values are different) than the table of the FIG. 51B that is used for min* processing.

FIG. 84A is a diagram illustrating an embodiment of log correction factor (e.g., ln(−value) and ln(+value)) behavior in accordance with certain aspects of the invention. This diagram shows how the behavior of the two separate log correction factors, ln(−value) and ln(+value), vary as a function of Δ=A−B. The values of the positive log correction factor (ln(1+exp(−|A−B|) or ln(+value) and the negative log correction factor (ln(1+exp(−|B−A|) or ln(−value) are plotted in this two-dimensional diagram as a function of Δ=A−B. There is actually only a certain region in which the values of the positive log correction factor and the values of the negative log correction factor actually vary. For example, as the difference between the two input values, namely Δ, becomes very large (or very small), the two separate log correction factors saturate to predetermined values. For example, as Δ varies between −∞ and +∞, then the values of the positive log correction factor and the negative log correction factor vary between approximately 0.00 and 0.69.

Within the region in which the log correction values are not saturated as a function of Δ, the determination of the values of the positive log correction factor and the negative log correction factor are made using the two separate functional blocks within the FIG. 83 that output the positive log correction factor (ln(1+exp(−|A−B|) or ln(+value)) and the negative log correction factor (ln(1+exp(−|B−A|) or ln(−value)) based on the 3 LSBs of Δ, namely, Δ[2:0]. The appropriate log table is employed to determine the values of the positive log correction factor and the negative log correction factor within the center portion of interest. The max* log saturation block (or min* log saturation block) controls the determination of the actual and final log correction factor in the regions in which the positive log correction factor and the negative log correction factor have saturated.

FIG. 84B is a diagram illustrating an embodiment of the individual bit contributions of Δ as governing the log correction factors, ln(−value) and ln(+value), respectively, and the max* or min* log saturation circuits in accordance with certain aspects of the invention. This diagram breaks down the individual bit values of the difference, Δ, when implemented using 10 bit precision. As can be seen pictorially, the LSBs, Δ[2:0], govern the determination of the positive log correction factor (ln(1+exp(−|A−B|) or ln(+value)) and the negative log correction factor (ln(1+exp(−|B−A|) or ln(−value)). The next LSBs, Δ[8:3], govern the operation of the max* log saturation block (or min* log saturation block) and the sign bit of the difference, Δ[9], select which of the input values is the maximum value (or the minimum). Also, the MSB of these next LSBs, Δ[3], is used to select which of the positive log correction factor (ln(1+exp(−|A−B|) or ln(+value)) and the negative log correction factor (ln(1+exp(−|B−A|) or ln(−value)) is selected from the log correction value MUX within either of a min* circuit (or a max* circuit).

Figure 85:
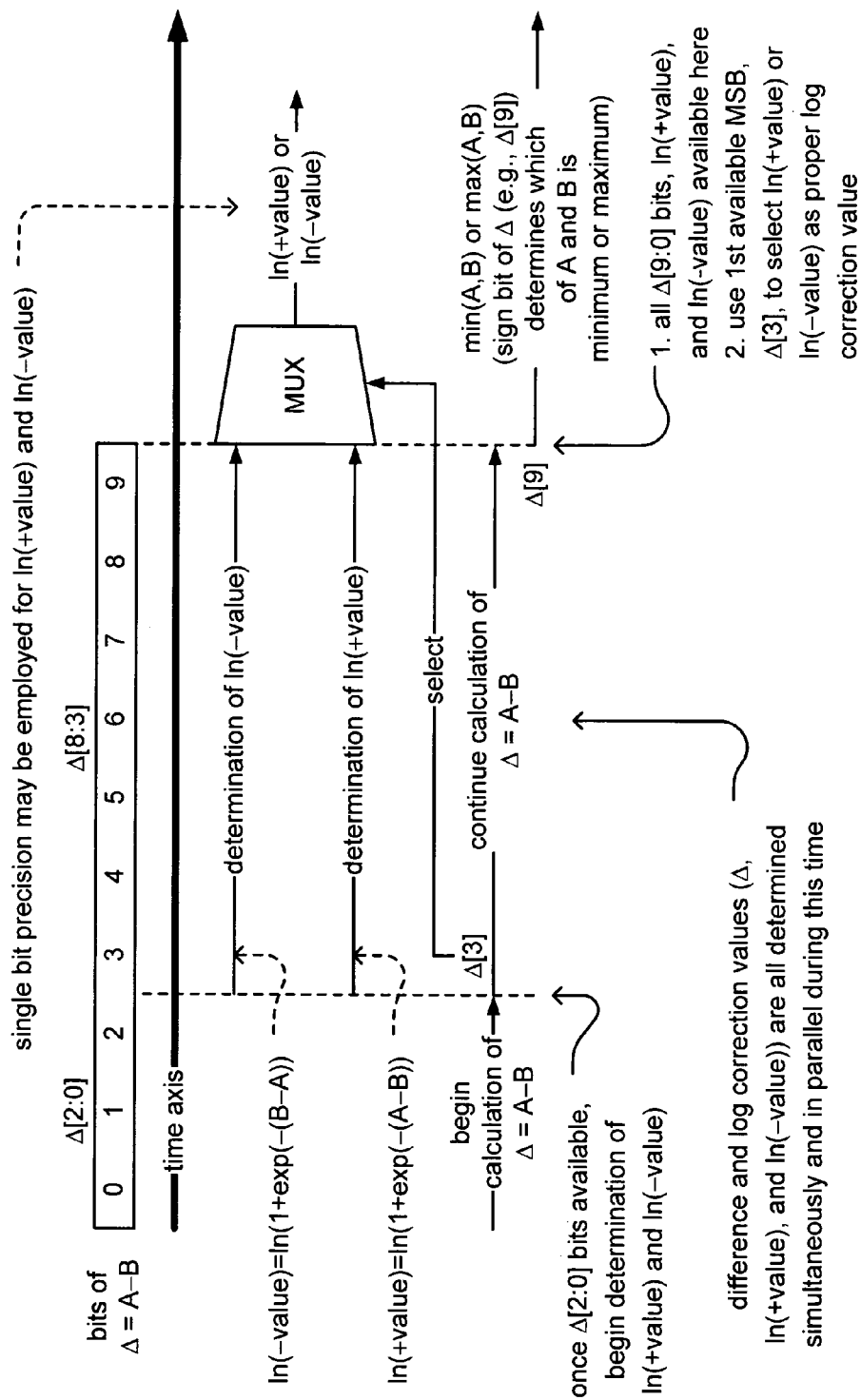
FIG. 85 is a diagram illustrating a timing diagram embodiment of calculating $\Delta = A - B$, the log correction factors (e.g., ln(−value) and ln(+value)) that may be employed for min* or max* circuits in accordance with certain aspects of the invention.

FIG. 85 is a diagram illustrating a timing diagram embodiment of calculating Δ=A−B, the log correction factors (e.g., ln(−value) and ln(+value)) that may be employed for min* or max* circuits in accordance with certain aspects of the invention. This timing diagram shows when the various intermediate values are determined within min* circuits or max* circuits.

Initially, the LSBs of the difference, Δ, is calculated. When the first 3 LSBs of the difference, Δ[2:0], are available, then the positive log correction value, ln(+value), and the negative log correction value, ln(+value), are determined simultaneously and in parallel. Also, when the first 3 LSBs of the difference, Δ[2:0], then the remaining bits of the difference, Δ, continue to be calculated. During this time period, 3 separate values are all being calculated simultaneously and parallel within the min* processing or max* processing. Specifically, the intermediate bits of the difference, Δ[8:3], continues to be calculated and the positive log correction value, ln(+value), and the negative log correction value, ln(+value), are all determined simultaneously and in parallel with one another. It is noted that the determination of the.

When the MSB of the difference, Δ[9], is available (e.g., when the totality of all of the bits of the difference, D, have been determined), then this MSB is used to select which of the input value (A or B) is the maximum value (within max* processing) or the minimum value (within min* processing).

Figure 86:
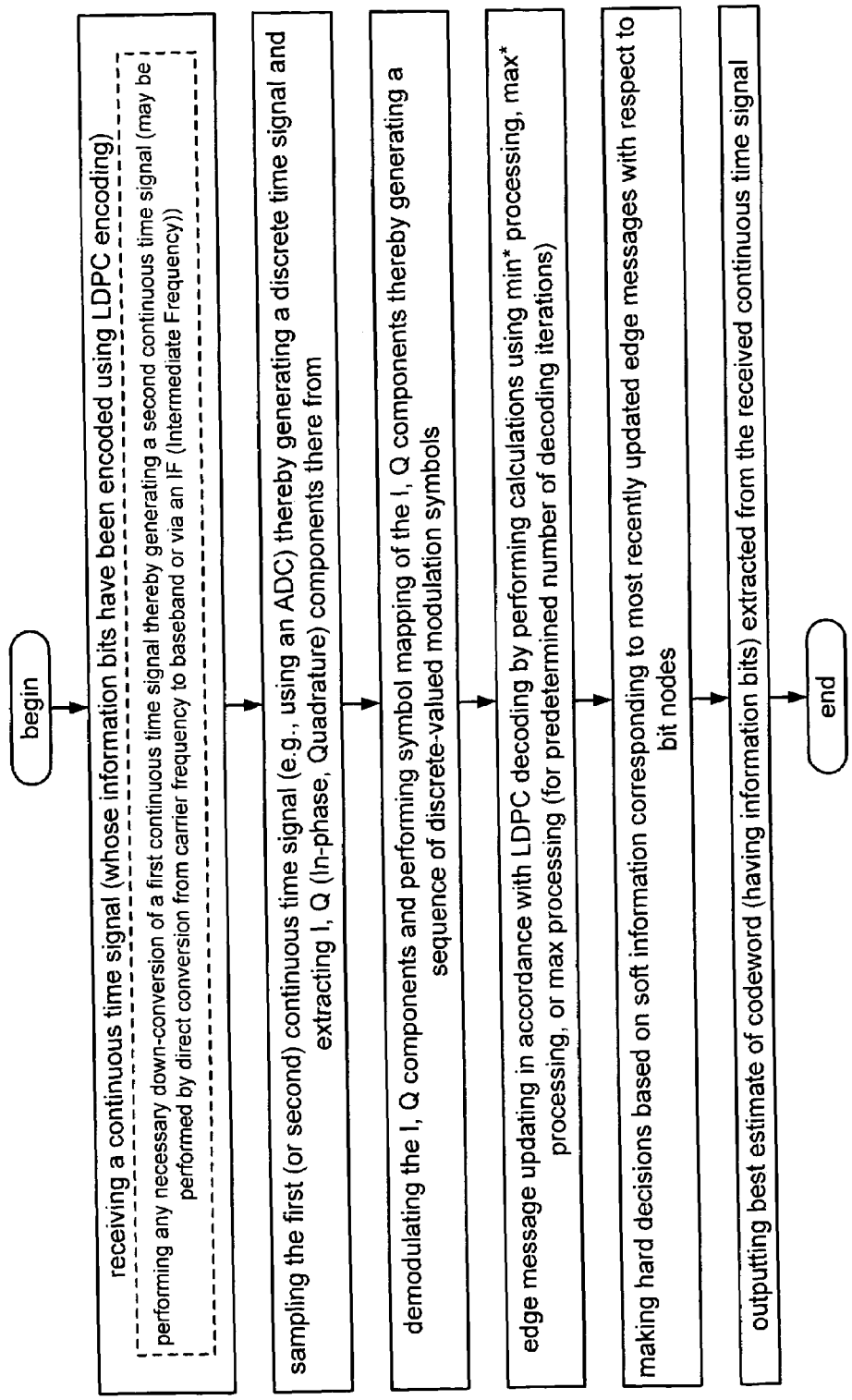
FIG. 86 is a flowchart illustrating an embodiment of a method for decoding LDPC coded signals by employing min* processing, max* processing, or max processing in accordance with certain aspects of the invention.

FIG. 86 is a flowchart illustrating an embodiment of a method for decoding LDPC coded signals by employing min* processing, max* processing, or max processing in accordance with certain aspects of the invention. This method involves receiving a continuous time signal (whose information bits have been encoded using LDPC encoding). This may also involve performing any necessary down-conversion of a first continuous time signal thereby generating a second continuous time signal (may be performed by direct conversion from carrier frequency to baseband or via an IF (Intermediate Frequency)). That is to say, the originally received continuous time signal may need to undergo certain down-converting and filtering to get it into a baseband signal format.

The method then involves sampling the first (or second) continuous time signal (e.g., using an ADC (Analog to Digital Converter)) thereby generating a discrete time signal and extracting I, Q (In-phase, Quadrature) components there from. After this, the method then involves demodulating the I, Q components and performing symbol mapping of the I, Q components thereby generating a sequence of discrete-valued modulation symbols.

The method then involves performing iterative decoding processing according to a preferred LDPC decoding approach. The method then involves performing edge message updating in accordance with LDPC decoding by performing calculations using min* processing, max* processing, or max processing (for a predetermined number of decoding iterations).

The method then involves making hard decisions based on soft information corresponding to the most recently updated edge messages with respect to bit nodes. Ultimately, the method involves outputting a best estimate of a codeword (having information bits) that has been extracted from the received continuous time signal.

Figure 87:
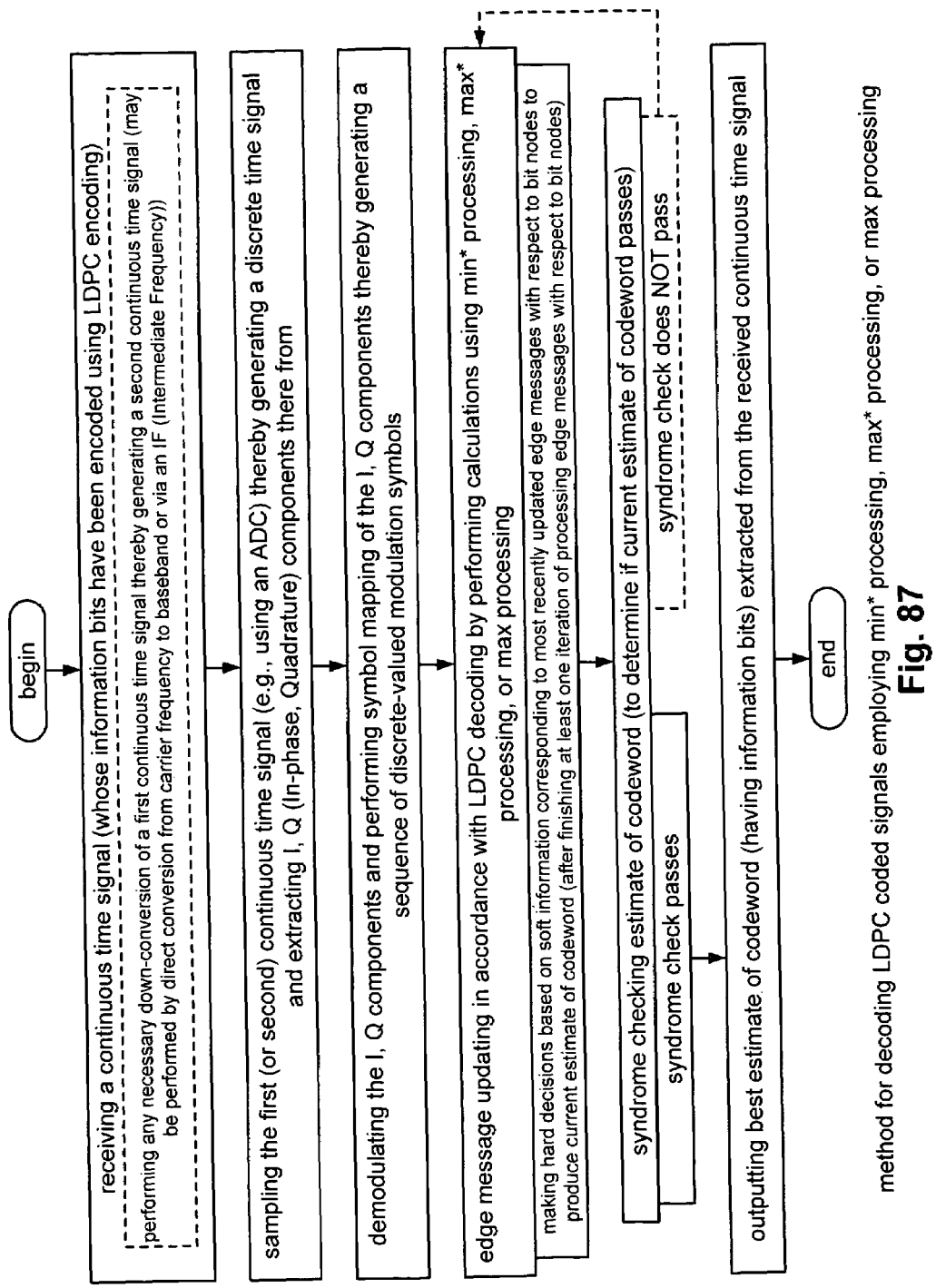
FIG. 87 is a flowchart illustrating an embodiment of an alternative method for decoding LDPC coded signals by employing min* processing, max* processing, or max processing in accordance with certain aspects of the invention.

FIG. 87 is a flowchart illustrating an embodiment of an alternative method for decoding LDPC coded signals by employing min* processing, max* processing, or max processing in accordance with certain aspects of the invention. Initially, this method operates similarly to the embodiment described in the preceding diagram.

For example, this method involves receiving a continuous time signal (whose information bits have been encoded using LDPC encoding). This may also involve performing any necessary down-conversion of a first continuous time signal thereby generating a second continuous time signal (may be performed by direct conversion from carrier frequency to baseband or via an IF (Intermediate Frequency)). That is to say, the originally received continuous time signal may need to undergo certain down-converting and filtering to get it into a baseband signal format.

The method then involves sampling the first (or second) continuous time signal (e.g., using an ADC (Analog to Digital Converter)) thereby generating a discrete time signal and extracting I, Q (In-phase, Quadrature) components there from. After this, the method then involves demodulating the I, Q components and performing symbol mapping of the I, Q components thereby generating a sequence of discrete-valued modulation symbols.

The method then involves performing iterative decoding processing according to a preferred LDPC decoding approach. The method then involves performing edge message updating in accordance with LDPC decoding by performing calculations using min* processing, max* processing, or max processing (for a predetermined number of decoding iterations).

However, the iterative decoding processing is handled differently in this embodiment than in the embodiment of the preceding diagram. During each iterative decoding iteration, the method of this embodiment involves making hard decisions based on soft information corresponding to most recently updated edge messages with respect to bit nodes to produce current estimate of codeword. This making of hard decisions during each iterative decoding iteration is performed only after finishing at least one iterative decoding iteration of processing edge messages with respect to bit nodes. That is to say, at least one updating of the edge messages with respect to the bit nodes need to be available to make hard decisions based on the corresponding soft information. Also, during each iterative decoding iteration, the method involves performing syndrome checking of the current estimate of the codeword. This is performed to determine if the current estimate of the codeword passes the all of the syndromes within an acceptable degree of accuracy. If the syndrome check does NOT pass during this iterative decoding iteration, the method involves performing at least one additional iterative decoding iteration. However, if the syndrome check does pass during this iterative decoding iteration, the method involves outputting a best estimate of the codeword (having information bits) that has been extracted from the originally received continuous time signal.

Figure 88:
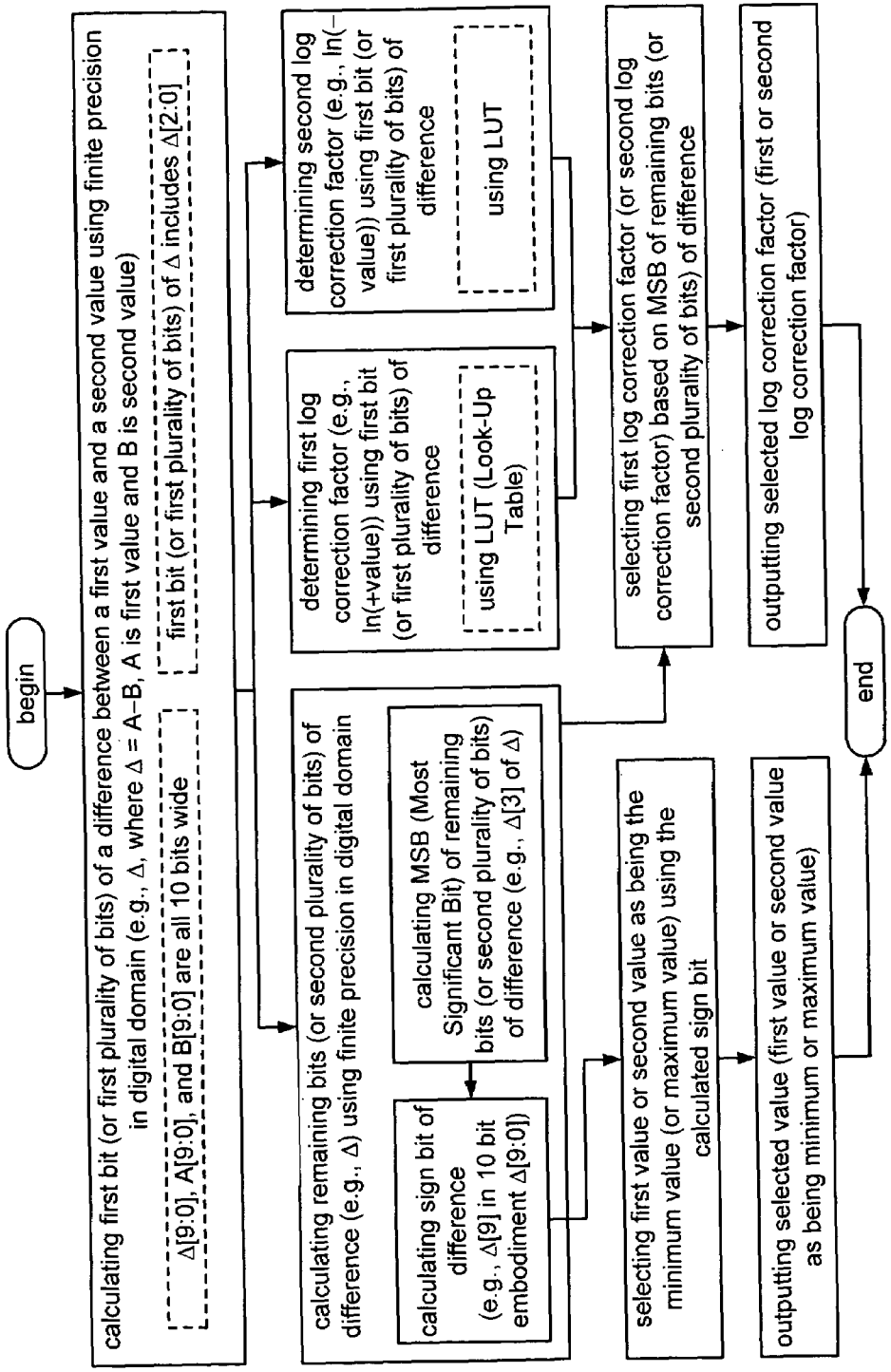
FIG. 88 is a flowchart illustrating an embodiment of alternative method for performing min* (or max*) processing in accordance with certain aspects of the invention.

FIG. 88 is a flowchart illustrating an embodiment of alternative method for performing min* (or max*) processing in accordance with certain aspects of the invention. The method involves calculating a first bit (or first plurality of bits) of a difference between a first value and a second value using finite precision in the digital domain (e.g., $\Delta$, where $\Delta$=A−B, A is first value and B is second value). This may alternatively be viewed as calculating a first bit or a first plurality of LSBs of the difference, $\Delta$. In some embodiments, all of these elements are 10 bits wide; for example, $\Delta[9:0]$, A[9:0], and B[9:0] are all 10 bits wide.

The method then performs multiple operations simultaneously and in parallel with one another. The method involves calculating the remaining bits (or a second plurality of bits) of difference (e.g., $\Delta$) using finite precision in the digital domain. This may be viewed as calculating a second plurality of LSBs of the difference, $\Delta$. This involves calculating a MSB (Most Significant Bit) of the remaining bits (or the second plurality of bits) of the difference (e.g., $\Delta[3]$ of $\Delta$). Moreover, this also involves calculating a sign bit of the difference (e.g., $\Delta[9]$ in 10 bit embodiment $\Delta[9:0]$).

Also, a second of the simultaneously and in parallel operations involves determining a first log correction factor (e.g., ln(+value)) using the first bit (or the first plurality of bits) of the difference, $\Delta$. This may involve using the LSBs of the of the difference (e.g., $\Delta[2:0]$ of $\Delta$) to perform this determination. This may be performed by selecting the first log correction factor from a LUT (Look-Up Table). In some embodiments, the first log correction factor is implemented using only a single bit degree of precision.

Also, a third of the simultaneously and in parallel operations involves determining second log correction factor (e.g., ln(−value)) using the first bit (or the first plurality of bits) of the difference, $\Delta$. This may also involve using the LSBs of the of the difference (e.g., $\Delta[2:0]$ of $\Delta$) to perform this determination as well.

The method then involves selecting either the first log correction factor or the second log correction factor based on the MSB of the remaining bits (or the second plurality of bits) of the difference, $\Delta$. For example, this may involve using the MSB of the remaining bits (or the second plurality of bits) of the difference (e.g., $\Delta[3]$ of $\Delta$). As appropriate, this may involve using a min* log saturation block (or a max* log saturation block) whose operation is governed by the remaining bits (or the second plurality of bits) of the difference (e.g., $\Delta[8:3]$ of $\Delta$). The method also involves selecting either the first value or the second value as being the minimum value (or maximum value) using the calculated sign bit.

The method then also involves outputting the selected log correction factor (either the first log correction factor or the second log correction factor). The method also involves outputting the selected value (either the first value or the second value) as being minimum (or maximum) value.

It is also noted that the methods described within the preceding FIGURES may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A min* (min star) circuit, the circuit comprising:
a subtraction block that is operable to calculate a difference between a first input value and a second input value;
a first log correction factor block that is operable to determine a first log correction factor based on a first plurality of LSBs (Least Significant Bits) of the difference;
a second log correction factor block that is operable to determine a second log correction factor based on the first plurality of LSBs of the difference;
a min* log saturation block whose output value is governed by a second plurality of LSBs of the difference;
a log correction factor MUX (Multiplexor) that is operable to receive the first log correction factor and the second log correction factor as inputs and whose selection is governed by an MSB (Most Significant Bit) of the second plurality of LSBs of the difference;
an input value selection MUX that is operable to receive the first input value and the second input value as inputs and whose selection is governed by an MSB of the difference; and
a logic OR gate that is operable to receive the output value from the min* log saturation block and an output of the log correction factor MUX; and wherein:
an output of the input value selection MUX is a minimum input value selected from among the first input value and the second input value; and
an output of the logic OR gate is a final log correction factor;
the first input value is a finite precision number A;
the second input value is a finite precision number B;
in accordance with min* processing, the minimum input value is A or B; and
in accordance with min* processing, the final log correction factor is $\ln(1+e^{-|A-B|})$.

2. The circuit of claim 1, wherein:
the final log correction factor is subtracted from the minimum input value to generate a final min* resultant based on the first input value and the second input value.

3. The circuit of claim 1, wherein:
the final log correction factor is subtracted from the minimum input value to generate an intermediate min* resultant based on the first input value and the second input value; and
a constant value offset is added to the intermediate min* resultant to generate a final min* resultant based on the first input value and the second input value.

4. The circuit of claim 1, wherein:
the MSB of the difference is a sign bit of the difference.

5. The circuit of claim 1, wherein:
during a first time period:
the subtraction block is operable to calculate the first plurality of LSBs of the difference between the first input value and the second input value;
during a second time period:
the subtraction block is operable to calculate the second plurality of LSBs of the difference between the first input value and the second input value;
the first log correction factor block is operable to determine the first log correction factor based on the first plurality of LSBs of the difference; and
the second log correction factor block is operable to determine the second log correction factor based on the first plurality of LSBs of the difference.

6. The circuit of claim 1, wherein:
during a first time period:
the subtraction block is operable to calculate the first plurality of LSBs of the difference between the first input value and the second input value;
during a second time period:
the subtraction block is operable to calculate the second plurality of LSBs of the difference between the first input value and the second input value;
the first log correction factor block is operable to determine the first log correction factor based on the first plurality of LSBs of the difference;
the second log correction factor block is operable to determine the second log correction factor based on the first plurality of LSBs of the difference;
during a third time period: and
the MSB of the second plurality of LSBs of the difference directs the log correction factor MUX select either the first log correction factor or the second log correction factor.

7. The circuit of claim 1, further comprising:
a LUT (Look-Up Table) that includes a plurality of first log correction factors and a plurality of second log correction factors defined as a function of first plurality of LSBs of the difference;
wherein the first log correction factor block looks up the first log correction factor from the LUT based on the first plurality of LSBs of the difference; and
wherein the second log correction factor block looks up the second log correction factor from the LUT based on the first plurality of LSBs of the difference.

8. The circuit of claim 1, further comprising:
a LUT (Look-Up Table) that includes a plurality of first log correction factors and a plurality of second log correction factors defined as a function of first plurality of LSBs of the difference;
wherein the first log correction factor block looks up the first log correction factor from the LUT based on the first plurality of LSBs of the difference;
wherein the second log correction factor block looks up the second log correction factor from the LUT based on the first plurality of LSBs of the difference; and
wherein each log correction factor of the plurality of first log correction factors and a plurality of second log correction factors is bit value of either a 0 or a 1 as defined by a single bit of precision.

9. The circuit of claim 1, further comprising:
a LUT (Look-Up Table) that includes a plurality of min* log saturation block output values defined as a function of the second plurality of LSBs of the difference.

10. The circuit of claim 1, wherein:
the output value of the min* log saturation block is a 1 when each bit of the second plurality of LSBs of the difference is a 1;
the output value of the min* log saturation block is a 1 when each bit of the second plurality of LSBs of the difference is a 0; and
the output value of the min* log saturation block is a 0 when at least one bit of the second plurality of LSBs of the difference is a 1 and at least one bit of the second plurality of LSBs of the difference is a 0.

11. The circuit of claim 1, wherein:
the final log correction factor is a bit value of either a 0 or a 1 as defined by a single bit of precision.

12. The circuit of claim 1, wherein:
the circuit is contained within an LDPC (Low Density Parity Check) decoder that is operable to decode an LDPC coded signal.

13. The circuit of claim 1, wherein:
the circuit is contained within a MAP decoder that is operable to decode a turbo coded signal or a TTCM (Turbo Trellis Coded Modulation) coded signal.

14. The circuit of claim 1, wherein:
the circuit is contained within a decoder that is operable to decode a coded signal;
the decoder is implemented within a communication device; and
the communication device is implemented within at least one of a cable television distribution system, a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

15. A min* (min star) circuit, the circuit comprising:
a subtraction block that is operable to calculate a difference between a first input value and a second input value;
a first log correction factor block that is operable to determine a first log correction factor based on a first plurality of LSBs (Least Significant Bits) of the difference;
a second log correction factor block that is operable to determine a second log correction factor based on the first plurality of LSBs of the difference;
a min* log saturation block whose output value is governed by a second plurality of LSBs of the difference;
a log correction factor MUX (Multiplexor) that is operable to receive the first log correction factor and the second log correction factor as inputs and whose selection is governed by an MSB (Most Significant Bit) of the second plurality of LSBs of the difference;
an input value selection MUX that is operable to receive the first input value and the second input value as inputs and whose selection is governed by an MSB of the difference; and
a logic OR gate that is operable to receive the output value from the min* log saturation block and an output of the log correction factor MUX; and wherein:
an output of the input value selection MUX is a minimum input value selected from among the first input value and the second input value;
an output of the logic OR gate is a final log correction factor;
during a first time period:
the subtraction block is operable to calculate the first plurality of LSBs of the difference between the first input value and the second input value;
during a second time period:
the subtraction block is operable to calculate the second plurality of LSBs of the difference between the first input value and the second input value;
the first log correction factor block is operable to determine the first log correction factor based on the first plurality of LSBs of the difference; and the second log correction factor block is operable to determine the second log correction factor based on the first plurality of LSBs of the difference;
the first input value is a finite precision number A;
the second input value is a finite precision number B;
in accordance with min* processing, the minimum input value is A or B; and
in accordance with min*processing, the final log correction factor is $\ln(1+e^{-|A-B|})$.

16. The circuit of claim 15, wherein:
the final log correction factor is subtracted from the minimum input value to generate a final min* resultant based on the first input value and the second input value.

17. The circuit of claim 15, wherein:
the final log correction factor is subtracted from the minimum input value to generate an intermediate min* resultant based on the first input value and the second input value; and
a constant value offset is added to the intermediate min* resultant to generate a final min* resultant based on the first input value and the second input value.

18. The circuit of claim 15, wherein:
the MSB of the difference is a sign bit of the difference.

19. The circuit of claim 15, wherein:
during a third time period: and
the MSB of the second plurality of LSBs of the difference directs the log correction factor MUX select either the first log correction factor or the second log correction factor.

20. The circuit of claim 15, further comprising:
a LUT (Look-Up Table) that includes a plurality of first log correction factors and a plurality of second log correction factors defined as a function of first plurality of LSBs of the difference;
wherein the first log correction factor block looks up the first log correction factor from the LUT based on the first plurality of LSBs of the difference; and
wherein the second log correction factor block looks up the second log correction factor from the LUT based on the first plurality of LSBs of the difference.

21. The circuit of claim 15, further comprising:
a LUT (Look-Up Table) that includes a plurality of first log correction factors and a plurality of second log correction factors defined as a function of first plurality of LSBs of the difference;
wherein the first log correction factor block looks up the first log correction factor from the LUT based on the first plurality of LSBs of the difference;
wherein the second log correction factor block looks up the second log correction factor from the LUT based on the first plurality of LSBs of the difference; and
wherein each log correction factor of the plurality of first log correction factors and a plurality of second log correction factors is bit value of either a 0 or a 1 as defined by a single bit of precision.

22. The circuit of claim 15, further comprising:
a LUT (Look-Up Table) that includes a plurality of min* log saturation block output values defined as a function of the second plurality of LSBs of the difference.

23. The circuit of claim 15, wherein:
the output value of the min* log saturation block is a 1 when each bit of the second plurality of LSBs of the difference is a 1;
the output value of the min* log saturation block is a 1 when each bit of the second plurality of LSBs of the difference is a 0; and the output value of the min* log saturation block is a 0 when at least one bit of the second plurality of LSBs of the difference is a 1 and at least one bit of the second plurality of LSBs of the difference is a 0.

24. The circuit of claim 15, wherein:
the final log correction factor is a bit value of either a 0 or a 1 as defined by a single bit of precision.

25. The circuit of claim 15, wherein:
the circuit is contained within an LDPC (Low Density Parity Check) decoder that is operable to decode an LDPC coded signal.

26. The circuit of claim 15, wherein:
the circuit is contained within a MAP decoder that is operable to decode a turbo coded signal or a TTCM (Turbo Trellis Coded Modulation) coded signal.

27. The circuit of claim 15, wherein:
the circuit is contained within a decoder that is operable to decode a coded signal;
the decoder is implemented within a communication device; and
the communication device is implemented within at least one of a cable television distribution system, a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

28. A min* (min star) circuit, the circuit comprising:
a subtraction block that is operable to calculate a difference between a first input value and a second input value;
a first log correction factor block that is operable to determine a first log correction factor based on a first plurality of LSBs (Least Significant Bits) of the difference;
a second log correction factor block that is operable to determine a second log correction factor based on the first plurality of LSBs of the difference;
a min* log saturation block whose output value is governed by a second plurality of LSBs of the difference;
a log correction factor MUX (Multiplexor) that is operable to receive the first log correction factor and the second log correction factor as inputs and whose selection is governed by an MSB (Most Significant Bit) of the second plurality of LSBs of the difference;
an input value selection MUX that is operable to receive the first input value and the second input value as inputs and whose selection is governed by an MSB of the difference;
a logic OR gate that is operable to receive the output value from the min* log saturation block and an output of the log correction factor MUX, wherein:
an output of the input value selection MUX is a minimum input value selected from among the first input value and the second input value; and
an output of the logic OR gate is a final log correction factor; and
a LUT (Look-Up Table) that includes a plurality of first log correction factors and a plurality of second log correction factors defined as a function of first plurality of LSBs of the difference; and wherein:
the first log correction factor block looks up the first log correction factor from the LUT based on the first plurality of LSBs of the difference;

the second log correction factor block looks up the second log correction factor from the LUT based on the first plurality of LSBs of the difference;
each log correction factor of the plurality of first log correction factors and a plurality of second log correction factors is bit value of either a 0 or a 1 as defined by a single bit of precision;
the output value of the min* log saturation block is a 1 when each bit of the second plurality of LSBs of the difference is a 1;
the output value of the min* log saturation block is a 1 when each bit of the second plurality of LSBs of the difference is a 0;
the output value of the min* log saturation block is a 0 when at least one bit of the second plurality of LSBs of the difference is a 1 and at least one bit of the second plurality of LSBs of the difference is a 0; and
the final log correction factor is a bit value of either a 0 or a 1 as defined by a single bit of precision;
the first input value is a finite precision number A;
the second input value is a finite precision number B;
in accordance with min* processing, the minimum input value is A or B; and
in accordance with min* processing, the final log correction factor is $\ln(1+e^{-|A-B|})$.

29. The circuit of claim 28, wherein:
the final log correction factor is subtracted from the minimum input value to generate a final min* resultant based on the first input value and the second input value.

30. The circuit of claim 28, wherein:
the final log correction factor is subtracted from the minimum input value to generate an intermediate min* resultant based on the first input value and the second input value; and
a constant value offset is added to the intermediate min* resultant to generate a final min* resultant based on the first input value and the second input value.

31. The circuit of claim 28, wherein:
the MSB of the difference is a sign bit of the difference.

32. The circuit of claim 28, wherein:
during a first time period:
the subtraction block is operable to calculate the first plurality of LSBs of the difference between the first input value and the second input value;
during a second time period:
the subtraction block is operable to calculate the second plurality of LSBs of the difference between the first input value and the second input value;
the first log correction factor block is operable to determine the first log correction factor based on the first plurality of LSBs of the difference; and
the second log correction factor block is operable to determine the second log correction factor based on the first plurality of LSBs of the difference.

33. The circuit of claim 28, wherein:
during a first time period:
the subtraction block is operable to calculate the first plurality of LSBs of the difference between the first input value and the second input value;
during a second time period:
the subtraction block is operable to calculate the second plurality of LSBs of the difference between the first input value and the second input value;
the first log correction factor block is operable to determine the first log correction factor based on the first plurality of LSBs of the difference;

the second log correction factor block is operable to determine the second log correction factor based on the first plurality of LSBs of the difference;

during a third time period: and the MSB of the second plurality of LSBs of the difference directs the log correction factor MUX select either the first log correction factor or the second log correction factor.

34. The circuit of claim 28, wherein:

the circuit is contained within an LDPC (Low Density Parity Check) decoder that is operable to decode an LDPC coded signal.

35. The circuit of claim 28, wherein:

the circuit is contained within a MAP decoder that is operable to decode a turbo coded signal or a TTCM (Turbo Trellis Coded Modulation) coded signal.

36. The circuit of claim 28, wherein:

the circuit is contained within a decoder that is operable to decode a coded signal;

the decoder is implemented within a communication device; and the communication device is implemented within at least one of a cable television distribution system, a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

37. A max* (max star) circuit, the circuit comprising:

a subtraction block that is operable to calculate a difference between a first input value and a second input value;

a first log correction factor block that is operable to determine a first log correction factor based on a first plurality of LSBs (Least Significant Bits) of the difference;

a second log correction factor block that is operable to determine a second log correction factor based on the first plurality of LSBs of the difference;

a max* log saturation block whose output value is governed by a second plurality of LSBs of the difference;

a log correction factor MUX (Multiplexor) that is operable to receive the first log correction factor and the second log correction factor as inputs and whose selection is governed by an MSB (Most Significant Bit) of the second plurality of LSBs of the difference;

an input value selection MUX that is operable to receive the first input value and the second input value as inputs and whose selection is governed by an MSB of the difference; and a logic AND gate that is operable to receive the output value from the max* log saturation block and an output of the log correction factor MUX; and wherein:

an output of the input value selection MUX is a maximum input value selected from among the first input value and the second input value; and an output of the logic AND gate is a final log correction factor;

the first input value is a finite precision number A;

the second input value is a finite precision number B;

in accordance with min* processing, the minimum input value is A or B; and in accordance with min* processing, the final log correction factor is $\ln(1+e^{-|A-B|})$.

38. The circuit of claim 37, wherein:

the final log correction factor is added to the maximum input value to generate a final max* resultant based on the first input value and the second input value.

39. The circuit of claim 37, wherein:

the final log correction factor is added to the maximum input value to generate an intermediate max* resultant based on the first input value and the second input value; and a constant value offset is added to the intermediate max* resultant to generate a final max* resultant based on the first input value and the second input value.

40. The circuit of claim 37, wherein:

the MSB of the difference is a sign bit of the difference.

41. The circuit of claim 37, wherein:

during a first time period:

the subtraction block is operable to calculate the first plurality of LSBs of the difference between the first input value and the second input value;

during a second time period:

the subtraction block is operable to calculate the second plurality of LSBs of the difference between the first input value and the second input value;

the first log correction factor block is operable to determine the first log correction factor based on the first plurality of LSBs of the difference; and the second log correction factor block is operable to determine the second log correction factor based on the first plurality of LSBs of the difference.

42. The circuit of claim 37, wherein:

during a first time period:

the subtraction block is operable to calculate the first plurality of LSBs of the difference between the first input value and the second input value;

during a second time period:

the subtraction block is operable to calculate the second plurality of LSBs of the difference between the first input value and the second input value;

the first log correction factor block is operable to determine the first log correction factor based on the first plurality of LSBs of the difference;

the second log correction factor block is operable to determine the second log correction factor based on the first plurality of LSBs of the difference;

during a third time period: and the MSB of the second plurality of LSBs of the difference directs the log correction factor MUX select either the first log correction factor or the second log correction factor.

43. The circuit of claim 37, further comprising:

a LUT (Look-Up Table) that includes a plurality of first log correction factors and a plurality of second log correction factors defined as a function of first plurality of LSBs of the difference;

wherein the first log correction factor block looks up the first log correction factor from the LUT based on the first plurality of LSBs of the difference; and wherein the second log correction factor block looks up the second log correction factor from the LUT based on the first plurality of LSBs of the difference.

44. The circuit of claim 37, further comprising:

a LUT (Look-Up Table) that includes a plurality of first log correction factors and a plurality of second log correction factors defined as a function of first plurality of LSBs of the difference;

wherein the first log correction factor block looks up the first log correction factor from the LUT based on the first plurality of LSBs of the difference;

wherein the second log correction factor block looks up the second log correction factor from the LUT based on the first plurality of LSBs of the difference; and wherein each log correction factor of the plurality of first log correction factors and a plurality of second log correction factors is bit value of either a 0 or a 1 as defined by a single bit of precision.

45. The circuit of claim 37, further comprising:

a LUT (Look-Up Table) that includes a plurality of max* log saturation block output values defined as a function of the second plurality of LSBs of the difference.

46. The circuit of claim 37, wherein:

the output value of the max* log saturation block is a 1 when each bit of the second plurality of LSBs of the difference is a 1;

the output value of the max* log saturation block is a 1 when each bit of the second plurality of LSBs of the difference is a 0; and the output value of the max* log saturation block is a 0 when at least one bit of the second plurality of LSBs of the difference is a 1 and at least one bit of the second plurality of LSBs of the difference is a 0.

47. The circuit of claim 37, wherein:

the final log correction factor is a bit value of either a 0 or a 1 as defined by a single bit of precision.

48. The circuit of claim 37, wherein:

the circuit is contained within an LDPC (Low Density Parity Check) decoder that is operable to decode an LDPC coded signal.

49. The circuit of claim 37, wherein:

the circuit is contained within a MAP decoder that is operable to decode a turbo coded signal or a TTCM (Turbo Trellis Coded Modulation) coded signal.

50. The circuit of claim 37, wherein:

the circuit is contained within a decoder that is operable to decode a coded signal;

the decoder is implemented within a communication device; and the communication device is implemented within at least one of a cable television distribution system, a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

51. A max* (max star) circuit, the circuit comprising:

a subtraction block that is operable to calculate a difference between a first input value and a second input value;

a first log correction factor block that is operable to determine a first log correction factor based on a first plurality of LSBs (Least Significant Bits) of the difference;

a second log correction factor block that is operable to determine a second log correction factor based on the first plurality of LSBs of the difference;

a max* log saturation block whose output value is governed by a second plurality of LSBs of the difference;

a log correction factor MUX (Multiplexor) that is operable to receive the first log correction factor and the second log correction factor as inputs and whose selection is governed by an MSB (Most Significant Bit) of the second plurality of LSBs of the difference;

an input value selection MUX that is operable to receive the first input value and the second input value as inputs and whose selection is governed by an MSB of the difference; and a logic AND gate that is operable to receive the output value from the max* log saturation block and an output of the log correction factor MUX; and wherein:

an output of the input value selection MUX is a maximum input value selected from among the first input value and the second input value;

an output of the logic AND gate is a final log correction factor;

during a first time period:

the subtraction block is operable to calculate the first plurality of LSBs of the difference between the first input value and the second input value;

during a second time period:

the subtraction block is operable to calculate the second plurality of LSBs of the difference between the first input value and the second input value;

the first log correction factor block is operable to determine the first log correction factor based on the first plurality of LSBs of the difference; and the second log correction factor block is operable to determine the second log correction factor based on the first plurality of LSBs of the difference;

the first input value is a finite precision number A;

the second input value is a finite precision number B;

in accordance with min* processing, the minimum input value is A or B; and in accordance with min* processing, the final log correction factor is $\ln(1+e^{-|A-B|})$.

52. The circuit of claim 51, wherein:

the final log correction factor is added to the maximum input value to generate a final max* resultant based on the first input value and the second input value.

53. The circuit of claim 51, wherein:

the final log correction factor is added to the maximum input value to generate an intermediate max* resultant based on the first input value and the second input value; and a constant value offset is added to the intermediate max* resultant to generate a final max* resultant based on the first input value and the second input value.

54. The circuit of claim 51, wherein:

the MSB of the difference is a sign bit of the difference.

55. The circuit of claim 51, wherein:

during a third time period: and the MSB of the second plurality of LSBs of the difference directs the log correction factor MUX select either the first log correction factor or the second log correction factor.

56. The circuit of claim 51, further comprising:

a LUT (Look-Up Table) that includes a plurality of first log correction factors and a plurality of second log correction factors defined as a function of first plurality of LSBs of the difference;

wherein the first log correction factor block looks up the first log correction factor from the LUT based on the first plurality of LSBs of the difference; and wherein the second log correction factor block looks up the second log correction factor from the LUT based on the first plurality of LSBs of the difference.

57. The circuit of claim 51, further comprising:
a LUT (Look-Up Table) that includes a plurality of first log correction factors and a plurality of second log correction factors defined as a function of first plurality of LSBs of the difference;
wherein the first log correction factor block looks up the first log correction factor from the LUT based on the first plurality of LSBs of the difference;
wherein the second log correction factor block looks up the second log correction factor from the LUT based on the first plurality of LSBs of the difference; and
wherein each log correction factor of the plurality of first log correction factors and a plurality of second log correction factors is bit value of either a 0 or a 1 as defined by a single bit of precision.

58. The circuit of claim 51, further comprising:
a LUT (Look-Up Table) that includes a plurality of max* log saturation block output values defined as a function of the second plurality of LSBs of the difference.

59. The circuit of claim 51, wherein:
the output value of the max* log saturation block is a 1 when each bit of the second plurality of LSBs of the difference is a 1;
the output value of the max* log saturation block is a 1 when each bit of the second plurality of LSBs of the difference is a 0; and
the output value of the max* log saturation block is a 0 when at least one bit of the second plurality of LSBs of the difference is a 1 and at least one bit of the second plurality of LSBs of the difference is a 0.

60. The circuit of claim 51, wherein:
the final log correction factor is a bit value of either a 0 or a 1 as defined by a single bit of precision.

61. The circuit of claim 51, wherein:
the circuit is contained within an LDPC (Low Density Parity Check) decoder that is operable to decode an LDPC coded signal.

62. The circuit of claim 51, wherein:
the circuit is contained within a MAP decoder that is operable to decode a turbo coded signal or a TTCM (Turbo Trellis Coded Modulation) coded signal.

63. The circuit of claim 51, wherein:
the circuit is contained within a decoder that is operable to decode a coded signal;
the decoder is implemented within a communication device; and
the communication device is implemented within at least one of a cable television distribution system, a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

64. A max* (max star) circuit, the circuit comprising:
a subtraction block that is operable to calculate a difference between a first input value and a second input value;
a first log correction factor block that is operable to determine a first log correction factor based on a first plurality of LSBs (Least Significant Bits) of the difference;
a second log correction factor block that is operable to determine a second log correction factor based on the first plurality of LSBs of the difference;
a max* log saturation block whose output value is governed by a second plurality of LSBs of the difference;
a log correction factor MUX (Multiplexor) that is operable to receive the first log correction factor and the second log correction factor as inputs and whose selection is governed by an MSB (Most Significant Bit) of the second plurality of LSBs of the difference;
an input value selection MUX that is operable to receive the first input value and the second input value as inputs and whose selection is governed by an MSB of the difference;
a logic AND gate that is operable to receive the output value from the max* log saturation block and an output of the log correction factor MUX, wherein:
an output of the input value selection MUX is a maximum input value selected from among the first input value and the second input value; and
an output of the logic AND gate is a final log correction factor; and
a LUT (Look-Up Table) that includes a plurality of first log correction factors and a plurality of second log correction factors defined as a function of first plurality of LSBs of the difference;
the first log correction factor block looks up the first log correction factor from the LUT based on the first plurality of LSBs of the difference;
the second log correction factor block looks up the second log correction factor from the LUT based on the first plurality of LSBs of the difference;
each log correction factor of the plurality of first log correction factors and a plurality of second log correction factors is bit value of either a 0 or a 1 as defined by a single bit of precision;
the output value of the max* log saturation block is a 1 when each bit of the second plurality of LSBs of the difference is a 1;
the output value of the max* log saturation block is a 1 when each bit of the second plurality of LSBs of the difference is a 0; and
the output value of the max* log saturation block is a 0 when at least one bit of the second plurality of LSBs of the difference is a 1 and at least one bit of the second plurality of LSBs of the difference is a 0; and
the final log correction factor is a bit value of either a 0 or a 1 as defined by a single bit of precision;
the first input value is a finite precision number A;
the second input value is a finite precision number B;
in accordance with min* processing, the minimum input value is A or B; and
in accordance with min* processing, the final log correction factor is $\ln(1+e^{-|A-B|})$.

65. The circuit of claim 64, wherein:
the final log correction factor is added to the maximum input value to generate a final max* resultant based on the first input value and the second input value.

66. The circuit of claim 64, wherein:
the final log correction factor is added to the maximum input value to generate an intermediate max* resultant based on the first input value and the second input value; and
a constant value offset is added to the intermediate max* resultant to generate a final max* resultant based on the first input value and the second input value.

67. The circuit of claim 64, wherein:
the MSB of the difference is a sign bit of the difference.

68. The circuit of claim 64, wherein:
during a first time period:
  the subtraction block is operable to calculate the first plurality of LSBs of the difference between the first input value and the second input value;
during a second time period:
  the subtraction block is operable to calculate the second plurality of LSBs of the difference between the first input value and the second input value;
  the first log correction factor block is operable to determine the first log correction factor based on the first plurality of LSBs of the difference; and
  the second log correction factor block is operable to determine the second log correction factor based on the first plurality of LSBs of the difference.

69. The circuit of claim 64, wherein:
during a first time period:
  the subtraction block is operable to calculate the first plurality of LSBs of the difference between the first input value and the second input value;
during a second time period:
  the subtraction block is operable to calculate the second plurality of LSBs of the difference between the first input value and the second input value;
  the first log correction factor block is operable to determine the first log correction factor based on the first plurality of LSBs of the difference;
  the second log correction factor block is operable to determine the second log correction factor based on the first plurality of LSBs of the difference;
during a third time period: and
  the MSB of the second plurality of LSBs of the difference directs the log correction factor MUX select either the first log correction factor or the second log correction factor.

70. The circuit of claim 64, wherein:
the circuit is contained within an LDPC (Low Density Parity Check) decoder that is operable to decode an LDPC coded signal.

71. The circuit of claim 64, wherein:
the circuit is contained within a MAP decoder that is operable to decode a turbo coded signal or a TTCM (Turbo Trellis Coded Modulation) coded signal.

72. The circuit of claim 64, wherein:
the circuit is contained within a decoder that is operable to decode a coded signal;
the decoder is implemented within a communication device; and
the communication device is implemented within at least one of a cable television distribution system, a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

73. A method for performing min* (min star) processing, the method comprising:
during a first time period:
  calculating a first plurality of LSBs (Least Significant Bits) of a difference between a first input value and a second input value;
during a second time period:
  calculating a second plurality of LSBs of the difference between the first input value and the second input value;
  determining a first log correction factor based on the first plurality of LSBs of the difference;
  determining a second log correction factor based on the first plurality of LSBs of the difference;
during a third time period:
  selecting either the first log correction factor or the second log correction factor as being a final log correction value based on an MSB (Most Significant Bit) of the second plurality of LSBs of the difference; and
  selecting a minimum input value from among the first input value and the second input value based on an MSB of the difference; and wherein:
the first input value is a finite precision number A;
the second input value is a finite precision number B;
in accordance with min* processing, the minimum input value is A or B; and
in accordance with min* processing, the final log correction factor is $\ln(1+e^{-|A-B|})$.

74. The method of claim 73, further comprising:
looking up the first log correction factor within a LUT (Look-Up Table) based on the first plurality of LSBs of the difference;
looking up the second log correction factor within the LUT based on the first plurality of LSBs of the difference; and
wherein the LUT includes a plurality of first log correction factors and a plurality of second log correction factors defined as a function of first plurality of LSBs of the difference.

75. The method of claim 73, further comprising:
looking up the first log correction factor within a LUT (Look-Up Table) based on the first plurality of LSBs of the difference;
looking up the second log correction factor within the LUT based on the first plurality of LSBs of the difference;
wherein the LUT includes a plurality of first log correction factors and a plurality of second log correction factors defined as a function of first plurality of LSBs of the difference; and
wherein each log correction factor of the plurality of first log correction factors and a plurality of second log correction factors is bit value of either a 0 or a 1 as defined by a single bit of precision.

76. The method of claim 73, further comprising:
forcing the final log correction value to a predetermined value when each bit of the second plurality of LSBs of the difference is a 1 or when each bit of the second plurality of LSBs of the difference is a 0.

77. The method of claim 73, further comprising:
subtracting the final log correction factor from the minimum input value thereby generating a final min* resultant based on the first input value and the second input value.

78. The method of claim 73, further comprising:
subtracting the final log correction factor from the minimum input value thereby generating an intermediate min* resultant based on the first input value and the second input value; and
adding a constant value offset to the intermediate min* resultant to generate a final min* resultant based on the first input value and the second input value.

79. The method of claim 73, wherein:
the final log correction factor is a bit value of either a 0 or a 1 as defined by a single bit of precision.

80. The method of claim 73, wherein:
the method is performed within a decoder that is operable to decode an LDPC (Low Density Parity Check) coded signal.

81. The method of claim 73, wherein:
the method is performed within a decoder that is operable to decode a turbo coded signal or a TTCM (Turbo Trellis Coded Modulation) coded signal.

82. The method of claim 73, wherein:
the method is performed within a decoder that is operable to decode a coded signal;
the decoder is implemented within a communication device; and
the communication device is implemented within at least one of a cable television distribution system, a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

83. A method for performing max* (max star) processing, the method comprising:
during a first time period:
calculating a first plurality of LSBs (Least Significant Bits) of a difference between a first input value and a second input value;
during a second time period:
calculating a second plurality of LSBs of the difference between the first input value and the second input value;
determining a first log correction factor based on the first plurality of LSBs of the difference;
determining a second log correction factor based on the first plurality of LSBs of the difference;
during a third time period:
selecting either the first log correction factor or the second log correction factor as being a final log correction value based on an MSB (Most Significant Bit) of the second plurality of LSBs of the difference; and
selecting a maximum input value from among the first input value and the second input value based on an MSB of the difference; and wherein:
the first input value is a finite precision number A;
the second input value is a finite precision number B;
in accordance with min* processing, the minimum input value is A or B; and
in accordance with min* processing, the final log correction factor is $\ln(1+e^{-|A-B|})$.

84. The method of claim 3, further comprising:
looking up the first log correction factor within a LUT (Look-Up Table) based on the first plurality of LSBs of the difference;
looking up the second log correction factor within the LUT based on the first plurality of LSBs of the difference; and
wherein the LUT includes a plurality of first log correction factors and a plurality of second log correction factors defined as a function of first plurality of LSBs of the difference.

85. The method of claim 83, further comprising:
looking up the first log correction factor within a LUT (Look-Up Table) based on the first plurality of LSBs of the difference;
looking up the second log correction factor within the LUT based on the first plurality of LSBs of the difference;
wherein the LUT includes a plurality of first log correction factors and a plurality of second log correction factors defined as a function of first plurality of LSBs of the difference; and
wherein each log correction factor of the plurality of first log correction factors and a plurality of second log correction factors is bit value of either a 0 or a 1 as defined by a single bit of precision.

86. The method of claim 83, further comprising:
forcing the final log correction value to a predetermined value when each bit of the second plurality of LSBs of the difference is a 1 or when each bit of the second plurality of LSBs of the difference is a 0.

87. The method of claim 83, further comprising:
adding the final log correction factor to the maximum input value thereby generating a final max* resultant based on the first input value and the second input value.

88. The method of claim 83, further comprising:
adding the final log correction factor to the maximum input value thereby generating an intermediate max* resultant based on the first input value and the second input value; and
adding a constant value offset to the intermediate max* resultant to generate a final max* resultant based on the first input value and the second input value.

89. The method of claim 83, wherein:
the final log correction factor is a bit value of either a 0 or a 1 as defined by a single bit of precision.

90. The method of claim 83, wherein:
the method is performed within a decoder that is operable to decode an LDPC (Low Density Parity Check) coded signal.

91. The method of claim 83, wherein:
the method is performed within a decoder that is operable to decode a turbo coded signal or a TTCM (Turbo Trellis Coded Modulation) coded signal.

92. The method of claim 83, wherein:
the method is performed within a decoder that is operable to decode a coded signal;
the decoder is implemented within a communication device; and
the communication device is implemented within at least one of a cable television distribution system, a satellite communication system, an HDTV (High Definition Television) communication system, a cellular communication system, a microwave communication system, a point-to-point communication system, a uni-directional communication system, a bi-directional communication system, a one to many communication system, a fiber-optic communication system, a WLAN (Wireless Local Area Network) communication system, and a DSL (Digital Subscriber Line) communication system.

* * * * *

UNITED STATES PATENT AND TRADEMARK OFFICE
CERTIFICATE OF CORRECTION

PATENT NO.         : 7,415,079 B2                                      Page 1 of 1
APPLICATION NO.    : 10/865456
DATED              : August 19, 2008
INVENTOR(S)        : Kelly Brian Cameron et al.

It is certified that error appears in the above-identified patent and that said Letters Patent is hereby corrected as shown below:

Column 101, line 57, in Claim 28: "Value" should be lowercase.

Column 103, line 64, in Claim 37: replace "min*" with --max*--.

Column 103, line 64, in Claim 37: replace "minimum" with --maximum--.

Column 103, line 66, in Claim 37: replace "min*" with --max*--.

Column 106, line 32, in Claim 51: replace "min*" with --max*--.

Column 106, line 32, in Claim 51: replace "minimum" with --maximum--.

Column 106, line 34, in Claim 51: replace "min*" with --max*--.

Column 108, line 49, in Claim 64: replace "min*" with --max*--.

Column 108, line 49, in Claim 64: replace "minimum" with --maximum--.

Column 108, line 51, in Claim 64: replace "min*" with --max*--.

Column 111, line 49, in Claim 83: replace "min*" with --max*--.

Column 111, line 49, in Claim 83: replace "minimum" with --maximum--.

Column 111, line 51, in Claim 83: replace "min*" with --max*--.

Signed and Sealed this

Twenty-first Day of April, 2009

JOHN DOLL
*Acting Director of the United States Patent and Trademark Office*